(12) United States Patent
Lee

(10) Patent No.: US 9,443,579 B2
(45) Date of Patent: Sep. 13, 2016

(54) VSL-BASED VT-COMPENSATION AND ANALOG PROGRAM SCHEME FOR NAND ARRAY WITHOUT CSL

(71) Applicant: Peter Wung Lee, Saratoga, CA (US)

(72) Inventor: Peter Wung Lee, Saratoga, CA (US)

(73) Assignee: APLUS FLASH TECHNOLOGY, INC, Fremont, CA (US)

( * ) Notice: Subject to any disclaimer, the term of this patent is extended or adjusted under 35 U.S.C. 154(b) by 0 days.

(21) Appl. No.: 14/828,427

(22) Filed: Aug. 17, 2015

(65) Prior Publication Data

US 2016/0049192 A1    Feb. 18, 2016

Related U.S. Application Data

(60) Provisional application No. 62/038,329, filed on Aug. 17, 2014.

(51) Int. Cl.
| | |
|---|---|
| *G11C 5/02* | (2006.01) |
| *G11C 11/56* | (2006.01) |
| *G11C 16/10* | (2006.01) |
| *G11C 16/26* | (2006.01) |
| *G11C 16/04* | (2006.01) |
| *G11C 16/34* | (2006.01) |
| *G11C 7/18* | (2006.01) |
| *G11C 16/08* | (2006.01) |

(52) U.S. Cl.
CPC .............. *G11C 11/5635* (2013.01); *G11C 7/18* (2013.01); *G11C 11/5642* (2013.01); *G11C 11/5671* (2013.01); *G11C 16/0483* (2013.01); *G11C 16/08* (2013.01); *G11C 16/10* (2013.01); *G11C 16/26* (2013.01); *G11C 16/3427* (2013.01); *G11C 16/3459* (2013.01); *G11C 2207/2245* (2013.01); *G11C 2211/5641* (2013.01)

(58) Field of Classification Search
USPC ......................................... 365/51, 63, 185.17
See application file for complete search history.

(56) References Cited

U.S. PATENT DOCUMENTS

2010/0259961 A1* 10/2010 Fasoli .................... B82Y 10/00
365/51

\* cited by examiner

*Primary Examiner* — Vu Le
(74) *Attorney, Agent, or Firm* — Raywell Group LLC

(57) ABSTRACT

A YUKAI NAND array comprising multiple strings of all TLC and mixed TLC+SLC memory cells associated with hierarchical global/local bit lines (GBL/LBL) and each string being associated with one LBL and having adjacent LBL as a dedicated local source line (LSL) with full BL-shielding without wasting extra silicon area and without a common source line to connect all strings. Each of the LBLs is interleavingly associated with either an Odd or Even string selected via one pair of dummy cells inserted in each string and is used as one on-chip PCACHE register with full BL-shielding to perform concurrent ABL, AnP and Alt-WL program under multi-passes program schemes with LBL program voltage compensations and half-BL Odd/Even program-verify and read operations with individual $V_{SL}$-based Vt-compensation to mitigate high WL-WL and BL-BL coupling effects.

57 Claims, 80 Drawing Sheets

ABL, AnP, Alt-WL Program Scheme

| Boundary WL | Time | t0 | t1 | t2 | t3 | t4 | t5 | t6 | t7 | t8 | t9 | t10 | t11 | t12 | t13 | t14 |
|---|---|---|---|---|---|---|---|---|---|---|---|---|---|---|---|---|
| Yes | DMYWL | DP | 1S | | 2S/2S' | | | | | | | | | | | |
| 1st(Yes) | WLn-1 | DS | 1P | 1S | 2P/2P' | | 2S/2S' | 3P/3P' | | | 3S/3S" | | | | | |
| No | WLn | | 1S | 1P | 2S/2S' | 1S | 2P/2P' | 3S/3S' | 1S | 2S/2S' | 3P/3P" | | | | | |
| No | WLn+1 | | | 1S | | 1P | 2S/2S' | | 1P | 2P/2P' | 3S/3S" | 1S | 2S/2S' | 3P/3P" | | 3S/3S" |
| No | WLn+2 | | | | | 1S | | | 1S | 2S/2S' | | 1P | 2P/2P' | 3S/3S" | 2S | 3P/3P" |
| 2nd(Yes) | WLn+3 | | | | | | | | | | | 1S | 2S/2S' | | 2P | 3S/3S" |
| 1st(Yes) | WLn+4 | | | | | | | | | | | 1S | | | 2S | |
| 3-bit PB | DMYWL | WLn-1 | WLn | WLn-1 | WLn+1 | WLn | WLn-1 | WLn+2 | WLn+1 | WLn | WLn+3 | WLn+2 | WLn+1 | WLn+3 | WLn+2 |

Note

1. DP: Dummy WL program
2. Option 1: 1-2-8 (coarse)-8(fine) program; Non-boundary WL program: 1P/2P/3P; Boundary WL program: 1P/2P/3P'
3. Option 2: 1-2-5-8 program; Non-boundary WL program: 1P/2P/3P"; Boundary WL program: 1P/2P/3P'

Fig. 5A

ABL, AnP, Alt WL Program Scheme

| Boundary WL | Time | t10 | t11 | t12 | t13 | t14 | t0' | t1' | t2' | t3' | t4' | t5' | t6' | t7' | t8' | t9' | t10' |
|---|---|---|---|---|---|---|---|---|---|---|---|---|---|---|---|---|---|
| No | WLn+2 | 1S | 2P/2P' | 3S/3S" | 2S | 3P/3P' | | | | | | | | | | | |
| 2nd(Yes) | WLn+3 | 1P | 2S/2S' | | 2P | 3S/3S" | Read | 1S | | 2S/2S' | | | 3S' | 3S/3S" | | | |
| 1st (Yes) | WLn+4 | 1S | | | 2S | | | 1P | 1S | 2P/2P' | | 2S/2S' | 3P' | 3P/3P' | | | 3S/3S" |
| No | WLn+5 | | | | | | | 1S | 1P | 2S/2S' | 1S | 2P/2P' | 3S' | 3S/3S" | | | 3P/3P' |
| No | WLn+6 | | | | | | | | 1S | | 1P | 2S/2S' | | | 1S | 2P/2P' | 3S/3S" |
| No | WLn+7 | | | | | | | | | | 1S | | | | 1P | 1S | 2S/2S' |
| 3-bit PB | WLn+3 | WLn+2 | WLn+2 | WLn+1 | WLn+3 | WLn+2 | WLn+2 | WLn+4 | WLn+5 | WLn+4 | WLn+6 | WLn+5 | WLn+4 | WLn+3 | WLn+7 | WLn+6 | WLn+5 |
| Note | | | | | | | | | | | | | | | | | |
| 1. Option 1: 1-2-8 (coarse)-8(fine) program; Non-boundary WL program: 1P/2P/3P; Boundary WL program: 1P/2P/3P' | | | | | | | | | | | | | | | | | |
| 2. Option 2: 1-2-5-8 program; Non-boundary WL program: 1P/2P/3P'; Boundary WL program: 1P/2P/3P' | | | | | | | | | | | | | | | | | |

Fig. 5B

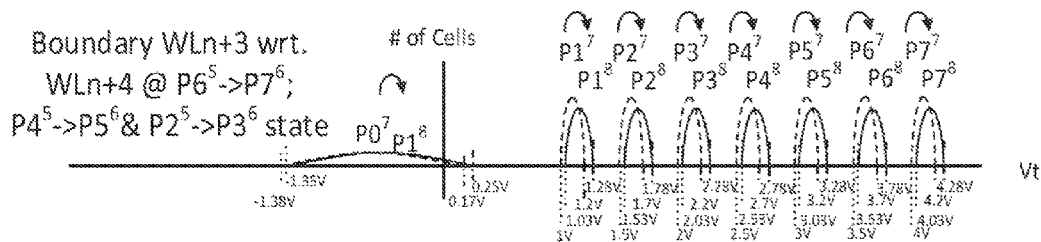

| Time | State | Vtmin/Vtmax(New) of WLn+3 wrt. WLn+4 @ P6⁵->P7⁶ | |
|---|---|---|---|
| t7' | 3P": P6⁵->P7⁶ (WLn+4) | Vtmin(new)=Vtmin(old)+0.03V | |
| | | Vtmax(new)=Vtmax(old)+0.08V | |
| | State | Vtmin/Vtmax(New) of WLn+3 wrt. WLn+4 @ P4⁵->P5⁶ | |
| | 3P": P4⁵->P5⁶ (WLn+4) | Vtmin(new)=Vtmin(old)+0.03V | |
| | | Vtmax(new)=Vtmax(old)+0.08V | |
| | State | Vtmin/Vtmax(New) of WLn+3 wrt. WLn+4 @ P2⁵->P3⁶ | |
| | 3P": P2⁵->P3⁶ (WLn+4) | Vtmin(new)=Vtmin(old)+0.03V | |
| | | Vtmax(new)=Vtmax(old)+0.08V | |
| Note | | | |
| 1. Vtmin is shifted by WLn+4's (Vtp7⁶min-Vtp6⁵max)x7.5%=(3.6-3.14)x7.5%=0.0345V | | | |
| 2. Vtmax is shifted by WLn+4's (Vtp7⁶max-Vtp6⁵min)x7.5%=(3.8-2.7)x7.5%=0.0825V | | | |
| 3. Vtmin is shifted by WLn+4's (Vtp5⁶min-Vtp4⁵max)x7.5%=(2.6-2.14)x7.5%=0.0345V | | | |
| 4. Vtmax is shifted by WLn+4's (Vtp5⁶max-Vtp4⁵min)x7.5%=(2.8-1.7)x7.5%=0.0825V | | | |
| 5. Vtmin is shifted by WLn+4's (Vtp3⁶min-Vtp2⁵max)x7.5%=(2.6-2.14)x7.5%=0.0345V | | | |
| 6. Vtmax is shifted by WLn+4's (Vtp3⁶max-Vtp2⁵min)x7.5%=(2.8-1.7)x7.5%=0.0825V | | | |

Fig. 7G

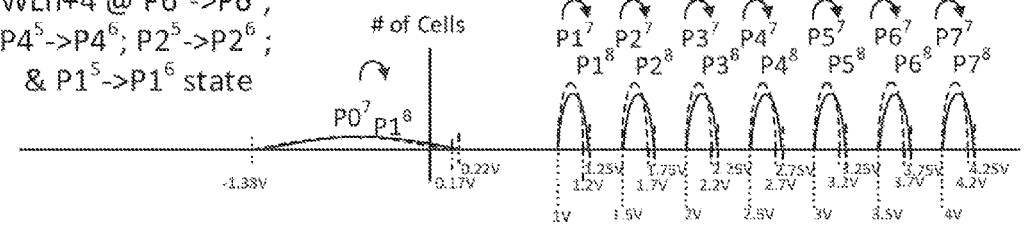

Compensate Boundary WLn+3 by Applying Individual $V_{SL}$=0.03V

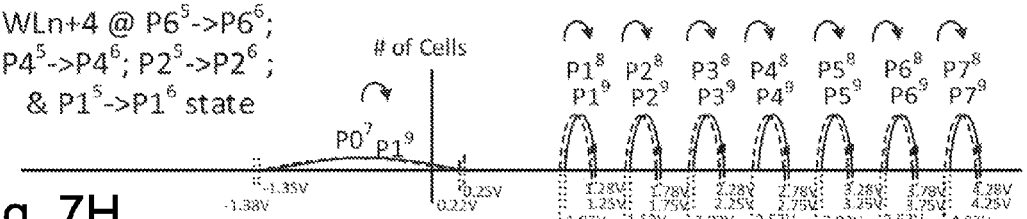

Fig. 7H

| Time | State | Vtmin/Vtmax(New) of WLn+3 wrt. WLn+4 @ P6⁵ -> P6⁶ |
|---|---|---|
| t7' | 3P": P6⁵->P6⁶ (WLn+4) | Vtmin(new)=Vtmin(old) |
| | | Vtmax(new)=Vtmax(old)+0.05V |
| | State | Vtmin/Vtmax(New) of WLn+3 wrt. WLn+4 @ P4⁵ -> P4⁶ |
| | 3P": P4⁵->P4⁶ (WLn+4) | Vtmin(new)=Vtmin(old) |
| | | Vtmax(new)=Vtmax(old)+0.05V |
| | State | Vtmin/Vtmax(New) of WLn+3 wrt. WLn+4 @ P2⁵ -> P2⁶ |
| | 3P": P2⁵->P2⁶ (WLn+4) | Vtmin(new)=Vtmin(old) |
| | | Vtmax(new)=Vtmax(old)+0.05V |
| | State | Vtmin/Vtmax(New) of WLn+3 wrt. WLn+4 @ P1⁵ -> P1⁶ |
| | 3P": P1⁵->P1⁶ (WLn+4) | Vtmin(new)=Vtmin(old) |
| | | Vtmax(new)=Vtmax(old)+0.05V |
| | Note | |
| | 1. No Vtmin shift by WLn+4's (Vtp6⁶min-Vtp6⁵max) due to lock-out | |
| | 2. Vtmax is shifted by WLn+4's (Vtp6⁶max-Vtp6⁵min)x7.5%=(3.3-2.7)x7.5%=0.045V | |
| | 3. No Vtmin shift by WLn+4's (Vtp4⁶min-Vtp4⁵max) due to lock-out | |
| | 4. Vtmax is shifted by WLn+4's (Vtp4⁶max-Vtp4⁵min)x7.5%=(2.3-1.7)x7.5%=0.045V | |
| | 5. No Vtmin shift by WLn+4's (Vtp2⁶min-Vtp2⁵max) due to lock-out | |
| | 6. Vtmax is shifted by WLn+4's (Vtp2⁶max-Vtp2⁵min)x7.5%=(2.3-1.7)x7.5%=0.045V | |
| | 7. No Vtmin shift by WLn+4's (Vtp1⁶min-Vtp1⁵max) due to lock-out | |
| | 8. Vtmax is shifted by WLn+4's (Vtp1⁶max-Vtp1⁵min)x7.5%=(2.3-1.7)x7.5%=0.045V | |

| 1st-pass Program: 1P (Option 1 & 2) ||
|---|---|
| WLn | $V_{LBL}$ |
| P0 | 2V/Vinh |
| P4 | 0V/Vinh |

Fig. 8A

| 2$^{nd}$-pass Program: 2P (Option 1 & Option 2) ||||
|---|---|---|---|
| State | $V_{LBL}$ | State | $V_{LBL}$ |
| P0 | Vinh | P4 | 1.5V/Vinh |
| P1 | 3V/Vinh | P5 | 1V/Vinh |
| P2 | 2.5V/Vinh | P6 | 0.5V/Vinh |
| P3 | 2V/Vinh | P7 | 0V/Vinh |

Fig. 8B

| 2$^{nd}$-pass Program: 2P' (Option 2) ||
|---|---|
| State | $V_{LBL}$ |
| P0 | Vinh |
| P1 | 2.5V/Vinh |
| P2 | 2V/Vinh |
| P4 | 1V/Vinh |
| P6 | 0V/Vinh |

Fig. 8C

| 3rd-pass Program: 3P (Option 1) | | | | | | | | |
|---|---|---|---|---|---|---|---|---|
| $V_{LBL}$ | | WLn+1 | | | | | | |
| | | P0 | P1 | P2 | P3 | P4 | P5 | P6 | P7 |
| WLn | P0 | Vinh | Vinh | Vinh | Vinh | Vinh | Vinh | Vinh | Vinh |
| | P1 | 3V/Vinh | 3.1V/Vinh | 3.2V/Vinh | 3.3V/Vinh | 3V/Vinh | 3.1V/Vinh | 3.2V/Vinh | 3.3V/Vinh |
| | P2 | 2.5V/Vinh | 2.6V/Vinh | 2.7V/Vinh | 2.8V/Vinh | 2.5V/Vinh | 2.6V/Vinh | 2.7V/Vinh | 2.8V/Vinh |
| | P3 | 2V/Vinh | 2.1V/Vinh | 2.2V/Vinh | 2.3V/Vinh | 2V/Vinh | 2.1V/Vinh | 2.2V/Vinh | 2.3V/Vinh |
| | P4 | 1.5V/Vinh | 1.6V/Vinh | 1.7V/Vinh | 1.8V/Vinh | 1.5V/Vinh | 1.6V/Vinh | 1.7V/Vinh | 1.8V/Vinh |
| | P5 | 1V/Vinh | 1.1V/Vinh | 1.2V/Vinh | 1.3V/Vinh | 1V/Vinh | 1.1V/Vinh | 1.2V/Vinh | 1.3V/Vinh |
| | P6 | 0.5V/Vinh | 0.6V/Vinh | 0.7V/Vinh | 0.8V/Vinh | 0.5V/Vinh | 0.6V/Vinh | 0.7V/Vinh | 0.8V/Vinh |
| | P7 | 0V/Vinh | 0.1V/Vinh | 0.2V/Vinh | 0.3V/Vinh | 0V/Vinh | 0.1V/Vinh | 0.2V/Vinh | 0.3V/Vinh |

Fig. 8D

| 3rd-pass Program: 3P'' (Option 2) | | | | | | | | |
|---|---|---|---|---|---|---|---|---|
| $V_{LBL}$ | | WLn+1 | | | | | | |
| | | P0 | P1 | P2 | P3 | P4 | P5 | P6 | P7 |
| WLn | P0 | Vinh | Vinh | Vinh | Vinh | Vinh | Vinh | Vinh | Vinh |
| | P1 | 3V/Vinh | 3V/Vinh | 3V/Vinh | 3.2V/Vinh | 3V/Vinh | 3.2V/Vinh | 3V/Vinh | 3.2V/Vinh |
| | P2 | 2.5V/Vinh | 2.5V/Vinh | 2.6V/Vinh | 2.6V/Vinh | 2.7V/Vinh | 2.7V/Vinh | 2.8V/Vinh | 2.8V/Vinh |
| | P3 | 2V/Vinh | 2V/Vinh | 2V/Vinh | 2.2V/Vinh | 2V/Vinh | 2.2V/Vinh | 2V/Vinh | 2.2V/Vinh |
| | P4 | 1.5V/Vinh | 1.5V/Vinh | 1.5V/Vinh | 1.7V/Vinh | 1.5V/Vinh | 1.7V/Vinh | 1.5V/Vinh | 1.7V/Vinh |
| | P5 | 1V/Vinh | 1V/Vinh | 1V/Vinh | 1.2V/Vinh | 1V/Vinh | 1.2V/Vinh | 1V/Vinh | 1.2V/Vinh |
| | P6 | 0.5V/Vinh | 0.5V/Vinh | 0.5V/Vinh | 0.7V/Vinh | 0.5V/Vinh | 0.7V/Vinh | 0.5V/Vinh | 0.7V/Vinh |
| | P7 | 0V/Vinh | 0V/Vinh | 0V/Vinh | 0.2V/Vinh | 0V/Vinh | 0.2V/Vinh | 0V/Vinh | 0.2V/Vinh |

Fig. 8E

| 3rd-pass Program: 3P' (Option 1 & Option 2) | | | | | | | | |
|---|---|---|---|---|---|---|---|---|
| $V_{LBL}$ | | WLn+1 | | | | | | |
| | | P0 | P1 | P2 | P3 | P4 | P5 | P6 | P7 |
| WLn | P0 | Vinh | Vinh | Vinh | Vinh | Vinh | Vinh | Vinh | Vinh |
| | P1 | 3V/Vinh | 3V/Vinh | 3.1V/Vinh | 3.1V/Vinh | 3.2V/Vinh | 3.2V/Vinh | 3.3V/Vinh | 3.3V/Vinh |
| | P2 | 2.5V/Vinh | 2.5V/Vinh | 2.5V/Vinh | 2.7V/Vinh | 2.5V/Vinh | 2.7V/Vinh | 2.5V/Vinh | 2.7V/Vinh |
| | P3 | 2V/Vinh | 2V/Vinh | 2.1V/Vinh | 2.1V/Vinh | 2.2V/Vinh | 2.2V/Vinh | 2.3V/Vinh | 2.3V/Vinh |
| | P4 | 1.5V/Vinh | 1.5V/Vinh | 1.6V/Vinh | 1.6V/Vinh | 1.7V/Vinh | 1.7V/Vinh | 1.8V/Vinh | 1.8V/Vinh |
| | P5 | 1V/Vinh | 1V/Vinh | 1.1V/Vinh | 1.1V/Vinh | 1.2V/Vinh | 1.2V/Vinh | 1.3V/Vinh | 1.3V/Vinh |
| | P6 | 0.5V/Vinh | 0.5V/Vinh | 0.6V/Vinh | 0.6V/Vinh | 0.7V/Vinh | 0.7V/Vinh | 0.8V/Vinh | 0.8V/Vinh |
| | P7 | 0V/Vinh | 0V/Vinh | 0.1V/Vinh | 0.1V/Vinh | 0.2V/Vinh | 0.2V/Vinh | 0.3V/Vinh | 0.3V/Vinh |

Fig. 8F

| State | $V_{LBL}$ | T0 GBL | T0 LBL | T1 GBL | T1 LBL | T2 GBL | T2 LBL | After C.S. |
|---|---|---|---|---|---|---|---|---|
| \multicolumn{9}{l}{ABL 1st-pass/2nd-pass/3rd-pass (all options) TLC program @ Vdd=2.4V} |
| P0 | 2V | 0 | 7->0 | 0 | 7->0 | Vdd | 6 | 2V |
| P1 | 2.5V | Vdd | 7 | 0.5 | 5.4->0.5 | 0 | 5.1->0 | 2.5V |
| P1 | 3.0V | Vdd | 7 | 1.6 | 5.4->1.6 | 0.4 | 5.1->0.4 | 3V |
| P1 | 3.1V | Vdd | 7 | 1.6 | 5.4->1.6 | 0.7 | 5.1->0.7 | 3.1V |
| P1 | 3.2V | Vdd | 7 | 1.6 | 5.4->1.6 | 1 | 5.1->1.0 | 3.2V |
| P1 | 3.3V | Vdd | 7 | 1.6 | 5.4->1.6 | 1.3 | 5.1->1.3 | 3.3V |
| P2 | 2V | 0.6 | 7->0.6 | Vdd | 5.4 | 0 | 5.1->0 | 2V |
| P2 | 2.5V | Vdd | 7 | 0.5 | 5.4->0.5 | 0 | 5.1->0 | 2.5V |
| P2 | 2.6V | Vdd | 7 | 0.8 | 5.4->0.8 | 0 | 5.1->0 | 2.6V |
| P2 | 2.7V | Vdd | 7 | 1.1 | 5.4->1.1 | 0 | 5.1->0 | 2.7V |
| P2 | 2.8V | Vdd | 7 | 1.4 | 5.4->1.4 | 0 | 5.1->0 | 2.8V |
| P3 | 2.0V | 0.6 | 7->0.6 | Vdd | 5.4 | 0 | 5.1->0 | 2V |
| P3 | 2.1V | 0.9 | 7->0.9 | Vdd | 5.4 | 0 | 5.1->0 | 2.1V |
| P3 | 2.2V | 1.2 | 7->1.2 | Vdd | 5.4 | 0 | 5.1->0 | 2.2V |
| P3 | 2.3V | 1.5 | 7->1.5 | Vdd | 5.4 | 0 | 5.1->0 | 2.3V |
| P4 | 0V | 0 | 7->0 | 0 | 5.4->0 | 0 | 5.1->0 | 0V |
| P4 | 1V | 1 | 7->1 | 1 | 5.4->1 | 1 | 5.1->1 | 1V |
| P4 | 1.5V | 1.5 | 7->1.5 | 1.5 | 5.4->1.5 | 1.5 | 5.1->1.5 | 1.5V |
| P4 | 1.6V | 1.6 | 7->1.6 | 1.6 | 5.4->1.6 | 1.6 | 5.1->1.6 | 1.6V |
| P4 | 1.7V | 0 | 7->0 | 0 | 5.4->0 | Vdd | 5.1 | 1.7V |
| P4 | 1.8V | 0 | 7->0 | Vdd | 5.4 | 0 | 5.1->0 | 1.8V |
| P5 | 1.0V | 1 | 7->1 | 1 | 5.4->1 | 1 | 5.1->1 | 1V |
| P5 | 1.1V | 1.1 | 7->1.1 | 1.1 | 5.4->1.1 | 1.1 | 5.1->1.1 | 1.1V |
| P5 | 1.2V | 1.2 | 7->1.2 | 1.2 | 5.4->1.2 | 1.2 | 5.1->1.2 | 1.2V |
| P5 | 1.3V | 1.3 | 7->1.3 | 1.3 | 5.4->1.3 | 1.3 | 5.1->1.3 | 1.3V |
| P6 | 0V | 0 | 7->0 | 0 | 5.4->0 | 0 | 5.1->0 | 0V |
| P6 | 0.5V | 0.5 | 7->0.5 | 0.5 | 5.4->0.5 | 0.5 | 5.1->0.5 | 0.5V |
| P6 | 0.6V | 0.6 | 7->0.6 | 0.6 | 5.4->0.6 | 0.6 | 5.1->0.6 | 0.6V |
| P6 | 0.7V | 0.7 | 7->0.7 | 0.7 | 5.4->0.7 | 0.7 | 5.1->0.7 | 0.7V |
| P6 | 0.8V | 0.8 | 7->0.8 | 0.8 | 5.4->0.8 | 0.8 | 5.1->0.8 | 0.8V |
| P7 | 0V | 0 | 7->0 | 0 | 5.4->0 | 0 | 5.1->0 | 0V |
| P7 | 0.1V | 0.1 | 7->0.1 | 0.1 | 5.4->0.1 | 0.1 | 5.1->0.1 | 0.1V |
| P7 | 0.2V | 0.2 | 7->0.2 | 0.2 | 5.4->0.2 | 0.2 | 5.1->0.2 | 0.2V |
| P7 | 0.3V | 0.3 | 7->0.3 | 0.3 | 5.4->0.3 | 0.3 | 5.1->0.3 | 0.3V |
| All Inh. States | Vinh | Vdd | 7V | Vdd | 5.4V | Vdd | 5.1V | 5.83V |

Fig. 8G

| State | $V_{LBL}$ | T0 GBL | T0 LBL | T1 GBL | T1 LBL | T2 GBL | T2 LBL | T3 GBL | T3 LBL | After C.S. |
|---|---|---|---|---|---|---|---|---|---|---|
| P0 | 2.0V | 0.8 | 7->0.8 | Vdd | 6.4 | 0.8 | 5.0->0.8 | 0 | 3.6->0 | 2V |
| P1 | 2.5V | 0 | 7->0 | Vdd | 6.4 | 0 | 5->0 | Vdd | 3.6 | 2.5V |
| P1 | 3.0V | Vdd | 7 | 0 | 6.4->0 | Vdd | 5 | 0 | 3.6->0 | 3V |
| P1 | 3.1V | Vdd | 7 | 0.4 | 6.4->0 | Vdd | 5 | 0 | 3.6->0 | 3.1V |
| P1 | 3.2V | Vdd | 7 | 0.8 | 6.4->0.8 | Vdd | 5 | 0 | 3.6->0 | 3.2V |
| P1 | 3.3V | Vdd | 7 | 0.8 | 6.4->0.8 | Vdd | 5 | 0.4 | 3.6->0.4 | 3.3V |
| P2 | 2V | 0.8 | 7->0.8 | Vdd | 6.4 | 0.8 | 5.0->0.8 | 0 | 3.6->0 | 2V |
| P2 | 2.5V | 0 | 7->0 | Vdd | 6.4 | 0 | 5->0 | Vdd | 3.6 | 2.5V |
| P2 | 2.6V | 0.4 | 7->0.4 | Vdd | 6.4 | 0 | 5->0 | Vdd | 3.6 | 2.6V |
| P2 | 2.7V | 0.8 | 7->0.8 | Vdd | 6.4 | 0 | 5->0 | Vdd | 3.6 | 2.7V |
| P2 | 2.8V | 0.8 | 7->0.8 | Vdd | 6.4 | 0.4 | 5->0.4 | Vdd | 3.6 | 2.8V |
| P3 | 2.0V | 0.8 | 7->0.8 | Vdd | 6.4 | 0.8 | 5.0->0.8 | 0 | 3.6->0 | 2V |
| P3 | 2.1V | 0.8 | 7->0.8 | Vdd | 6.4 | 0.8 | 5.0->0.8 | 0.4 | 3.6->0.4 | 2.1V |
| P3 | 2.2V | 0.8 | 7->0.8 | Vdd | 6.4 | 0.8 | 5.0->0.8 | 0.8 | 3.6->0.8 | 2.2V |
| P3 | 2.3V | 0.6 | 7->0.6 | 0 | 6.4->0 | Vdd | 5 | Vdd | 3.6 | 2.3V |
| P4 | 0V | 0 | 7->0 | 0 | 6.4->0 | 0 | 5.0->0 | 0 | 3.6->0 | 0V |
| P4 | 1.0V | 0.4 | 7->0.4 | 0 | 6.4->0 | 0 | 5.0->0 | Vdd | 3.6 | 1V |
| P4 | 1.5V | 0.8 | 7->0.8 | 0.8 | 6.4->0.8 | 0.8 | 5.0->0.8 | Vdd | 3.6 | 1.5V |
| P4 | 1.6V | 0 | 7->0 | Vdd | 6.4 | 0 | 5.0->0 | 0 | 3.6->0 | 1.6V |
| P4 | 1.7V | 0.4 | 7->0.4 | Vdd | 6.4 | 0 | 5.0->0 | 0 | 3.6->0 | 1.7V |
| P4 | 1.8V | 0.8 | 7->0.8 | Vdd | 6.4 | 0 | 5.0->0 | 0 | 3.6->0 | 1.8V |
| P5 | 1.0V | 0.4 | 7->0.4 | 0 | 6.4->0 | 0 | 5.0->0 | Vdd | 3.6 | 1V |
| P5 | 1.1V | 0.8 | 7->0.8 | 0 | 6.4->0 | 0 | 5.0->0 | Vdd | 3.6 | 1.1V |
| P5 | 1.2V | 0.8 | 7->0.8 | 0.4 | 6.4->0.4 | 0 | 5.0->0 | Vdd | 3.6 | 1.2V |
| P5 | 1.3V | 0.8 | 7->0.8 | 0.8 | 6.4->0.8 | 0 | 5.0->0 | Vdd | 3.6 | 1.3V |
| P6 | 0V | 0 | 7->0 | 0 | 6.4->0 | 0 | 5.0->0 | 0 | 3.6->0 | 0V |
| P6 | 0.5V | 0.5 | 7->0.5 | 0.5 | 6.4->0.5 | 0.5 | 5.0->0.5 | 0.5 | 3.6->0.5 | 0.5V |
| P6 | 0.6V | 0.6 | 7->0.6 | 0.6 | 6.4->0.6 | 0.6 | 5.0->0.6 | 0.6 | 3.6->0.6 | 0.6V |
| P6 | 0.7V | 0.7 | 7->0.7 | 0.7 | 6.4->0.7 | 0.7 | 5.0->0.7 | 0.7 | 3.6->0.7 | 0.7V |
| P6 | 0.8V | 0.8 | 7->0.8 | 0.8 | 6.4->0.8 | 0.8 | 5.0->0.8 | 0.8 | 3.6->0.8 | 0.8V |
| P7 | 0V | 0 | 7->0 | 0 | 6.4->0 | 0 | 5.0->0 | 0 | 3.6->0 | 0V |
| P7 | 0.1V | 0.1 | 7->0.1 | 0.1 | 6.4->0.1 | 0.1 | 5.0->0.1 | 0.1 | 3.6->0.1 | 0.1V |
| P7 | 0.2V | 0.2 | 7->0.2 | 0.2 | 6.4->0.2 | 0.2 | 5.0->0.2 | 0.2 | 3.6->0.2 | 0.2V |
| P7 | 0.3V | 0.3 | 7->0.3 | 0.3 | 6.4->0.3 | 0.3 | 5.0->0.3 | 0.3 | 3.6->0.3 | 0.3V |
| All Inh. States | Vinh | Vdd | 7V | Vdd | 6.4V | Vdd | 5V | Vdd | 3.6V | 5.5V |

ABL 1st-pass/2nd-pass/3rd-pass/fine TLC program @ Vdd=1.6V

Fig. 8H

Option 1 : 1-2-8(coarse)-8(fine)

| VFY Voltage State | 1P | | 2P | | 3P (Non-boundary WL) | | 3P' (Bonndary WL) | |
|---|---|---|---|---|---|---|---|---|
| | WL | SL | WL | SL | WL | SL | WL | SL |
| P0 | 0V | 1.4V | Neglect | | Neglect | | Neglect | |
| P1 | Neglect | | 0.2V | 0V | 0.6V | 0V | 1V | 0V |
| P2 | Neglect | | 0.7V | 0V | 1.1V | 0V | 1.5V | 0V |
| P3 | Neglect | | 1.2V | 0V | 1.6V | 0V | 2V | 0V |
| P4 | 0.6 | 0V | 1.7V | 0V | 2.1V | 0V | 2.5V | 0V |
| P5 | Neglect | | 2.2V | 0V | 2.6V | 0V | 3V | 0V |
| P6 | Neglect | | 2.7V | 0V | 3.1V | 0V | 3.5V | 0V |
| P7 | Neglect | | 3.2V | 0V | 3.6V | 0V | 4V | 0V |

Fig. 8I

Option 2 : 1-2-5-8

| VFY Voltage State | 1P | | 2P' (Non-boundary WL) | | 2P (Bonndary WL) | | 3P" (Non-boundary WL) | | 3P' (Bonndary WL) | |
|---|---|---|---|---|---|---|---|---|---|---|
| | WL | SL | WL | SL | WL | SL | WL | SL | WL | SL |
| P0 | 0V | 1.4V | Neglect | | Neglect | | Neglect | | Neglect | |
| P1 | Neglect | | 0.2V | 0V | 0.2V | 0V | 0.6V | 0V | 1V | 0V |
| P2 | Neglect | | 0.7V | 0V | 0.7V | 0V | 1.1V | 0V | 1.5V | 0V |
| P3 | Neglect | | Neglect | | 1.2V | 0V | 1.6V | 0V | 2V | 0V |
| P4 | 0.6 | 0V | 1.7V | 0V | 1.7V | 0V | 2.1V | 0V | 2.5V | 0V |
| P5 | Neglect | | Neglect | | 2.2V | 0V | 2.6V | 0V | 3V | 0V |
| P6 | Neglect | | 2.7V | 0V | 2.7V | 0V | 3.1V | 0V | 3.5V | 0V |
| P7 | Neglect | | Neglect | | 3.2V | 0V | 3.6V | 0V | 4V | 0V |

Fig. 8J

| Read Operation of WLn-1~WLn+2 wrt. Programmed Adj. WL | | |
|---|---|---|
| Voltage \ State | WL | SL |
| P0 out of P1~P7 | 0.5V | 0V |
| P0~P1 out of P2~P7 | 1V | 0V |
| P0~P2 out of P3~P7 | 1.5V | 0V |
| P0~P3 out of P4~P7 | 2V | 0V |
| P0~P4 out of P5~P7 | 2.5V | 0V |
| P0~P5 out of P6~P7 | 3V | 0V |
| P7 out of P0~P6 | 3.5V | 0V |

Fig. 8K

| Read Operation of Boundary WLn+3 wrt. WLn+4 @ E-State | | |
|---|---|---|
| Voltage \ State | WL | SL |
| P0 out of P1~P7 | 0.1V | 0V |
| P0~P1 out of P2~P7 | 0.9V | 0V |
| P0~P2 out of P3~P7 | 1.1V | 0V |
| P0~P3 out of P4~P7 | 1.9V | 0V |
| P0~P4 out of P5~P7 | 2.1V | 0V |
| P0~P5 out of P6~P7 | 2.9V | 0V |
| P7 out of P0~P6 | 3.1V | 0V |

Fig. 8L

| Read Operation of Boundary WLn+3 wrt. WLn+4 @ Programmed State | | |
|---|---|---|
| Voltage \ State | WL | SL |
| P0 out of P1~P7 | 0.9V | 0V |
| P0~P1 out of P2~P7 | 1.4V | 0V |
| P0~P2 out of P3~P7 | 1.9V | 0V |
| P0~P3 out of P4~P7 | 2.4V | 0V |
| P0~P4 out of P5~P7 | 2.9V | 0V |
| P0~P5 out of P6~P7 | 3.4V | 0V |
| P7 out of P0~P6 | 3.9V | 0V |

Fig. 8M

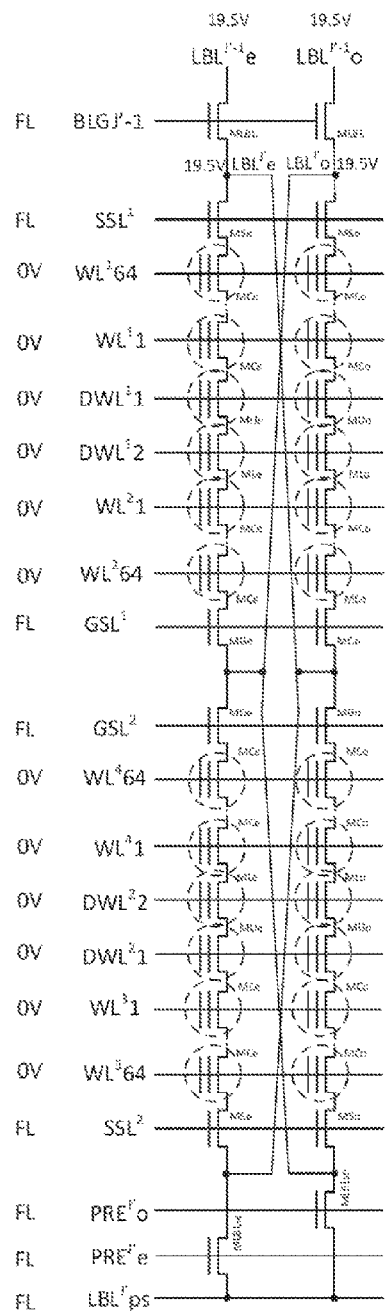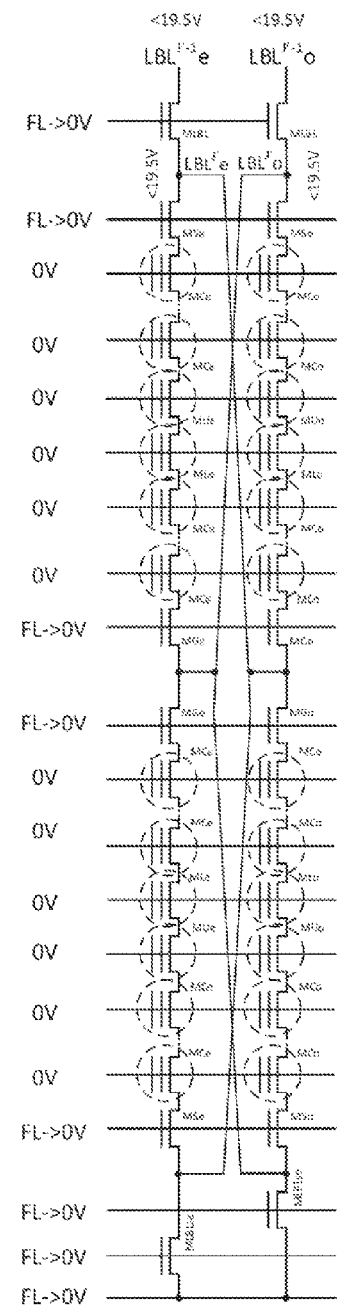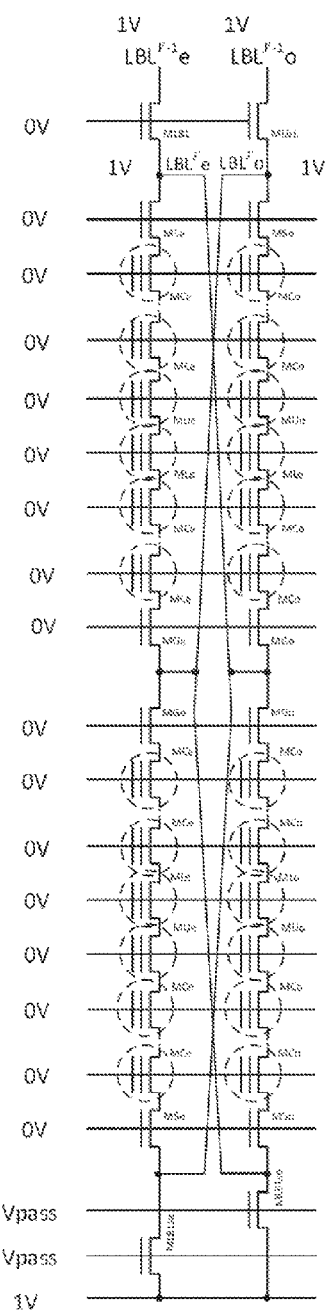
Fig. 10A — Multiple Blocks Erase (Fresh Regular & Dummy Cells) in same LG
Fig. 10B — PW/DNW/WL Discharge post Multiple Blocks Erase
Fig. 10C — Concurrent $C_{LBL}$ Discharge post Multiple Blocks Erase

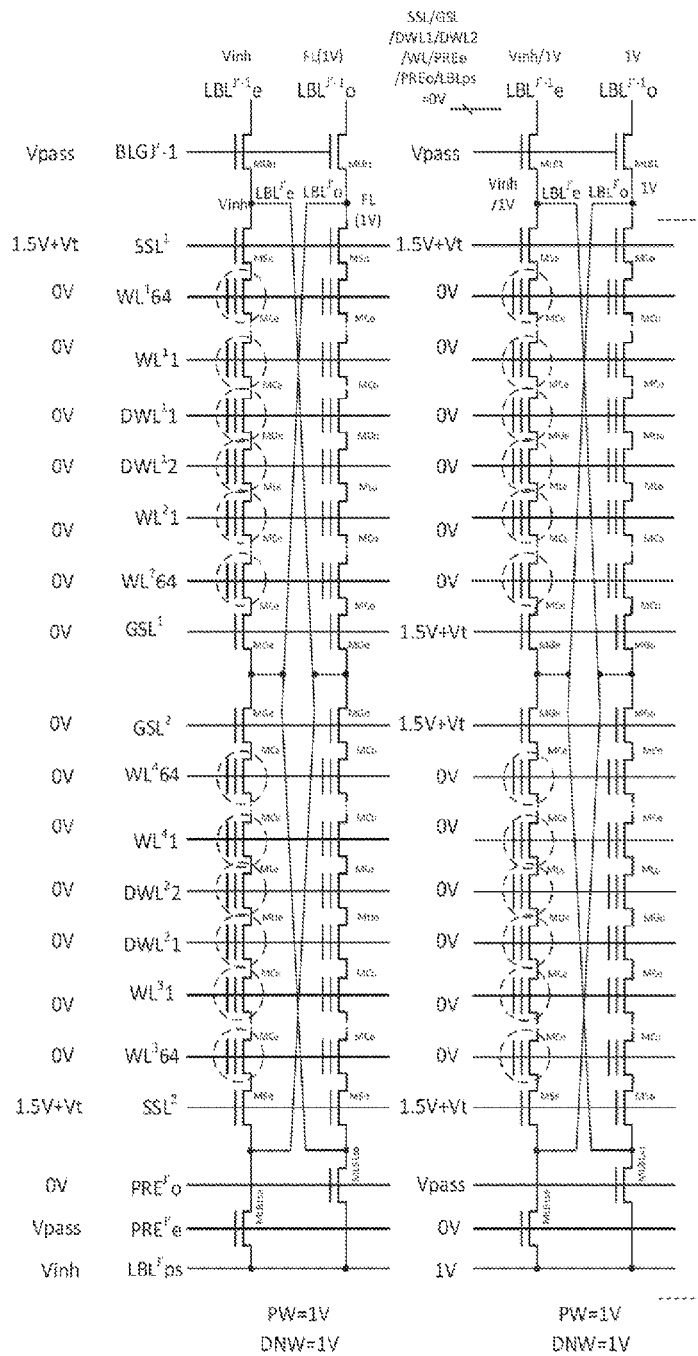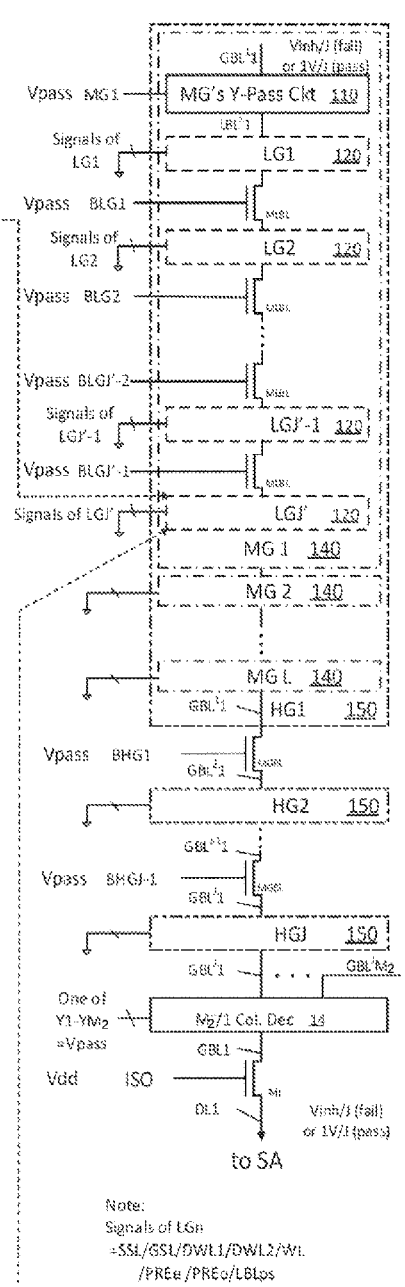
Fig. 10D — Concurrent Pre-Charge $C_{LBLe}$ =Vinh
Fig. 10E — Concurrent Discharge $C_{LBLe}$ =1V when N-string's Vt<-1V (N ≥ 1)
Fig. 10F — Erase Verify by Charge Sharing between LBL & GBL

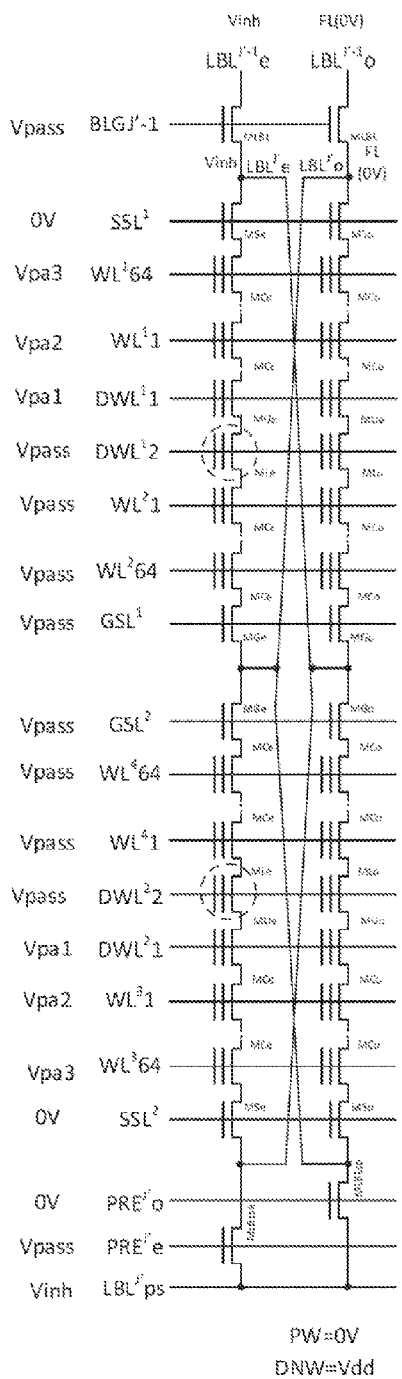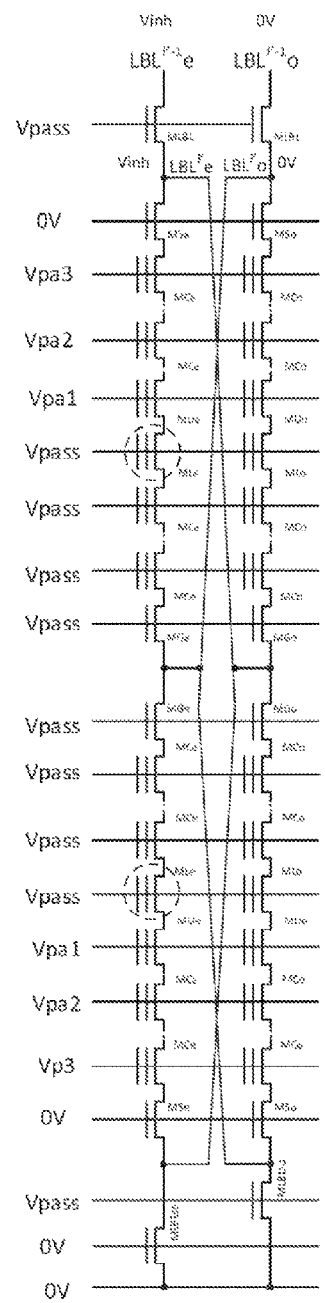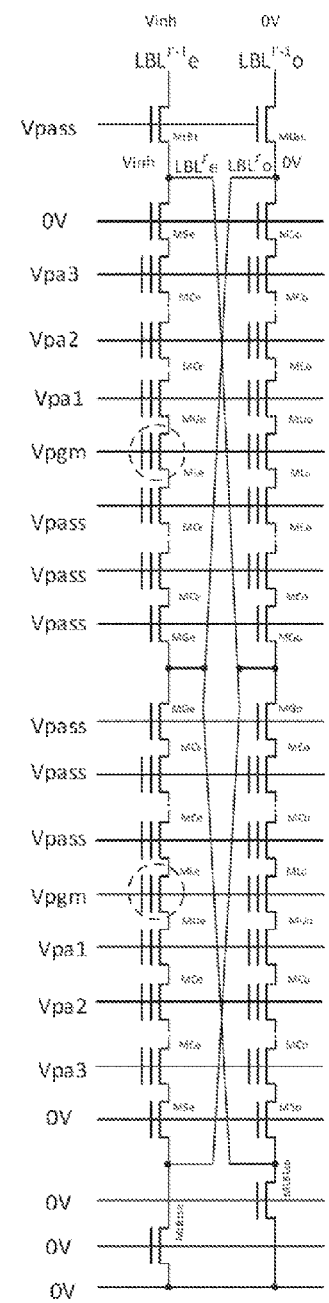
Fig. 11A — Concurrent Pre-Charge $C_{LBLe}$=Vinh
Fig. 11B — Concurrent Discharge $C_{LBLe}$=0V
Fig. 11C — Concurrent Program Dummy Cells MLe

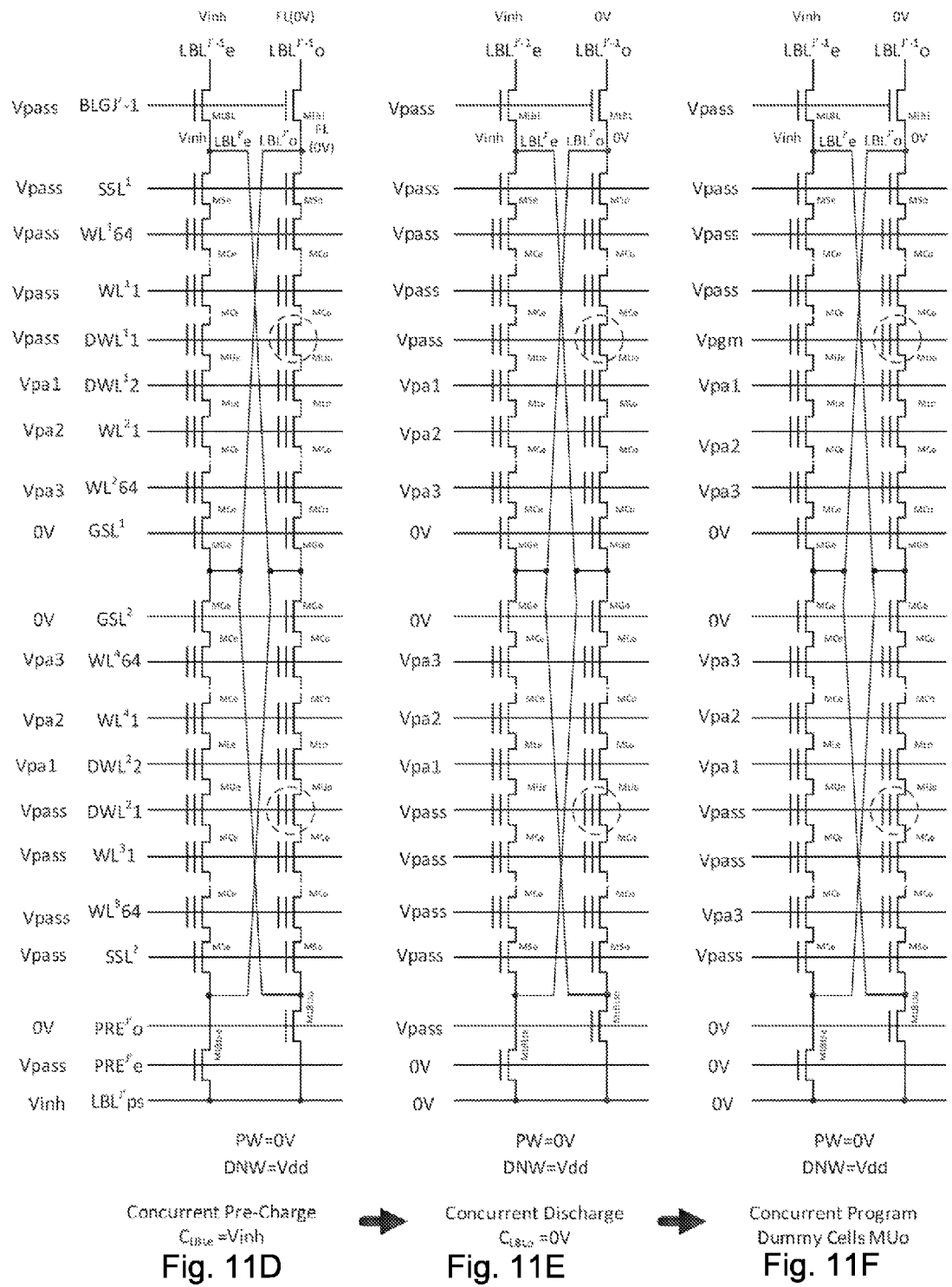
Fig. 11D — Concurrent Pre-Charge $C_{LBLe}$ =Vinh
Fig. 11E — Concurrent Discharge $C_{LBLo}$ =0V
Fig. 11F — Concurrent Program Dummy Cells MUo

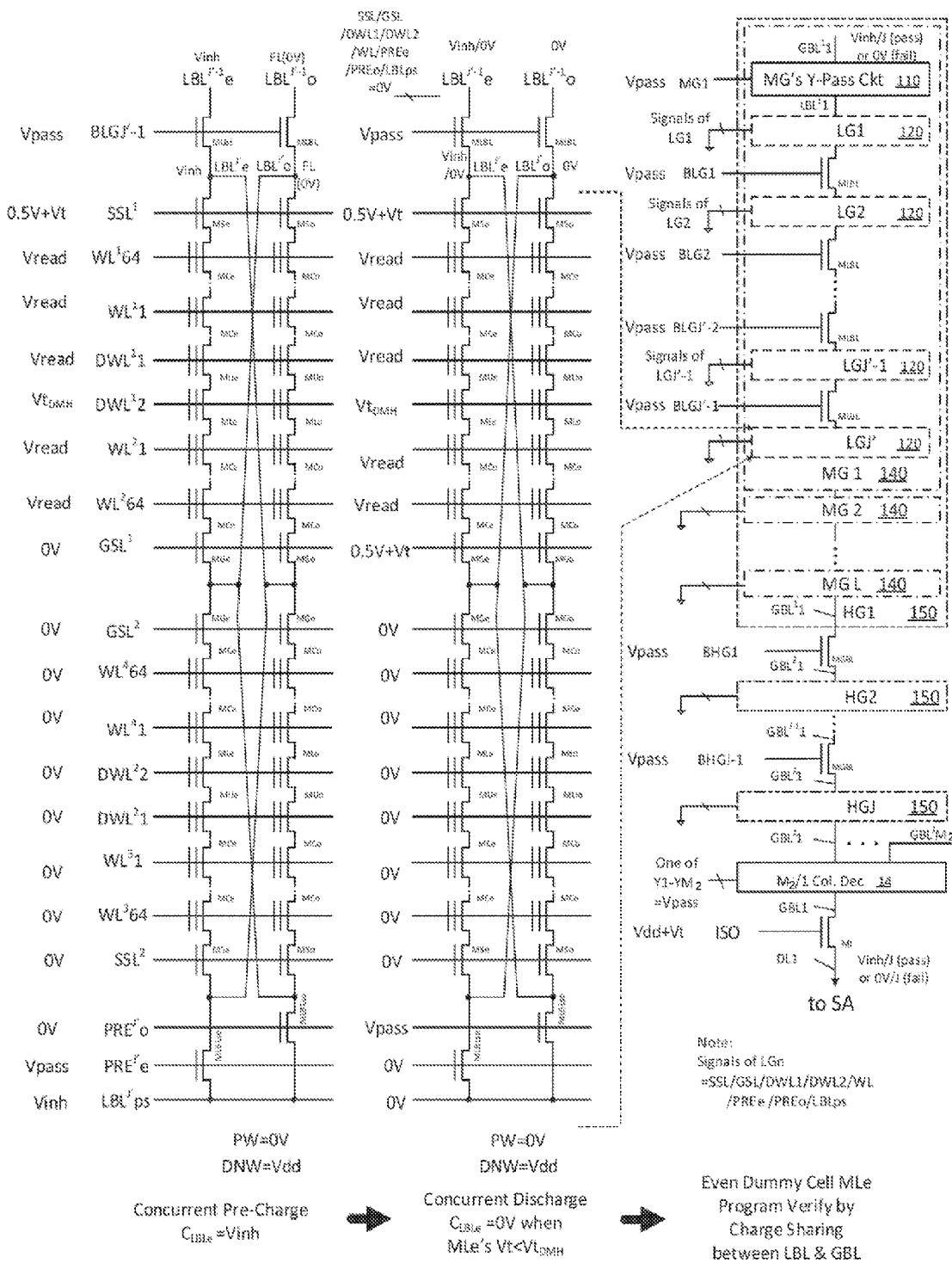
Fig. 11G — Concurrent Pre-Charge $C_{LBLe}$=Vinh
Fig. 11H — Concurrent Discharge $C_{LBLe}$=0V when MLe's Vt<Vt$_{DMH}$
Fig. 11I — Even Dummy Cell MLe Program Verify by Charge Sharing between LBL & GBL

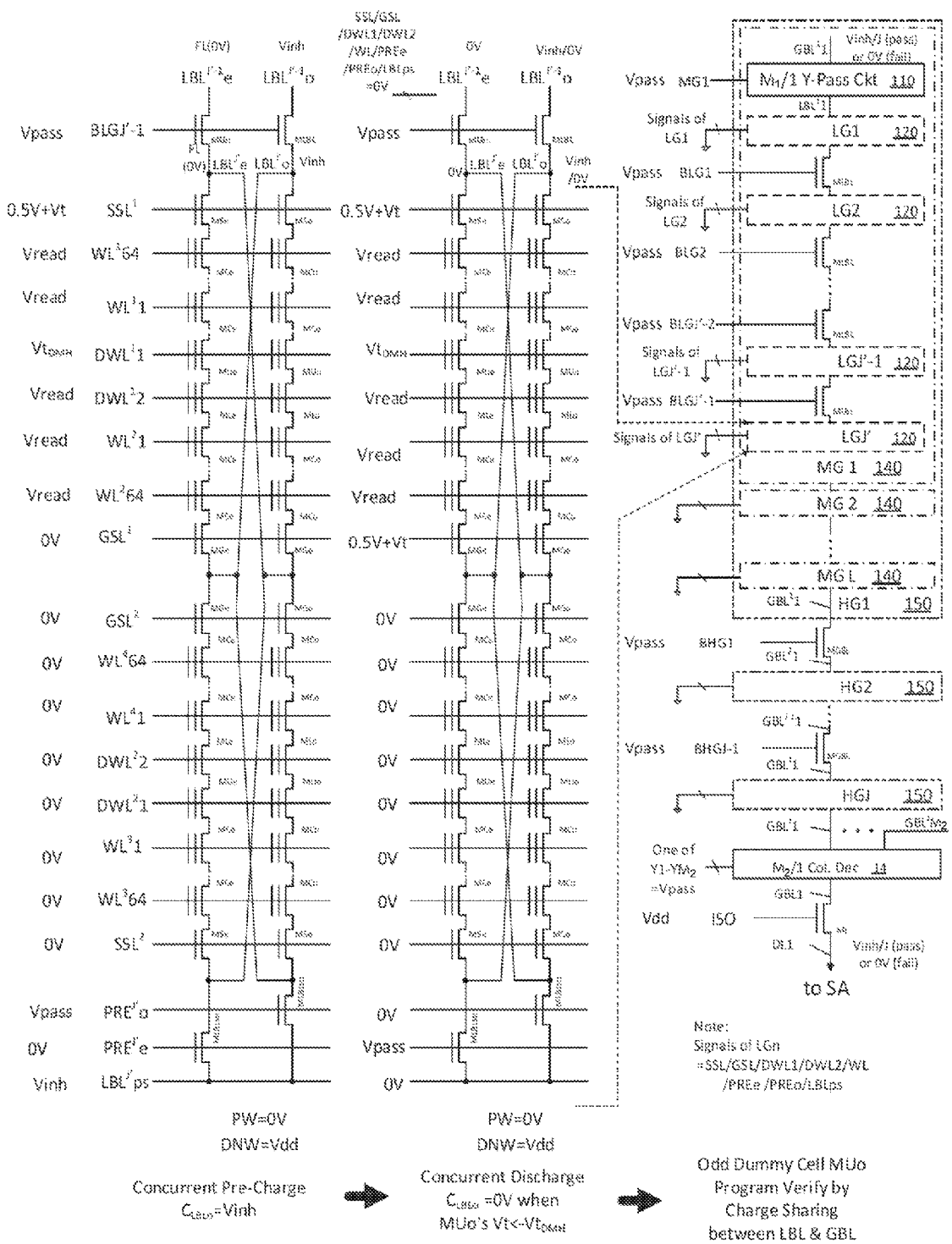

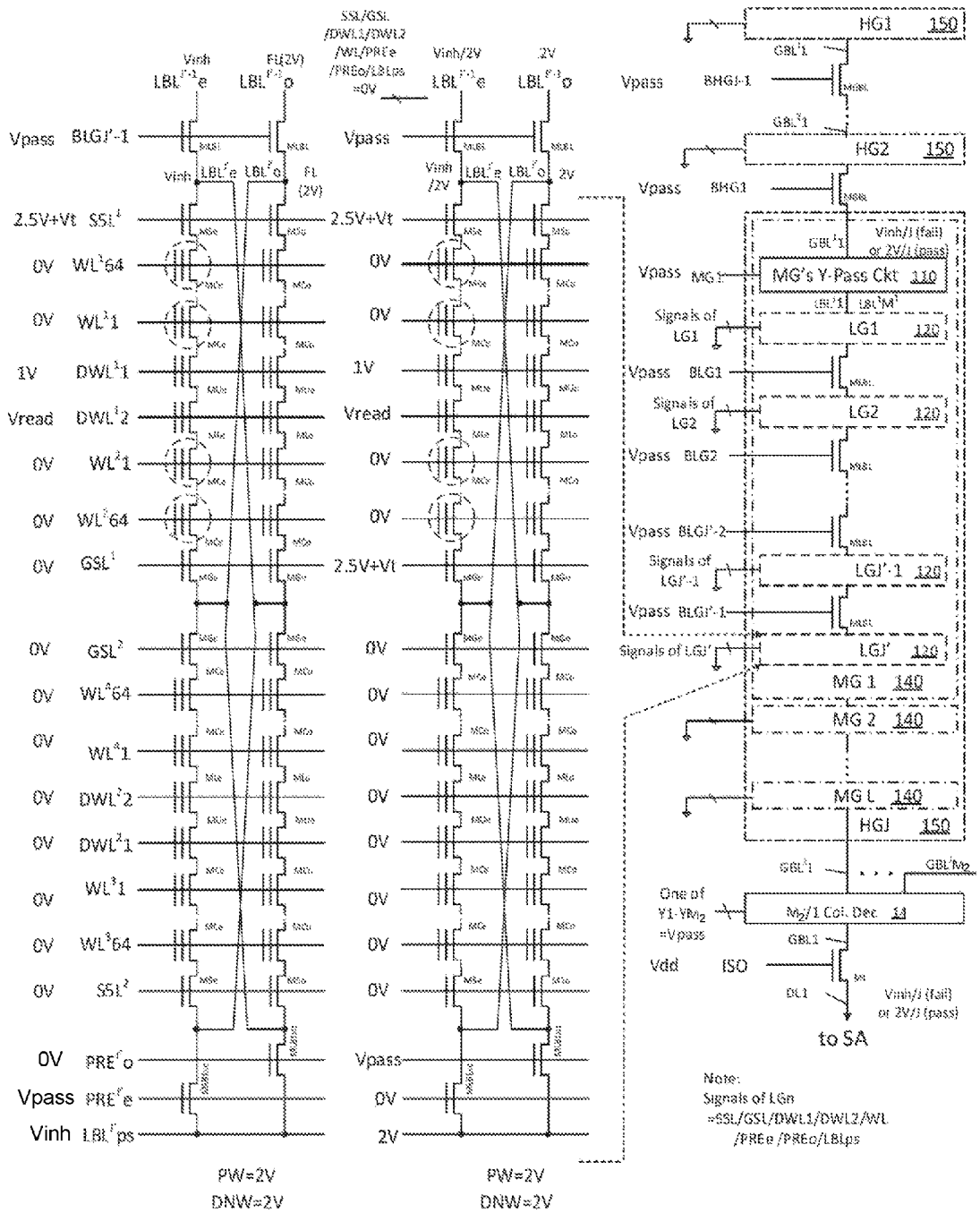
Fig. 11M — Concurrent Pre-Charge $C_{LBLe}$ =Vinh
Fig. 11N — Concurrent Discharge $C_{LBLe}$ =2V when Selected string's Vt < -2V;
Fig. 11O — Erase verify of Even String in LGJ' by Charge Sharing between LBL & GBL

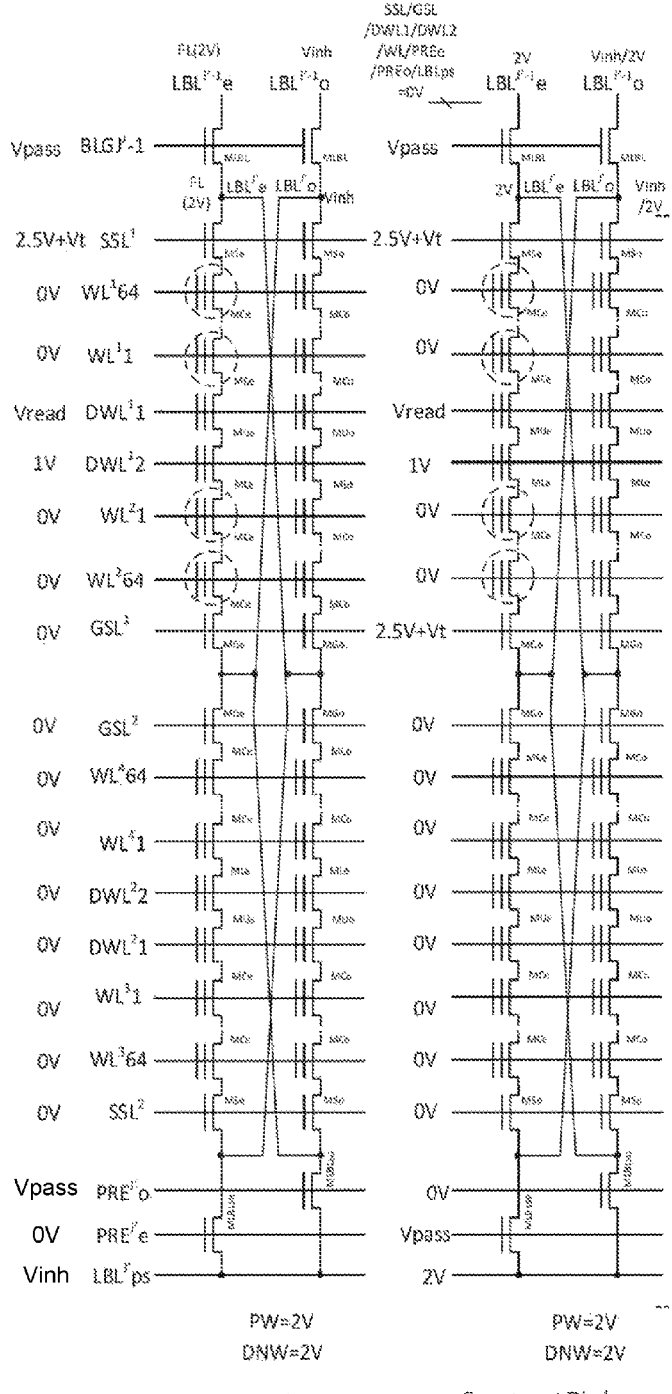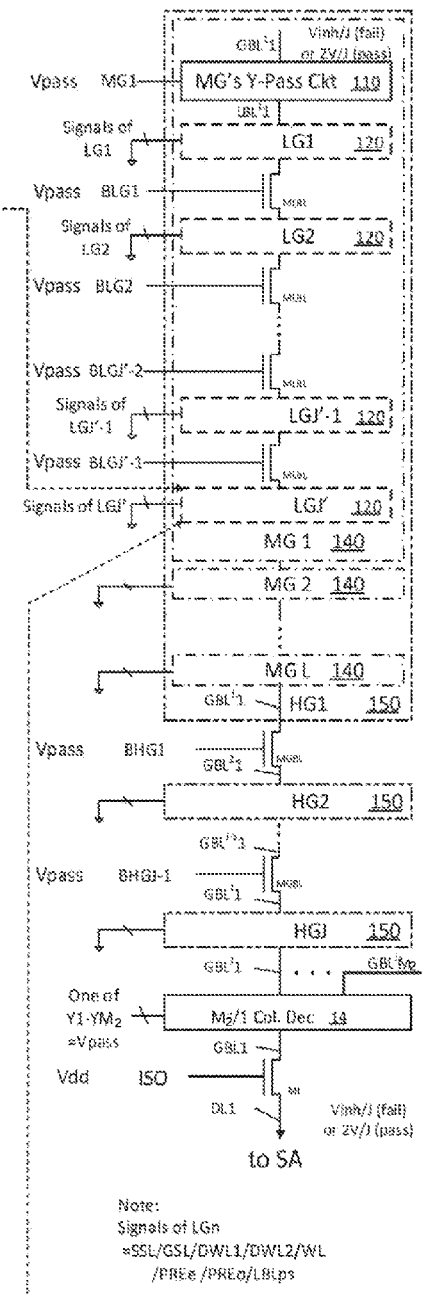
Fig. 11P — Concurrent Pre-Charge $C_{LBLo}$ = Vinh
Fig. 11Q — Concurrent Discharge $C_{LBLo}$ = 2V when Selected string's Vt < -2V;
Fig. 11R — Erase verify of Odd String in LGj' by Charge Sharing between LBL & GBL

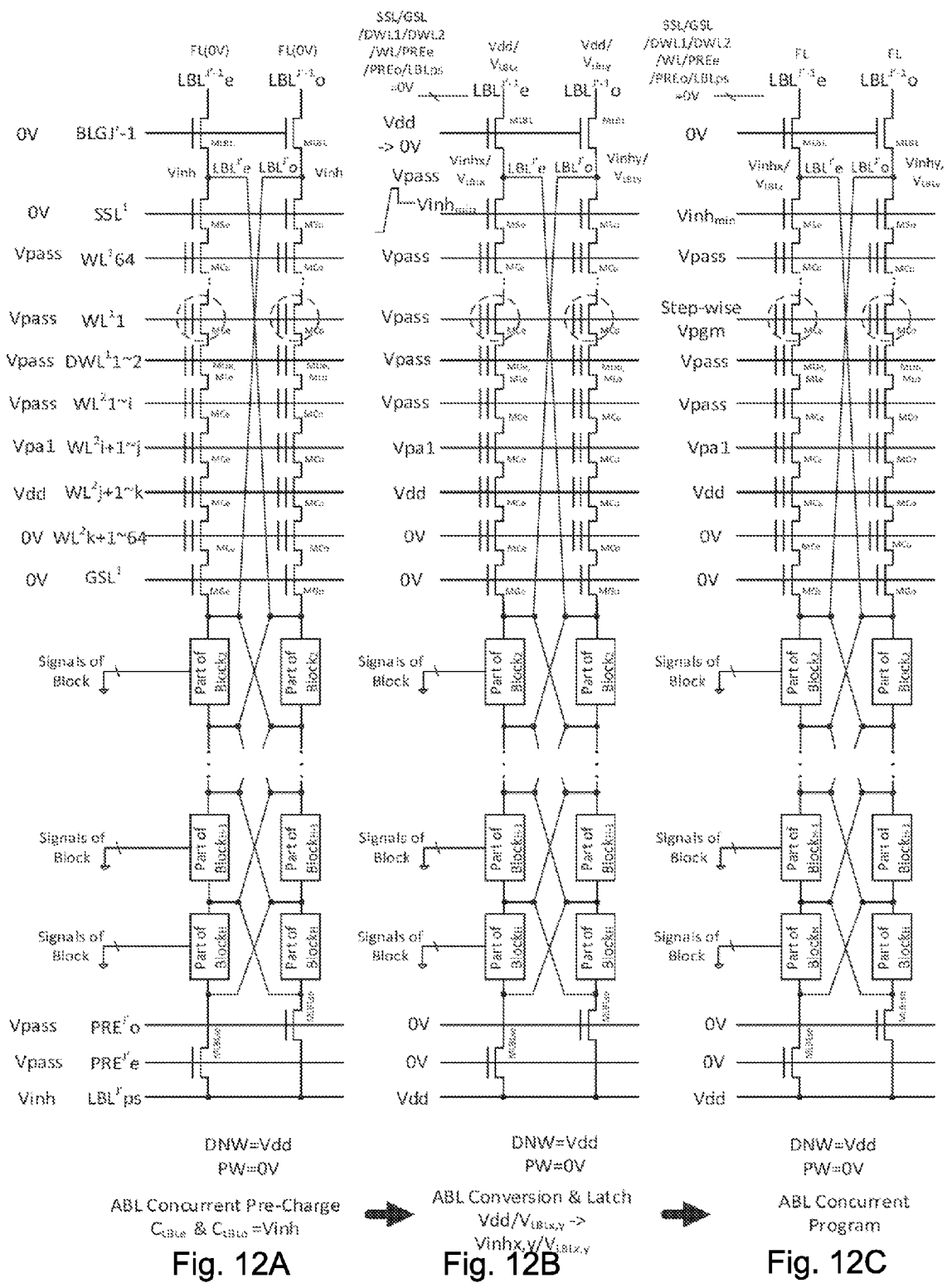

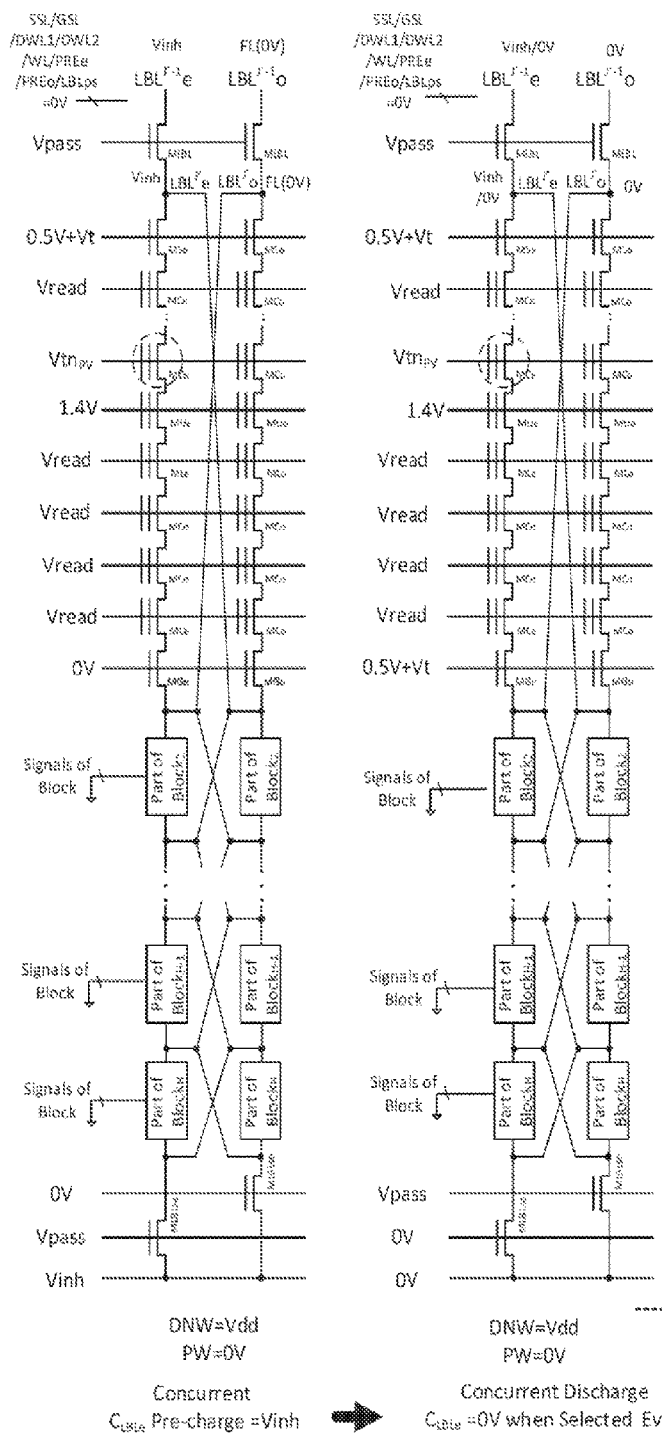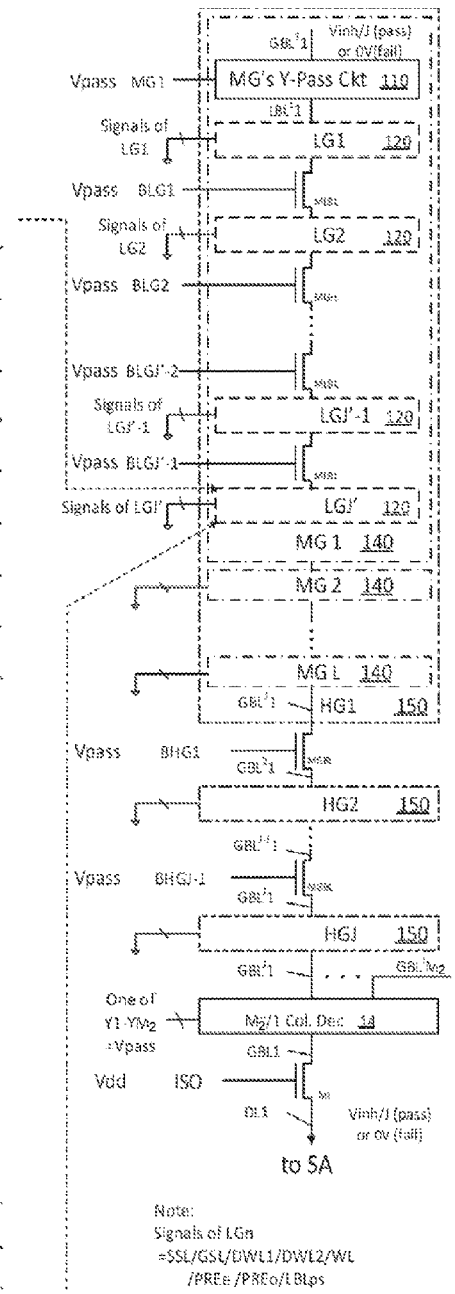
Fig. 12D — Concurrent $C_{LBL}$ Pre-charge =Vinh
Fig. 12E — Concurrent Discharge $C_{LBL}$=0V when Selected Even Cell's Vt < $Vtn_{PV}$
Fig. 12F — Even Cell MLe Program Verify by Charge Sharing between LBL & GBL Non-boundary/Boundary WL Read in Option 1: 1-2-8(coarse)-8(fine)
& Non-boundary WL Read in Option 2: 1-2-5-8
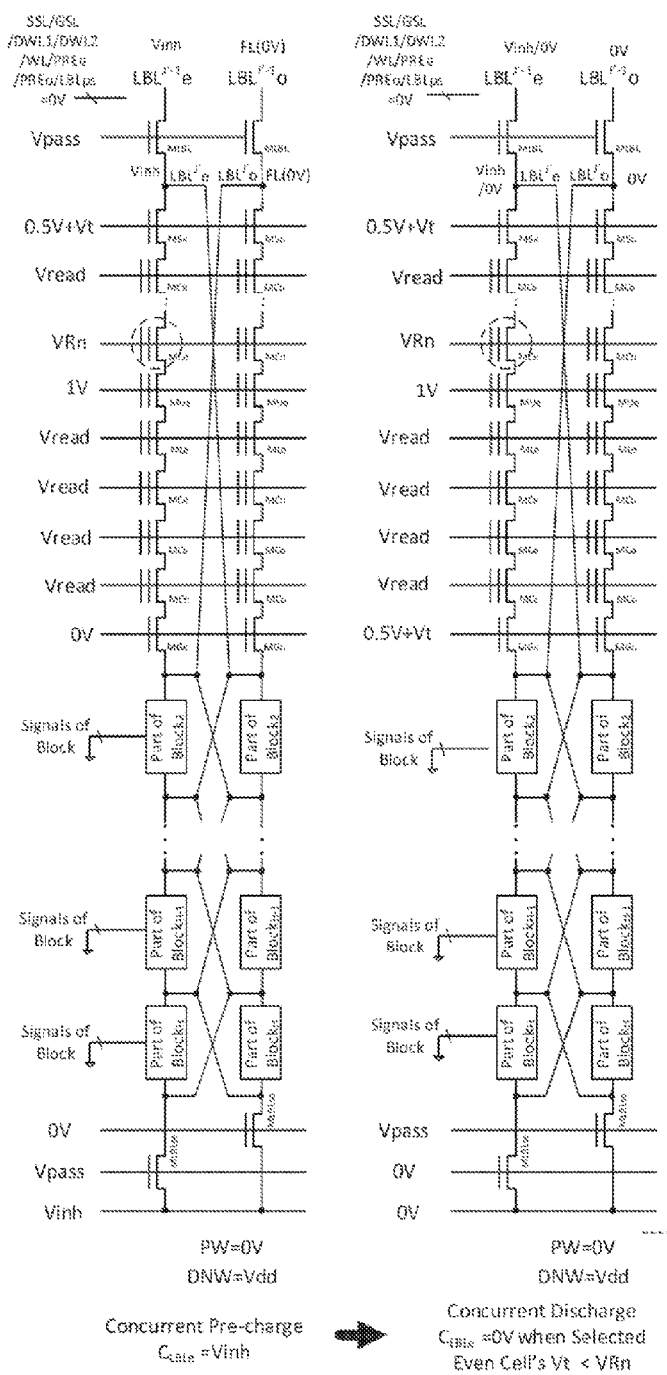
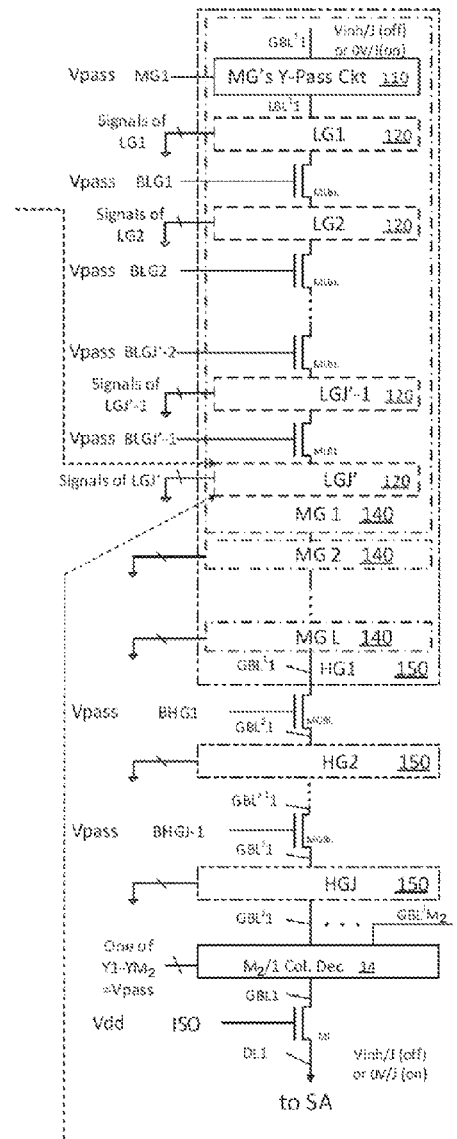
Fig. 13A — Concurrent Pre-charge $C_{GBL} = Vinh$
Fig. 13B — Concurrent Discharge $C_{GBL} = 0V$ when Selected Even Cell's Vt < VRn
Fig. 13C — Even Cell MCe Read by Charge Sharing between LBL & GBL ABL, AnP, Alt-WL Program Scheme

| Boundary WL | Time | t_ | t0 | t1 | t2 | t3 | t4 | t5 | t6 | t7 | t8 | t9 | t10 |
|---|---|---|---|---|---|---|---|---|---|---|---|---|---|
| Yes | DWL1 | DP | | | | | | | | | | | |
| Yes | DWL2 | DS | DP | 1S | | 2S | | | | | | | |
| 1st(Yes) | WLn-1 | | DS | 1P | 1S | 2P | 1P | 2S | | | | | |
| No | WLn | | | 1S | 1P | 2S | 1S | 2P | 1S | 2S | | | |
| No | WLn+1 | | | | 1S | | 1P | 2S | 1P | 2P | 1P | 2S | |
| No | WLn+2 | | | | | | 1S | 2P | 1S | 2S | 1S | 2P | 2S |
| 2nd(Yes) | WLn+3 | | | | | | | 2S | | 1P | 1S | 2P | 2P |
| 1st(Yes) | WLn+4 | | | | | | | | | 2S | 1S | 2S | 2S |
| | 3-bit PB | | DWL1 | DWL2 | WLn-1 | WLn | WLn+1 | WLn | WLn+1 | WLn+2 | WLn+1 | WLn+2 | WLn+3 | WLn+2 | WLn+3 |

1. DP: Dummy WL program
2. Option 3/4: 1-5-8 program: 1P/2P

Fig. 14A

ABL, AnP, Alt-WL Program Scheme

| Boundary WL | Time | t8 | t9 | t10 | t1' | t2' | t3' | t4' | t5' | t6' | t7' |
|---|---|---|---|---|---|---|---|---|---|---|---|
| No | WLn+2 | 1S | 2P | 2S | | | | | | | |
| 2nd(Yes) | WLn+3 | 1P | 2S | 2P | 1S | 1P | 2S | | | | |
| 1st(Yes) | WLn+4 | 1S | | 2S | 1P | 1S | 2P | 1S | 2P | | |
| No | WLn+5 | | | | 1S | 1S | 2S | 1P | 2S | | |
| No | WLn+6 | | | | | | | 1S | 2P | 1S | 2P |
| No | WLn+7 | | | | | | | | | 1P | 2S |
| | 3-bit PB | WLn+3 | WLn+2 | WLn+3 | WLn+4 | WLn+5 | WLn+4 | WLn+6 | WLn+5 | WLn+7 | WLn+6 |

1. DP: Dummy WL program
2. Option 3: 1-5-8 program: 1P/2P

Fig. 14B

| Boundary WL | Time | t8 | t9 | t10 | t0' | t1' | t2' | t3' | t4' | t5' | t6' | t7' | t8' |
|---|---|---|---|---|---|---|---|---|---|---|---|---|---|
| \multicolumn{14}{c}{ABL, AnP, Alt-WL Program Scheme} ||||||||||||||
| No | WLn+2 | 1S | 2P | 2S |  |  |  | 3S |  |  |  |  |  |
| 2nd(Yes) | WLn+3 | 1P | 2S | 2P | Read | 1S |  | 3P | 2S |  |  |  |  |
| 1st (Yes) | WLn+4 | 1S |  | 2S |  | 1P | 1S | 3S | 2P |  |  |  |  |
| No | WLn+5 |  |  |  |  | 1S | 1P |  | 2S | 1S | 2S |  |  |
| No | WLn+6 |  |  |  |  |  | 1S |  |  | 1P | 2P | 1S | 2P |
| No | WLn+7 |  |  |  |  |  |  |  |  | 1S | 2S | 1P | 2S |
| 3-bit PB |  | WLn+3 | WLn+2 | WLn+3 | WLn+3 | WLn+4 | WLn+5 | WLn+3 | WLn+4 | WLn+6 | WLn+5 | WLn+7 | WLn+6 |

1. DP: Dummy WL program
2. Option 4: 1-5-8 program: 1P/2P/3P

Fig. 14C

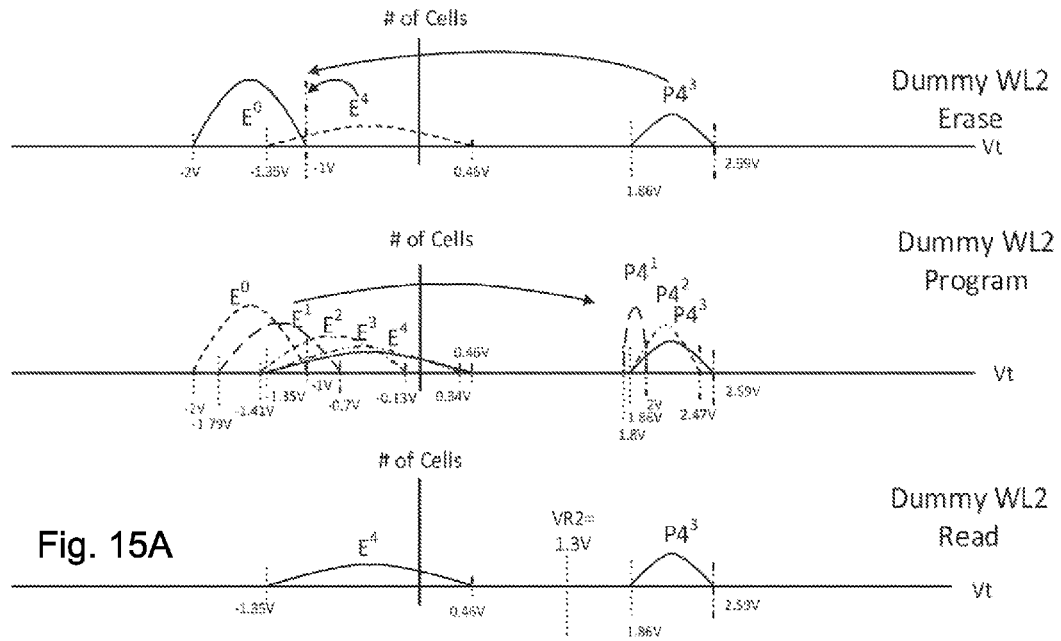

Fig. 15A

| Time | State | Vtemax & Vtp4max of for Dummy WL2 |
|---|---|---|
| | Initial | $Vte^0max = -1V$; $Vte^0min = -2V$ |
| t_ | DS: $E^0 \to P4^1$ (DWL1) | $Vte^1max = (-1) + (2+2) \times 7.5\% = -0.7V$; |
| t0 | DP: $E^1 \to P4^1$ (DWL2) | $Vte^2max = (-0.7) + (1.79+2) \times 7.5\% \times 2 = -0.13V$; |
| | | $Vtp2^1max = (1.8) + (0.2) = 2V$ |
| t1 | 1S: $E^1 \to P6^1$ (WLn-1) | $Vte^3max = (-0.13) + (3 \div 3.2) \times 7.5\% = 0.34V$ |
| | | $Vtp4^2max = (2) + (3 \div 3.2) \times 7.5\% = 2.47V$ |
| t3 | 2S: $Pn^2 \to Pn^3$ (WLn-1) | $Vte^4max = (0.34) + (4.6-3.05) \times 7.5\% = 0.46V$ |
| | | $Vtp4^3max = (2.47) + (4.6-3.05) \times 7.5\% = 2.59V$ |
| Note | | |
| 1. $Vte^1min$ is shifted by 0.21V due to DWL1's $(Vtp4^1min - Vte^0max) \times 7.5\% = (1+1.8) \times 7.5\% = 0.21V$; $Vte^1min = (-2) + (0.21) = -1.79V$ | | |
| 2. $Vte^2min$ is shifted by 0.38V due to DWL2's $(Vtp4^1min - Vte^1max) \times 7.5\% \times 2 = (0.7+1.8) \times 15\% = 0.38V$; $Vte^2min = (-1.79) + (0.38) = -1.41V$ | | |
| 3. $Vte^3min$ & $Vtp2^2min$ are shifted by 0.06V due to WLn-1's $(Vtp0^1min - Vte^1max) \times 7.5\% = (1.7 - 0.9) \times 7.5\% = 0.06V$ | | |
| 4. No shift on $Vte^4min$ & $Vtp4^3min$ due to no program on WLn-1's Vtp0 | | |

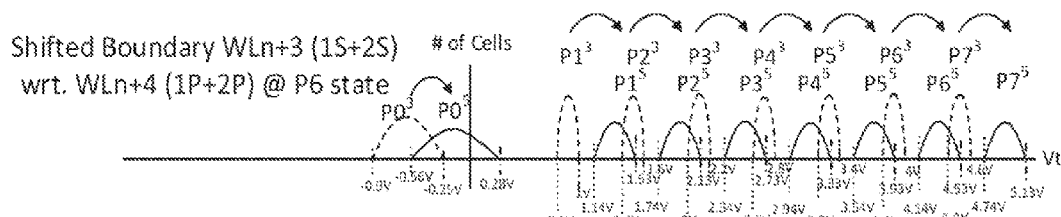

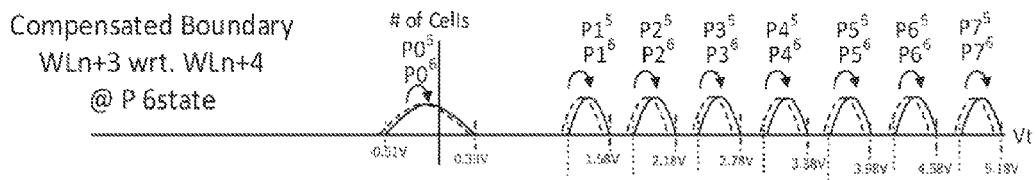

| Time | State | Vtmin/Vtmax(New) of WLn+3 wrt. WLn+4 @ P6 |
|---|---|---|
| t1' | 1S: E² ->P6¹ (WLn+4) | Vtmin(new)=Vtmin(old)+0.3315V+0.0555V<br>=Vtmin(old)+0.34V |
| t3' | 2S: P6² ->P6³ (WLn+4) | |
| t1' | 1S: E² ->P6¹ (WLn+4) | Vtmax(new)=Vtmax(old)+0.4613V+0.0713V<br>=Vtmax(old)+0.53V |
| t3' | 2S: P6² ->P6³ (WLn+4) | |

| Note |
|---|
| 1. Vtmin is shifted by WLn+4's (Vtp6¹min-Vte²max)<br>x7.5%=(3+1.42)x7.5%=0.3315V |
| 2. Vtmin is shifted by WLn+4's (Vtp6³min-Vtp6²max)<br>x7.5%=(3.8-3.66)x7.5%=0.0105V |
| 3. Vtmax is shifted by WLn+4's (Vtp6¹max-Vte²min)<br>x7.5%=(3.2+2.95)x7.5%=0.4613V |
| 4. Vtmax is shifted by WLn+4's (Vtp6³max-Vtp6²min)<br>x7.5%=(4-3.05)x7.5%=0.0713V |

Fig. 15H

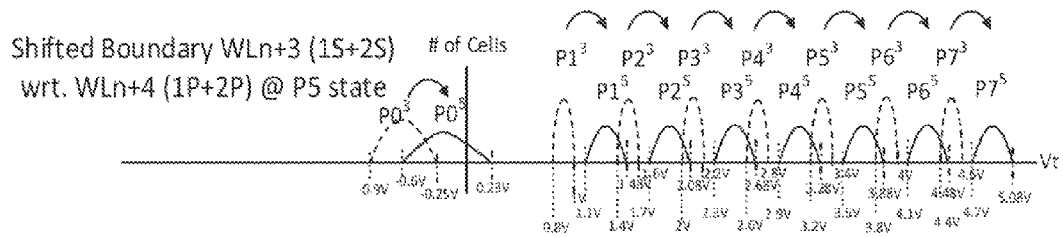

Compensate Boundary WLn+3 by Applying Individual $V_{SL}$=0.1V

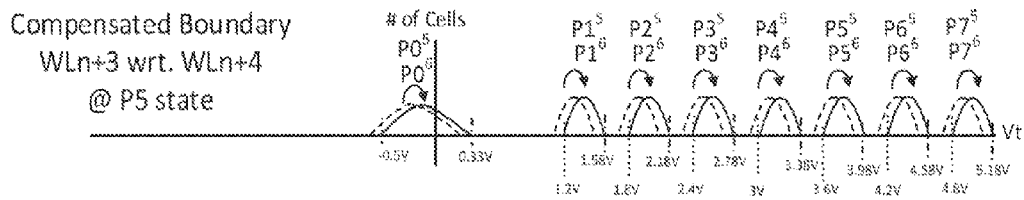

| Time | State | Vtmin/Vtmax(New) of WLn+3 wrt. WLn+4 @ P5 |
|---|---|---|
| t1' | 1S: $E^2$->$P4^1$ (WLn+4) | Vtmin(new)=Vtmin(old)+0.2415V+0.0555V |
| t3' | 2S: $P4^2$->$P5^3$ (WLn+4) | =Vtmin(old)+0.3V |
| t1' | 1S: $E^2$->$P4^1$ (WLn+4) | Vtmax(new)=Vtmax(old)+0.3713V+0.1088V |
| t3' | 2S: $P4^2$->$P5^3$ (WLn+4) | =Vtmax(old)+0.48V |
| Note | | |
| 1. Vtmin is shifted by WLn+4's ($Vtp4^1min-Vte^2max$) x7.5%=(1.8+1.42)x7.5%=0.2415V | | |
| 2. Vtmin is shifted by WLn+4's ($Vtp5^3min-Vtp4^2max$) x7.5%=(3.2-2.46)x7.5%=0.0555V | | |
| 3. Vtmax is shifted by WLn+4's ($Vtp4^1max-Vte^2min$) x7.5%=(2+2.95)x7.5%=0.3713V | | |
| 4. Vtmax is shifted by WLn+4's ($Vtp5^3max-Vtp4^2min$) x7.5%=(3.4-1.85)x7.5%=0.1088V | | |

Fig. 15I

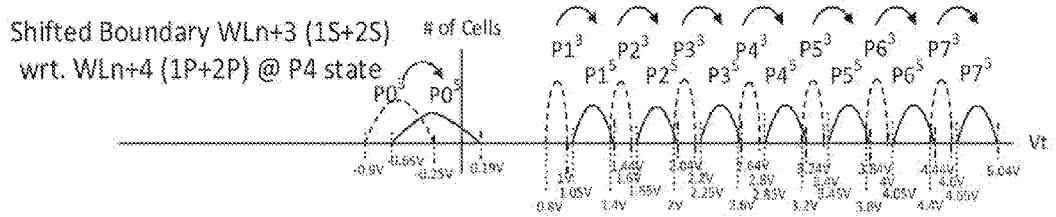

Compensate Boundary WLn+3 by Applying Individual $V_{SL}=0.14V$

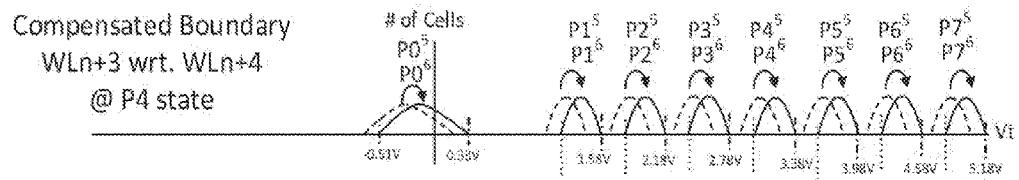

| Time | State | Vtmin/Vtmax(New) of WLn+3 wrt. WLn+4 @ P4 |
|---|---|---|
| t1' | 1S: $E^2 \rightarrow P4^1$ (WLn+4) | Vtmin(new)=Vtmin(old)+0.2363V+0.012V |
| t3' | 2S: $P4^2 \rightarrow P4^3$ (WLn+4) | =Vtmin(old)+0.25V |
| t1' | 1S: $E^2 \rightarrow P4^1$ (WLn+4) | Vtmax(new)=Vtmax(old)+0.3713V+0.0713V |
| t3' | 2S: $P4^2 \rightarrow P4^3$ (WLn+4) | =Vtmax(old)+0.44V |

| Note |
|---|
| 1. Vtmin is shifted by WLn+4's ($Vtp4^1min-Vte^2max$) x7.5%=(1.8+1.42)x7.5%=0.2415V |
| 2. Vtmin is shifted by WLn+4's ($Vtp4^3min-Vtp4^2max$) x7.5%=(2.6-2.46)x7.5%=0.0105V |
| 3. Vtmax is shifted by WLn+4's ($Vtp4^1max-Vte^2min$) x7.5%=(2+2.95)x7.5%=0.3713V |
| 4. Vtmax is shifted by WLn+4's ($Vtp4^3max-Vtp4^2min$) x7.5%=(2.8-1.85)x7.5%=0.0713V |

Fig. 15J

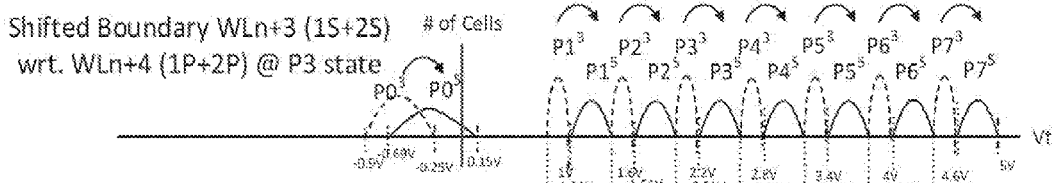

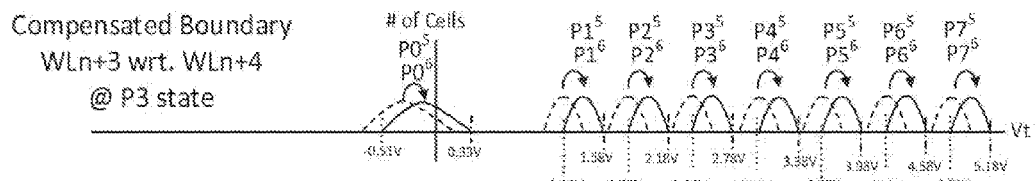

| Time | State | Vtmin/Vtmax(New) of WLn+3 wrt. WLn+4 @ P3 |
|---|---|---|
| t1' | 1S: $E^2 \to P2^1$ (WLn+4) | Vtmin(new)=Vtmin(old)+0.1515V+0.0555V =Vtmin(old)+0.21V |
| t3' | 2S: $P2^2 \to P3^3$ (WLn+4) | |
| t1' | 1S: $E^2 \to P2^1$ (WLn+4) | Vtmax(new)=Vtmax(old)+0.2813V+0.1163V =Vtmax(old)+0.4V |
| t3' | 2S: $P2^2 \to P3^3$ (WLn+4) | |
| Note | | |
| 1. Vtmin is shifted by WLn+4's ($Vtp2^1min - Vte^2max$) x7.5%=(0.6+1.42)x7.5%=0.1515V | | |
| 2. Vtmin is shifted by WLn+4's ($Vtp3^3min - Vtp2^2max$) x7.5%=(2-1.26)x7.5%=0.0555V | | |
| 3. Vtmax is shifted by WLn+4's ($Vtp2^1max - Vte^2min$) x7.5%=(0.8+2.95)x7.5%=0.2813V | | |
| 4. Vtmax is shifted by WLn+4's ($Vtp3^3max - Vtp2^2min$) x7.5%=(2.2-0.65)x7.5%=0.1163V | | |

Fig. 15K

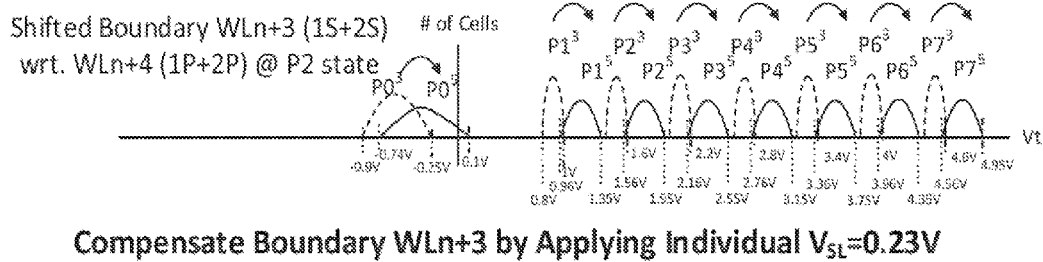

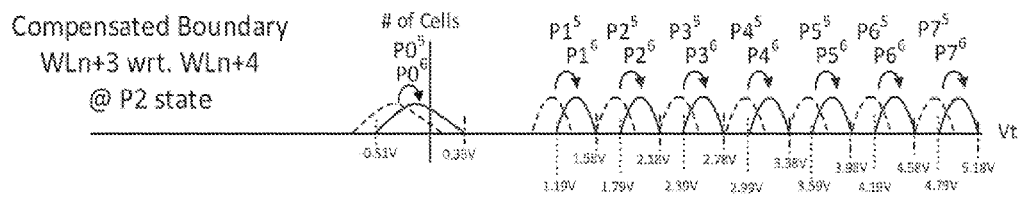

| Time | State | Vtmin/Vtmax(New) of WLn+3 wrt. WLn+4 @ P2 |
|---|---|---|
| t1' | 1S: $E^2$->$P2^1$ (WLn+4) | Vtmin(new)=Vtmin(old)+0.1515V+0.0105V |
| t3' | 2S: $P2^2$->$P2^3$ (WLn+4) | =Vtmin(old)+0.16V |
| t1' | 1S: $E^2$->$P2^1$ (WLn+4) | Vtmax(new)=Vtmax(old)+0.2813V+0.0713V |
| t3' | 2S: $P2^2$->$P2^3$ (WLn+4) | =Vtmax(old)+0.35V |

| Note |
|---|
| 1. Vtmin is shifted by WLn+4's ($Vtp2^1min-Vte^2max$) x7.5%=(0.6+1.42)x7.5%=0.1515V |
| 2. Vtmin is shifted by WLn+4's ($Vtp2^3min-Vtp2^2max$) x7.5%=(1.4-1.26)x7.5%=0.0105V |
| 3. Vtmax is shifted by WLn+4's ($Vtp2^1max-Vte^2min$) x7.5%=(0.8+2.95)x7.5%=0.2813V |
| 4. Vtmax is shifted by WLn+4's ($Vtp2^3max-Vtp2^2min$) x7.5%=(1.6-0.65)x7.5%=0.0713V |

Fig. 15L

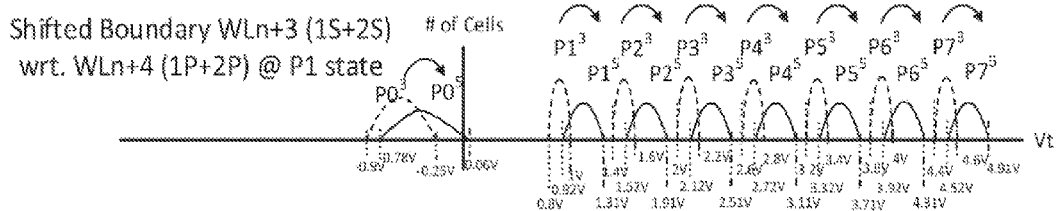

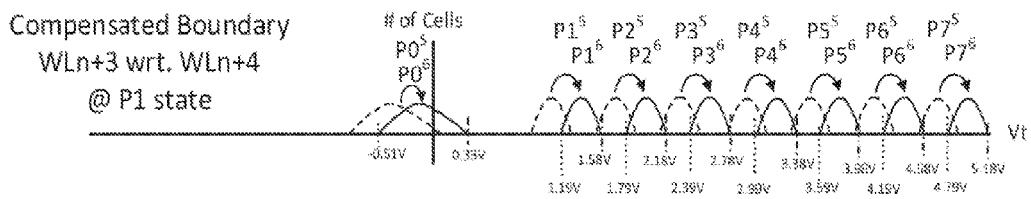

| Time | State | Vtmin/Vtmax(New) of WLn+3 wrt. WLn+4 @ P1 |
|---|---|---|
| t1' | 1S: E² → P1¹ (WLn+4) | Vtmin(new)=Vtmin(old)+0.1065V+0.0105V<br>=Vtmin(old)+0.12V |
| t3' | 2S: P1² → P1³ (WLn+4) | |
| t1' | 1S: E² → P1¹ (WLn+4) | Vtmax(new)=Vtmax(old)+0.2363V+0.0713V<br>=Vtmax(old)+0.31V |
| t3' | 2S: P1² → P1³ (WLn+4) | |

| Note |
|---|
| 1. Vtmin is shifted by WLn+4's (Vtp1¹min-Vte²max)<br>x7.5%=(1.42)x7.5%=0.1065V |
| 2. Vtmin is shifted by WLn+4's (Vtp1³min-Vtp1²max)<br>x7.5%=(0.8-0.66)x7.5%=0.0105V |
| 3. Vtmax is shifted by WLn+4's (Vtp1¹max-Vte²min)<br>x7.5%=(0.2+2.95)x7.5%=0.2363V |
| 4. Vtmax is shifted by WLn+4's (Vtp1³max-Vtp1²min)<br>x7.5%=(1-0.05)x7.5%=0.0713V |

Fig. 15M

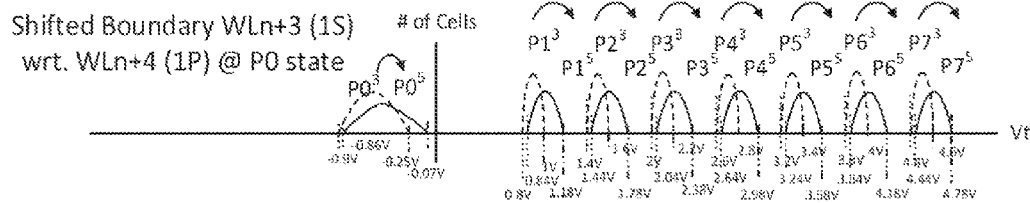

Compensate Boundary WLn+3 by Applying Individual V$_{SL}$=0.35V

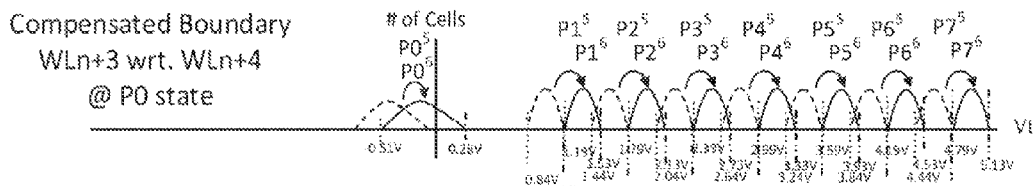

| Time | State | Vtmin/Vtmax(New) of WLn+3 wrt. WLn+4 @ P0 |
|---|---|---|
| t1' | 1S: E$^2$->P0$^3$ (WLn+4) | Vtmin(new)=Vtmin(old)+0.04V |
| t3' | No PGM: P0$^2$->P0$^3$ (WLn+4) | |
| t1' | 1S: E$^2$->P0$^3$ (WLn+4) | Vtmax(new)=Vtmax(old)+0.18V |
| t3' | No PGM: P0$^2$->P0$^3$ (WLn+4) | |
| Note | | |
| 1. Vtmin is shifted by WLn+4's (Vtp2$^1$min-Vte$^2$max) x7.5%=(-0.9+1.42)x7.5%=0.039V | | |
| 2. No shifted Vtmin due to no program on WLn+4's (Vtp0$^3$min-Vtp0$^2$max) | | |
| 3. Vtmax is shifted by WLn+4's (Vtp2$^1$max-Vte$^2$min) x7.5%=(-0.6+2.95)x7.5%=0.1763V | | |
| 4. No shifted Vtmin due to no program on WLn+4's (Vtp0$^3$max-Vtp0$^2$min) | | |

Fig. 15N

Boundary WLn+3 Read Operation by Applying Individual V$_{SL}$ =0V/0.05V/0.1V/ 0.14V/0.18V/0.23V/0.27V/0.35V wrt. WLn+4 @ P7/P6/P5/P4/P3/P2/P1/P0 state

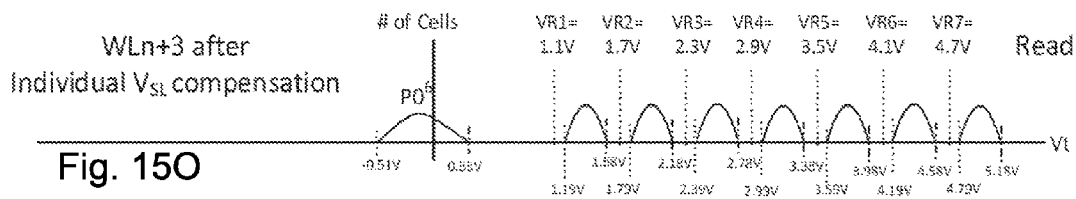

Fig. 15O

| 2nd-pass Program: 2P (Option 3 & Option 4) | | | | | | | | | |
|---|---|---|---|---|---|---|---|---|---|
| $V_{LBL}$ | | WLn+1 | | | | | | | |
| | | P0 | P1 | P2 | P3 | P4 | P5 | P6 | P7 |
| WLn | P0 | Vinh | Vinh | Vinh | Vinh | Vinh | Vinh | Vinh | Vinh |
| | P1 | 3.6V/Vinh | 3.6V/Vinh | 3.6V/Vinh | 3.9V/Vinh | 3.6V/Vinh | 3.9V/Vinh | 3.6V/Vinh | 3.9V/Vinh |
| | P2 | 3V/Vinh | 3V/Vinh | 3V/Vinh | 3.3V/Vinh | 3V/Vinh | 3.3V/Vinh | 3V/Vinh | 3.3V/Vinh |
| | P3 | 2.4V/Vinh | 2.4V/Vinh | 2.4V/Vinh | 2.7V/Vinh | 2.4V/Vinh | 2.7V/Vinh | 2.4V/Vinh | 2.7V/Vinh |
| | P4 | 1.8V/Vinh | 1.8V/Vinh | 1.8V/Vinh | 2.1V/Vinh | 1.8V/Vinh | 2.1V/Vinh | 1.8V/Vinh | 2.1V/Vinh |
| | P5 | 1.2V/Vinh | 1.2V/Vinh | 1.2V/Vinh | 1.5V/Vinh | 1.2V/Vinh | 1.5V/Vinh | 1.2V/Vinh | 1.5V/Vinh |
| | P6 | 0.6V/Vinh | 0.6V/Vinh | 0.6V/Vinh | 0.9V/Vinh | 0.6V/Vinh | 0.9V/Vinh | 0.6V/Vinh | 0.9V/Vinh |
| | P7 | 0V/Vinh | 0V/Vinh | 0V/Vinh | 0.3V/Vinh | 0V/Vinh | 0.3V/Vinh | 0V/Vinh | 0.3V/Vinh |

Fig. 17B

| ABL 1st-pass/2nd-pass (option 3 & option 4) TLC program @ Vdd=2.4V | | | | | | | |
|---|---|---|---|---|---|---|---|
| State | $V_{LBL}$ | T0 | | T1 | | T2 | After C.S. |
| | | GBL | LBL | GBL | LBL | GBL | LBL | |
| P0 | 3.9V | 1.2 | 7->1.2 | Vdd | 5.4 | Vdd | 5.1 | 3.9V |
| P1 | 3V | Vdd | 7 | 1.6 | 5.4->1.6 | 0.4 | 5.1->0.4 | 3V |
| | 3.6V | 0.3 | 7->0.3 | Vdd | 5.4 | Vdd | 5.1 | 3.6V |
| | 3.9V | 1.2 | 7->1.2 | Vdd | 5.4 | Vdd | 5.1 | 3.9V |
| P2 | 2.4V | Vdd | 7 | 0.2 | 5.4->0.2 | 0 | 5.1->0 | 2.4V |
| | 3V | Vdd | 7 | 1.6 | 5.4->1.6 | 0.4 | 5.1->0.4 | 3V |
| | 3.3V | Vdd | 7 | 1.6 | 5.4->1.6 | 1.3 | 5.1->1.3 | 3.3V |
| P3 | 2.4V | Vdd | 7 | 0.2 | 5.4->0.2 | 0 | 5.1->0 | 2.4V |
| | 2.7V | Vdd | 7 | 1.1 | 5.4->1.1 | 0 | 5.1->0 | 2.7V |
| P4 | 1.2V | 1.2 | 7->1.2 | 1.2 | 5.4->1.2 | 1.2 | 5.1->1.2 | 1.2V |
| | 1.8V | 0 | 7->0 | Vdd | 5.4 | 0 | 5.1->0 | 1.8V |
| | 2.1V | 0.9 | 7->0.9 | Vdd | 5.4 | 0 | 5.1->0 | 2.1V |
| P5 | 1.2V | 1.2 | 7->1.2 | 1.2 | 5.4->1.2 | 1.2 | 5.1->1.2 | 1.2V |
| | 1.5V | 1.5 | 7->1.5 | 1.5 | 5.4->1.5 | 1.5 | 5.1->1.5 | 1.5V |
| P6 | 0V | 0 | 7->0 | 0 | 5.4->0 | 0 | 5.1->0 | 0V |
| | 0.6V | 0.6 | 7->0.6 | 0.6 | 5.4->0.6 | 0.6 | 5.1->0.6 | 0.6V |
| | 0.9V | 0.9 | 7->0.9 | 0.9 | 5.4->0.9 | 0.9 | 5.1->0.9 | 0.9V |
| P7 | 0V | 0 | 7->0 | 0 | 5.4->0 | 0 | 5.1->0 | 0V |
| | 0.3V | 0.3 | 7->0.3 | 0.3 | 5.4->0.3 | 0.3 | 5.1->0.3 | 0.3V |
| All Inh. States | Vinh | Vdd | 7V | Vdd | 5.4V | Vdd | 5.1V | 5.83V |

Fig. 17D

| State | $V_{LBL}$ | T0 | | T1 | | T2 | | T3 | | After C.S. |
|---|---|---|---|---|---|---|---|---|---|---|
| | | GBL | LBL | GBL | LBL | GBL | LBL | GBL | LBL | |
| P0 | 3.9V | 0.6 | 7->0.6 | Vdd | 6.4 | Vdd | 5 | Vdd | 3.6 | 3.9V |
| P1 | 3V | Vdd | 7 | 0 | 6.4->0 | Vdd | 5 | 0 | 3.6->0 | 3V |
| | 3.6V | Vdd | 7 | Vdd | 6.4 | 0.8 | 5->0.8 | 0.2 | 3.6->0.2 | 3.6V |
| | 3.9V | 0.6 | 7->0.6 | Vdd | 6.4 | Vdd | 5 | Vdd | 3.6 | 3.9V |
| P2 | 2.4V | 0.8 | 7->0.8 | 0.2 | 6.4->0.2 | Vdd | 5 | Vdd | 3.6 | 2.4V |
| | 3V | Vdd | 7 | 0 | 6.4->0 | Vdd | 5 | 0 | 3.6->0 | 3V |
| | 3.3V | Vdd | 7 | 0.8 | 6.4->0.8 | Vdd | 5 | 0.4 | 3.6->0.4 | 3.3V |
| P3 | 2.4V | 0.8 | 7->0.8 | 0.2 | 6.4->0.2 | Vdd | 5 | Vdd | 3.6 | 2.4V |
| | 2.7V | Vdd | 7 | 0.2 | 6.4->0.2 | 0 | 5.0->0 | Vdd | 3.6 | 2.7V |
| P4 | 1.2V | 0.8 | 7->0.8 | 0.4 | 6.4->0.4 | 0 | 5.0->0 | Vdd | 3.6 | 1.2V |
| | 1.8V | Vdd | 7 | 0.2 | 6.4->0.2 | 0 | 5.0->0 | 0 | 3.6->0 | 1.8V |
| | 2.1V | Vdd | 7 | 0.8 | 6.4->0.8 | 0.6 | 5.0->0.6 | 0 | 3.6->0 | 2.1V |
| P5 | 1.2V | 0.8 | 7->0.8 | 0.4 | 6.4->0.4 | 0 | 5.0->0 | Vdd | 3.6 | 1.2V |
| | 1.5V | 0.8 | 7->0.8 | 0.2 | 6.4->0.2 | Vdd | 5 | 0 | 3.6->0 | 1.5V |
| P6 | 0V | 0 | 7->0 | 0 | 6.4->0 | 0 | 5.0->0 | 0 | 3.6->0 | 0V |
| | 0.6V | 0.6 | 7->0.6 | 0.6 | 6.4->0.6 | 0.6 | 5.0->0.6 | 0.6 | 3.6->0.6 | 0.6V |
| | 0.9V | 0 | 7->0 | 0 | 6.4->0 | 0 | 5.0->0 | Vdd | 3.6 | 0.9V |
| P7 | 0V | 0 | 7->0 | 0 | 6.4->0 | 0 | 5.0->0 | 0 | 3.6->0 | 0V |
| | 0.3V | 0.3 | 7->0.3 | 0.3 | 6.4->0.3 | 0.3 | 5.0->0.3 | 0.3 | 3.6->0.3 | 0.3V |
| All Inh. States | Vinh | Vdd | 7V | Vdd | 6.4V | Vdd | 5V | Vdd | 3.6V | 5.5V |

Fig. 17E

Option 3 & Option 4 :1-5-8

| VFY Voltage State | 1P (Option 3 & Option 4) | | 2P (Option 3 & Option 4) | | 3P (Option 4) | |
|---|---|---|---|---|---|---|
| | WL | SL | WL | SL | WL | SL |
| P0 | 0V | 0.9V | Neglect | | Neglect | |
| P1 | 0V | 0V | 0.8V | 0V | 1.4V | 0V |
| P2 | 0.6V | 0V | 1.4V | 0V | 2V | 0V |
| P3 | Neglect | | 2V | 0V | 2.6V | 0V |
| P4 | 1.8V | 0V | 2.6V | 0V | 3.2V | 0V |
| P5 | Neglect | | 3.2V | 0V | 3.8V | 0V |
| P6 | 3V | 0V | 3.8V | 0V | 4.4V | 0V |
| P7 | Neglect | | 4.4V | 0V | 5V | 0V |

Read Operation of WLn-1~WLn+2 wrt. Programmed Adj. WL (Option 3 & option 4)

| State \ Voltage | WL | SL |
|---|---|---|
| P0 out of P1~P7 | 0.7V | 0V |
| P0~P1 out of P2~P7 | 1.3V | 0V |
| P0~P2 out of P3~P7 | 1.9V | 0V |
| P0~P3 out of P4~P7 | 2.5V | 0V |
| P0~P4 out of P5~P7 | 3.1V | 0V |
| P0~P5 out of P6~P7 | 3.7V | 0V |
| P7 out of P0~P6 | 4.3V | 0V |

Fig. 17H

Read Operation of Boundary WLn+3 wrt. WLn+4 @ E-State (Option 3 & Option 4)

| State \ Voltage | WL | SL |
|---|---|---|
| P0 out of P1~P7 | 0.7V | 0V |
| P0~P1 out of P2~P7 | 1.3V | 0V |
| P0~P2 out of P3~P7 | 1.9V | 0V |
| P0~P3 out of P4~P7 | 2.5V | 0V |
| P0~P4 out of P5~P7 | 3.1V | 0V |
| P0~P5 out of P6~P7 | 3.7V | 0V |
| P7 out of P0~P6 | 4.3V | 0V |

Fig. 17I

Read Operation of Boundary WLn+3 wrt. WLn+4 @ P0~P7 state (Option 3)

| State \ Voltage | WLn+3 | SL (WLn+4) | | | | | | |
|---|---|---|---|---|---|---|---|---|
| | | P0 | P1 | P2 | P3 | P4 | P5 | P6 | P7 |
| P0 out of P1~P7 | 1.1V | 0.35V | 0.27V | 0.23V | 0.18V | 0.14V | 0.1V | 0.05V | 0V |
| P0~P1 out of P2~P7 | 1.7V | 0.35V | 0.27V | 0.23V | 0.18V | 0.14V | 0.1V | 0.05V | 0V |
| P0~P2 out of P3~P7 | 2.3V | 0.35V | 0.27V | 0.23V | 0.18V | 0.14V | 0.1V | 0.05V | 0V |
| P0~P3 out of P4~P7 | 2.9V | 0.35V | 0.27V | 0.23V | 0.18V | 0.14V | 0.1V | 0.05V | 0V |
| P0~P4 out of P5~P7 | 3.5V | 0.35V | 0.27V | 0.23V | 0.18V | 0.14V | 0.1V | 0.05V | 0V |
| P0~P5 out of P6~P7 | 4.1V | 0.35V | 0.27V | 0.23V | 0.18V | 0.14V | 0.1V | 0.05V | 0V |
| P7 out of P0~P6 | 4.7V | 0.35V | 0.27V | 0.23V | 0.18V | 0.14V | 0.1V | 0.05V | 0V |

ABL, AnP, Alt-WL Program Scheme (Option 5)

| SLC/TLC | Boundary WL | Time | t_ | t0 | t1 | t2 | t3 | t4 | t5 | t6 | t7 |
|---|---|---|---|---|---|---|---|---|---|---|---|
| SLC | Yes | DWL1 | DP | | | | | | | | |
| SLC | Yes | DWL2 | DS | DP | 1S | | | | | | |
| TLC | 1st (Yes) | WLn-1 | | DS | 1P | 1S | 2S | | 2S | | |
| TLC | No | WLn | | | 1S | 1P | 2P | 1S | 2P | 1S' | 2S |
| TLC | 2nd (Yes) | WLn+1 | | | | 1S | 2S | 1P | 2S | 1P' | 2P |
| SLC | No | WLn+2 | | | | | | 1S | | | 2S |
| | | 3-bit PB | | DWL1 | DWL2 | WLn-1 | WLn | WLn+1 | WLn | WLn+2 | WLn+1 |
| | | 1-bit PB | | | | | | | | | |

1. DP: Dummy WL program
2. 1P'/2P': 1-1 SLC program
3. 1P/2P: 1-5-8 TLC program

ABL, AnP, Alt-WL Program Scheme (Option 5)

| SLC/TLC | Boundary WL | Time | t0' | t1' | t2' | t3' | t4' | t5' | t6' | t7' |
|---|---|---|---|---|---|---|---|---|---|---|
| SLC | No | WLn+2 | 1S | 1S | 2P' | | | | | |
| TLC | 1st (Yes) | WLn+3 | 1P | 1P | 2S' | 2S | 1S | | | |
| TLC | No | WLn+4 | 1S | 1S | | 2P | 1P | 2P | | |
| TLC | 2nd (Yes) | WLn+5 | | | | 2S | 1S | 2S | 1S' | 2S |
| SLC | No | WLn+6 | | | | | | | 1P' | 2P |
| 3-bit PB | | WLn+3 | WLn+4 | WLn+4 | WLn+5 | WLn+5 | WLn+6 | WLn+6 | |
| 1-bit PB | | WLn+2 | | | | | | | | |

1. 1P/2P: 1-5-8 TLC program
2. 1P'/2P': 1-1 SLC program

Fig. 20C

ABL, AnP, Alt-WL Program Scheme (Option 5)

| SLC/TLC | Boundary WL | Time | t2 | t4 | t5 | t6 | t7 | t0' | t1' | t2' | t3' | t5' | t0" |
|---|---|---|---|---|---|---|---|---|---|---|---|---|---|
| TLC | 2nd (Yes) | WLn+1 | 1S | 1P | 2S | 1S' | 2P | 1S | 2S' | 2P' | 2S | | SS |
| SLC | No | WLn+2 | | 1S | | 1P' | 2S | 1P | 2S | 2P | 2S | 2S | SP |
| TLC | 1st (Yes) | WLn+3 | | | | 1S' | 2S | 1S | 2S | 2P | 2P | 2S | SS |
| 3-bit PB | | WLn | WLn+1 | WLn+1 | WLn | WLn+2 | WLn+1 | WLn+2 | WLn+3 | WLn+3 | WLn+4 | WLn+4 | |
| 1-bit PB | | | | | | WLn+2 | | | | | | WLn+2 | |

1. 1P'/2P': 1-1 SLC program
2. SP: 1-2 SLC program
3. 1P/2P: 1-5-8 TLC program

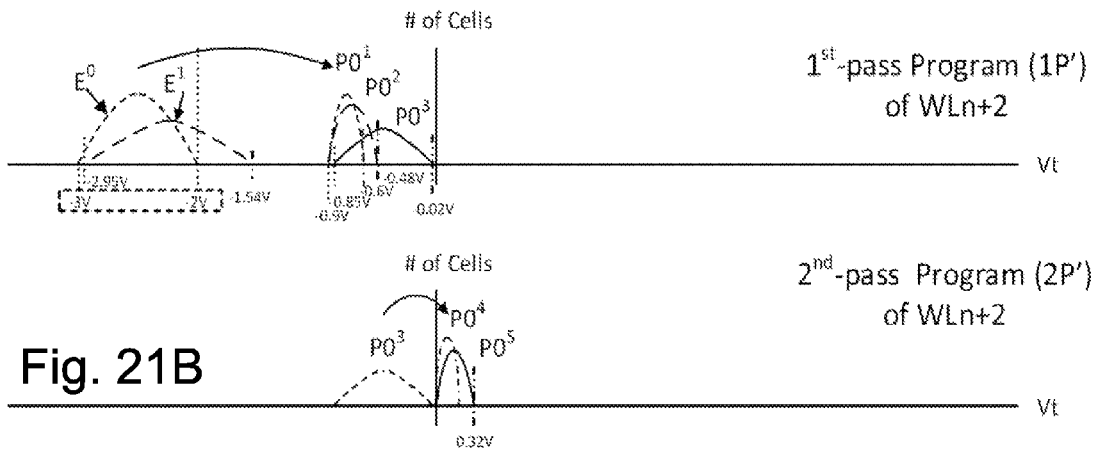

Fig. 21B

| Time | State | Vtmax of E & P0 for WLn+2 wrt. Adj. Programmed WLn+1 & WLn+2 |
|---|---|---|
|  | Initial | Vte⁰max= -2V; Vte⁰min= -3V |
| t4 | 1S: E¹->P0¹ (WLn+1) | Vte¹max =(-2)+ (3.2+2.95)x7.5%= -1.54V |
| t6 | 1P': E¹->P0¹ (WLn+2) | Vtp0¹max =(-0.9)+ (0.3)= -0.6V |
| t7 | 2S: Pn³->Pn⁴ (WLn+1) | Vtp0²max =(-0.6)+ (4.6-3.05)x7.5%= -0.48V |
| t0' | 1S: E¹->P6¹ (WLn+3) | Vtp0³max =(-0.48)+ (2.95+3.2)x7.5%=-0.02V |
| t2' | 2P': P0³->P0⁴ (WLn+2) | Vtp0⁴max=(0) + (0.2)=0.2V |
| t3' | 2S: Pn³->Pn⁴ (WLn+3) | Vtp0⁵max=(0.2) + (4.6-3.05)x7.5%=0.32V |

| Note |
|---|
| 1. Vtp0¹max is set to -0.6V due to WLn+3's (Vtp6¹max-Vte¹min) x7.5%x2 =(3.2+2.95)x15%=0.92V; (-1.54)+(0.92)= -0.62V<-0.6V |
| 2. Vte¹min is shifted by 0.05V due to WLn+2's (Vtp0¹min-Vte¹max) x7.5%= (1.54 -0.9)x7.5%=0.05V |
| 3. Vtp0³min is is shifted by 0.05V due to WLn+3's (Vtp01min-Vte1max) x7.5%= (1.54 -0.9)x7.5%=0.05V |
| 4. Vtp0⁴max is set to 0.2V due to WLn+2's (Vtp0⁴max-Vtp0³min) x7.5%x2 =(0.9+0.2)x15%=0.17V; (-0.02)+(0.17)= 0.15V<0.2V |
| 5. No shift on Vtp0⁵min due to no program on WLn+3's VtpO |

Fig. 22B

2nd-pass Program (Option 5)

| WLn | | 2P | | | | | | | | 2P' | |
|---|---|---|---|---|---|---|---|---|---|---|---|
| | V_LBL | P0 | P1 | P2 | P3 | WLn+1 P4 | P5 | P6 | P7 | State | V_LBL |
| P0 | | Vinh | Vinh | Vinh | Vinh | Vinh | Vinh | Vinh | Vinh | | |
| P1 | 3.6V/Vinh | 3.6V/Vinh | 3.6V/Vinh | 3.6V/Vinh | 3.6V/Vinh | 3.9V/Vinh | 3.6V/Vinh | 3.9V/Vinh | | | |
| P2 | 3V/Vinh | 3V/Vinh | 3V/Vinh | 3V/Vinh | 3V/Vinh | 3.3V/Vinh | 3V/Vinh | 3.3V/Vinh | | | |
| P3 | 2.4V/Vinh | 2.4V/Vinh | 2.4V/Vinh | 2.4V/Vinh | 2.4V/Vinh | 2.7V/Vinh | 2.4V/Vinh | 2.7V/Vinh | P0 | 0V | |
| P4 | 1.8V/Vinh | 1.8V/Vinh | 1.8V/Vinh | 1.8V/Vinh | 1.8V/Vinh | 2.1V/Vinh | 1.8V/Vinh | 2.1V/Vinh | | | |
| P5 | 1.2V/Vinh | 1.2V/Vinh | 1.2V/Vinh | 1.2V/Vinh | 1.2V/Vinh | 1.5V/Vinh | 1.2V/Vinh | 1.5V/Vinh | | | |
| P6 | 0.6V/Vinh | 0.6V/Vinh | 0.6V/Vinh | 0.6V/Vinh | 0.6V/Vinh | 0.9V/Vinh | 0.6V/Vinh | 0.9V/Vinh | | | |
| P7 | 0V/Vinh | 0V/Vinh | 0V/Vinh | 0V/Vinh | 0V/Vinh | 0.3V/Vinh | 0V/Vinh | 0.3V/Vinh | | | |

Fig. 22C

SLC Program: SP (Option 5)

| State | V_LBL |
|---|---|
| P0 | Vinh |
| P1 | 0V/Vinh |

Fig. 22D

| VFY Voltage \ State | 1P (Option 5) | | 2P (Option 5) | |
|---|---|---|---|---|
| | WL | SL | WL | SL |
| P0 | 0V | 0.9V | Neglect | |
| P1 | 0V | 0V | 0.8V | 0V |
| P2 | 0.6V | 0V | 1.4V | 0V |
| P3 | Neglect | | 2V | 0V |
| P4 | 1.8V | 0V | 2.6V | 0V |
| P5 | Neglect | | 3.2V | 0V |
| P6 | 3V | 0V | 3.8V | 0V |
| P7 | Neglect | | 4.4V | 0V |

| VFY Voltage State | 1P' (Option 5) | | 2P' (Option 5) | | SP (Option 5) | |
|---|---|---|---|---|---|---|
| | WL | SL | WL | SL | WL | SL |
| P0 | 0V | 0.9V | 0V | 0V | Neglect | |
| P1 | Neglect | | Neglect | | 0.9V | 0V |

Fig. 22E

| Read Operation of TLC WL (Option 5) | | |
|---|---|---|
| Voltage State | WL | SL |
| P0 out of P1~P7 | 0.7V | 0V |
| P0~P1 out of P2~P7 | 1.3V | 0V |
| P0~P2 out of P3~P7 | 1.9V | 0V |
| P0~P3 out of P4~P7 | 2.5V | 0V |
| P0~P4 out of P5~P7 | 3.1V | 0V |
| P0~P5 out of P6~P7 | 3.7V | 0V |
| P7 out of P0~P6 | 4.3V | 0V |

Fig. 22F

| Read Operation of SLC WL (Option 5) | | |
|---|---|---|
| Voltage State | WL | SL |
| P0 out of P1~P0 | 0.7V | 0V |

Fig. 22G

VSL-BASED VT-COMPENSATION AND ANALOG PROGRAM SCHEME FOR NAND ARRAY WITHOUT CSL

1. CROSS-REFERENCES TO RELATED APPLICATIONS

This application claims priority to U.S. Provisional Application No. 62/038,329 entitled "VSL-BASED Vt-COMPENSATION FOR MIXED TLC+SLC NAND", filed Aug. 17, 2014, commonly assigned and incorporated by reference herein for all purposes.

This application is related to U.S. patent application Ser. Nos. 14/806,629, 14/583,178, 14/487,078, 14/341,739, 14/316,936, and 14/283,209, incorporated by reference herein for all purposes.

This application is related to following U.S. Pat. Nos. 5,867,429; 6,542,407; 6,522,580; 6,781,877; 6,807,095; 6,847,553; 6,870,768; 6,888,758; 6,917,542; 7,046,548; 7,061,798; 7,102,924; 7,187,585; 7,196,928; 7,196,946; 7,196,928; 7,224,613; 7,289,344; 7,289,348; 7,301,808; 7,301,813; 7,301,839; 7,315,477; 7,321,510; 7,372,730; 7,397,698; 7,443,729; 7,499,329; 7,506,113; 7,522,454; 7,652,929; 7,876,611; 7,876,611; 8,036,041; 8,130,556; 8,274,823; 8,284,606; 8,284,613; 8,400,839; 8,570,810; 8,638,608; 8,705,293; 6,917,542; 7,839,690; 7,499,338; 6,657,891; 5,734,609; 8,503,230; 8,625,357; 8,654,585; 8,681,545; 8,665,649; 8,477,533; 7,023,735; 6,816,409; 8,661,294; 8,681,543; 8,675,416; 8,681,543; 8,694,720; 8,711,624; 8,755,224; 8,893,247; 8,625,359; 8,634,251; 8,654,588; 8,681,563; 8,730,733; 8,737,140; 8,773,911; 8,218,348; 7,499,329; 8,526,236; 8,400,826; 8,687,430; 8,687,431; 8,670,272; 8,630,115; 8,462,559; 8,705,277; 8,705,290; 8,700,879; 8,717,819; 8,773,910; 8,638,609; 8,644,081; 8,694,766; 8,711,621; 7,706,188; 8,675,410; and 8,711,621; incorporated by reference herein for all purposes.

2. BACKGROUND OF THE INVENTION

The present invention generally is directed to Non-volatile (NVM) NAND memory architecture design. In particular, the present invention relates to a multi-page concurrent All-bitline (ABL), All-threshold-state-program (AnP), Alternate-wordline (Alt-WL) TLC program but half-bitline (HBL) Odd/Even program-verify and read operations to cope with more severe Yupin-induced coupling effect due to the higher TLC logic data compression rate per one physical NAND cell as well as advanced 10 nm-class manufacturing technology nodes. Through examples, a preferred analog nLC program scheme with $\Delta$Vtpn-based $2^n$ $V_{LBL}$ assignments in accordance with nLC cell and an individual $V_{SL}$-based Vt-compensation read scheme are provided for this concurrent ABL, AnP, Alt-WL, nLC program but concurrent HBL Odd/Even nLC program-verify and read operations with more tightened Vtpn-width and larger Vtpn-gap, aiming particularly to greatly improve NVM NAND memory performance in chip level over the extremely high-density nLC NAND in read and program speed, power consumption, and the data reliability without a need to change the existing NAND cell structure and process technology.

Electrically erasable and programmable NAND, NOR, EEPROM and the likes are among the most popular NVMs. Particularly, NAND is extensively used with a big volume in cellular phones, digital cameras, personal digital assistants, mobile computing devices, tablet, SSD and desktop computers and other emerging wearable devices due to much higher density at a lower cost.

Typically, the mainstream 2D nLC NAND flash memories utilize a 2-poly NMOS memory cell with a floating gate that is provided above and insulated from a channel region in a triple-P-well within a deep-N-well on top of common P-substrate across the cell array region. The floating gate is made of a poly-silicon material (so-called poly1) and is positioned on top and between N-active source and drain regions. A control gate is made of another poly-silicon material (poly2) and provided over and insulated from the poly1 floating gate. The threshold voltage (Vtn) of each nLC flash cell is controlled by the amount of charges that are retained on the poly1 floating gate layer. In other words, a nLC cell's Vtn check means the minimum control gate voltage, e.g., $V_{WL}$ (Vg) voltage, that must be biased with respect to its source node voltage, Vs, to turn on the cell to allow the current conduction of $I_{DS}$ flowing between its drain (with voltage level at Vd) and source (with voltage level at Vs) to meet a condition of Vtn check equation of Vgs=Vg−Vs>Vtpn or Vgs−Vtpn>0. On the contrary, when the condition becomes Vgs−Vtpn<0, then the selected flash cell would not conduct current. In other words, the cell is verified not in the current Vtpn state, and it should be in Vtpn+1 state, e.g., one or more high charge states with a larger Vtpn.

Throughout this specification, a nLC NAND flash cell used to store two ranges of charges is referred as 1-bit, 2-state (Vtn, where n=1) SLC cell; to store four ranges of charges are referred as a 2-bit, 4-state (Vtn, where n=2) MLC cell; to store eight ranges are referred as a 3-bit, 8-state (Vtn, where n=3) TLC cell; and to further store the sixteen ranges of charges are referred as a 4-bit but 16-state (Vtn, where n=4) XLC cell. When a floating-gate of each NAND cell is used to store more than 16 ranges of charges such as 256 states (Vtn, where n=8) is referred as the 8-bit analog cell.

As a result, in a NAND nLC read or any verification operation, by determining which Vtn of a NAND cell conducts current at a given Vgs on WLn under a circumstance of no Yupin coupling interference between adjacent wordlines (WLs) and bit lines (BLs), then each Vtpn of nLC (MLC or TLC) states of each accessed cell can be fully distinguished and determined. Note, the verification includes program-verify and erase-verify operations.

Unfortunately, a typical NAND array is usually formed in a very compact memory matrix to squeeze die size smaller. In All-bitline (ABL) or non-ABL NAND read and verification operations, a plurality of NAND cells with one cell per each string of one physically WLn are selected simultaneously. This means only one cell is read out from one long and compact NAND string that comprises a plurality of NAND cells being laid out in a highly tight 1-lambda (1λ) BL width and 1-lambda (1λ) spacing in X-direction and very tight 1λ WL width and 1λ spacing in Y-direction.

When NAND technology scaling comes to below 30 nm, or even down to 10 nm-class range, the floating-gate Vt interfering coupling effect becomes very severe between adjacent BLs and WLs. These are the well-known Yupin BL-BL or WL-WL cell coupling effects. The Yupin coupling effect will result in the nLC data reliability issue of unintentional error-bit reading, which is undesired but in fact not avoidable.

For example, the typical NAND technology node of 30 nm, the degree of total Yupin coupling effect is less than 30% averagely between two adjacent WLs and two adjacent BLs. When it comes to 20 m node, the degree of total Yupin coupling effect is increased to about 35% averagely. By extrapolation, the degree of total Yupin coupling effect will be further increased to a value more than 40% averagely if the isolation techniques do not get improved.

Typical NAND cell suffered Yupin coupling effect is referred as a "Victim cell or BLn cell in WLn", while the cells that generate Yupin coupling effects are referred as "Aggressor cell or two BLn−1 or BLn+1 cells in WLn or three BLn−1, BLn and BLn+1 cells in WLn−1 and WLn+1." Usually, one Victim cell is surrounded by eight Aggressor cells in 2D NAND array but twenty-six Aggressor cells in 3D NAND array.

Ultimately, in 2D NAND, each nLC Victim cell will be surrounded by eight Aggressor cells with $2^n$ possible Vtn values. In other words, the total combinations of Yupin coupling effect are $8 \times 2^n$. But if the Yupin coupling effects of four diagonal Aggressor cells are not significant and the coupling effect of precedent WL cell is taken care during current WL program because the precedent WL is programmed before the current WL, then the combinations of major significant Yupin coupling effect can be reduced to $3 \times 2^n$ by three Aggressor cells such as two cells of neighboring BLs in current WL and one cell of the same BL in next adjacent WL.

In summary, for both NAND read and verify operations, a cell's Vtn compensation to offset Yupin coupling effect to fix error-correcting code (ECC) errors is required.

Although in past years, there are plenty of Vtn compensation techniques being disclosed in prior art, all of them are more like the "Collective Vt-compensation" or "Pseudo Individual Vt-compensation (PIC)" solutions that rely on cell's $V_{WL}$-based or $V_{BL}$-based Vt-offset scheme. None of them are really based "Real Individual Vt-compensation (RIC)", which is referred as the $V_{SL}$-based Vt-offset compensation scheme by the present invention.

For example, in a conventional mainstream NAND memory block circuit of 2D array architecture. Each NAND block typically is made of a plurality of NAND strings with their individual drain nodes being connected to a plurality of bit lines (BLs) which can be divided into Even BL group (BLe) and Odd BL group (BLo) with their source nodes being connected to one common source line (CSL). The gates of a plurality of NAND cells (plus some dummy cells) in each string are respectively connected to different WLs. Each NAND string includes one top big select NMOS transistor gated to a DSL line and one bottom big select NMOS transistor gated to a SSL line. Additionally, dummy cells and regular NAND cells are formed in series with these two select transistors. The dummy cells are formed at both ends of each string nearing the top and bottom big select transistors for the purpose to avoid gate-induced-drain-leakage (GIDL) effect that results in higher Vt of regular cells of top and bottom WLs.

In such NAND block structure, the tight 1λ-width and 1λ-spacing of all BLe and BLo are laid as metal lines at m1 level in parallel in Y-direction and are perpendicular to all CSLs laid as different metal lines at m0 level (m0 being lower than m1) in X-direction. There is no individual SL line formed for each individual BL for each NAND string.

A method of program and read nLC cells in this conventional NAND array is referred as ABL program and program-verify and read, in which all nLC NAND cells in all strings in each selected physical WLn are programmed and read at same time as an advantage but at expense of 2-fold PB size. One bit of PB is connected to one corresponding bit of nLC cell formed in each physical WLn.

Another method of program and read based on above conventional NAND array is Odd/Even-BL or SBL (Shielded BL) read and program-verify. In this method, only one half of interleaving nLC cells of ½ of all BLs at each physical WLn of either Odd-BL group or Even-BL group are selectively programmed and read at same time with a benefit of just using one-half PB size of the ABL method mentioned earlier. One bit of PB is connected to two bits of nLC cells of two BLs through one Odd/Even column decoder. However, this is not a perfect BL-shielding method as the BL-BL coupling effect still happens, causing penalties of 2-fold latency of read and program-verify operation, 2-fold Vpass and Vread WL gate disturbance to degrade P/E endurance cycle data reliability of NAND products, and 2-fold power consumption of read, program and verify due to 2 times of half-page size access operations. On the other hand, although the ABL method has superior nLC performance and reliability over the Odd/Even-BL approach but it has a penalty of using 2× area size in PB.

In another example, U.S. Pat. No. 5,734,609 disclosed one non-mainstream paired 2D NAND string in which BL node of Even/Odd string is connected in a zigzag way to each corresponding SL node of next adjacent Odd/Even string. Two different metal lines are used for two adjacent BLs in parallel in Y-direction and are fully symmetrical in terms of layout and electric operations. There is no common horizontal SL metal line running in X-direction in each NAND block. Each NAND string is formed to have its individual BL and uses each physically adjacent BL as its individual SL. However, this still is not a perfect SBL scheme to guarantee BL-coupling free operation. Each NAND-string size is larger than the mainstream NAND-string of last example because one extra big 1-poly Depletion-type select transistor is added to the left string and another big Depletion-type NMOS select transistor is added to the right string respectively. These paired Depletion-type NMOS transistors form a pair of Odd and Even select transistors, which are laid out with a bigger channel length and size as the regular Enhancement-type transistor.

In yet another example, U.S. Pat. No. 8,695,943 disclosed a non-mainstream NAND scheme in which BL and SL lines are also laid out in parallel in Y-direction but not connected in a zigzag way between the drain and source nodes of two physically adjacent strings and no horizontal SLs are required. Again, each NAND-string size is formed larger than the one made of the mainstream NAND-string scheme by adding one extra big 2-poly floating-gate device in an even string and a similar big 2-poly floating-gate device in an odd string. Each of these added 2-poly floating-gate devices is laid out with the same big channel length as 1-poly enhancement-type select transistor. The read and verify operations of this NAND string is pretty much same as the last example but with disadvantages of requiring additional erase, program and verification on these large select transistors. Both interleaving BL and SL lines are formed with only one metal layer. As a result, the BL-BL coupling cannot be avoided and the quality and yield of the preferred ABL nLC program would be highly jeopardized.

In yet still another example, U.S. Pat. No. 7,499,329 disclosed another non-mainstream NAND array in which both BL and SL are also laid out in parallel in Y-direction and connected in a zigzag way between the drain and source nodes of two physically adjacent paired strings and each BL line is shared by one paired Odd and Even strings by the proper logic selection of SELECT lines. Both BL and SL lines are formed interleavingly with only one tight-pitch metal layer. Again, the disadvantage of this array is that two extra large 1-poly Enhancement-type select transistors have to be added to each paired strings. As a result, there is no perfect SBL effect and the BL-BL coupling cannot be avoided and the quality and yield of the preferred ABL nLC program would be highly jeopardized.

In summary, there is a strong need to improve those NAND array architectures without common source line (CSL) and without using extra large string-select transistors or any sort and having a plurality of separate BL and SL lines in parallel in the selected NAND block by using adjacent BL as an individual SL biased with an individual $V_{SL}$ to allow the preferred $V_{SL}$-based Vt-compensation to be implemented. Further, it is desired to have a Fine program and an alternating-WL program applied together with the $V_{SL}$-based Vt-offset mixed scheme to be used to make a final narrow-Vtpn program states for more reliable read and verification. As the results, the improvement should allow multi-page concurrent multi-page All-BL (ABL) and All-Vtn-Program (AnP) program but HBL read and HBL program-verify operations to be performed in a same NAND plane for dramatic reduction of latency and power consumption and PB size so that less erroneous reading can be achieved without a need of sophisticate ECC schemes and algorithms.

3. BRIEF SUMMARY OF THE INVENTION

The present invention provides a $V_{SL}$-based individual Vt-compensation scheme for various non-volatile NAND concurrent operations enabled with a preferred NAND memory array having at least two levels of BL-hierarchical structure for greatly improving chip-level performance in read and program speed, power consumption, and the data reliability. Embodiments of the present invention are applicable to NAND in either 2D or 3D setup with advanced high-density TLC or mixed TLC+SLC cells without changing existing NAND transistor layout and process technology.

In the following summarized inventive objectives of the present invention, the reference is made to the accompanying drawings that forms a part hereof, and in which is shown, by way of illustration, specific embodiments in which the disclosure may be practiced. In the drawings, like numerals describe substantially similar components throughout the several views. These embodiments are described in sufficient detail to enable those skilled in the art to practice the embodiments to capture the foundations of the following claimed objectives. Other embodiments may be utilized and structural, logical, and electrical changes may be made without departing from the scope and objectives of the present disclosure. The following detailed objectives, embodiments and descriptions, therefore, not to be taken in a limitation sense.

The preferred NAND memory array is a so-called YUKAI NAND array disclosed in a U.S. patent application Ser. No. 14/806,629 filed on Jul. 22, 2015 by a same inventor of the present invention, which is fully incorporated in this application for references. One of key features of the YUKAI NAND array is that based on a two-level hierarchical structure for global bit line (GBL) and local bit line (LBL) associated with a plurality of NAND strings in each block, each string of NAND cells uses one LBL as its dedicated bit line and one adjacent LBL as its dedicated local source line (LSL) without using a horizontal common SL. This architecture allows an individual $V_{SL}$-based Vt-compensation scheme being implemented in multi-page concurrent Odd/Even-BL TLC as well as MLC and SLC read operation.

Additionally, the present invention provides a technique using ΔVtn-based $V_{LBL}$s for ABL, AnP TLC program scheme on any page of NAND cells having a word line (WLn) with compensations set in accordance with TLC data of adjacent page of NAND cells at WLn+1, regardless of memory cells manufactured in 2D or 3D NAND array technology, formed as 2-poly floating-gate or 1-poly charge-trapping transistor type, and based on PMOS or NMOS NAND cell technology.

In order to fully and individually suppress Yupin coupling effects, $V_{BL}$-compensation technique alone is not enough because for 10 nm-class NAND design the total Yupin effect can exceed 40%, which is too high to use $V_{BL}$-based Vt-offset scheme alone without creating the side-effects of body-effect and punch-through of the accessed NAND cell in read sensing design.

In some embodiments, the present application provides many on-chip pseudo CACHE registers made of plurality of LBL short metal lines or capacitors without taking extra silicon areas to allow multi-page ABL and AnP program, read, and verify operations to be performed in same NAND plane for dramatic power and latency reduction, number of row-decoders and page buffer are also greatly reduced.

In an embodiment, an ABL, AnP, Alt-WL TLC program operation is associated with 8 $V_{LBL}$-compensation and 8 individual $V_{SL}$-based Vt-compensations for a TLC read operation. Several Alt-WL TLC program schemes are disclosed, all starting from an erase state with a negative Vt value in a single wide distribution and an erase-verify voltage of Vtemax≤−2V to 8 final program TLC states with narrow Vt distributions through several program passes. The number of program passes depends on the selection of TLC program scheme.

In a specific embodiment, the TLC program scheme includes a 1-2-8(coarse)-8(fine) TLC program. This is a 3-pass TLC program scheme that starts from one initial erase state, followed by a first-pass (1P) SLC-like 2-state interim program and next by a second-pass (2P) TLC-like 8-state interim coarse program, and ended lastly with a third-pass (3P) of a TLC 8-state final fine program.

In another specific embodiment, the TLC program scheme includes a 1-2-5-8 TLC program. This is a 3-pass TLC program scheme that starts from one initial erase state, followed by a 1P SLC-like 2-state interim program then a 2P MLC-like 5-state interim program, and ended lastly with a 3P TLC 8-state final fine program.

In yet another specific embodiment, the TLC program scheme includes a 1-5-8 TLC program. This is a 2-pass TLC program scheme that starts from one initial erase state, followed by a 1P MLC-like 5-state interim program, then ended lastly with a 2P TLC 8-state final program.

Furthermore, the present invention provides a preferred NAND memory array formed by either 100% full TLC array or a mixed TLC (≥75%) and SLC (≤25%) array including three adjacent TLC WLs for storing eight TLC program states with one SLC WL. The NAND array also includes dummy WLs configured for storing two SLC program states. The dummy WL SLC program is performed before any adjacent TLC program, but each SLC program is allowed to be performed after TLC program being performed in three adjacent TLC WLs. The mixed TLC+SLC NAND array is to allow a plurality of local metal line PCACHE registers to temporarily store three corresponding logic SLC page data per one TLC page data in a superfast speed without taking extra area overhead of the peripheral page buffer during sudden loss of Vdd operation power supply.

In an embodiment, the present invention provides a preferred paired NAND string symmetrical from each string drain node to each string source node in the YUKAI NAND array. Each string having one BL also uses one adjacent BL (associated with its paired string) as its dedicated SL without any common SL line (for all strings in each NAND block). Each paired string includes one top and one bottom large-size string-select transistor and two regular-size dummy NAND cells programmed with complementary Vts to enable Odd/Even-BL string selection and k number of regular NAND memory cells, wherein k=8, 16, 32, 64, 128, 256 or any integer number. In multiple examples in the specification, k=128 is used. The drain connections of Odd/Even NAND strings are conversely the source connections of Even/Odd strings without need of any common SL in WL-direction.

In an embodiment, the present invention further includes all features recited in the YUKAI NAND array incorporated for references by this application. The NAND array is divided (in order from large to small) to a plurality of High (HG), Middle (MG), and Low (LG) groups coupled by m-level hierarchical broken-GBL and broken-LBL metal line structures as pseudo CACHE (PCACHE) capacitors and their associated decoders, page buffer (PB) with real CACHE (RCACHE) register, and the preferred sets of biased conditions for performing NAND array operations, where m is an integer ≥2. Each capacitor size of 1-bit PCACHE is flexibly defined by changing number of broken-LBLs (one $C_{LG}$ per LG) or broken-GBLs (one $C_{HG}$ per HG) connected in accordance with the desired magnitude of capacitance of the desired operations. The definition of N-bit PCACHE register in WL-direction is defined as N-bit 1-page PCACHE register. All broken-LBL-based $C_{LG}$s connected in one MG forms a $C_{MG}$. All broken-GBL-based $C_{HG}$ connected in one column forms a $C_{column}$ of the total capacitance of GBL. Each row of N-bit PCACHE register is further divided into N/2-bit Odd PCACHE register and N/2-bit Even PCACHE register with a least capacitance located within NAND array without taking extra die size to acts as the temporary storage page buffer. Each odd and even $C_{LG}$ is connected to one common precharge power line via one switch transistor gated by $PRE^1e$ or $PRE^1o$ signals. One MG-divider transistor is used to connect a LBL to GBL to allow the independent and concurrent $C_{LG}$ precharge during LBL precharge cycle or concurrent discharge after the precharge or charge-sharing cycle.

For nLC program (n=3 for TLC), each small $C_{LG}$ PCACHE register can be used to temporarily store the desired one of final $2^n$ $V_{LBL}$ voltages after charge-sharing (CS) operations to save precharge-current during nLC program. During the CS operation, two or more $C_{LG}$ PCACHE registers are used to generate the desired $2^n$ analog $V_{LBL}$ voltages and a program-inhibit voltage of ~7V. Some of the analog $V_{LBL}$ voltages are greater than Vdd. But before conducting the nLC program, n bigger $C_{MG}$ PCACHE registers (n=3 for TLC) are used for respectively storing each page of nLC program data. When a program-verify is performed subsequently, the small $C_{LG}$ has to be switched to a bigger $C_{MG}$ that contains the selected block and WL for a secure CS operation between a LBL and a corresponding GBL. $C_{MG}$ PCACHE register now is selected for storing each page of nLC read, program-verify or erase-verify data. In addition, Vinh or Vdd precharge voltage for read and verify operations can be stored in $C_{MG}$s. Further, the largest $C_{HG}$ PCACHE register is configured to store the final sensed cell data after LBL-GBL CS operation which is performed between one selected $C_{MG}$ and a plurality of $C_{HG}$s connected to PB. $C_{HG}$ PCACHE register also is able to store the $C_{MG}$'s Vdd precharge or discharge voltage during read, verify and LBL-GBL CS operations.

In an embodiment, the present invention provides a method of performing multi-page concurrent TLC ABL program by utilizing at least four $C_{MG}$s per one selected $C_{HG}$, especially for those HG groups farthest from the PB. Within one of J selected HGs, six out of L $C_{MG}$s of the $C_{HG}$ are used to store two copies of three original logic-pages TLC program data (MSB, CSB, and LSB pages) and one out of J' $C_{LG}$ in the 7th $C_{MG}$ of the $C_{HG}$ that contains the selected physical page is used as the scratch register to temporarily store an interim TLC program data generated and loaded by the PB during the iterative TLC program and program-verify operations. Since in a subsequent Half-BL (HBL) program-verify operation, a DRAM-like charge-sharing (CS) operation between LBL and GBL will be performed, six big $C_{MG}$ capacitors are preferred to ensure the multi-page concurrent HBL TLC read, recall, and program-verify can be reliably with sufficient detectable signal performed under the CS operation. But for ABL TLC program, 3 to 4 pages of adjacent $C_{LG}$ capacitors will be used in each MG to generate desired $V_{LBL}$ program voltages for TLC program and Vinh program-inhibit voltage under different Vdd operations.

In an alternative embodiment, after the six $C_{MG}$s store the three TLC logic page data (MSB, CSB, and LSB) to make two copies of each bit of the 3-bit TLC digital data to be programmed to the TLC memory cell in the selected page, a series of iterative recall and write-back operations is performed between one or more of the six $C_{MG}$-based PCACHE registers and the PB (and associated real CACHE register) to provide temporary page data in PB for data setting conducted in the seventh $C_{MG}$ during generation of multiple $V_{LBL}$ program/program-inhibit voltages in interim or final TLC program operation. Each recall operation is performed in HBL manner (i.e., Odd/Even-BL) in two cycles. Each cycle is to read N/2-bit stored TLC page data from one of six corresponding N/2-bit $C_{MG}$s to N/2-bit PB by performing HBL destructive CS operation between the $C_{MG}$ and corresponding one or more $C_{HG}$s with N/2-bit stored Vinh/Vss data being diluted down to Vinh/J×L or Vss. In other words, 3 TLC N-bit page data stored in six selected N-bit $C_{MG}$s can be selected to read out, each page data from two CMGs with each containing respectively N/2-bit, sequentially to N-bit PB in 6 consecutive cycles. After each recall operation, due to the destructive charge-sharing, a write-back operation is performed to restore each N-bit digital TLC page data in ABL-manner to two $C_{MG}$s. Write-back operation is like digital data loading, which is sequentially done between N-bit PB and the corresponding N-bit $C_{MG}$ per one iterative cycle by performing a concurrent precharging operation on 6 N-bit $C_{MG}$s with Vinh~7V from respective precharge power lines LBLps and 6 N-bit-based sequential $C_{MG}$ voltage-conversion operations to change data pattern from Vdd/Vss to Vinh/Vss via N-bit PB and up to J $C_{HG}$s, depending on the layout location of the corresponding $C_{MG}$.

In an embodiment, the present invention provides a method of using one small $C_{LG}$ page that contains the selected WLn of a selected block to store one final optimized TLC program voltage page data that includes 8 different $V_{LBL}$s and 1 Vinh being generated by one preferred 3-cap or 4-cap CS operation. The single selected WLn has to be located within one of the selected blocks within the three or four selected LGs involved the CS operation.

In a specific embodiment, the present invention provides a method of using either a 3-cap or 4-cap CS technique to allow each $C_{LG}$ in 3 or 4 connected $C_{LG}$s to be independently precharged with a predetermined voltage so that at least eight optimal $V_{LBL}$s and 1 Vinh for different TLC program schemes can be obtained or to use only 2-cap CS to get desired 2 or 5 $V_{LBL}$ voltages and 1 Vinh. The final desired eight optimal $V_{LBL}$s and 1 Vinh are only kept in one selected $C_{LG}$ page that contains a selected WLn within the selected block. The guidelines of the above preferred $V_{LBL}$s are being set up without using any GBL voltage higher than Vdd from a low-voltage (LV) PB to save power consumption for TLC program and program-verify operation. The preferred one or more of obtained $V_{LBL}$s may be greater than Vdd under a condition of $V_{GBL} \leq$ Vdd to allow the use of a LV PB. With a j-cap CS, the final $V_{LBL} = 1/j \Sigma_1^j V_j$, wherein Vss≤Vj≤Vinh for the preferred j physical pages of $C_{LG}$s and Vinh is ~7V at maximum. For 3-cap CS, j=3 and Vss≤Vj≤Vinh. Similarly, for 4-cap CS, then j=4.

In an embodiment, the present invention provides a technique to allow multiple pages of N-bit $C_{LG}$s to be precharged with Vinh~7V or other desired voltages from the selected local LBLps precharge power lines at the same time or individually precharged at different cycle times to cut the precharge time. After multi-page concurrent ABL TLC program, all voltages in M selected N-bit $C_{LG}$s, M×6 N-bit $C_{MG}$s and N-bit $C_{HG}$s can be simultaneously discharged in 1-cycle through the selected LG circuits in faster speed or in few sequential cycles in slower speed but reducing the peak current by coupling the precharge power lines of LBLps to Vss or other values required for obtaining a desired source line voltage $V_{SL}$ commonly for all strings or individual $V_{SL}$ values for different strings. For a common $V_{SL}$ is used mainly when the individual $V_{SL}$-based Vt-compensation is not needed due to same or nearly same Vt-shift for all TLC cell states except the lowest program-state cell in the selected WLn.

In another specific embodiment, the present invention provides a NAND array structure and method for temporarily storing data or voltages in each $C_{LG}$-based PCACHE or each $C_{MG}$-based PCACHE registers in accordance with each pass of ABL and AnP TLC program under various TLC program schemes. For example, for a SLC-like 2-state 1P program, two $V_{LBL}$ program voltages of 2V (or Vdd) and 0V and one Vinh of ~7V are stored in one selected page of N-bit $C_{LG}$-based PCACHE register. For a TLC 8-state 2P program, seven $V_{LBL}$ program voltages of 0V, 0.5V, 1V, 1.5V, 2V, 2.5V, 3V and one Vinh of ~7V are stored in one selected page of N-bit $C_{LG}$-based PCACHE register. For a MLC-like 5-state 2P' interim program, 4 $V_{LBL}$ program voltages of 0V, 1V, 2V, 2.5V and one Vinh of ~7V are stored in one selected page of N-bit $C_{LG}$-based PCACHE register.

In an alternative specific embodiment, M pages of N-bit TLC cell's interim iterative program-verify data and precharged voltage are concurrently stored in M N-bit $C_{MG}$-based PCACHE registers. In addition, M×6 TLC page digital data of MSB, CSB, and LSB are preferably stored in M×6 $C_{MG}$-based PCACHE registers with Vdd/Vss to Vinh/Vss converted-voltage in ABL manner to save the PB's CACHE size. The converted-voltage data means each LV digital data of Vdd and Vss from each corresponding bit of PB are converted to HV digital data of Vinh and Vss. Similarly, ABL N-bit iterative concurrent TLC erase-verify data are stored in each N-bit $C_{MG}$-based PCACHE registers with preferred conversion of Vdd/Vss digital data pattern to Vinh/Vss digital data pattern for superior CS operation. ABL N-bit TLC read data are concurrently stored in each N-bit $C_{MG}$-based PCACHE registers, with the preferred conversion of Vinh/Vdd to $V_{LBL}$/Vss voltages for superior CS operation. The CS steps between $C_{MG}$ (LBL) and $C_{HG}$ (GBL) for ABL read and ABL verify operations have to be done in two cycles with Odd/Even-BL N/2-bit per cycle to avoid the GBL-GBL AC coupling effect.

In yet another specific embodiment, the present invention provides at least three TLC program schemes comprising a 3-pass 1-2-8(coarse)-8(fine) TLC program scheme, a 3-pass 1-2-5-8 TLC program scheme, and a 2-pass 1-5-8 TLC program scheme. The 3-pass 1-2-8(coarse)-8(fine) TLC program scheme includes 1P SLC-like 2-state interim program and verify operations, 2P TLC 8-state interim coarse program and verify operations, and 3P TLC 8-state final fine program and verify operations. The 3-pass 1-2-5-8 TLC program scheme includes 1P SLC-like 2-state interim program and verify operations, 2P' MLC-like 5-state interim program and verify operations, and 3P'" TLC 8-state final program and verify operations. The 2-pass 1-5-8 TLC program scheme includes 1P MLC-like 5-state interim program and verify operations followed by 2P TLC 8-state final program and verify operations.

In an embodiment, the present invention provides a preferred ABL, AnP, Alt-WL TLC program operation to perform certain passes of TLC program schemes with rotations and sequences among three adjacent WLs. Each pass is an ABL and AnP concurrent program on each selected WL. Each program pass has various numbers of $V_{LBL}$ voltages assigned in accordance with the desired final Vtp differences of all program states. For n-state TLC program, then n−1 $V_{LBL}$s and one Vinh voltage are assigned. Some $V_{LBL}$ voltages are greater than Vdd that cannot be generated from the LV PB. The program-inhibit voltage Vinh is about 7V, which is coupled from each selected local precharge power line LBLps within a precharge unit, rather than from PB via long m3 GBL line to save power consumption.

In another embodiment, the present invention provides a preferred multi-page Odd/Even-BL WLn concurrent program-verify scheme, M WLn being selected from M different blocks associated with M selected PCACHEs in YUKAI NAND array. Specifically for TLC program-verify scheme, it includes using one common $V_{SL}$ for all selected TLC cells source nodes in all M selected WLn, or using 8 or less individual $V_{SL}$ for all selected TLC cells source nodes in accordance with different targeted TLC program states Vtpn in all M selected WLn+1, where M is an integer≤J×L.

In an alternative embodiment, the present invention provides a PB circuit associated with YUKAI NAND memory array, including a Multiplier circuit for amplifying the low sensed $V_{LBL}$ voltage data induced by Odd/Even-BL DRAM-like CS operation between the selected N/2-bit $C_{MG}$ and N/2-bit $C_{HG}$s from each corresponding $C_{LBL}$ in a selected segment of the NAND memory array, a DRAM-like sense amplifier using charge-sharing technique to sense TLC data in accordance with Vtpn, a $V_{LBL}$ (<Vdd−Vt) analog voltage generation circuit for ABL simultaneous program, a D/A converter, a A/D converter, and a real $N_2$-bit CACHE (RCACHE) register to temporarily store 3 pages of N-bit TLC bit data in $N/N_2$ sequential cycles.

In an embodiment, the present invention provides a preferred TLC+SLC mixed NAND block within the YUKAI NAND array, including a plurality of 4-WL units with each 4-WL unit having at least three adjacent WLs with all TLC cells with one adjacent WL with SLC cells, thereby resulting in 75% TLC-occupancy percentage of whole NAND array.

In another embodiment, the two Odd/Even complementary dummy WLs in each block can be electrically treated as two extra but free SLC WLs in the mixed TLC+SLC 2D hierarchical NAND array to further reduce two SLC WLs for all strings in a block. As such, these two Odd/Even dummy WLs should be physically split into two separated 4-WL TLC+SLC units. For example, two 4-WL units are formed with 3 consecutive TLC-WLs and 1 Odd/Even SLC-WL per unit. Thus, the program and program-verify operation of these two Odd/Even dummy WL cells should be same as the regular SLC cells in this mixed SLC+TLC NAND array.

In another embodiment, the two dummy WLs placed at both ends of each NAND string in each block can be electrically treated as two extra but free SLC WLs in the preferred TLC+SLC mixed 2D hierarchical NAND array. As such these two dummy WLs should be physically placed at top 4-WL unit below SSL1 line with an order of 1 dummy WL and 3 TLC-WLs and bottom 4-WL unit with a reverse order of 3 TLC-WLs and 1 dummy WL. Thus, the program and program-verify operation of these two dummy WLs cells should be same as the regular SLC cells in this mixed SLC+TLC array.

In yet another embodiment, the present invention further discloses that the SLC-WL cells are configured to quickly store PB data from external off-chip DRAM CACHE registers when power supply of Vdd is suddenly removed. For this mixed TLC+SLC NAND array, a batch-base concurrent SLC program and program-verify on multiple selected SLC WLs can be performed to reduce the latency. The M pages off-chip DRAM N-bit digital data can be sequentially loaded in M corresponding N-bit PCACHE registers in M dispersed LGs distributed among multiple MGs and HGs of the mixed TLC+SLC NAND array first and then performed an ABL multi-page concurrent N-bit SLC program on M selected SLC WLs in M 4-WL units without increasing the PB sizes in peripheral area to reduce the die sizes and program speed and need of a costly super-large Vdd capacitors to store the Vdd voltage for preparing a sudden power down. After Vdd being powered up again, the M pages of stored SLC data in M SLC-WLs in M 4-WL units can be concurrently programmed into the desired TLC in background program. In one or more embodiments, multiple SLC WL cells can be performed multiple TLC WLs on the same time to reduce the latency and power consumption.

In following description, when N-bit is referred, it means that total 16 KB physical NAND cells in 16 KB LBL lines residing in one physical WL or page not including the additional syndrome ECC bytes. In this application, N-bit means a full physical WL page of 16 KB cells. Thereby, N/2-bit means 8 KB which is ½ of one full physical page or ½ WL size storing 8 KB regular NAND cells. 16 KB and N-bit or 8 KB and N/2-bit are alternately used in this description and should be treated as the same. As explained later, each short LBL line is associated with a $C_{LBL}$ capacitor and is also referred as one local LG metal1 or metal2 line (m1 or m2) or one local broken-LBL metal1 (m1) or metal2 (m2) line in a LG referred as $C_{LG}$ capacitor or $C_{LG}$-based PCACHE register. Each LG includes H NAND blocks, which are connected in LBL-direction by 16 KB m1 and 16 KB m2 LBL lines with 1λ width and 1λ spacing with special layout technique to attain the full LBL shielding effect to allow the preferred ABL program and program-inhibit operations without LBL-LBL AC coupling effect.

Many advantages and benefits can be achieved by applications of the present invention to improve performance of NAND-based NVM flash memory devices. In particular, a main advantage lies in substantial improvement of all areas of mainstream nLC NAND designs by up to M-fold, particularly in 10 nm-class NAND design, regardless of 2D or 3D NAND manufacturing technologies. Further, it provides a BL-hierarchical NAND flash TLC design without any requirement to change existing NAND cell structure and its associated manufacturing process and technology so that a quick adoption, implementation, and verification can be achieved. The so-called multi-page nLC ABL operation to allow M WLs from M blocks to be programmed concurrently in ABL manner and to be read and verified concurrently in two cycles within same plane, regardless of SLC type cells, MLC type cells, or TLC type of cells or mixed TLC+SLC cells in each block. In addition to the power and latency M-fold or more reduction in erase-verify, read, program and program-verify operations, an individual $V_{SL}$-based Vt-offset for both read and verify operations can be provided with up to 8 desired Vt-compensations to provide dramatic improvement of TLC data integrity and reliability.

4. BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

FIG. 5A is a table showing a preferred ABL, AnP, and Alt-WL program scheme with alternate WL rotations and sequences for performing multi-passes TLC program operations according to an embodiment of the present invention.

FIG. 5B is a table showing a preferred ABL, AnP, and Alt-WL program scheme with alternate WL rotations and sequences for performing multi-passes TLC program operations according to another embodiment of the present invention.

FIG. 7G is a diagram showing Vt distributions, shifting, verify and widened voltages for TLC operations of NAND memory cells with a boundary WLn+3 with next adjacent WLn+4 in a 3P" program in association with a preferred 1-2-5-8 TLC program scheme according to another embodiment of the present invention.

FIG. 7H is a diagram showing Vt distributions, shifting, verify and widened voltages for TLC operations of NAND memory cells with a boundary WLn+3 with next adjacent WLn+4 in an alternative 3P"' program in association with a preferred 1-2-5-8 TLC program scheme according to another embodiment of the present invention.

FIG. 8A is a table showing preferred two $V_{LBL}$ program voltages and one program-inhibit voltage of Vinh assigned for a 1P 2-state SLC-like 1P program within TLC program according to an embodiment of the present invention.

FIG. 8B is a table showing preferred 7 $V_{LBL}$ program voltages and one program-inhibit voltage of Vinh assigned for a 2P MLC program within a 1-2-8-8 TLC program scheme according to an embodiment of the present invention.

FIG. 8C is a table showing one set of preferred 5 $V_{LBL}$ program voltages and one program-inhibit voltage of Vinh assigned for a 2P MLC-like program within a 1-2-5-8 TLC program scheme according to an embodiment of the present invention.

FIG. 8D is a table showing 8 sets of preferred 8 $V_{LBL}$ program voltages and one program-inhibit voltage of Vinh assigned for a 3P TLC program within a 1-2-8-8 TLC program scheme with compensation according to an embodiment of the present invention.

FIG. 8E is a table showing 8 sets of preferred 8 $V_{LBL}$ program voltages and one program-inhibit voltage of Vinh assigned for a 3P"' TLC program within a 1-2-5-8 TLC program scheme with compensation according to an embodiment of the present invention.

FIG. 8F is a table showing 8 sets of preferred 8 $V_{LBL}$ program voltages and one program-inhibit voltage of Vinh assigned for a 3P"' TLC program within a 1-2-5-8 TLC program scheme with compensation according to an embodiment of the present invention.

FIG. 8G is a table showing an example of generating several sets of 8 desired $V_{LBL}$ voltages and one program-inhibit voltage per each pass (1P, 2P, 2P', 3P and 3P"') of ABL, AnP, and Alt-WL TLC program in WLn cells with individual compensations from adjacent WLn+1 cells subjecting to 3-cap CS operations according to an embodiment of the present invention.

FIG. 8H is a table showing an example of generating several sets of 8 desired $V_{LBL}$ voltages and one program-inhibit voltage per each pass (1P, 2P, 2P', 3P and 3P"') of ABL, AnP, and Alt-WL TLC program in WLn cells with individual compensations from adjacent WLn+1 cells subjecting to 4-cap CS operations according to another embodiment of the present invention.

FIG. 8I is a table showing preferred $V_{FY}$ program-verify voltages on select WLn with individual $V_{SL}$ Vt-offset voltages on each select BLn's source nodes in accordance with the each pass of TLC interim and final program states under 1-2-8(coarse)-8(fine) TLC program scheme according to an embodiment of the present invention.

FIG. 8J is a table showing preferred $V_{FY}$ program-verify voltages on select WLn with individual $V_{SL}$ Vt-offset voltages on each select BLn's source nodes in accordance with the each pass of TLC interim and final program states under 1-2-5-8 TLC program scheme according to an embodiment of the present invention.

FIG. 8K is a table showing preferred 8 VRn read voltages and one common $V_{SL}$=0V on those non-boundary WL cells without Vt-offset when next boundary WLn+3 cells are programmed with TLC data according to an embodiment of the present invention.

FIG. 8L is a table showing preferred 8 VRn read voltages and one common $V_{SL}$=0V on those boundary WLn+3 cells without Vt-offset when next boundary WLn+4 cells are not programmed with TLC data but in $E^0$-state according to an embodiment of the present invention.

FIG. 8M is a table showing preferred 8 VRn read voltages and one common $V_{SL}$=0V on those boundary WLn+3 cells without Vt-offset when next boundary WLn+4 cells are programmed with TLC data according to another embodiment of the present invention.

FIGS. 10A, 10B, and 10C are diagrams respectively showing preferred sets of bias conditions for performing consecutive three steps of All-BL erase operation on multi-blocks for both regular NAND memory cells and dummy cells according to an embodiment of the present invention.

FIGS. 10D, 10E, and 10F are diagrams showing preferred sets of the bias conditions respectively for three steps of Even dummy-cell erase-verify operation according to an embodiment of the present invention.

FIGS. 11A, 11B, and 11C are diagrams showing preferred bias conditions respectively for three steps of Even dummy-cell program operation according to an embodiment of the present invention.

FIGS. 11D, 11E, and 11F are diagrams showing preferred bias conditions respectively for three steps of Odd dummy-cell program operation according to an embodiment of the present invention.

FIGS. 11G, 11H, and 11I are diagrams showing respective steps to perform concurrent precharge, concurrent discharge and concurrent program-verify for Even dummy cells according to an embodiment of the present invention.

FIGS. 11J, 11K, and 11L are diagrams respective steps to perform concurrent precharge, concurrent discharge and concurrent program-verify for Odd dummy cells according to an embodiment of the present invention.

FIGS. 11M, 11N, and 11O are diagrams showing respective steps to further perform concurrent precharge, concurrent discharge and concurrent erase-verify for selected regular cells in Even strings in selected blocks after successful program operation for Odd and Even dummy cells according to an embodiment of the present invention.

FIGS. 11P, 11Q, and 11R are diagrams showing respective steps to further perform concurrent precharge, concurrent discharge and concurrent erase-verify for selected regular cells in Odd strings in selected blocks after successful program operation for Odd and Even dummy cells according to an embodiment of the present invention.

FIGS. 12A, 11B, and 11C are diagrams showing respective sets of bias conditions for performing ABL and AnP coarse and fine TLC program operations according to an embodiment of the present invention.

FIGS. 12D, 12E, and 12F are diagrams showing respective sets of bias conditions for performing Even/Odd-BL and AnP TLC concurrent program-verify operations according to an embodiment of the present invention.

FIGS. 13A, 13B, and 13C are diagrams showing respective sets of bias conditions for performing Even-BL TLC concurrent read operation for non-boundary and boundary WL regular cells programmed within 1-2-8(coarse)-8(fine) TLC program scheme and for non-boundary WL cells programmed within 1-2-5-8 TLC program scheme according to an embodiment of the present invention.

Figure 13D:
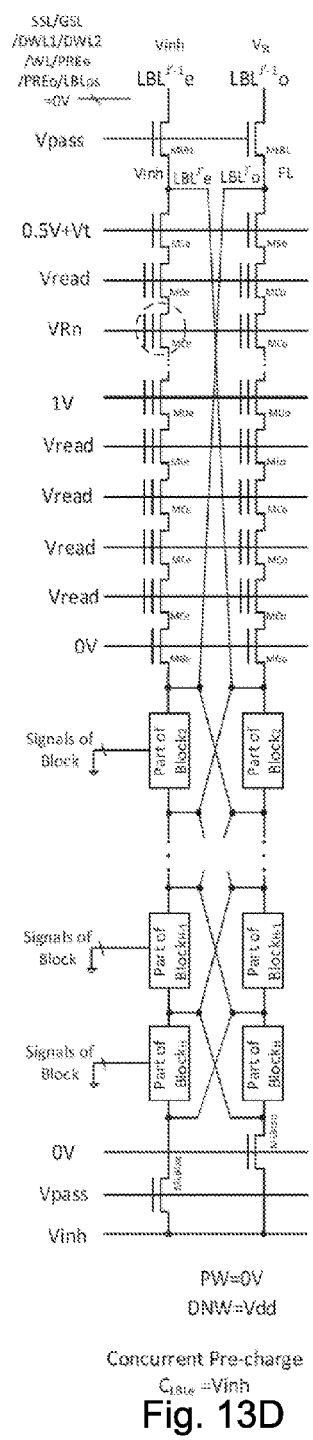
Figure 13E:
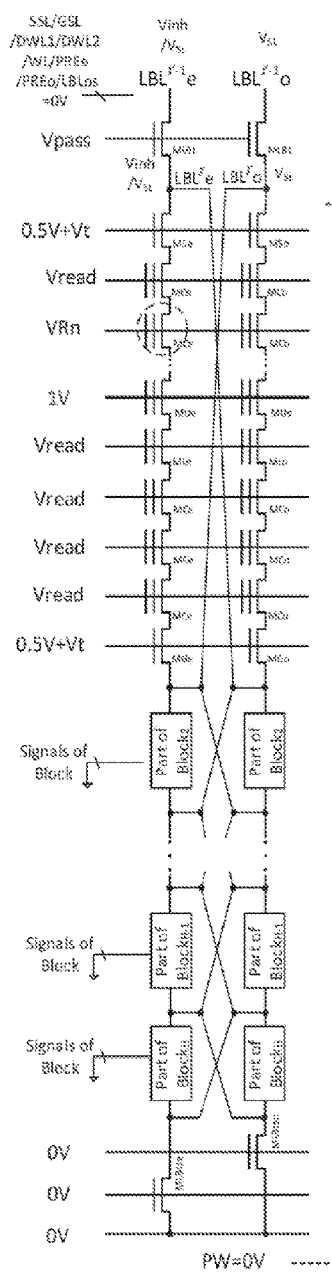
Figure 13F:
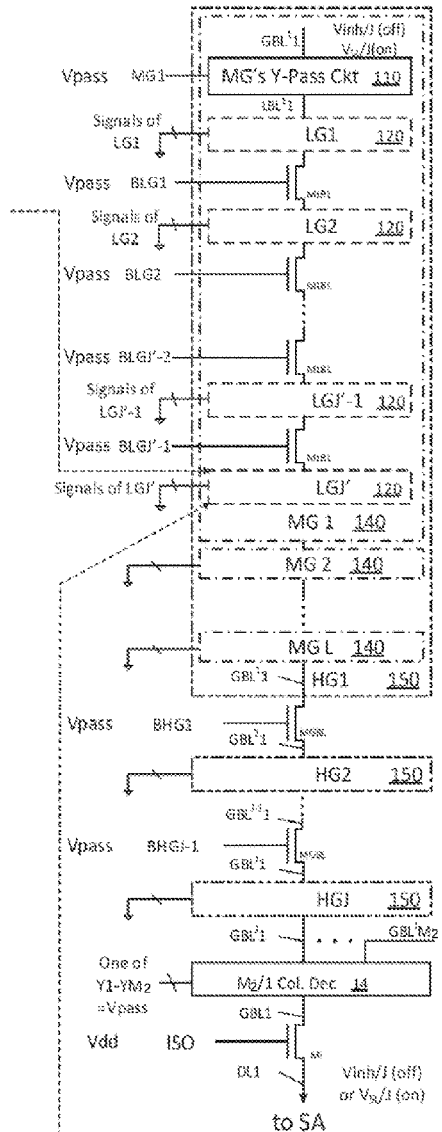

FIGS. 13D, 13E, and 13F are diagrams showing respective sets of bias conditions for performing same Even-LBL concurrent read operation from boundary WL cells programmed within 1-2-5-8 TLC program scheme according to an embodiment of the present invention.

FIG. 14A shows a preferred ABL, AnP, and Alt-WL TLC program sequence starting from a dummy WL to second boundary WLn+3 with WLn+4 cells stayed in $E^0$-state because its TLC page data is not ready and WLn+3 being programmed with 1P and 2P to full 8 TLC states under 1-5-8 TLC program scheme according to an embodiment of the present invention.

FIG. 14B shows a preferred ABL, AnP, and Alt-WL TLC program sequence further from WLn+3 to WLn+7 and beyond whenever WLn+4 TLC data is ready to be programmed with 1P and 2P under 1-5-8 TLC scheme according to an embodiment of the present invention.

FIG. 14C shows an alternate ABL, AnP, and Alt-WL TLC program sequence from WLn+3 to WLn+7 and beyond with WLn+3 cells being programmed with TLC data and are pre-read to allow FP before WLn+4 cells changing from $E^0$-state to TLC states by 1P and 2P programs under 1-5-8 TLC scheme according to an embodiment of the present invention.

FIG. 15A is a diagram showing Vt distributions, shifting, verify and widened voltages for TLC operations of dummy cells in erase, SLC-like program, and read in association with 1-5-8 TLC program scheme according to an embodiment of the present invention.

Figure 15B:
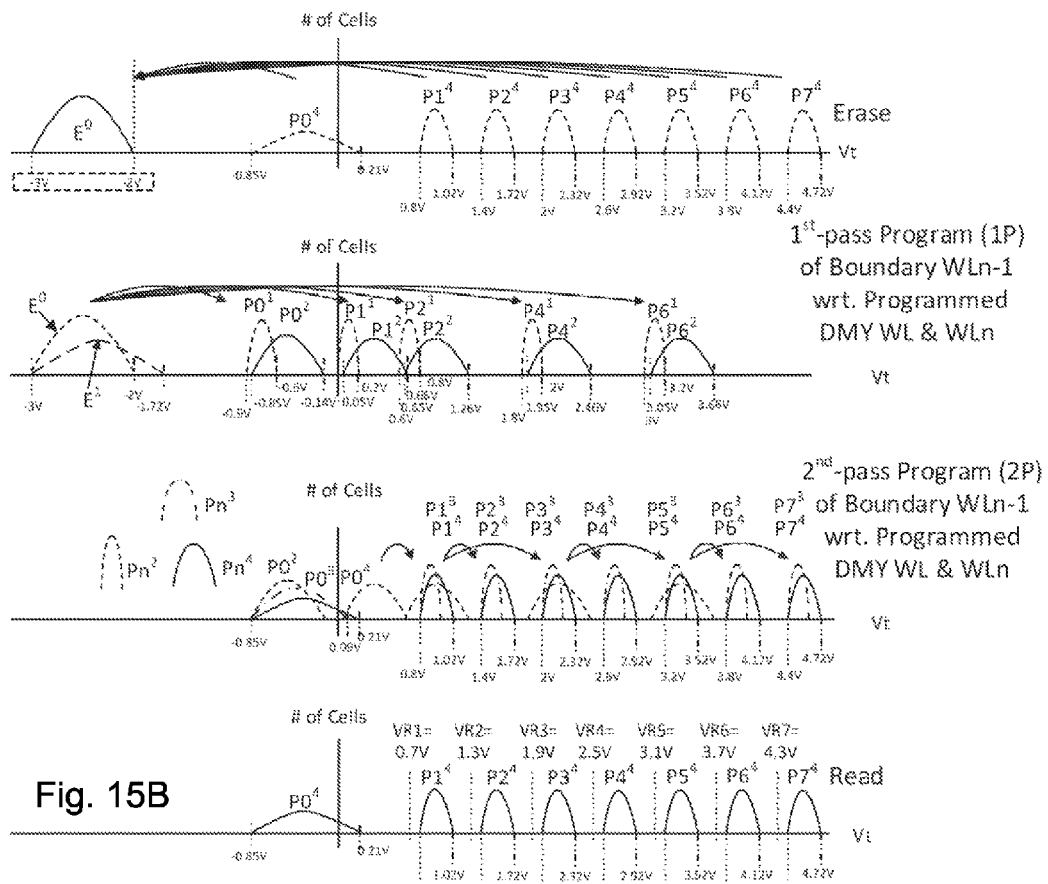

FIG. 15B is a diagram showing Vt distributions, shifting, verify and widened voltages for TLC operations of NAND memory cells in first boundary WLn-1 with adjacent dummy WL and non-boundary WLn being under 1-5-8 TLC program scheme according to an embodiment of the present invention.

Figure 15C:
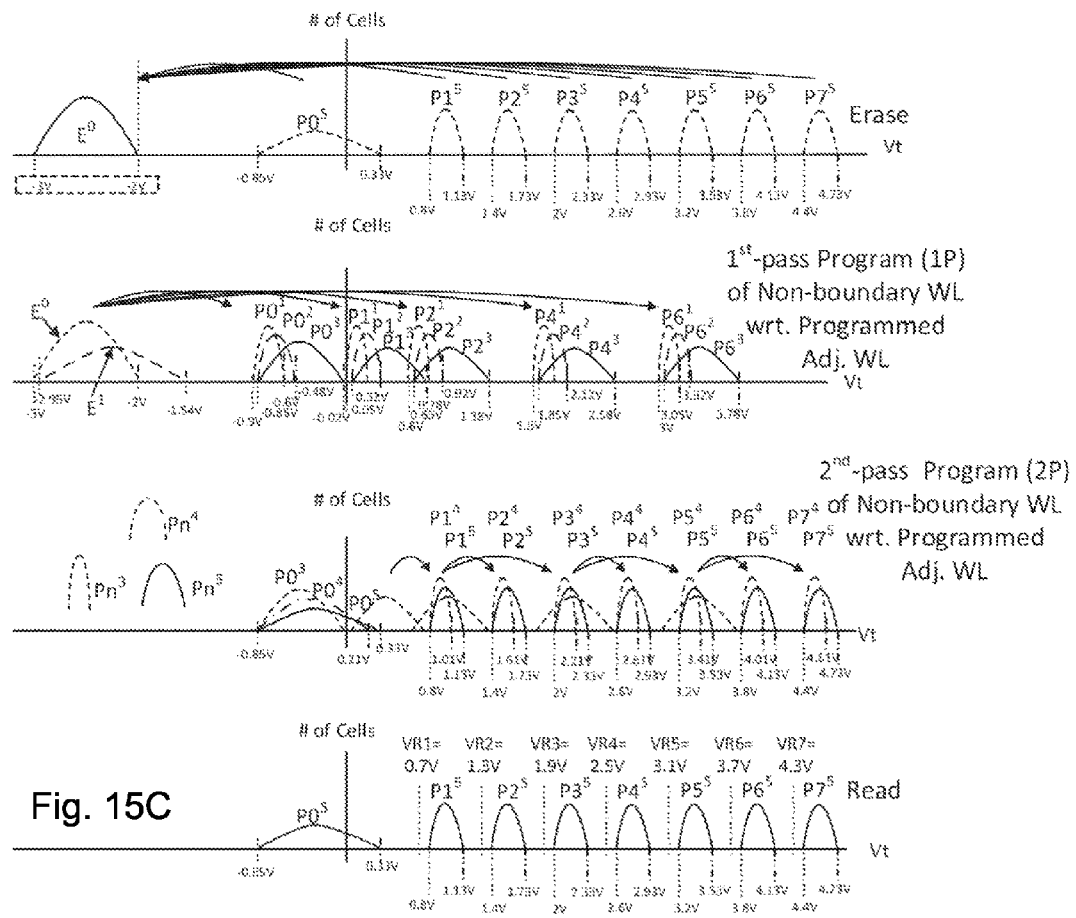

FIG. 15C is a diagram showing Vt distributions, shifting, verify and widened voltages for TLC operations of NAND memory cells in non-boundary WLs with adjacent WL programmed under 1-5-8 TLC program scheme for according to an embodiment of the present invention.

Figure 15D:
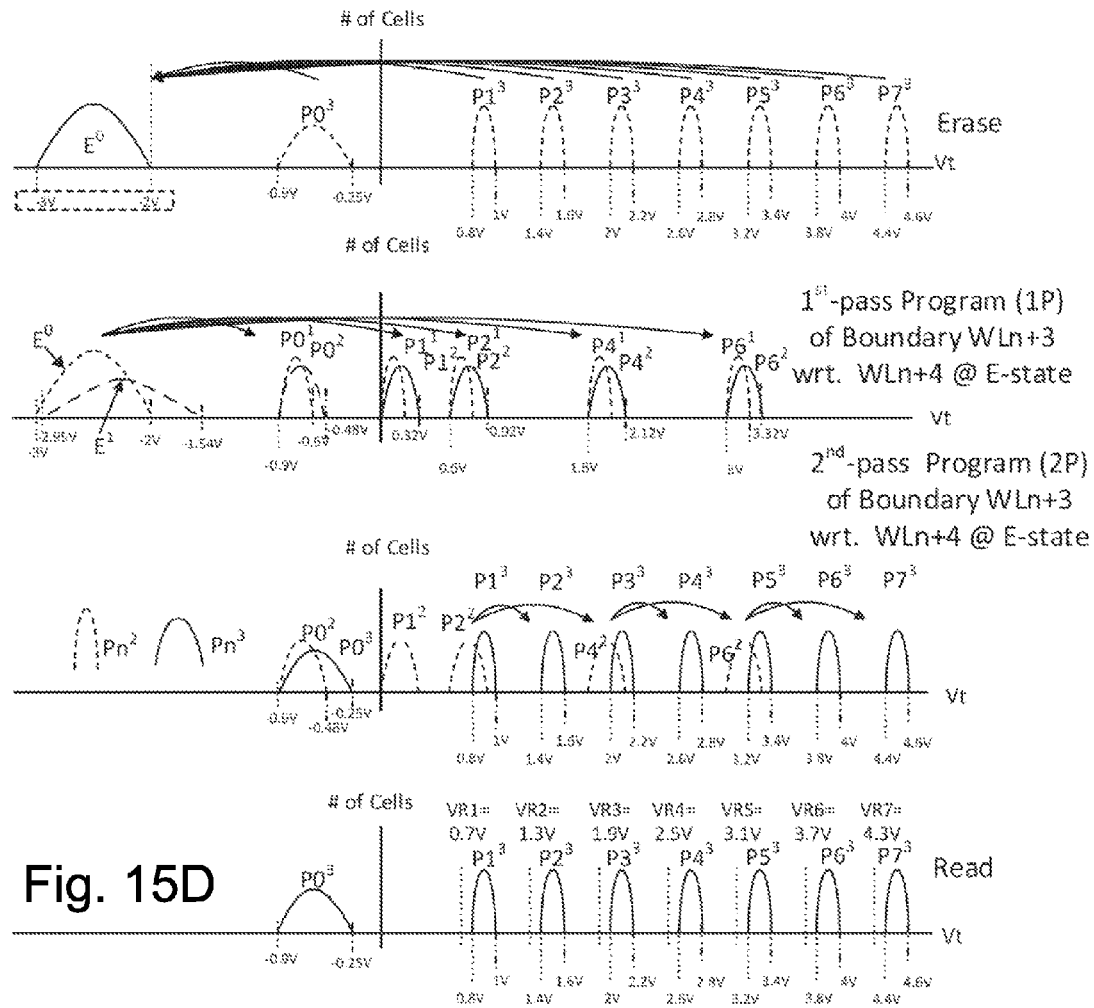

FIG. 15D is a diagram showing Vt distributions, shifting, verify and widened voltages for TLC operations of NAND memory cells in second boundary WLn+3 with next WLn+4 cells being at E-state under 1-5-8 TLC program scheme according to an embodiment of the present invention.

Figure 15E:
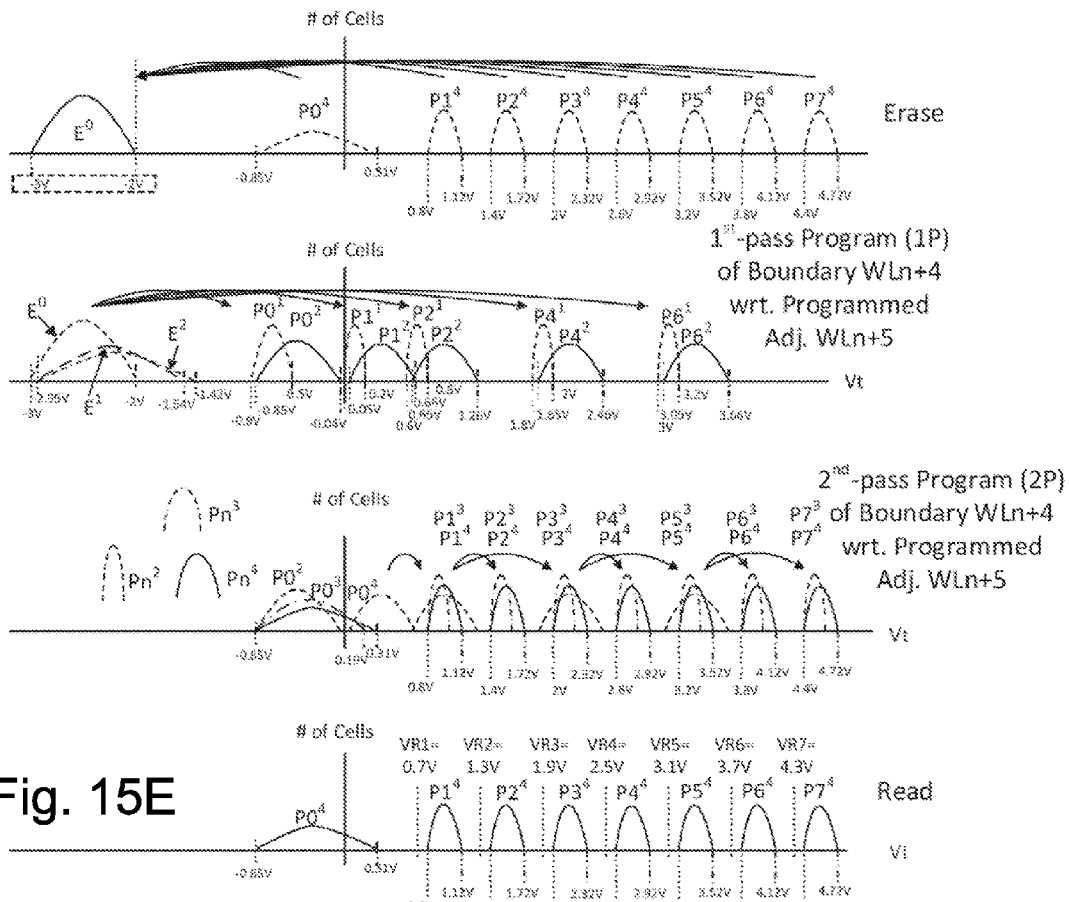

FIG. 15E is a diagram showing Vt distributions, shifting, verify and widened voltages for TLC operations of NAND memory cells in boundary WLn+4 with adjacent WLn+5 cells being programmed TLC data under 1-5-8 TLC program scheme according to an embodiment of the present invention.

Figure 15F:
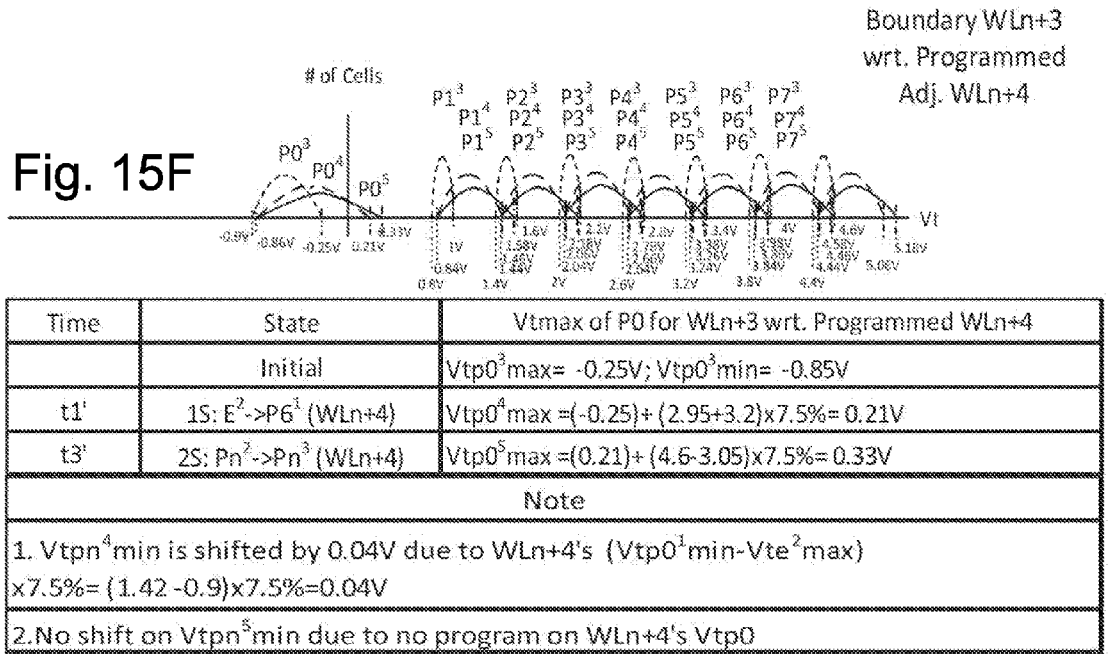

FIG. 15F is a diagram showing preferred 8-state TLC read operation on boundary WLn+3 cells without including $V_{SL}$=0V with respect to WLn+4 cells being program with TLC data under 1-5-8 TLC program scheme according to an embodiment of the present invention.

Figure 15G:
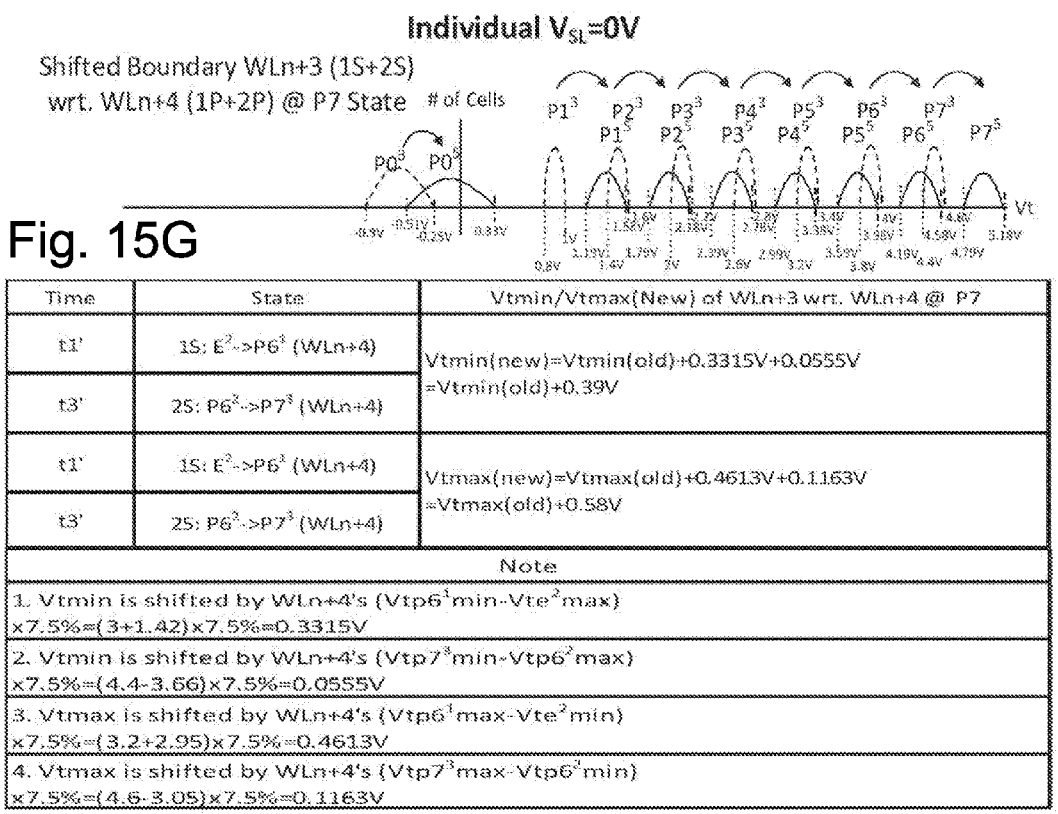

FIG. 15G is a diagram showing preferred 8-state TLC read operation on boundary WLn+3 cells with $V_{SL}$=0V and with respect to WLn+4 TLC cells being in P7 state under 1-5-8 TLC program scheme according to an embodiment of the present invention.

FIG. 15H is a diagram showing preferred 8-state TLC read operation on boundary WLn+3 cells with negligible $V_{SL}$=0.05V and with WLn+4 TLC cells being in P6 state under 1-5-8 TLC program scheme according to an embodiment of the present invention.

FIG. 15I is a diagram showing preferred 8-state TLC read operation on boundary WLn+3 cells with $V_{SL}$=0.1V and with WLn+4 TLC cells being in P5 state under 1-5-8 TLC program scheme according to an embodiment of the present invention.

FIG. 15J is a diagram showing preferred 8-state TLC read operation on boundary WLn+3 cells with $V_{SL}$=0.14V and with WLn+4 TLC cells being in P4 state under 1-5-8 TLC program scheme according to an embodiment of the present invention.

FIG. 15K is a diagram showing preferred 8-state TLC read operation on boundary WLn+3 cells with $V_{SL}$=0.18V and with WLn+4 TLC cells being in P3 state under 1-5-8 TLC program scheme according to an embodiment of the present invention.

FIG. 15L is a diagram showing preferred 8-state TLC read operation on boundary WLn+3 cells with $V_{SL}$=0.23V and with WLn+4 TLC cells being in P2 state under 1-5-8 TLC program scheme according to an embodiment of the present invention.

FIG. 15M is a diagram showing preferred 8-state TLC read operation on boundary WLn+3 cells with $V_{SL}$=0.27V and with WLn+4 TLC cells being in P1 state under 1-5-8 TLC program scheme according to an embodiment of the present invention.

FIG. 15N is a diagram showing preferred 8-state TLC read operation on boundary WLn+3 cells with $V_{SL}$=0.35 V and with WLn+4 TLC cells being in P0 state under 1-5-8 TLC program scheme according to an embodiment of the present invention.

FIG. 15O summarizes a preferred 8 final TLC states on boundary WLn+3 cells with Vt width=0.39V and Vt-gap=0.21V after applying 8 individual $V_{SL}$ compensations under 1-5-8 TLC program scheme according to an embodiment of the present invention.

Figure 16A:
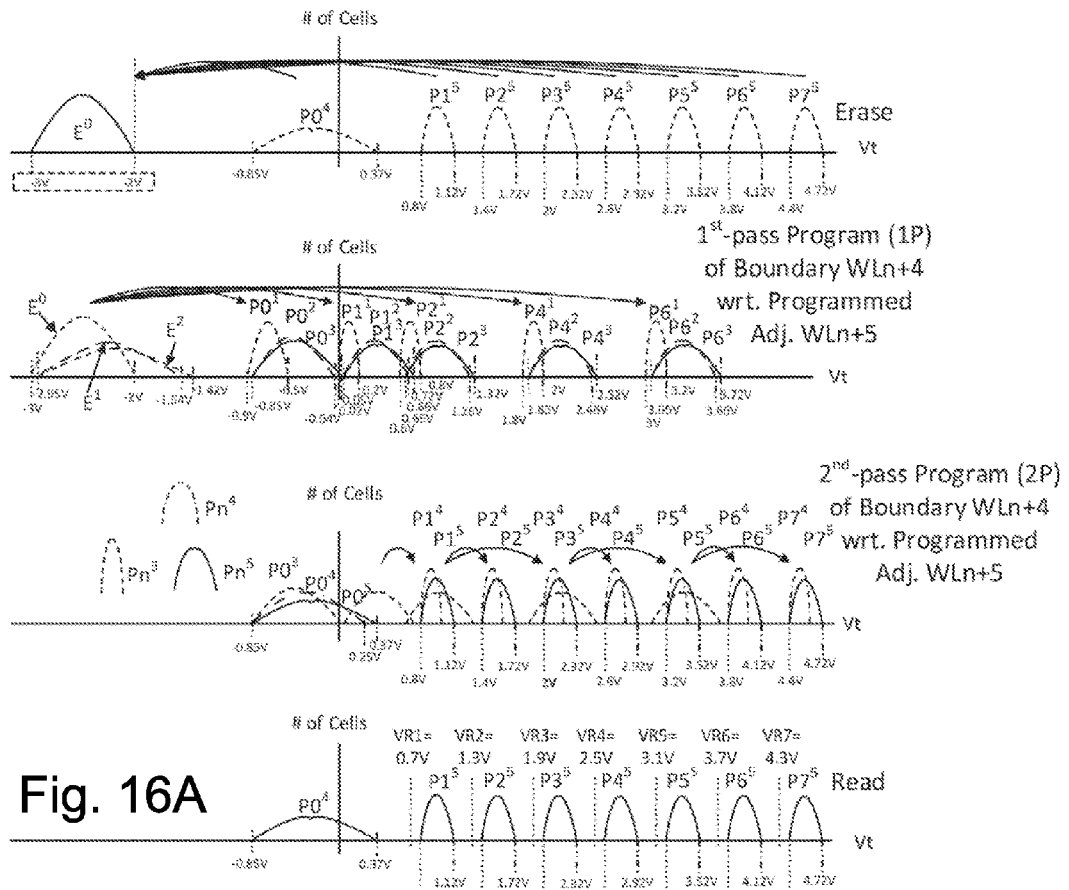

FIG. 16A is a diagram showing Vt distributions, shifting, verify and widened voltages for TLC operations of new boundary WLn+4 cells under 1-5-8 TLC program scheme with next WLn+5 cells being also programmed with TLC data according to an embodiment of the present invention.

Figure 16B:
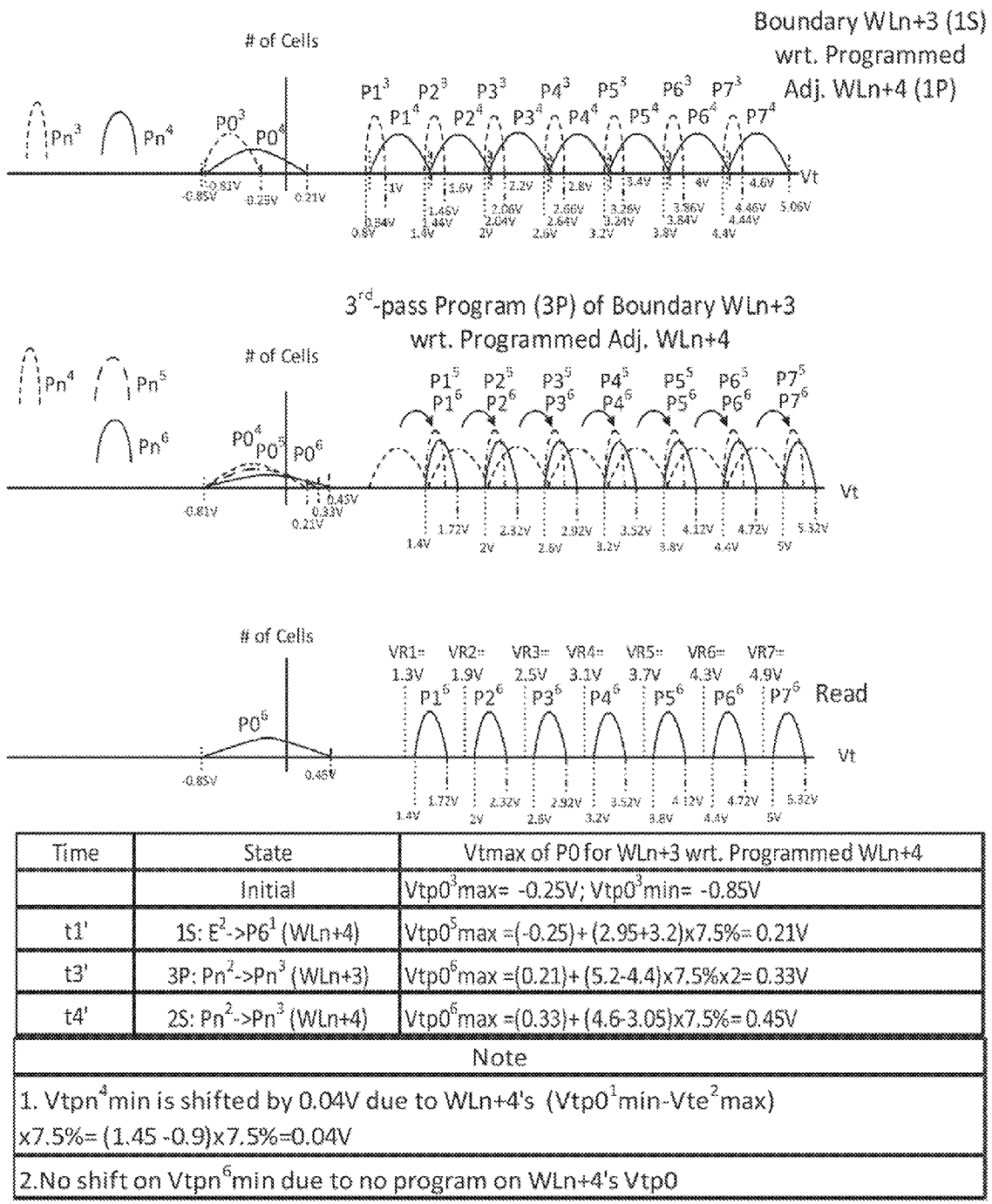

FIG. 16B is a diagram showing Vt distributions, shifting, verify and widened voltages for TLC operations of boundary WLn+3 cells being programmed with TLC data and pre-read to allow a fine program (FP) before 1P and 2P programs on WLn+4 cells by under 1-5-8 TLC program scheme according to an embodiment of the present invention.

Figures 16C, 17A, 17C:
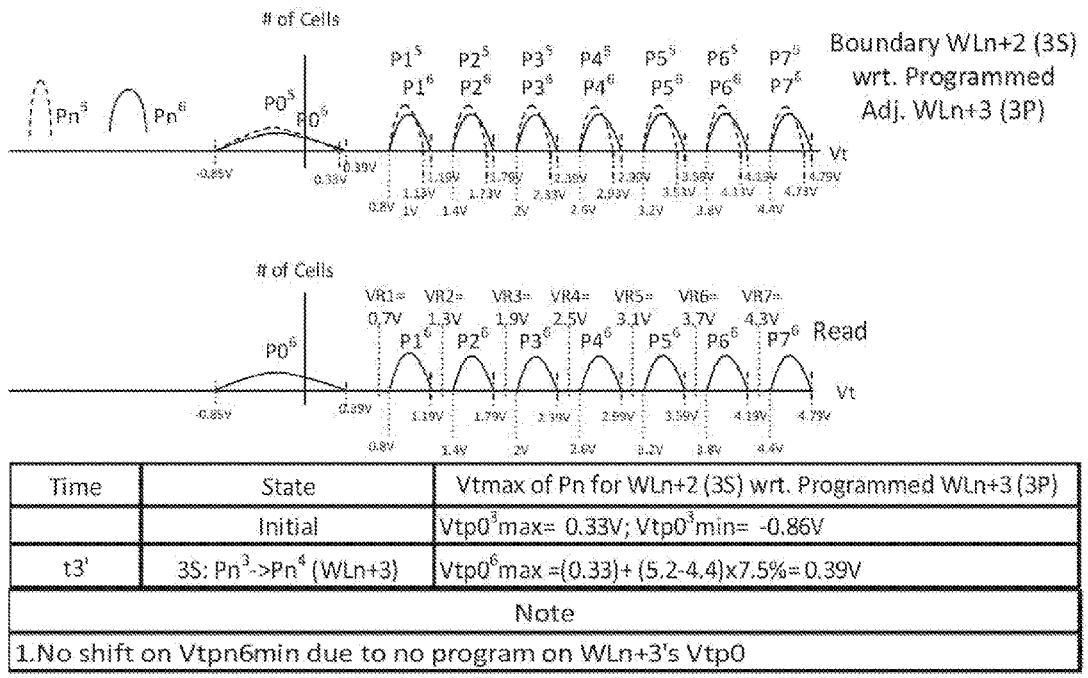

FIG. 16C is a diagram showing Vt distributions, shifting, verify and widened voltages for TLC operations of non-boundary WLn+2 cells before and after WLn+3 cells 3P program under 1-5-8 TLC program scheme according to an embodiment of the present invention.

FIG. 17A shows a set of preferred 5 $V_{LBL}$ program voltages and one Vinh program-inhibit voltage assigned for a 1P MLC-like program to generate 5 interim states under 1-5-8 TLC program scheme according to an embodiment of the present invention.

FIG. 17B shows 8 sets of preferred 8 $V_{LBL}$ program voltages and one Vinh program-inhibit voltage assigned for a 2P program to generate 8 states under 1-5-8 TLC program scheme with $V_{LBL}$ compensation according to an embodiment of the present invention.

FIG. 17C shows a set of preferred 8 $V_{LBL}$ program voltages and one Vinh program-inhibit voltage assigned for a 3P program under 1-5-8 TLC program scheme with $V_{LBL}$ compensation according to an embodiment of the present invention.

FIG. 17D shows an example of generating several sets of 8 desired $V_{LBL}$ voltages and one program-inhibit voltage for both 1P and 2P of 1-5-8 TLC program for either boundary and non-boundary WLn cells with or without individual $V_{LBL}$ compensations from adjacent WLn+1 programmed cells subjecting to 3-cap CS operations according to an embodiment of the present invention.

FIG. 17E shows a preferred method of using 4-cap CS to calculate all desired $V_{LBL}$ voltages in accordance with programmed Vt differences of 1P, 2P and 3P under 1-5-8 TLC program scheme and a minimum Vdd of 1.6V according to an embodiment of the present invention.

FIG. 17F shows 3 preferred sets of $V_{FY}$ program-verify voltages on selected WL with or without the individual $V_{SL}$ Vt-offset for respective 1P, 2P, and 3P programs under 1-5-8 TLC program scheme according to an embodiment of the present invention.

FIG. 17G shows preferred 7 VRn read voltages and $V_{SL}$ voltages for TLC read of non-boundary WLs (WLn–1~WLn+2) with respect to the programmed adjacent WLn without using $V_{SL}$-based Vt-offset under 1-5-8 TLC program scheme according to an embodiment of the present invention.

FIG. 17H shows preferred 7 VRn read voltages and $V_{SL}$ voltages for TLC read of boundary WLn+3 cells programmed under 1-5-8 TLC program scheme with respect to adjacent WLn+4 cells being in E state without using $V_{SL}$-based Vt-offset according to an embodiment of the present invention.

FIG. 17I shows preferred 7 VRn read voltages for TLC read of boundary WLn+3 cells with 8 sets of 7 individual $V_{SL}$ compensations in accordance with 8 different TLC program states stored in the adjacent WLn+4 cells according to an embodiment of the present invention.

Figures 17J, 18A:
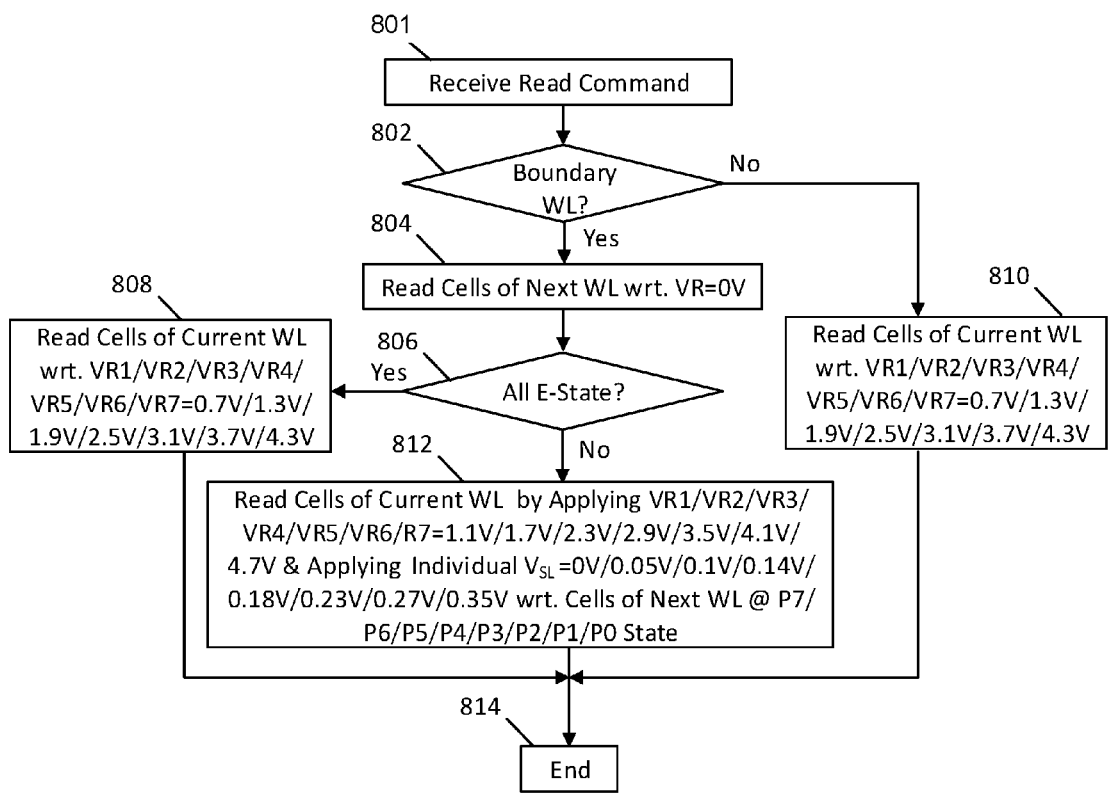

FIG. 17J shows preferred 7 VRn read voltages and $V_{SL}$ voltages for TLC read of boundary WLn+3 cells programmed under 1-5-8 TLC program scheme with respect to adjacent WLn+4 cells being in TLC programmed states without including $V_{SL}$-based Vt-offset according to an embodiment of the present invention.

FIG. 18A is a flow chart of a preferred TLC read operation for both boundary and non-boundary WL cells under 1-5-8 TLC program scheme according to an embodiment of the present invention.

Figure 18B:
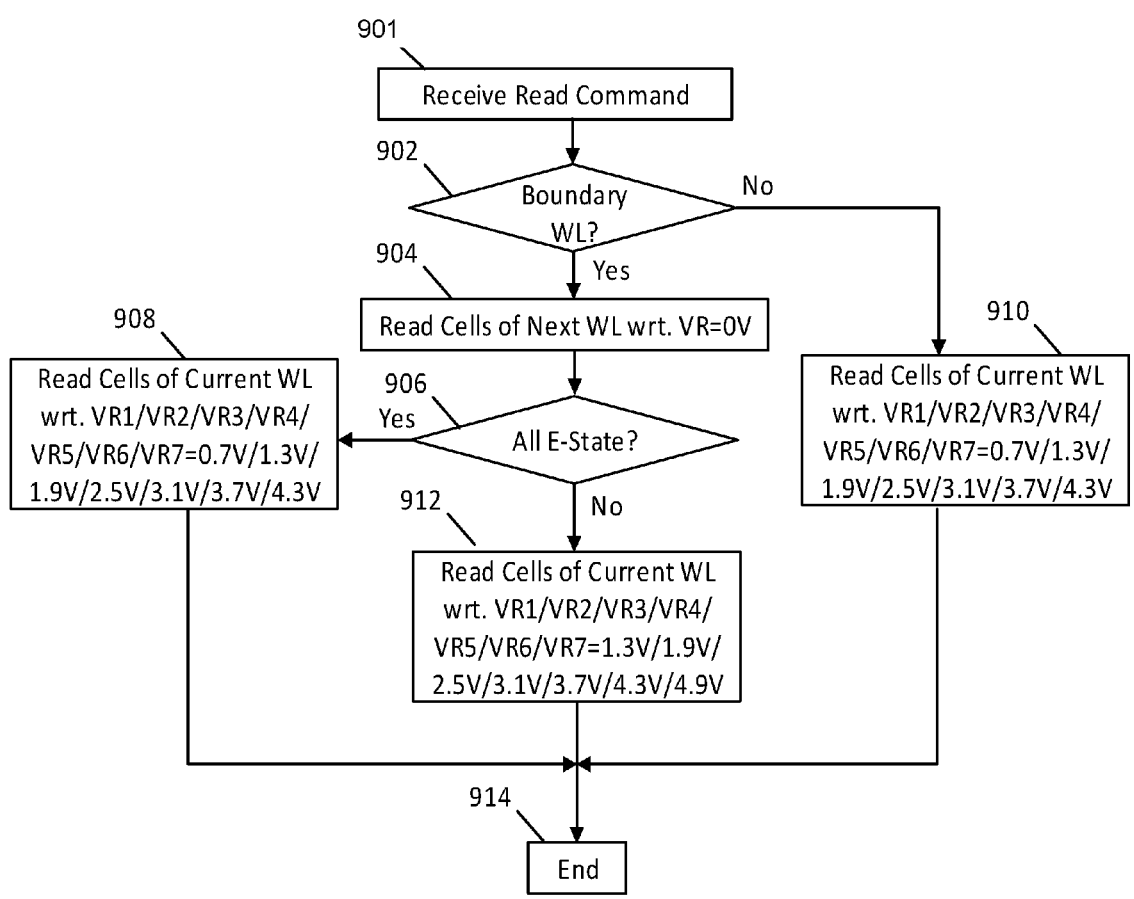

FIG. 18B is a flow chart of a preferred TLC read operation for both boundary and non-boundary WL cells under 1-5-8 TLC program scheme plus a 3P program according to an embodiment of the present invention.

Figure 19A:
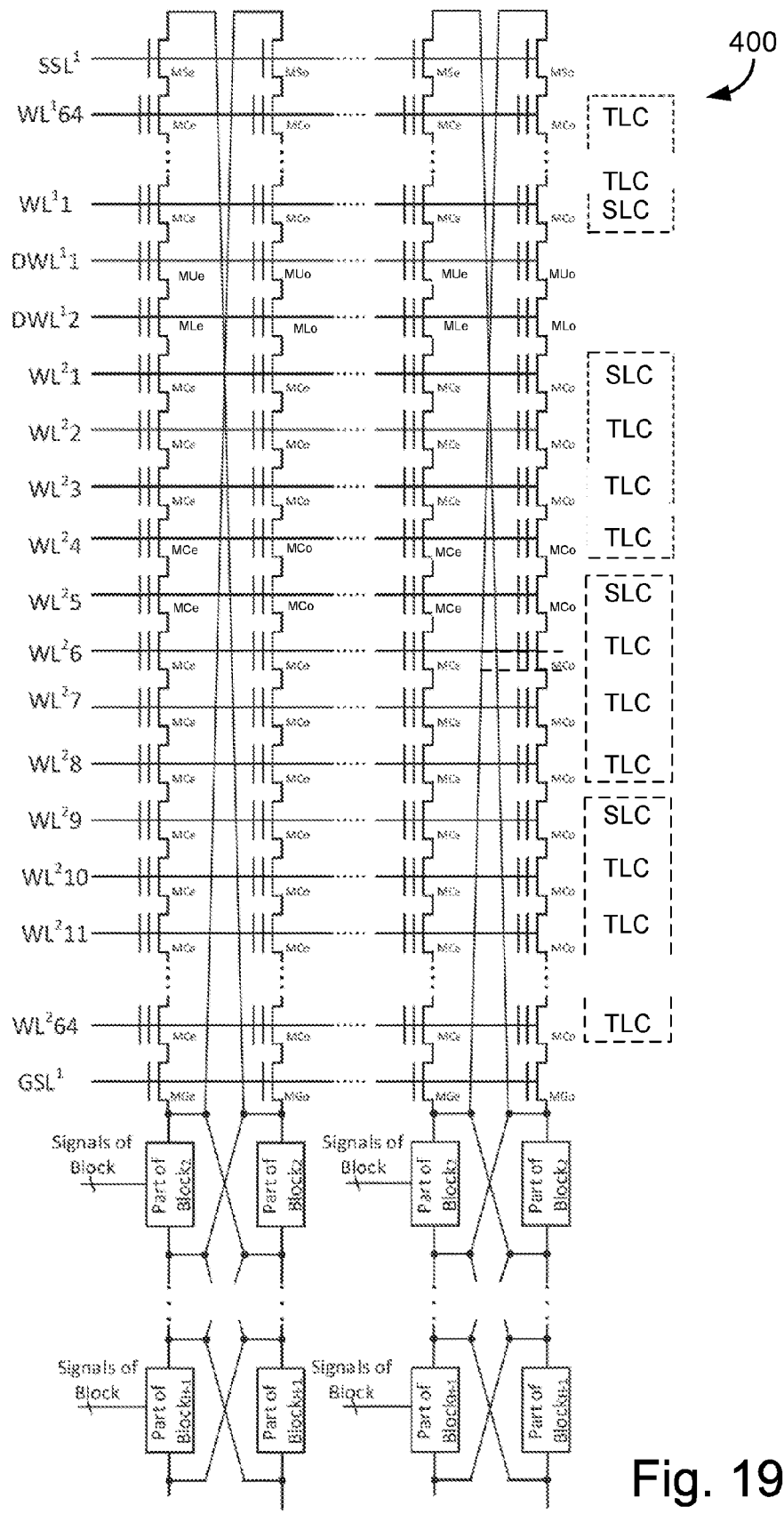

FIG. 19A is diagram showing an alternative YUKAI NAND array made by mixed TLC+SLC blocks including a plurality of 4-WL units at least within each half-block with 3 continuous WLs of TLC cells and one WL of SLC cells and two dummy WLs inserted together in the middle of each string according to an embodiment of the present invention.

Figure 19B:
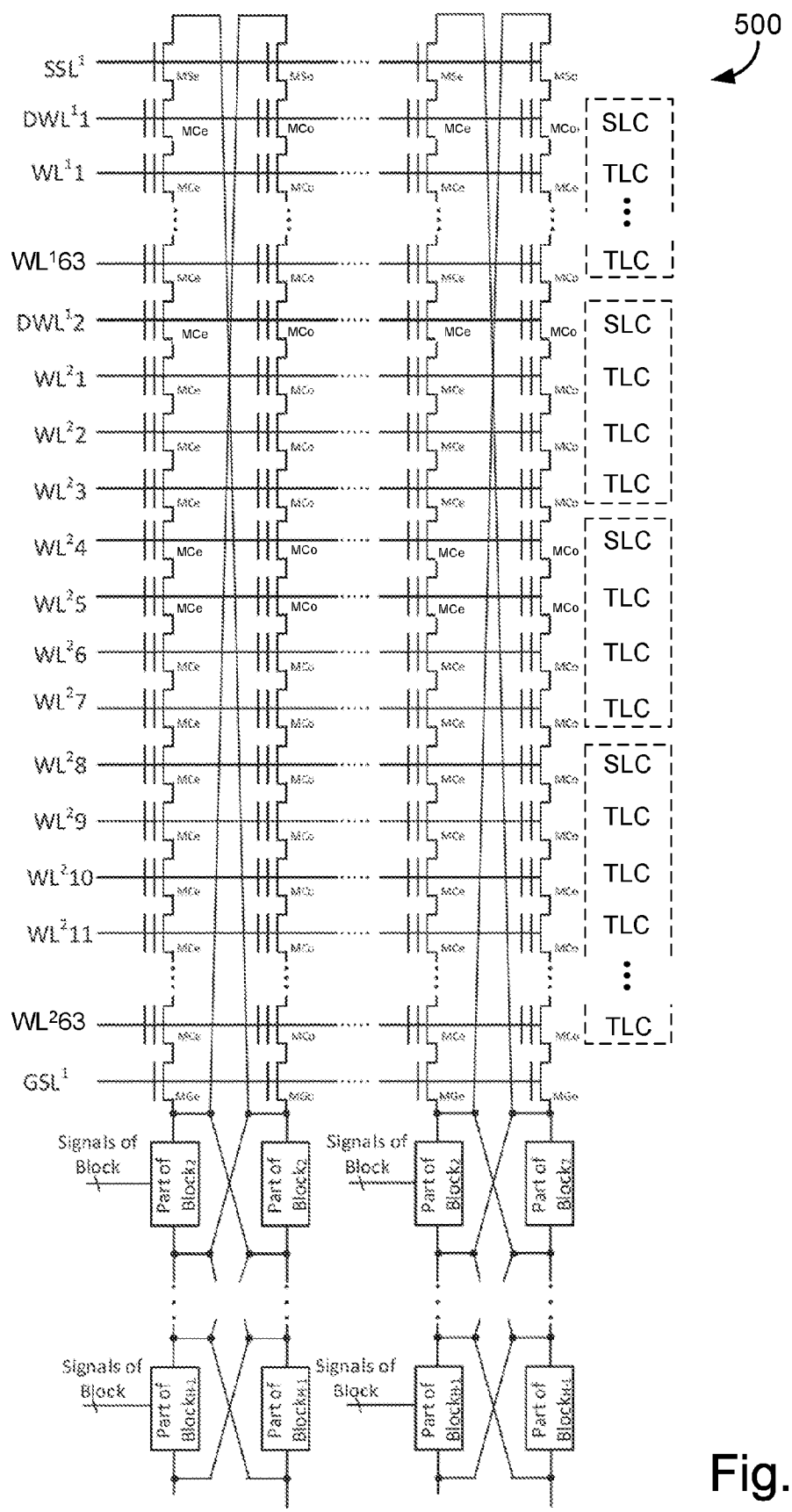

FIG. 19B is diagram showing another alternative YUKAI NAND array made by mixed TLC+SLC blocks including a plurality of 4-WL units at least within each half-block with 3 continuous WLs of TLC cells and one WL of SLC cells and one dummy WL inserted ahead of a first sub-string and another dummy WL in the middle of each string ahead of a second sub-string according to another embodiment of the present invention.

FIG. 20A is a table showing a preferred ABL, AnP, and Alt-WL program sequence for mixed TLC (3-WL)+SLC (1-WL) in each 4-WL unit of a whole block according to an embodiment of the present invention.

FIG. 20B is a table showing another preferred ABL, AnP, and Alt-WL program sequence for mixed TLC (3-WL)+SLC (1-WL) in each 4-WL unit of a whole block according to another embodiment of the present invention.

FIG. 20C is a table showing a preferred ABL, AnP, and Alt-WL program sequence for mixed TLC (3-WL)+SLC (1-WL) in each 4-WL unit of a whole block according to yet another embodiment of the present invention.

Figure 21A:
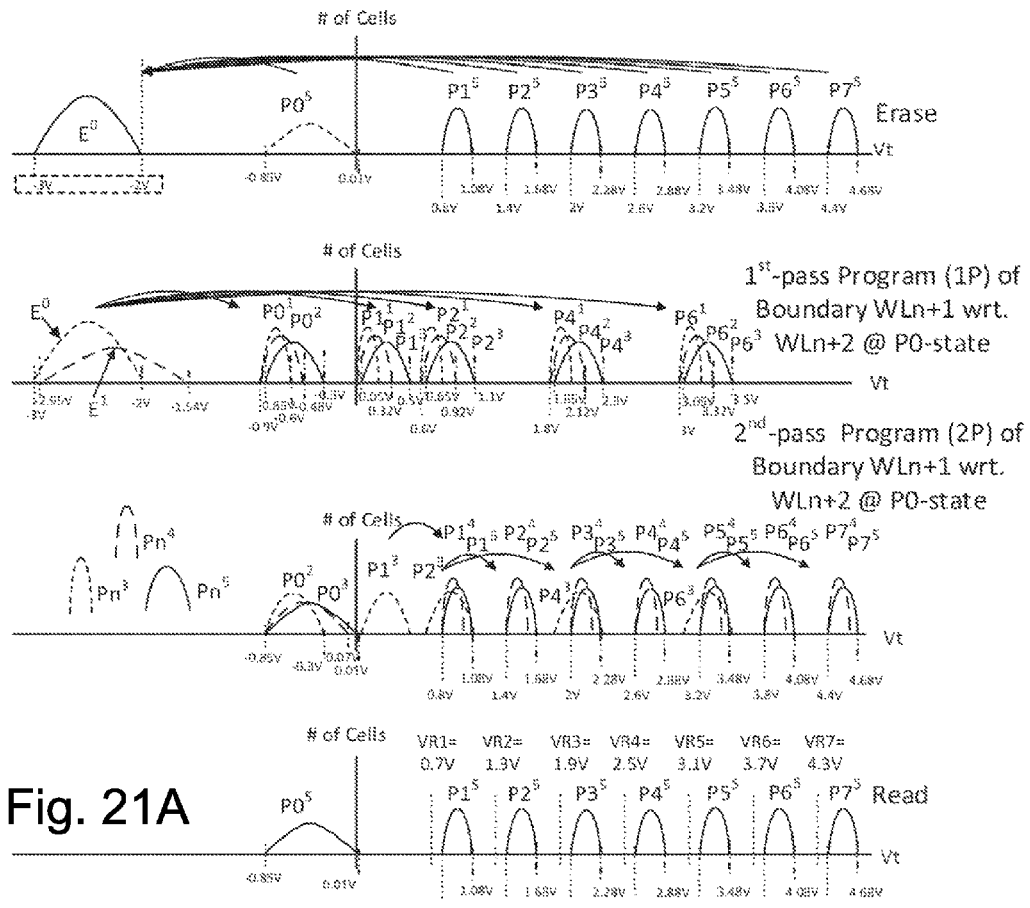

FIG. 21A is a diagram showing Vt distributions, populations, shifting, verify and widened voltages for TLC operations of new boundary WLn+1 TLC cells in mixed SLC+TLC units under 1-5-8 TLC program scheme with WLn+2 cells being programmed with 1P and 2P of SLC data according to an embodiment of the present invention.

FIG. 21B is a diagram showing Vt distributions, populations, shifting, verify and widened voltages for SLC 1P' and 2P' program of WLn+2 SLC cells in mixed SLC+TLC units under 1-5-8 TLC program scheme according to an embodiment of the present invention.

Figure 21C:
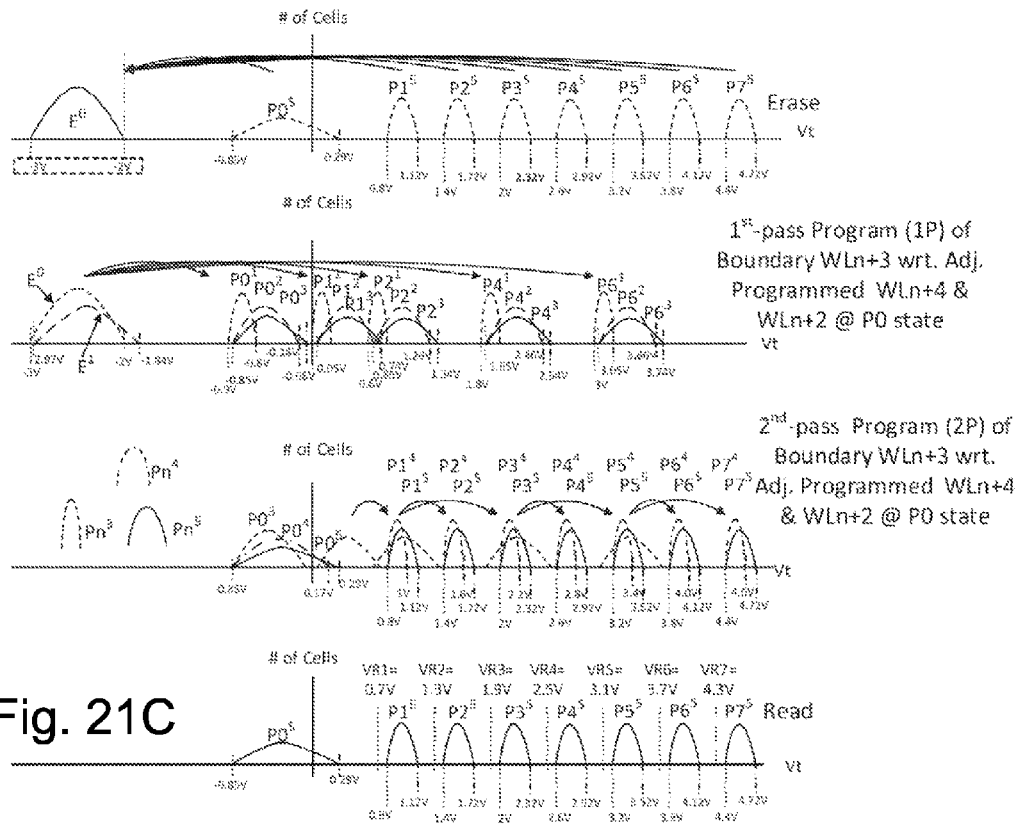

FIG. 21C is a diagram showing Vt distributions, populations, shifting, verify and widened voltages for TLC operations of new boundary WLn+3 TLC cells in mixed SLC+TLC units under 1P and 2P operations of 1-5-8 TLC program scheme with respect to WLn+4 being programmed with TLC data and WLn+2 cells being programmed with SLC data according to an embodiment of the present invention.

Figure 21D:
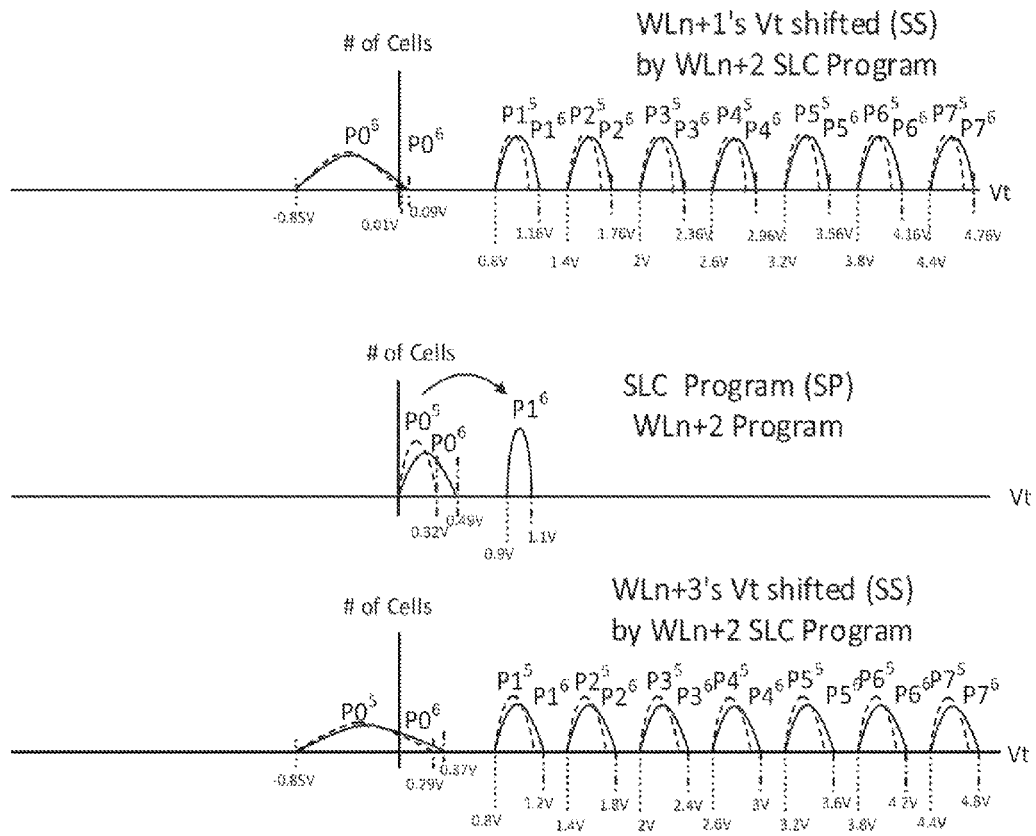

FIG. 21D is a diagram showing Vt distributions, populations, shifting, verify and widened voltages for TLC operations of WLn+1 cells in mixed SLC+TLC units before and after WLn+2's SLC program according to an embodiment of the present invention.

Figures 21E, 22A:
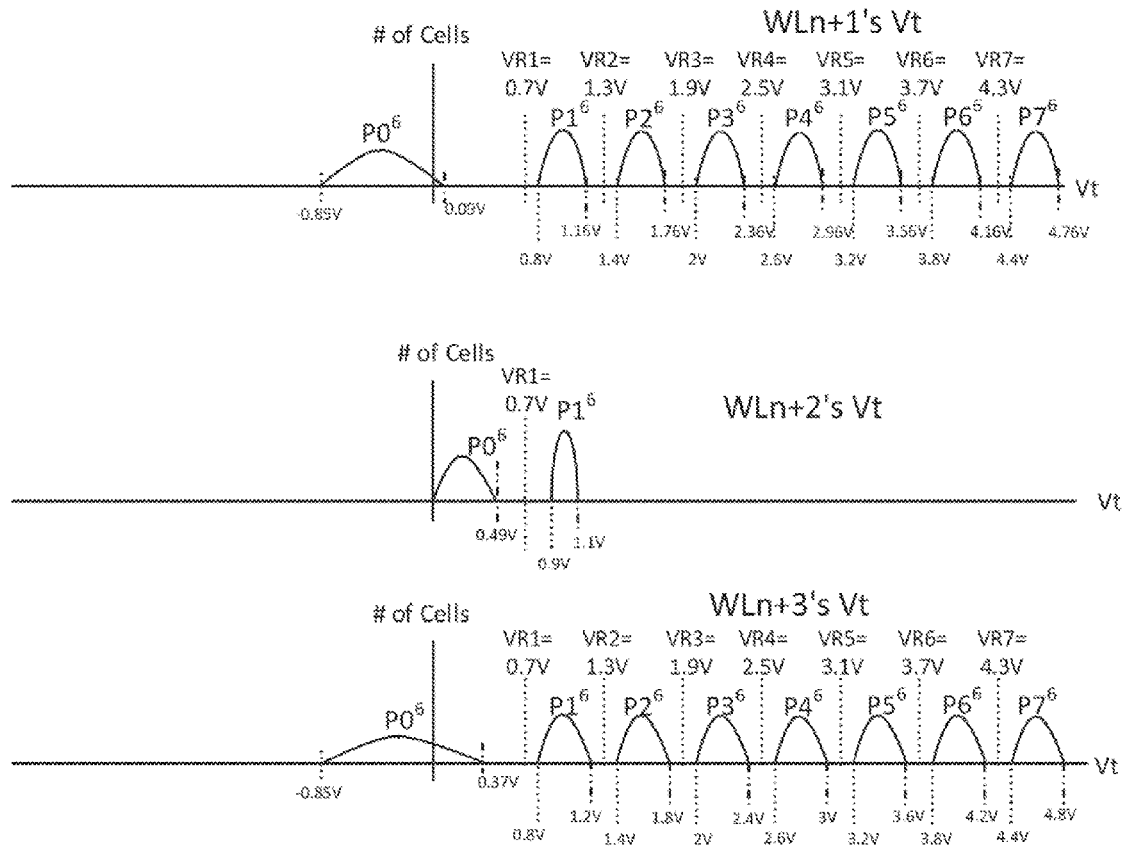

FIG. 21E is a diagram showing Vt distributions, populations, shifting, verify and widened voltages for TLC operations of WLn+1 's 8-state TLC cells, SLC operation of WLn+2 SLC cells, and TLC operation of WLn+3's another 8-state TLC cells in a mixed TLC+SLC unit according to an embodiment of the present invention.

FIG. 22A shows preferred 5 $V_{LBL}$ program voltages and one Vinh program-inhibit voltage assigned for 1P and 1P' MLC-like programs to generate 5 interim states under 1-5-8 TLC program scheme in a mixed TLC+SLC unit according to an embodiment of the present invention.

FIG. 22B shows 8 sets of preferred 8 $V_{LBL}$ program voltages and one Vinh program-inhibit voltage assigned for a 2P program to generate 8 states under 1-5-8 TLC program scheme with $V_{LBL}$ compensation according to an embodiment of the present invention.

FIG. 22C shows preferred 2 $V_{LBL}$ program voltages for SLC-program according to an embodiment of the present invention.

FIG. 22D shows two sets of preferred $V_{FY}$ program-verify voltages on select WLn with individual $V_{SL}$ Vt-offset voltages respectively in accordance with MLC-like 1P programmed 5 states of P0, P1, P2, P4, and P6 and TLC 2P programmed 7 states of P1 to P7 for a mixed TLC+SLC unit according to an embodiment of the present invention.

FIG. 22E shows various sets of preferred $V_{FY}$ program-verify voltages on select WLn with individual $V_{SL}$ Vt-offset voltages of 1P', 2P' and SP in accordance with the each interim and final SLC programs for a mixed TLC+SLC unit according to an embodiment of the present invention.

FIG. 22F shows preferred 7 VRn read voltages and one common $V_{SL}$=0V on those TLC WLs of a mixed TLC+SLC unit according to an embodiment of the present invention.

FIG. 22G shows preferred VR read voltages and one common $V_{SL}$=0V on those SLC WL of a mixed TLC+SLC unit according to an embodiment of the present invention.

5. DETAILED DESCRIPTION OF THE INVENTION

In the following detailed description of the present embodiments, reference is made to the accompanying drawings that forms a part hereof, and in which is shown, by way of illustration, specific embodiments in which the disclosure may be practiced. In the drawings, like numerals describe substantially similar components throughout the several views. These embodiments are described in sufficient detail to enable those skilled in the art to practice the embodiments. Other embodiments may be utilized and structural, logical, and electrical changes may be made without departing from the scope of the present disclosure. The following detailed description, therefore, not to be taken in a limitation sense.

So far, almost of all 2D non-hierarchical NAND key operations are performed in unit of single WL in one selected NAND plane. Although there are many prior art disclosing operation on multiple WLs in multiple independent blocks in multiple independently different planes, there are no solutions to allow multiple WLs in different blocks of a same plane to be read, programmed and verified simultaneously within same plane of non-Hierarchical NAND array. This is what we referred as the multi-page concurrent operations of NAND designs.

When more than 10 physical WLs in different blocks and different LGs within same or different HGs but in a same plane are selected for a batch-based simultaneous erase, program, verify and read, then more than 10-fold improvements in speed and power performance can be easily achieved. From our study, the above batch-based concurrent operations in same plane can only be performed within the BL-hierarchical NAND array according to an embodiment of the present invention.

In the specification, three embodiments of the present invention on multi-page concurrent TLC ABL, AnP and Alt-WL program schemes are disclosed in details for illustrating various key NAND operations. It is also understood that the examples and embodiments described herein are for illustrative purposes only and that various modifications or changes in light thereof will be suggested to persons skilled in the art and are to be included within the spirit and purview of this application and scope of the appended claims.

The preferred batch-based TLC NAND operations includes partial or full block TLC erase, random page TLC erase-verify, ABL TLC program and Half-BL program-verify optimized with 8 ΔVtpn-based VLBL program voltages in accordance with the stored 8 TLC data in opposing TLC cells in adjacent WLn+1. Lastly, the $V_{SL}$-based common and individual Vt-offset scheme during TLC read are also proposed for more accurate and reliable TLC read under different LV Vdd operating ranges.

In prior art practice, each nLC NAND memory cell can store data in either analog or digital form. When storing one bit of digital data, two threshold voltages of each nLC NAND memory cell is divided into two ranges which represent two distinct memory states. The nLC cell is referred as a SLC cell with n=1, which means 1b/1cell. The SLC memory states are assigned with logical data "1" and "0." At least one current breakpoint level between two states is generally established so as to partition the conduction window of each SLC cell into two ranges.

When the SLC cell is read by applying predetermined, fixed voltages, on its gate of WLn, its source/drain conduction current is resolved into one of the memory states by comparing it with the breakpoint level, e.g., reference voltage, or reference current. If the current read is higher than that of the breakpoint level, the SLC cell is determined to be "on" and in the logical state of "1." If the current is less than the breakpoint level, the SLC cell is determined to be "off" and in the other logical state of "0." In one example of a SLC NAND memory, one of the final desired voltage threshold (Vte) is negative after each SLC cell is erased, and defined as logic "1."

Conversely, the final programmed state threshold voltage (Vtp) is positive after a SLC program operation, and defined as logic "0." When the threshold voltage is negative and a read is attempted by applying 0 volts to the selected SLC cell's control gate, the SLC cell will turn on to indicate logic one is being stored. When the threshold voltage is positive and a read operation is attempted by applying 0 volts to SLC cell's control gate, the SLC cell will not turn on to indicate that logic zero is being stored.

Furthermore, each nLC NAND cell can also store more bits of digital data than a SLC cell by utilizing more than two ranges of threshold voltages (Vtn) to represent distinct memory states. The threshold voltage window can be divided into the number of desired memory states and multiple breakpoint levels used to resolve the individual states. For example, if four states are used, there will be four threshold voltage ranges representing four distinct memory states which are assigned the data values "11," "10," "01," and "00." This 4-state nLC cell is referred as MLC cell with n=2, which means 2b/1cell.

In one example of a MLC cell, the final desired threshold voltage after an erase operation is preferably to be negative and defined as "11." Positive threshold voltages are used for the states of "10," "01," and "00." Note, the upper tail of Vte can exceed 0V to become positive when the Yupin-coupling effect become very severe, particularly in 10 nm-class NAND designs.

Likewise, each nLC NAND cell can also store multiple bits of digital data than a MLC cell by utilizing more than four ranges of threshold voltages (Vtn) of four nLC program states to represent distinct memory states. For example, if eight states are used, there will be eight threshold voltage ranges representing eight distinct memory states which are assigned the data values "111," "110," "101," "100," "011," "010," "001," and "000." This 8-state nLC cell is referred as TLC cell with n=3, which means 3b/1cell with a lowest threshold voltage of "111" after an erase operation and a highest Vt of "000" after a TLC program.

Likewise, each nLC NAND cell can also store multiple bits of digital data than a TLC cell by utilizing more than eight ranges of threshold voltages (Vtn) to represent more distinct memory states. For example, if sixteen states are used, there will be sixteen threshold voltage ranges representing 16 distinct memory states which are assigned the data values "1111," "1110," "1101," "1100," "1011," "1010," "1001," "1000," "0111," "0110," "0101," "0100," "0011," "0010," "0001," and "0000." This 16-state nLC cell is referred as XLC cell with n=4, which means 4b/1cell with a lowest threshold voltage of "1111" after an erase operation and a highest Vt of "0000" after a XLC program.

In some implementations, the above nLC data values (e.g., logical states) are assigned to the threshold ranges using a Gray code assignment so that if the threshold voltage of a floating gate erroneously shifts to its neighboring physical state, only one bit will be affected. The specific relationship between the nLC data programmed into each nLC memory cell and the threshold voltage ranges of the nLC cell depends upon the nLC data encoding scheme adopted for the nLC memory cells.

Typically, most conventional nLC NAND cell's Vtn are defined and measured from cell's gate wordline voltage, $V_{WL}$, with respect to cell's common source node, $V_{SL}$ based on general circuit of NAND cell array. Normally, a $V_{SL}$ voltage at a common source line (CSL) node for all selected nLC cells in the selected WLn is being held at Vss during nLC n Vtn read and program-verify operations. The width of a negative erase Vte can be as wide as up to 2V and as low as −3V but the remaining n−1 Vtn of program states are kept pretty narrow-width, ranging from 0.2V to 0.5V as storage type varying from XLC to SLC with Yupin-coupling effect induced Vt widening.

Figure 1A:
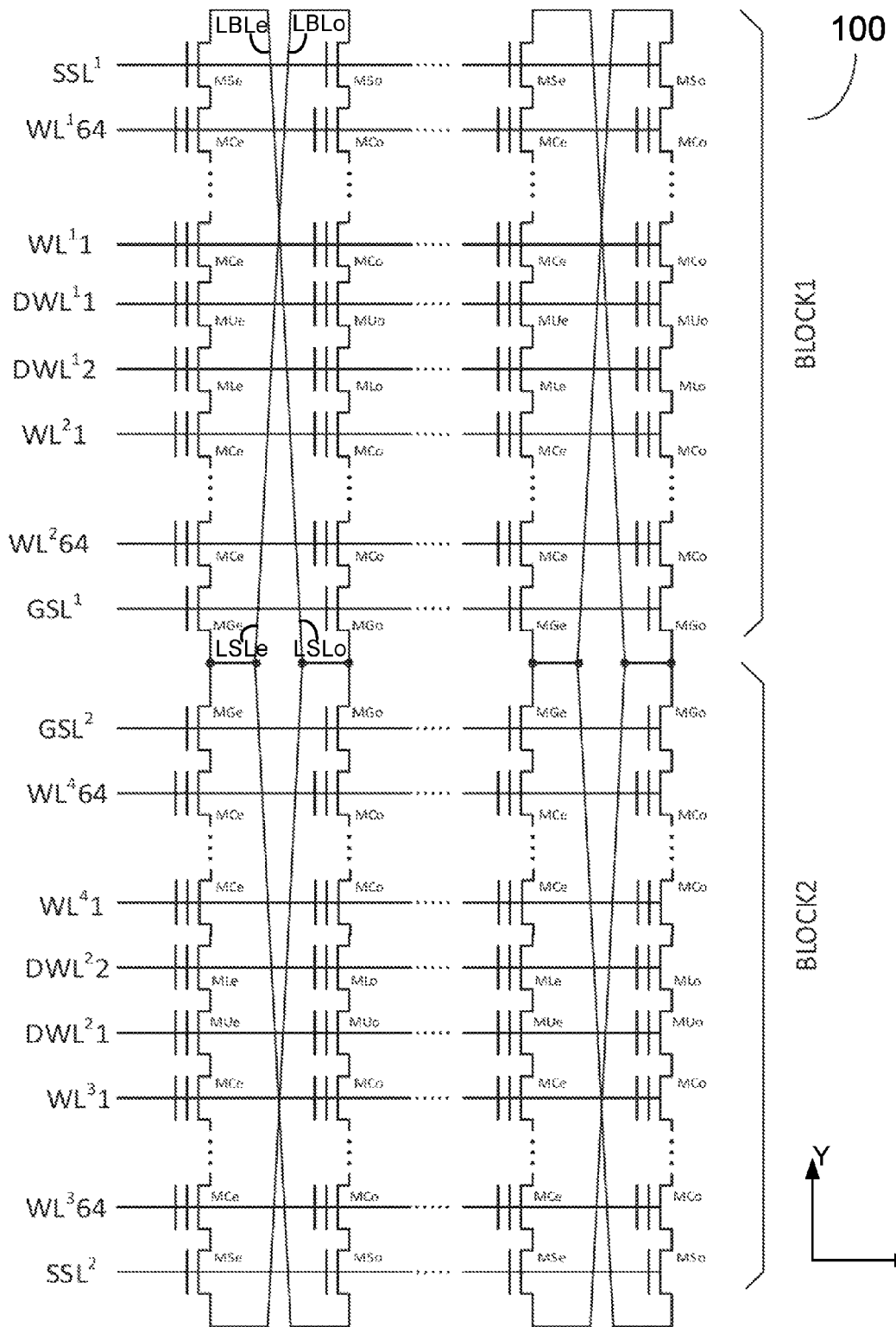
FIG. 1A is a diagram illustrating a YUKAI NAND array with a plurality of paired zigzag NAND strings having short string lengths according to an embodiment of the present invention.
Figure 1B:
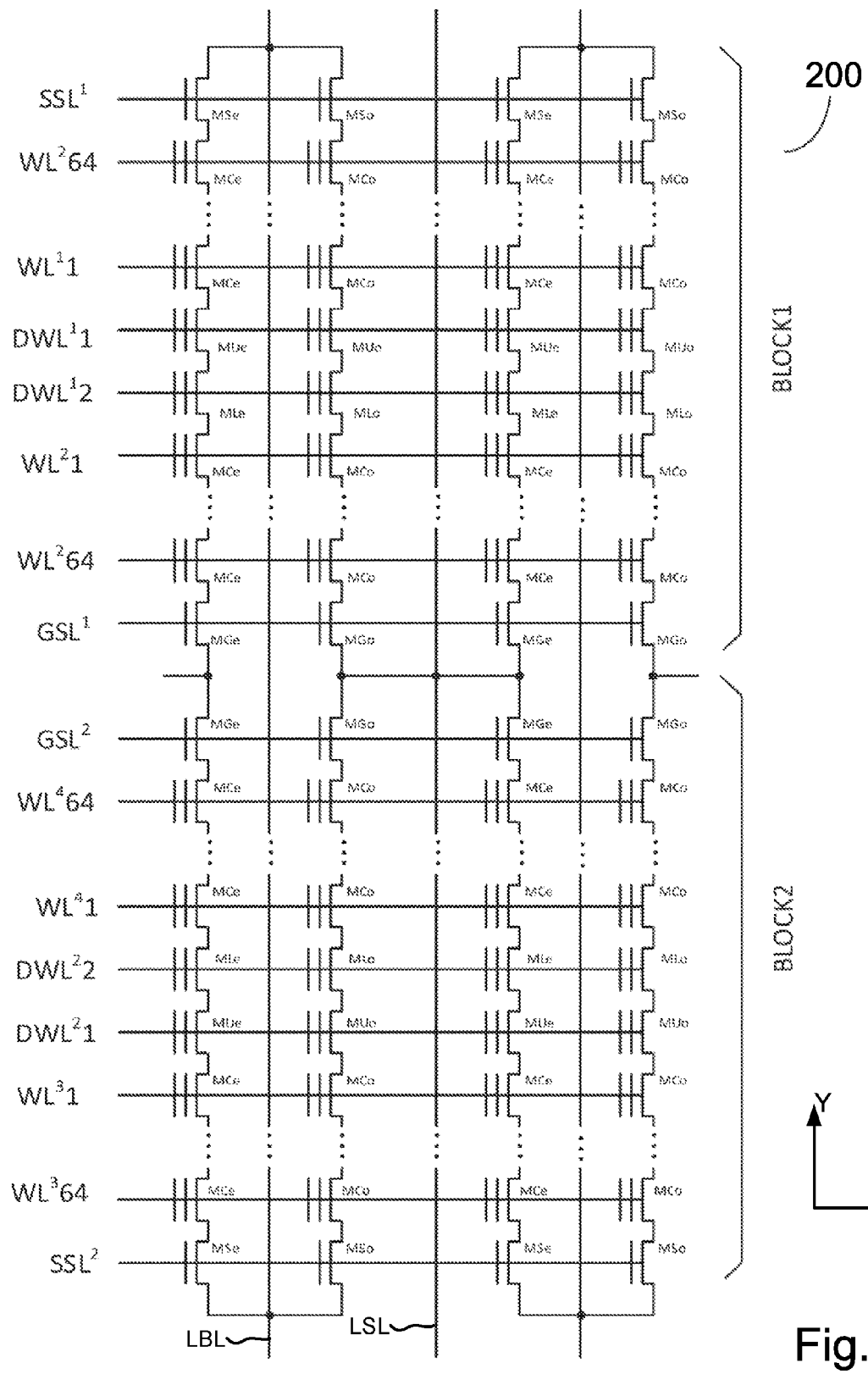
FIG. 1B is a diagram illustrating a YUKAI NAND array with a plurality of paired NAND strings without any common SL according to another embodiment of the present invention.
Figure 1C:
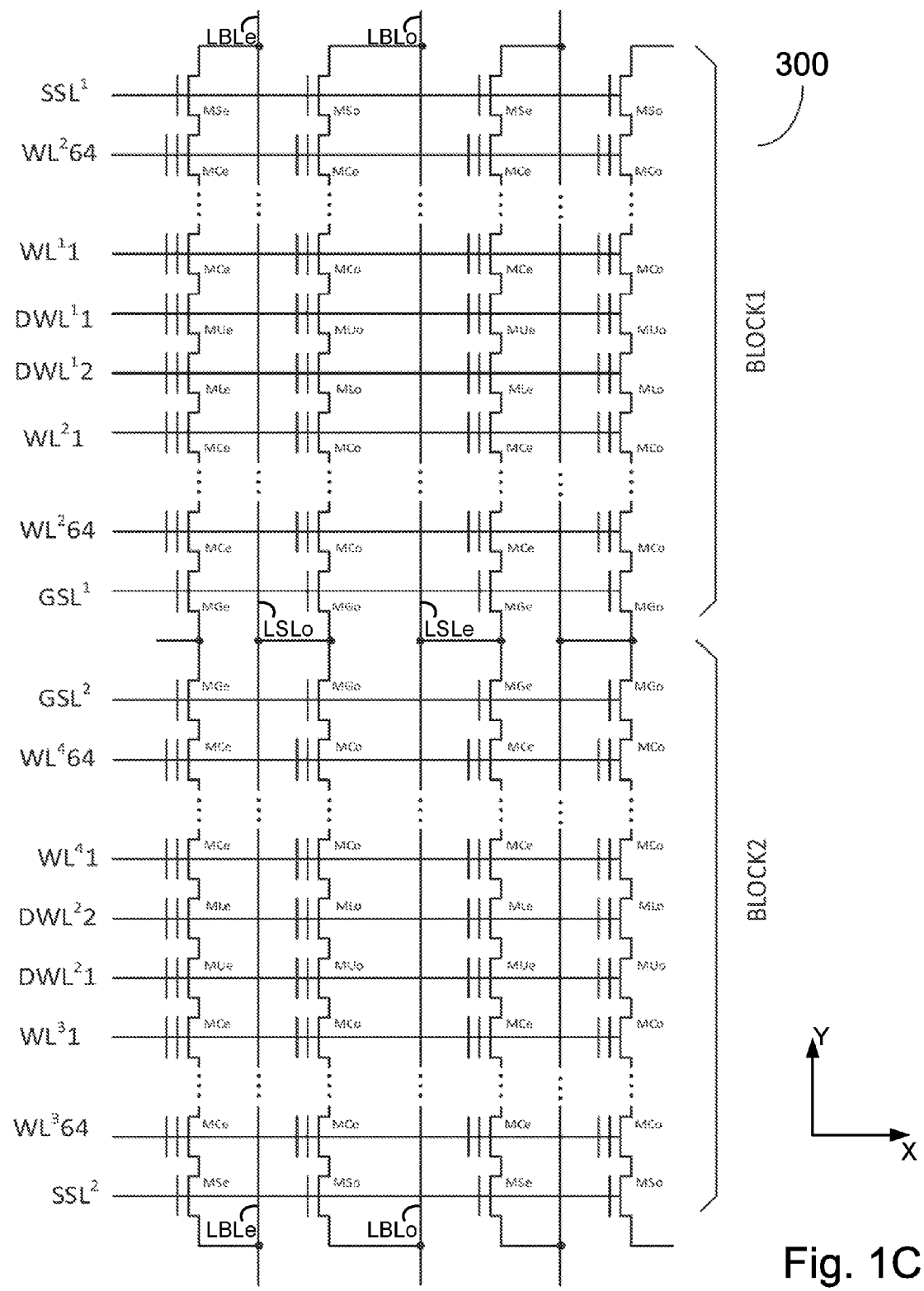
FIG. 1C is a diagram illustrating a YUKAI NAND array with a plurality of paired zigzag NAND strings with small programmable NAND dummy cells according to yet another embodiment of the present invention.

On the contrary, new NAND string schemes, as shown in several examples in FIGS. 1A, 1B, and 1C, based on YUKAI NAND array with all TLC memory cells allow each string having a dedicate bit line (BL) to use an adjacent BL as its dedicated SL. In other words, electrically, each BL is also a dedicated SL of an adjacent string. Therefore, no more common SLs laid along WL-direction are used in YUKAI NAND strings. As a result, all the above multiple Vtn measurements of the victim TLC cell in read and program-verify operations can be done with respect to a common $V_{SL}$ value or n individual $V_{SL}$ values, depending on the stored data of 8 surrounding aggressor NAND TLC cells in a 2D NAND array or 26 adjacent 3D NAND TLC cells in a 3D NAND array.

In current application, examples are given mainly for TLC erase, program, read and verify and program schemes of the YUKAI NAND arrays made of exemplary NAND strings in FIG. 1A, or FIG. 1B or FIG. 1C, the invention can be also applied to other variations of YUKAI NAND array. Additionally, the present invention should not be limited to any particular NAND array forms regardless of 2D or 3D NAND and memory cell types regardless of PMOS-cell or NMOS-cell NAND and 2-poly floating-gate cell or 1-poly charge-trapping cell.

FIG. 1A is a diagram illustrating a YUKAI NAND array with a plurality of paired zigzag NAND strings having short string lengths according to an embodiment of the present invention. As shown, the NAND array 100 is a YUKAI NAND array including a plurality of NAND blocks, each being formed with a plurality of paired NAND strings including cross-coupled Odd LBL line and Even LBL line in BL-direction or Y-direction. And in particular, each string in one paired Even-Odd strings is associated with an individual LBL line and uses its physically adjacent LBL line as an individual local source line (LSL) without any common SL in WL-direction or X-direction.

As an example, only two NAND blocks are shown in FIG. 1A to illustrate one key feature of the YUKAI NAND array according to an embodiment of the present invention. Each block contains 128 pages of regular NAND cells with gates connected to corresponding wordlines (WLs) in X-direction. In addition to those WLs, there is no extra large paired select transistor (such as 1-poly Depletion-type, 1-poly Enhancement-type, or 2-poly floating-gate type NMOS transistor) in each string. Instead, one pair of small 2-poly dummy NAND cells, MUe and MUo, or MLe and MLo, having same size as a regular NAND cell, MCe or MCo, is used to replace big string-select transistors used in many conventional NAND strings. The conventional mainstream NAND string has incorporated one dummy cell on top and one dummy cell on bottom of each string for the purpose to reduce the GIDL effect between the WLs in both ends nearing the top and bottom select transistors, two dummy cells with complementary Vts are used by the present invention for Odd and Even string selection. The physical placements of these two dummy cells in each YUKAI NAND string can be anywhere but are preferably placed in the middle of each string so that an ABL, AnP, and Alt-WL program scheme and sequence can be started from two middle points heading two opposite directions with least Vpass voltage disturbance. The YUKAI NAND string structure thus has the same compact string size of a mainstream NAND string while provides much more advantages in power saving and latency reduction that will be fully disclosed in subsequent sections of the specification.

In an embodiment, the pair of dummy cells is used as the Odd and Even string-select transistors by programming with the complementary Vts to allow the right logic selection of Odd and Even strings. The pair of small dummy cells (MUe and MUo, and MLe and MLo) in two respective dummy WLs ($DWL^1$ and $DWL^2$) for performing Odd and Even string selection are used to replace large channel-length HV select transistors in prior art, because Odd/Even string-select function is only performed during read and all verify operations which are not under the HV program conditions. Therefore, the channels of selected strings are at low voltage scenario, thus HV select transistor for Odd/Even select function is not required in read and all verify operations.

In other words, the only reason to have a large string-select transistor in the conventional NAND strings is to prevent the coupling leakage of ~7V from string channel to GBL. This coupling leakage of ~7V is boosted and generated when the selected WLn voltage is ramped to 20V during the page-program operation. But as seen in FIG. 1A, a boosted 7V coupling leakage in each string is protected because each string still keeps one top and bottom big select transistors such as MSe and MGe for each corresponding Even string and MSo and MGo for each adjacent Odd string.

Referring to FIG. 1A, the YUKAI NAND array operations are associated with preferred rows, columns, broken GBL and broken LBL decoders, and local LBL precharge circuits. In a specific embodiment, each string has an individual LBL and uses its adjacent LBL as a LSL so that the most accurate $V_{SL}$-based Vt-offset inventive concept can be easily implemented. Practically, this combines all the advantages of new $V_{BL}$-based and conventional $V_{WL}$-based Vt-offset techniques to overcome Yupin BL-BL and WL-WL coupling effects in 10 nm-class NAND memory design. In addition, a $V_{SL}$-based Vt-offset technique is applied to fix each degraded nLC Victim cell Vtn by using an individual SL-node Vt-compensation voltage, which is more direct and accurate than using a non-individual collective and inaccurate compensation techniques by either $V_{BL}$-based and $V_{WL}$-based Vt-offset techniques. Note, the cross-coupled paired strings require 1λ-width and 1λ-spacing m0/m2-level metal lines in non-contact areas for the interleaving BLs, which are configured to achieve fully BL shielding effect for superior ABL program.

Practically, this YUKAI NAND array combines all the advantages of a new $V_{BL}$-based and conventional $V_{WL}$-based Vt-offset techniques with an optimal, thus more flexible improvement to overcome the worst BL-BL and WL-WL Yupin coupling effects in 10 nm-class NAND design. The additional $V_{SL}$-based Vt-offset technique, with more details to be shown below, is able to fix each degraded victim TLC Vtn by using an individual SL-node Vt compensation voltage, which is more direct and accurate than conventional technique using non-individual collective and inaccurate compensation by either $V_{BL}$-based and $V_{WL}$-based Vt-offset.

The top block is referred as BLOCK1, while the bottom adjacent block is referred as BLOCK2 by the present invention. Although this cross-coupled paired strings require 1λ-width and 2λ-spacing for each of m1 and m2 metal lines in non-contact areas for the interleaving LBLs, the present invention uses 1λ-width and 1λ-spacing for combined m1 and m2 metal lines to achieve the fully BL shielding effect for superior ABL TLC program.

FIG. 1B is a diagram illustrating a YUKAI NAND array with a plurality of paired NAND strings without any common SL according to another embodiment of the present invention. As shown, a preferred NAND array 200 is made of a plurality of blocks that are further comprised of a plurality of paired Odd and Even NAND strings. Again, as an example, only two blocks are included in FIG. 1B to simply illustrate one of key feature of the YUKAI NAND array according to another embodiment of the present invention. Each paired NAND string includes one Odd and one Even LBL lines. Each string has an individual LBL in Y-direction and uses its adjacent LBL as an individual LSL without a separate common LSL in X-direction. Again, the NAND string contains no extra large paired select transistor (e.g., 1-poly Depletion-type transistor, 1-poly Enhancement-type transistor or 2-poly floating-gate type transistor). Instead, small paired 2-poly dummy NAND cells, MUe and MUo, or MLe and MLo, with a same size of the regular NAND cell, is used to replace conventionally used big select transistors. Other than in some conventional NAND strings using one dummy cell on top and one dummy cell on bottom of each string for the purpose to reduce the GIDL effect between the WLs in both ends nearing the top and bottom select transistors, these small paired dummy cells in the NAND strings of FIG. 1B are used as the Odd and Even string-select transistors without increasing the string size. The placements of two dummy WLs can be anywhere in each string but are preferably placed in the middle of NAND string or at least one in the middle and one in either top end or bottom end of string.

Referring to FIG. 1B, another feature of this YUKAI NAND string scheme is that a single metal1 line at m1-level can be used for all LBL lines because the zigzag LBL connection in FIG. 1A has been removed by straight (Y-direction) LBL lines. As a result, one metal line layer is saved. Note, the present invention preferably uses two metal line at respective m1-level and alternate m2-level with 1λ-width and 1λ-spacing to achieve a full LBL shielding effect (see FIG. 2 below) for superior ABL, AnP, and Alt-WL program.

FIG. 1C is a diagram illustrating a YUKAI NAND array with a plurality of paired zigzag NAND strings with small programmable NAND dummy cells according to yet another embodiment of the present invention. As shown, the NAND array 300 is made of a plurality of blocks with each block containing a plurality of paired Odd and Even NAND strings. Each paired NAND string includes one Odd and one Even LBL lines. In particular, each string has its own individual LBL and uses its adjacent LBL as an individual LSL along the Y-direction and no X-direction common SL is used in plurality of NAND strings within the plurality of blocks.

Again, one of features of this NAND string is that no extra large paired select transistor (1-poly Depletion-type, 1-poly Enhancement-type or 2-poly floating-gate type) is added to each NAND string. Instead, one small paired 2-poly dummy NAND cells with the same size of the regular NAND cell is used to replace above big select transistors. As some conventional NAND string has incorporated one dummy cell on top and one dummy cell on bottom of each string for the purpose to reduce the GIDL effect between the WLs in both ends nearing the top and bottom select transistors, these paired small dummy cells can also be used as the Odd and Even select transistors without increasing the string size. Thus the NAND strings in FIG. 1C can retain compact string length and at the same time be used for applying truly individual $V_{SL}$-based Vt-offset techniques for superior TLC program and read operation.

Note, although this NAND strings are non-cross-coupled paired strings requiring 1λ-width and 1λ-spacing of two-level metal lines, one at m1-level and alternate one at m2-level, for the interleaving Odd and Even BLs, it is preferred to uses the two-level metal lines with 1λ-width and 1λ-spacing to achieve fully BL shielding effect (see FIG. 2 below) for superior ABL program operation. The detail descriptions of the ABL, AnP, and Alt-WL MLC program, read, and verify operation based the above NAND string embodiments shown in FIGS. 1A, 1B, and 1C will be found throughout the specification and particularly below.

Figure 2:
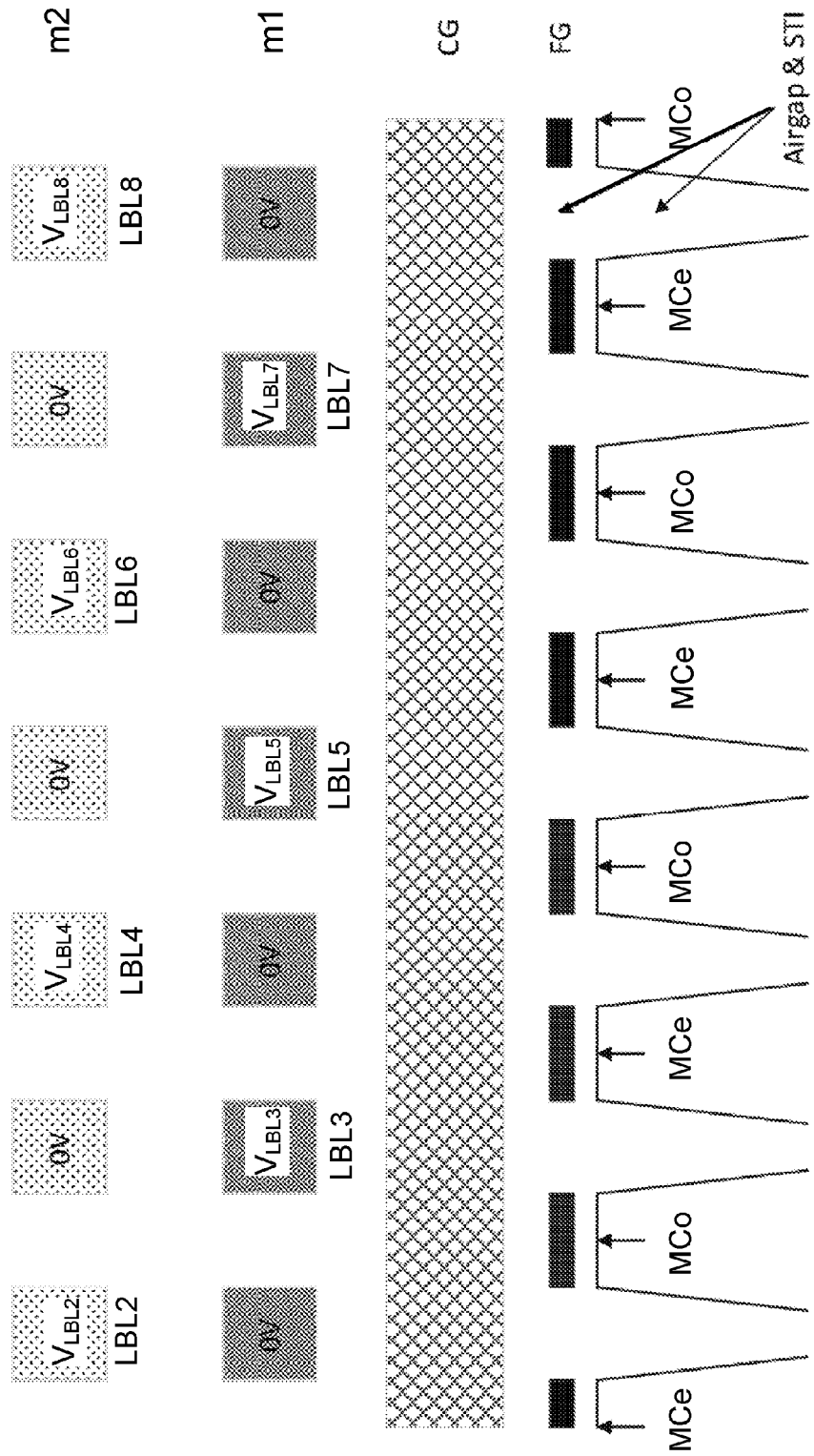
FIG. 2 is a diagram illustrating cross-sectional view and topological view of two levels, m1 and m2, of local bit line metal lines used in the YUKAI NAND strings according to embodiments of the present invention.

FIG. 2 is a diagram illustrating cross-sectional view and topological view of two bit line metal lines, arranged alternatively in two levels, m1 and m2, used in YUKAI NAND strings using the two-level interleaving and shielding topological LBL and GBL for preferred ABL, AnP and Alt-WL TLC program operations according to embodiments of the present invention. As shown, two metal lines of alternate m1 and m2 levels adopted by the BL-hierarchical NAND array structure are both made with 1λ width and 1λ spacing. One Odd LBL line (e.g., LBL3) at m1-level is connected to a first drain node of an Odd string for a first 1-bit of MLC data but the physically adjacent Even metal line at m1-level is not connected to a second drain node but is grounded (to 0V) in layout as the first-level shielding LBL structure. While the actual Even LBL line (e.g., LBL4) is laid at m2-level above m1-level and configured to connect to the second drain node of the Even string. Using two sets of metal lines arranged respectively at two m1 and m2 levels for interleaving Odd/Even strings as shielding topological LBL and LSL lines is one of important feature for performing concurrent ABL, AnP, and Alt-WL MLC, TLC, and XLC program operations (including 1P, 2P, or more than 2P and FP) based on NAND strings shown in FIG. 1A, FIG. 1B and FIG. 1C.

Referring to FIG. 2 again, two 1-λ metal-width and 1-λ metal-spacing LBLs at m1-level and alternate m2-level are interleavingly used to shield any two adjacent LBLs at the same level from coupling. As shown in FIG. 1A and FIG. 1C, two tight m1 and m2 levels metal lines are required for two adjacent Odd and Even LBLs to be connected in a zigzag way. But in FIG. 1B, optionally only one tight m1 level metal line is required to construct the NAND string. In this way, one level of metal lines can be saved for each broken-LBL line. But since ABL nLC program operation is pivotal for achieving a high nLC data reliability and yield to reduce the Yupin coupling effect, two levels of tight m1 and m2 lines are preferably used for all three embodiments of the YUKAI NAND arrays 100, 200, and 300. Thus, for all n $V_{LBL}$ voltages assigned to n-state concurrent nLC program (AnP), a full shielding of all LBLs n $V_{LBL}$ voltages is required to guarantee a successful operation of the ABL program with least ECC errors.

Additionally, FIG. 2 shows that an shielding of a m0-level Odd LBL data line is provided by connecting alternate Even metal lines of 1λ-width and 1λ-spacing at m1-level to ground and having corresponding Odd LBL data lines of 1λ-width and 1λ-spacing at m1-level coupled to $V_{LBL}$ voltages (e.g., four individual $V_{LBL0}$ to $V_{LBL3}$ voltages in MLC operation, or eight individual $V_{LBL0}$ to $V_{LBL7}$ voltages in TLC operation, or 16 individual $V_{LBL0}$ to $V_{LBL15}$ voltages in XLC operation). At the same time, alternate Odd metal lines of 1λ-width and 1λ-spacing at m2-level is grounded while adjacent Even LBL data line of 1λ-width and 1λ-spacing at m2-level coupled to $V_{LBL}$ voltages. As a result, any one tight 1-width and 1λ-spacing Odd/Even m1/m2-level LBL data line is fully shielded by two tight 1λ-width and 1λ-spacing adjacent Even/Odd m1/m2-level metal lines in ground. Both the m1-level and m2-level metal lines for shielding are grounded by connecting to grounding lines laid out at lowest level (not shown in FIG. 2) in parallel to WLs in X-direction crossing all strings of the YUKAI NAND array.

Figure 3:
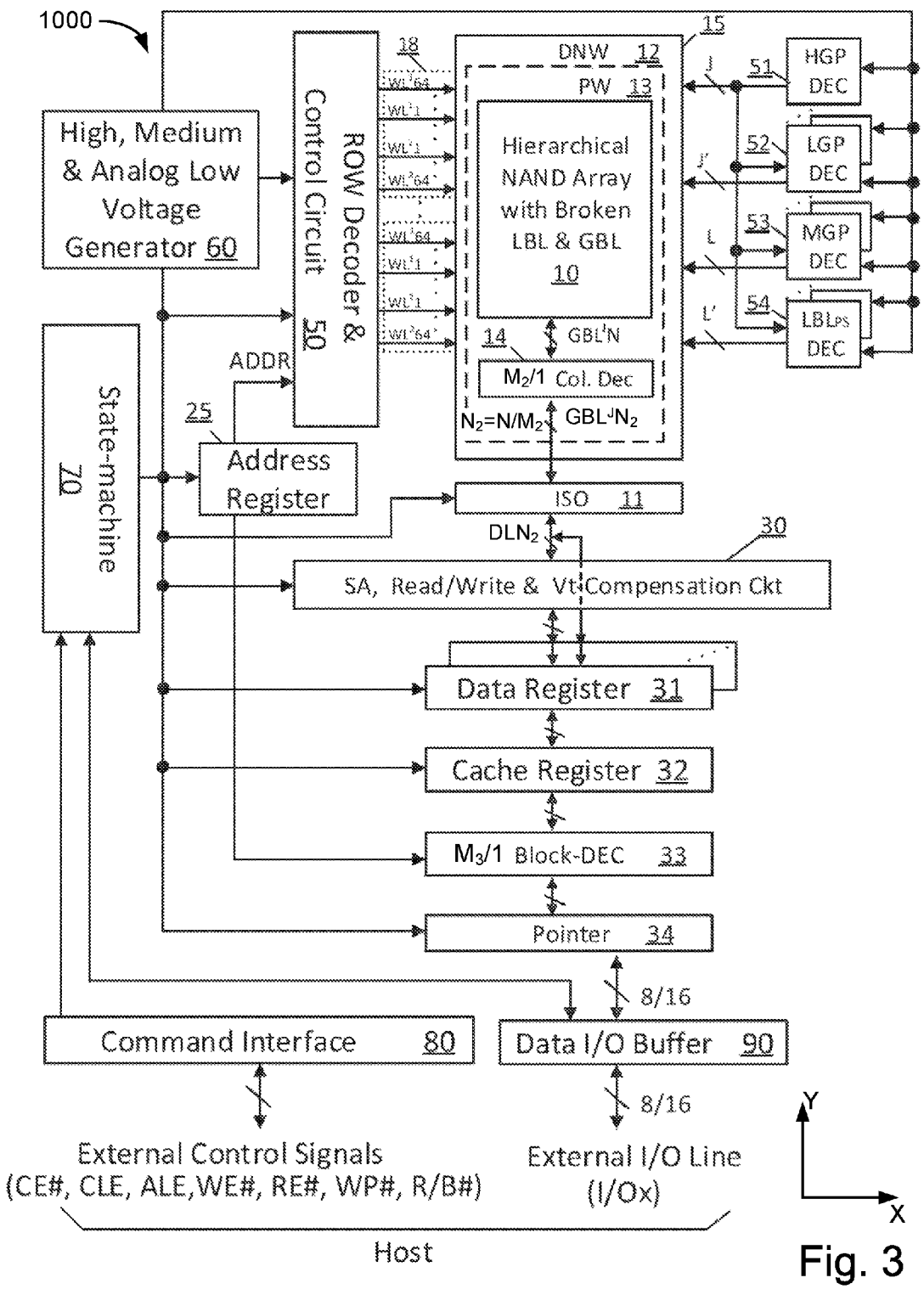
FIG. 3 is a block diagram of a preferred YUKAI NAND memory chip according to an embodiment of the present invention.

FIG. 3 is a block diagram of a preferred YUKAI NAND memory chip according to an embodiment of the present invention. As shown, the YUKAI NAND memory chip 1000 includes a YUKAI NAND array 15 in 2D NAND structure. In an implementation, the YUKAI NAND array 15 is comprised of a nLC NAND cell array 10. In a specific embodiment, the NAND cell array 10 is constructed with TLC cells arranged by a plurality of paired strings as shown in FIG. 1A. Alternatively, the NAND cell array 10 can be constructed with mixed TLC+SLC cells in each string. The NAND cell array 10 is configured to have a two-level BL-hierarchical top-level (m3) metal lines and lower-level (m1 or m2) metal lines laid along bit line directions respectively associated with each string. Each top-level metal line serves as a global bit line (GBL) linked to a column decoder 14 in a triple-P-well (TPW) 13 within a common deep-N-well (DNW) 12 of the YUKAI NAND array 15. A 20V ISO array device 11 including a plurality of 20V HV NMOS devices is disposed between the hierarchical YUKAI NAND array 15 and a page buffer (PB) 30. It is located outside the DNW 12 so that NAND array's high voltage 20V erase operation would not damage those low voltage (LV) peripheral circuits such as the PB 30, the LV data register 31, the LV CACHE registers 32, $M_3$/1 block decoder 33, and the LV pointer device 34, via a $N_2$ broken $GBL^J$/N2 lines placed between the NAND cell array 10 and $M_2$/1 column decoder 14. There are $N_2$ inputs of the ISO array device 11 of $GBL^J$ lines and with same number of outputs of $DLN_2$ connecting to $N_2$ bits of PB 30. Each lower-level metal line, at either m1 or m2 level below the m3 level, serves as a local bit line (LBL) lined to some strings locally in one column.

The YUKAI NAND array 15 is configured to have each GBL divided into J broken-GBL top-level metal lines respectively associated with J capacitors $C_{HG}$. Each top m3-level metal2 broken-GBL $C_{HG}$ is coupled to L m1/m2-level LBL respectively associated only to L MG groups. Each MG group is formed with one capacitor $C_{MG}$. $C_{MG}$ is a minimum capacitor for a local $C_{LBL}$ of one bit in read and verify operations. Therefore, $C_{MG}=C_{GBL}/J\times L$, as defined and calculated in BL length and value of capacitance where $C_{GBL}=J\times C_{HG}$ is capacitance of unbroken long GBL line, assuming a same unit of parasitic metal capacitance for m3-level metal lines and m1/m2-level metal lines. These J×L short and tight-spacing LBL m1/m2-level metal lines form a plurality of on-chip pseudo-CACHE (PCACHE) Registers with near zero-overhead, leading to J×L×(Vdd/Vinh)-fold reduction of latency and power consumption in nLC cells read and program-verify operations in the YUKAI NAND array 15. Additionally, each MG group can be further divided to J' smaller $C_{LG}$ capacitor each associated with a broken-LBL (a section of 1/L of LBL associated with a MG capacitor) to temporarily store the TLC page data for program operation in the YUKAI NAND array 15.

With the YUKAI NAND array proposed above, several advantages over conventional NAND array can be achieved. In nLC read and verify operation, $C_{MG}$ is precharged to Vinh, thus $V_{MG}$=Vinh≈7V. Therefore, $Q_{MG}$=Vinh× $C_{MG}$=Vinh×$C_{GBL}$/J×L, contrary to prior art of precharging the long $C_{GBL}$ with Vdd. Thus $Q_{GBL}$=Vdd×$C_{GBL}$. As a result, power ratio=Vdd×J×L/Vinh. In an example, assuming J=8, L=4, Vdd=2.7V, and Vinh=7V, the read and verify precharge power ratio=2.7×8×4/7≈12.3 (assuming same capacitance unit). In another example, assuming Vdd=1.8V, and Vinh=7V, then the power ratio=1.8×8×4/7≈8.2. Therefore, the YUKAI NAND array provides about 10-fold power reduction comparing to conventional NAND array during read and verify operations.

Similarly, a ratio of read or verify precharge time over prior art is also Vdd×J×L/Vinh a same precharge driving capability. In an embodiment, a stronger and higher 20V erase pump with 7V clamping can be used for the precharge Vinh pump supplied to the selected LBLps bus lines without overhead. Thus, the reduction of read and verify precharge and discharge time is ~10 fold.

For program operation on each selected page (corresponding to each WL), since even smaller $C_{LG}$ capacitors are used to temporarily store the nLC page data, thus the program precharge time can be further reduced with program precharge power ratio being Vdd×J×L×J'/Vinh=2.7×8×4× 4/7=135.8, assuming that J'=8, L=4, and J=8 for 1,204 physical blocks. That means more than 100-fold power reduction during each iterative incremental-step-pulse-programming (ISPP) nLC program. Since each (nLC) program operation is divided into a program step and a program-verify step and each program step time is further divided into one LBL precharge time and one FN-tunneling program ISPP time, it is more complicate than read and verify operation to compare the whole course of program latency reduction over prior art.

Worse than that, each nLC program operation may have up to n program-verify in one program pass. For example, for an ABL nLC program scheme, one program time plus up to four program-verify times are needed to be counted for one pass program latency. For one or two negative program-verify voltages, more power and latency are required to charge up highly capacitive TPW and DNW (as in erase-verify) than cases for positive, program-verify voltages without charging up TPW and DNW. In a specific embodiment, a method of 3-cap precharge and charge-sharing scheme is proposed to generate n $V_{LBL}$ program voltages on smaller capacitor $C_{LG}$/J'. Then, on average the overall program latency per selected page can be reduced by more than 10-fold as compared with prior art.

Furthermore, if M (M is an integer equal to 2 and greater) pages WLn are selected for performing M-page concurrent read, verify, and program operations, then additional approximately M-fold reduction in program latency can be achieved on top of about 10-fold reduction per page mentioned above. If M=10, then total latency reduction is about 100-fold.

Another advantage of using the YUKAI NAND array with a truly individual $V_{SL}$-based Vt-offset scheme to replace prior-art $V_{BL}$-based and $V_{WL}$-based Vt-offset techniques is a dramatic improvement of nLC data reliability. The $V_{SL}$-based Vt-offset scheme means using an individually adjustable NAND cell's source node voltage due to unique feature of this YUKAI array to offset Yupin coupling induced Vt-shift of each individual cell during read and program-verify operations in accordance with the stored nLC data of surrounding aggressor cells in the adjacent LBLs and WLs. For example, when final Vtn of nLC victim cells are locked out earlier than final Vtn of the aggressor cells, all Vtn of victim cells will be widened and shifted by Yupin coupling effect accordingly. Particularly when the aggressor Vtn shift from the most negative Vte to the highest Vtpn of 1P or and similarly for 2P program operation. All these shifting and widening Vtpn will make the Vt-gap between two adjacent program states smaller. Once Vtn value is increased and Vtn width is widen by Yupin coupling effect after programming adjacent WLn+1 or BLn+1 and BLn-1 cells not in same time, then a more effective individual Vtn compensation technique can be achieved by using this preferred $V_{SL}$-based Vt-offset scheme of the present invention.

Additional advantage of the memory chip based YUKAI NAND array over conventional one provides M-fold reduction in row decoder driver's area and layout pitch size by using a so called M-to-1 Row decoder scheme. This can be achieved due to unique batch-based M WLn lines being selected for performing concurrent read, program and program-verify operations. In other words, M page of nLC cells located at same row-address are simultaneously selected for all key NAND operations. By using M physically independent pages of on-chip capacitors as SCACHE registers in YUKAI NAND array, M pages (WLn) of nLC read data, or nLC program data or program-verify data can be stored in parallel. Since all M independent WLn nLC data of M selected blocks are stored in M corresponding local $C_{LBL}$ capacitors, thus no data contention will happen with a same WLn address. Therefore, M WLn gates can be connected together and M row decoders can be reduced to one with M-fold reduction in layout area.

Note, for each page of WLn, the required pages of PCACHE registers are subject to nLC types and the methods to generate n varied $V_{LBL}$ voltages for preferred ABL-program of the present invention. For example, for a MLC program, there are two PCACHE pages are required to store a 2-bit MLC page data for each selected WLn. Besides, three extra PCACHE capacitors are required for generating four preferred MLC $V_{LBL}$ voltages as a 3-cap charge-sharing technique is used by the present invention. The preferred n $V_{LBL}$ voltages are extended from 0V to some values larger than Vdd such as Vtnmax and Vinh. Specifically, the values of Vtnmax are about 2V for SLC, 3V for MLC, 4V for TLC, and about 5V for XLC with Vinh≥7V. Note, all $V_{LBL}$ voltage values are preferably fixed respective to Vdd variation. In other words, under different Vdd operation, n $V_{LBL}$ values assigned for nLC program would not be changed for the preferred ABL, AnP, and Alt-WL program operation.

Furthermore, a $M_2$-fold improvement over all prior art on PB size and CACHE area reduction can be achieved by using a so-called $M_2$-to-1 scheme for SAs, Data registers and CACHE registers under the proposed YUKAI-based nLC NAND memory chip 1000 (FIG. 3). Note, the CACHE area in a PB comprises a real CACHE logic circuit referred as RCACHE that takes an extra silicon area. The PCACHE is referred as a pseudo CACHE and is comprised of $C_{LG}$ or $C_{MG}$ capacitors. The PCACHE takes no extra silicon area and can be used only to temporarily store the nLC data within a predetermined limited time longer than typical DRAM's 60 ms refresh time because either $C_{LG}$ capacitor or $C_{MG}$ capacitor has much less a N+/PW leakage junction on LBL contact areas.

The reason that $M_2$-fold reduction can be achieved in PB bit number is because a group of $M_2$ GBL'/$M_2$ lines are connected to only 1-bit of PB (to be seen in FIG. 4D below). With aid of each PCACHE to temporarily latch and store one full-page nLC data for ABL-program in cell array, a full physical page of RCACHE is not required. It allows just 1/$M_2$ page size of PB to be used for transferring the full physical MLC page data in $M_2$ iterative times. Thus, a big $M_2$-fold reduction in PB size as oppose to a conventional ABL program operation that requires a PB with same bit number of each physical page of WLn.

Although some extra overheads have to be added to the NAND memory chip 1000 including a plurality of small HGP decoder 51, LGP decoder 52, MGP decoder 53, and LBLps decoder 54 to allow multiple WLs concurrent operations, these overheads are much less than the size to add RCACHEs. Note, the preferred multi-page concurrent operations in same or different NAND planes comprising YUKAI NAND array include at least a) read while program and program-verify and b) program while program-verify and read.

Referring to FIG. 3, the YUKAI NAND memory chip 1000 includes an ISO circuit 11 having a plurality of 20V HV NMOS devices inserted between the hierarchical NAND array 15 and a page buffer (PB) 30. There are $N_2$ number of GBL'/N2 lines as inputs of the ISO circuit 11, and $N_2$ number of $DLN_2$ lines as outputs connecting to same $N_2$ number of bits of the PB 30.

The PB 30 is comprised of a Multiplier circuit, a Sense Amplifier (SA) circuit, and s Read/Write and Vt-compensation circuits. The Multiplier circuit is a first analog-and-digital amplifier of a small signal developed in each of GBL'/N2 lines. The amplified signal is transferred to each of corresponding $DLN_2$ outputs after the sensed cell signal is stored at each corresponding $C_{LBL}$ capacitor by performing the predetermined CS with each corresponding GBL'/N capacitors. The Read/Write circuit is a second amplifier made of a controlled latch-type SA (like a DRAM SA) configured to distinguish the stored nLC states in read or the iterative program-verify states during each ISPP program step and then determine whether nLC data pass the verification to inhibit further program or fail to continue the ISPP program. The Vt-compensation circuit includes nLC D/A and A/D converts and $V_{LBL}$-generator for a preferred $V_{SL}$-based Vt-offset scheme.

Referring to FIG. 3 again, the NAND memory chip 1000 includes Data registers 31 configured to be multiple real CACHE registers or RCACHE. There are at least X number of RCACHEs made of large glue logics rather than $C_{LBL}$ as PCACHE in cell array. Typically, the X number of RCACHEs for storing nLC page data of one WLn is shown in Table 1 below for nLC operations.

TABLE 1

| nLC/WLn | SLC | MLC | TLC | XLC | Analog |
|---------|-----|-----|-----|-----|--------|
| X       | 1   | 2   | 3   | 4   | ≥5     |

The connections of the X Data registers 31 to the ISO circuit 11 include $N_2$ number of output data lines $DLN_2$ in parallel so that faster and more flexible storages of nLC page data can be achieved. Note, $N_2=N/M_2$.

The NAND memory chip 1000 further includes a CACHE register 32 configured as a $N_2$-bit RCACHE register like an one-page of $N_2$-bit Data register made of the glue logics rather than $C_{LBL}$ as PCACHE in cell array. Although there are X pages of data registers 31 for each PB 30, only one page of CACHE register 32 is required and shared independently by all X pages of PB 30. In an embodiment, the RCACHE register can be designed to have two functions for both Serial and Parallel read NAND interface.

Also shown in FIG. 3, the NAND memory chip 1000 further includes a $M_3$/1 Block-decoder circuit 33 and Pointer circuit 34 to be sequentially coupled to the CACHE register 32. The Pointer circuit 34 is a medium-sized page-buffer circuit with $M_3$/1 Block-decoder circuit 33 being used between the large CACHE register 32 and a small Data I/O Buffer 90 which is coupled to an external I/O Line connected to host. In an embodiment, the number of Data I/O Buffer 90 can be 8 or 16, depending on whether NAND interface is byte or word. The $M_3$ number is defined in Table 2 below to have $M_3$ selections of byte or word out from $N_2$ CACHE bits to Data I/O buffer 90 to be clocked out from the NAND chip to an off-chip Flash controller.

TABLE 2

| # of sequential clocks | Byte-I/O | Word-I/O |
|------------------------|----------|----------|
| $M_3$ value            | $N_2/8$  | $N_2/16$ |

Further shown in FIG. 3, the NAND memory chip 1000 includes a Command Interface circuit 80 configured to communicate external control signals from host to a state-machine 70. The state-machine 70 further use the control signals to interact with the Data I/O buffer 90 and to control each of ISO circuit 11, PB 30, X number of data register 31, CACHE register 32, $M_3$/1 Block-decoder circuit 33, and Pointer circuit 34. The state-machine 70 also provides controls of an Address register 25, a voltage generator 60, a Row-decoder control circuit 50, as well as HGP decoder 51, LGP decoder 52, MGP decoder 53, and LBLps decoder 54. The Row-decoder control circuit 50 receives ADDR information from the Address register 25 and corresponding high, medium, and analog low voltages from the voltage generator 60 for setting word line control gate voltages of each NAND block of the YUKAI NAND array 15 to perform preferred NAND read, program, and verify operations. The same NAND array 15 also receives control signals from as-mentioned HGP decoder 51, LGP decoder 52, MGP decoder 53, and LBLps decoder 54 for selecting or dividing the array into smaller groups like HG, LG, or MG and providing precharging/inhibiting voltages to each selected block through a LBLps power line during the preferred NAND read, program, and verify operations. In a specific embodiment, additional commands are added for performing preferred concurrent operations in same or different NAND planes. These new commands are intended for driving concurrent $C_{LBL}$ precharge, n varied-level $V_{LBL}$ generation, n $V_{SL}$-based Vt-offset values to cover Yupin BL-BL or WL-WL coupling effects. More detail descriptions about how to perform the preferred read, program, and verify operations under the proposed YUKAI NAND memory architecture can be found throughout the specification and particularly below.

Figure 4A:
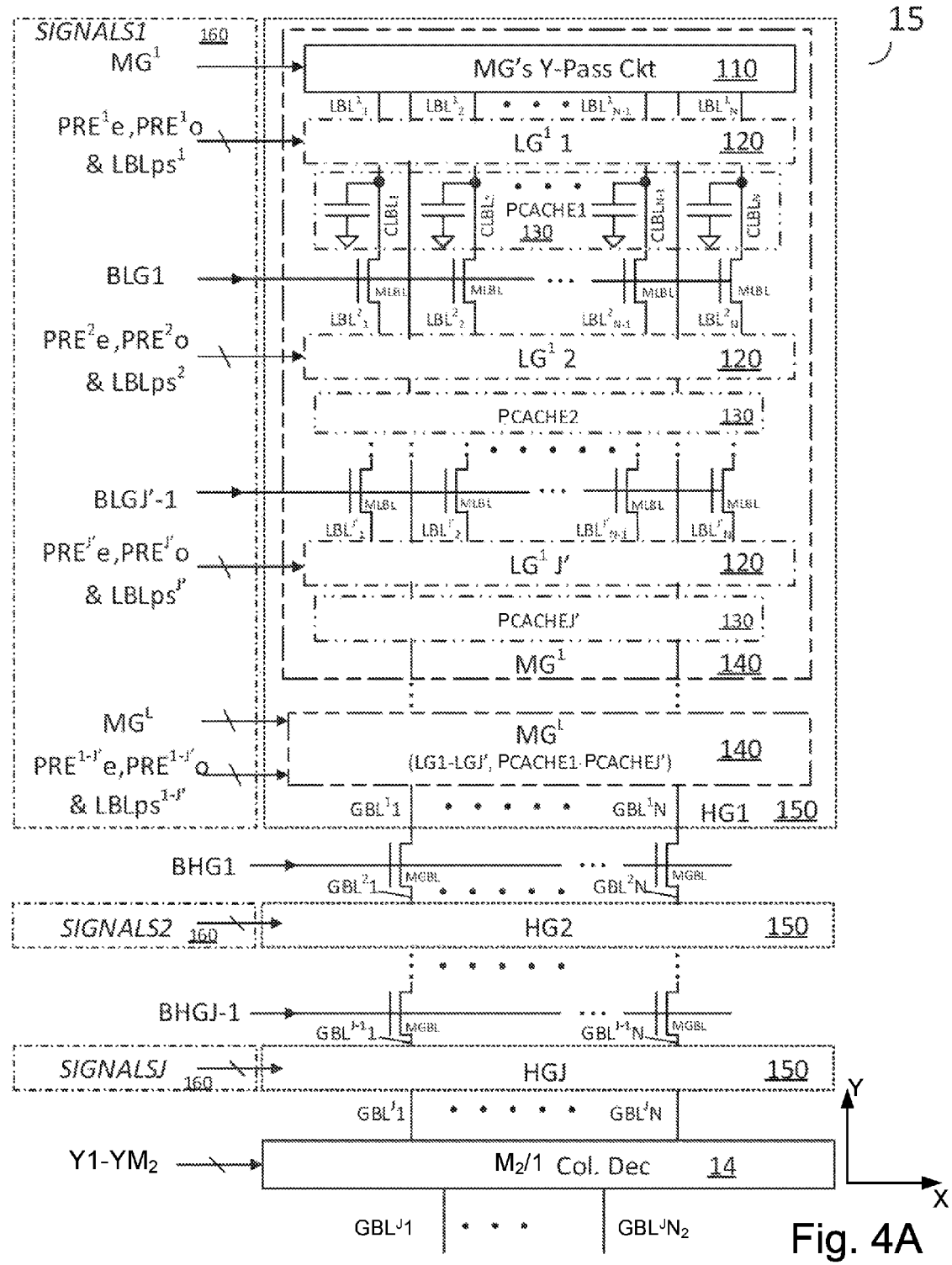
FIG. 4A is a diagram showing the YUKAI NAND array divided into multiple hierarchical BL groups according to an embodiment of the present invention.

FIG. 4A is a diagram showing preferred memory divisions of the YUKAI NAND array divided into three hierarchical BL groups according to an embodiment of the present invention. As shown, the whole NAND array 15 of FIG. 3 is divided into J equal-length or equal-size of broken GBL HG groups 150. The HG groups 150 are formed in triple-P-well 13 within a DNW 12 with a row of HV ISO array devices 11 located outside the DNW 12, as seen in FIG. 3. The last group HGJ is connected to $M_2/1$ Column-decoder 14 via N broken $GBL^J N$ lines. In fact, the size of each broken GBL group HGj (j=1, 2, . . . J) can be made identical or different and the number of HG groups is not necessary to be $2^Y$ where Y is a positive integer. From the hierarchical BL structure perspective, all J HG groups are disposed at the top-level of chip layout with total J number of broken GBL (top-level) lines $GBL^{1\sim J}N$ divided by (J−1) broken-GBL NMOS devices MGBL gated by corresponding (J−1) BHG signals. The group HGJ is one located nearest to the PB via a $M_2/1$ Column-decoder 14 but the group HG1 is one located farthest from the PB. Each HG group 150 is coupled by a Signals Row-decoder 160 to provide control signals like $MG^{1\sim L}$ for MG Y-pass devices to couple broken GBLs to LBLs, PREe, PREo and LBLps associated to each LG group for precharging/discharging LBLs, BLG signal for controlling connection/isolation between LGs.

As shown in FIG. 4A, each HG group 150 is further divided into L MG groups 140 connected by N corresponding top-level broken $GBL^J N$ metal lines at m3-level. Each m3-level metal line is associated with only one capacitor $C_{MG}$. Each MG group is then divided into J' broken lower-level LG groups 120 associated with shorter metal lines $LBL^{J'}_N$ at m1/m2-levels forming smaller capacitors $C_{LG}$. Each LG group comprises a plurality of NAND blocks (not directly shown) correspondingly connected by N lower-level m1/m2-level $LBL^{J'}_N$ metal lines which form one row of n-bit pseudo CACHE (PCACHE) registers 130. Each MG group includes a Y-pass circuit 110 configured to couple m3 top-level $GBL^J N$ metal lines respectively to the m1/m2 middle level N $LBL^{J'}_N$ lines of a first LG group. For the YUKAI NAND array based on paired string structure, $C_{LG}$ can be divided into two groups such as $C_{LGe}$ and $C_{LGo}$, or alternatively referred as $C_{LBLe}$ and $C_{LBLo}$, respectively.

The $M_2/1$ column-decoder 14 is coupled to HG group via total N number of broken $GBL^J N$ lines and further coupled to PB via total $N_2$ number of $GBL^J N2$ lines, where $N_2=N/M_2$. Since $N_2$ is smaller than N by $M_2$-fold, thus the PB size can be reduced by $M_2$-fold for a smaller chip area. The devices of $M_2/1$ column-decoder 14 are NMOS Y-select transistors gated by $M_2$ number of decoder inputs Y1~$YM_2$.

Furthermore, each YUKAI block includes N NAND strings cascaded in WL-direction, i.e., row-direction, or X-direction. Each of the N NAND strings can be any one selected from the group shown previously in FIGS. 1A-1C and more not shown without affecting the implementation of preferred NAND operations of the present invention based on the YUKAI NAND architecture proposed above.

Figure 4B:
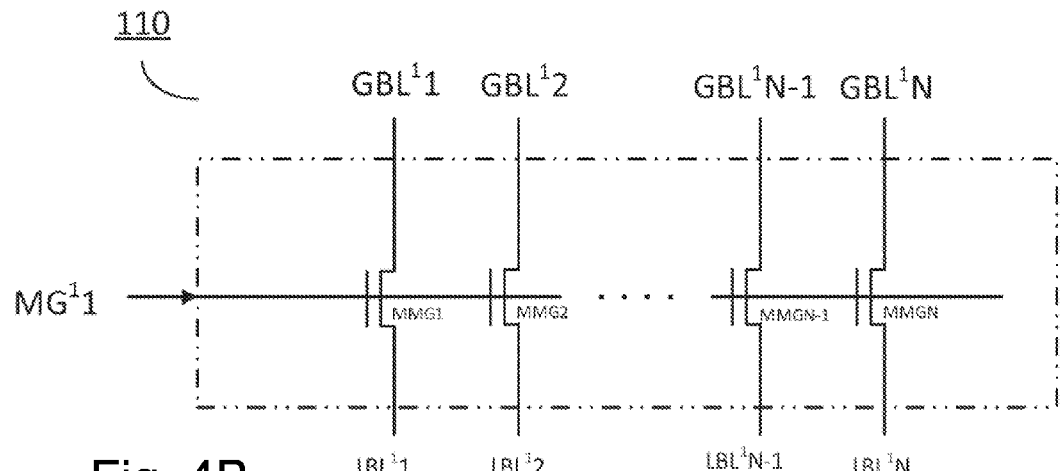
FIG. 4B is a diagram of a number of preferred Y-pass units in the YUKAI NAND array of FIG. 4A according to the embodiment of the present invention.

FIG. 4B is a diagram of a preferred MG Y-pass circuit in the NAND array of FIG. 4A according to the embodiment of the present invention. As shown, the MG Y-pass circuit 110 is configured to couple N number of LBLs with $N_1$ number of GBLs. As an example, FIG. 4B only shows that $N_1=N$, i.e., one top level metal line GBL is coupled to one lower metal line LBL in one-to-one fashion with a same 1λ pitch size. In a general scenario, the top-level metal line pitch size of each GBL can be $M_1$-fold relaxed as compared to each corresponding tight pitch bottom-level LBL line. In other words, each MG Y-pass circuit 110 includes $N_1$ number of NMOS 1-poly pass transistors such as from MMG1 to $MMGN_1$ with $M_1$ number of gates tied to $MG^1$ to $MG^1M$ respectively, where $N_1=N/M_1$, forming $N_1$ number of M/1 ($M_1$-to-1) multiplexer units for coupling $M_1$ number of LBL input lines at bottom-level to one GBL output at top-level. In an example, $M_1=2$ by making a 2-to-1 multiplexer unit for an Odd and Even select device, using only two $MG^1$ and $MG^12$ signals (e.g., MGo and MGe) to respectively select one of paired tight 1λ-width and 1λ-spacing m1/m2-level $LBL^1 1$ and m2/m1-level $LBL^1 2$ (e.g., LBLo and LBLe lines) for corresponding one top m3-level $GBL^1 1$ line.

Figure 4C:
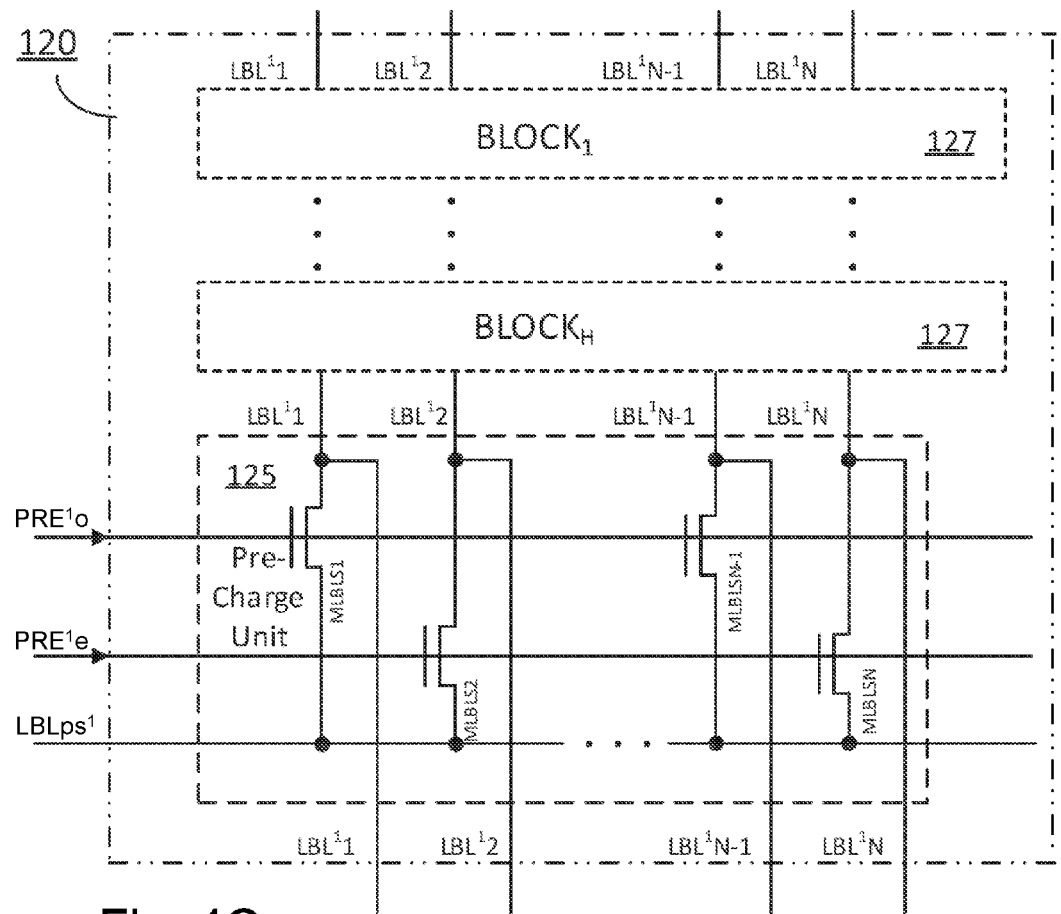
FIG. 4C is a diagram of a LG circuit in the YUKAI NAND array of FIG. 4A according to the embodiment of the present invention.

FIG. 4C is a diagram of a LG circuit in FIG. 4A comprising a preferred number of NAND blocks connected by common LBL lines and one shared LBL-precharger according to the embodiment of the present invention. As shown, a preferred LGJ' circuit 120 is one unit of a MG group 140 seen in FIG. 4A, including H NAND blocks 127, Block to $Block_H$, connected by N low-level tight m1/m2-level LBL metal lines (e.g., $LBL^1 1$ to $LBL^1 N$) and one shared LBL-precharger 125 comprised of N Precharger units. Each unit has N separate LBL outputs connected to $LBL^1 1$ to $LBL^1 N$ across H blocks but has only one common power line connected to $LBL^1 ps$ precharge power line for supplying a common medium program-inhibit voltage Vinh with maximum around ~7V for LBL precharge during program-verify and read operations.

The whole $LBL^1 1$ to $LBL^1 N$ lines are interleavingly divided into Even and Odd groups with their respective gates of MLBLS driven by $PRE^1 e$ and $PRE^1 o$ bias voltages. The function of this LGJ' circuit 12 is to form a preferred NAND LG capacitor $C_{LG}$ that allows an independent and smallest precharging and discharging current on each $C_{LG}$ of each PCACHE bit for performing multi-page concurrent ABL and AnP program operation under the framework of YUKAI NAND memory array architecture proposed above.

The voltage values of each selected $LBL^1 ps$ precharge power line vary in accordance with the targeted functions and the operating Vdd voltages for generating the desired n $V_{LBL}$ on the selected $C_{LM}$ capacitors for 0P, 1P, 2P and even FP programs. In order to generate up to 8 desired $V_{LBL}$ program voltages and one Vinh program-inhibit voltage ranging from 0V to Vtnmax for TLC storage in different program pass (1P, 2P, 3P, and FP), 3 or 4 $C_{LG}$ capacitors may be needed and the Vinh value can be flexible such as 5V to 7V, not always fixed at 7V. The generation of 8 $V_{LBL}$ program voltages and one Vinh is achieved via a charge-sharing (CS) operation by connecting the 3 or 4 adjacent $C_{LG}$ capacitors, depending on Vdd voltage.

The precharge of all $C_{LG}$ capacitors (Odd and Even) is performed by setting $PRE^1 e=PRE^1 o=Vpass$ and $VLBL^1 ps=Vinh$, where Vpass>Vinh+Vt, where Vt is the threshold voltage of MLBLS1 and MLBLS2. As such the Vinh on $VLBL^1 ps$ can be fully passed to $LBL^1 1$ to $LBL^1 N$ simultaneously without any voltage drop.

Referring to FIG. 4C, it only shows one $C_{LG}$ to be precharged with the desired Vinh at one precharging period such as T0, T1, and T2 as defined in FIG. 8G or T0, T1, T2, and T3 of FIG. 8H. For a 3-cap CS, there are 3 vertically adjacent small $C_{LG}$ capacitors need to be precharged with 3 different or same Vinh and then connected together to form one bigger $C_{LG}$ for CS to obtain the desired $V_{LBL}$ voltages as defined in FIG. 8G under higher 2.4V Vdd operation. For a 4-cap CS, there are 4 vertically adjacent small $C_{LG}$ capacitors need to be precharged with 4 different or same Vinh and then connected together to form one bigger $C_{LG}$ and then CS to obtain the desired $V_{LBL}$ voltages as defined in FIG. 8H under lower 1.6V Vdd operating voltages.

The connections of 3 or 4 rows of adjacent N-bit $C_{LG}$ capacitors or $C_{LG}$-based PCACHE registers are through the bus lines of $LBL^11$ to $LBL^1N$ and two corresponding N-bit $C_{LG}$ bridge transistors of MLBL gated by the corresponding BLGJ'-1 signals as shown in FIG. 4A. Note, when all the residue HVs in N $C_{LG}$ capacitors need to be charged after ABL program, $LBL^1$ps is reset from Vinh to 0V in most of cases, but in some cases reset to other desired verify or $V_{SL}$ offset-voltages with $PRE^1$o and $PRE^1$e biased in conduction state during read with the purpose to avoid recharge power consumption. Although Odd and Even LBL lines, such as $LBL^11$ and $LBL^12$ to $LBL^1N-1$ and $LBL^1N$ lines, are formed by interleaving m1/m2-level metal lines, this only happens in local $C_{LG}$ area. For those $LBL^11$ and $LBL^12$ to $LBL^1N-1$ and $LBL^1N$ lines used to connect the adjacent $C_{LG}$, they are turned to use m0-level only because this happens only at the boundary area between two adjacent LG groups as shown in the bottom LBL bus signals to allow the $LBL^1$ps precharge power line being formed by a lowest-level metal line only without increasing the total metal layer number in NAND array for cost reduction.

Figure 4D:
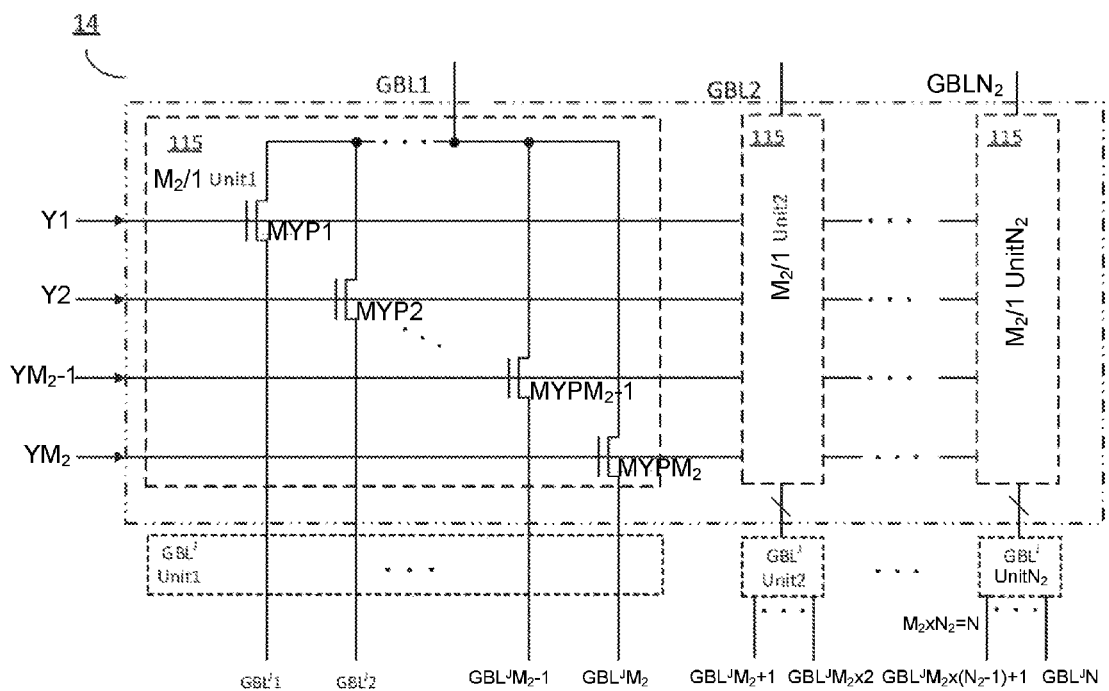
FIG. 4D is a diagram of a column-decoder circuit in the YUKAI NAND array of FIG. 4A according to the embodiment of the present invention.

FIG. 4D is a diagram of a column-decoder circuit in FIG. 4A having multiple GBL separate inputs with only one common output according to the embodiment of the present invention. As shown, a preferred Y-pass column-decoder circuit 14 as seen in FIG. 4A includes $N_2$ NMOS MHV Y-pass units 115. Each unit has $M_2$ LBL separate inputs connected to $M_2$ common gates of Y1, Y2, . . . $YM_2$ of corresponding NMOS MHV devices of MYP1, MYP2, . . . $MYPM_2$ and $M_2$ inputs of $GBL^J1$ to $GBL^JM_2$ with only one common GBL output. For example, in the $M_2/1$ ($M_2$-to-1 multiplexer) Unit1, the $M_2$ broken $GBL^JM_2$ inputs are decoded to one final GBL1 output, which will be connected to one corresponding bit of PB 30 via $N_2$-bit ISO circuit 11 as shown in FIG. 3. The total final outputs of the column-decoder circuit 14 are GBL1 to $GBLN_2$.

By implementing this Y-pass column-decoder circuit 14 to the NAND memory chip, a $M_2$-fold saving on PB size can be achieved and a tight chip layout area between PB and GBL is relaxed by $M_2$-fold. In other words, the number of $GBLN_2$ can be designed to be $M_2$-fold smaller than total GBL lines and still allows ABL program, because there are same number of N-bit LBL lines and N-bit capacitors of N-bit PCACHE register are used to temporarily store ABL-page N-bit data. These ABL N-bit MLC page data can be sequentially loaded and locked in from a smaller $N_2$-bit PB to a larger N-bit PCACHE $C_{LG}$ capacitors by $M_2$ cycles, where $N_2=N/M_2$. If $M_2=2$, then ½ PB size is saved. If $M_2=4$, then ¾ PB size is saved.

As a result, an ABL nLC-program scheme under the YUKAI NAND memory architecture of the present invention does not require a PB's bits number to be the same as the number of LBL lines. The column-decoder circuit 14 proposed above has many advantages including: 1) to allow bit number of $M_2/1$-reduction between N-bit local broken GBL lines and $N_2$-bit PB, where $M_2=N/N_2$ and $M_2=2, 4, 8, 16$, etc, for $M_2$-fold PB size reduction; 2) to allow final $N_2$-bit voltages of GBL1 to $GBLN_2$ from $GBL^J1$ to $GBL^JN$ to be higher than Vdd but below Vinh; 3) to load $N_2$-bit data into N-bit $C_{LG}$ from the smaller $N_2$-bit PB for the ABL nLC program scheme.

Figure 4E:
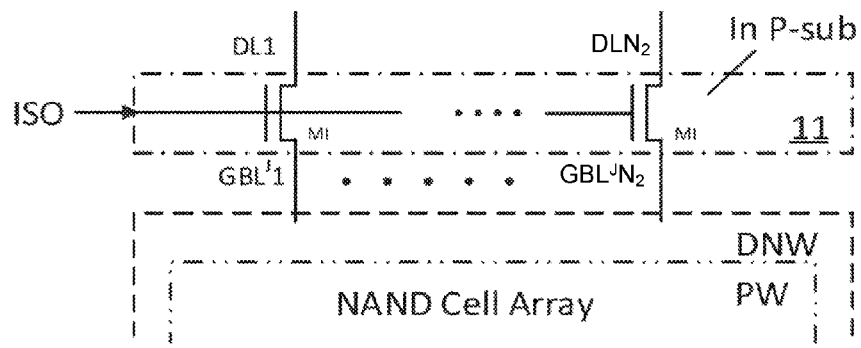
FIG. 4E is a diagram of an isolation circuit between the YUKAI NAND array of FIG. 4A and a page buffer according to an embodiment of the present invention.

FIG. 4E is a diagram of an isolation circuit between the NAND array and page buffer according to an embodiment of the present invention. As shown, in the ISO circuit 11, each final broken GBL line such as $GBL^J1$ to $GBL^JN2$ needs to have one corresponding 20V NMOS 1-poly device MI acting as a HV buffer to isolate the 20V HV erase voltage appearing on all nodes of $GBL^J1$ to $GBL^JN_2$ of the NAND array 15 from damaging $N_2$-bit corresponding LV PB located in the peripheral area. The isolation is achieved by coupling the signal of the common gate voltage $V_{ISO}$ of $N_2$ number of NMOS transistors MI to ground during erase operation, and coupling to a Vpass voltage higher than Vdd+Vt during other concurrent operations such as read, program-verify and erase-verify. The reason to have $V_{ISO}$>Vdd+Vt is to allow the full Vdd and Vss as high/low voltages from each corresponding $GBLN_2$ to store each data bit, DL1 to $DLN_2$, of $N_2$-bit of LV PB without any voltage drop through the ISO circuit 11 along with several intermediate paths through FIGS. 4A, 4B, 4C, and 4D.

The NMOS HV 20V 1-poly devices MI are formed outside the regular NAND array area. In other words, these ISO devices are preferably formed on the regular P-well as row-decoder devices (not shown), not in the same Triple-P-Well (TPW) and deep-N-well (DNW) as the regular NAND cells within NAND array 15. As a consequence, 20V Verase in the TPW and DNW in NAND array 15 would be blocked by this HV ISO circuit 11 (see FIG. 4E and FIG. 3) by grounding $V_{ISO}$=0V. Table 3 below summaries settings of $V_{ISO}$ voltage for various NAND nLC operations.

TABLE 3

| nLC operation | $V_{ISO}$ | Conditions Y = 1 to $N_2$ |
|---|---|---|
| During PB sensing | Vdd + Vt | If $VGBL^JY \geq Vdd$, |
| During PB sensing | Vdd | If $VGBL^JY < Vdd$, |
| During erase | 0 V | $VGBL^JY = 20 V$ |
| During read and verify | Vdd + Vt | $V_{DLY}$ = Vdd or Vss |
| During all GBL precharge | 0 V | $V_{DLY}$ = don't-care |
| During 2-CAP CS | 0 V | $V_{DLY}$ = don't-care |
| During Vinh/Vss and Vdd/Vss conversion in $C_{LG}$ and $C_{MG}$ | 0 V | $V_{DLY}$ = don't-care |

In an implementation of the present invention, a preferred 8-state TLC ABL, AnP and Alt-WL program scheme and their associated Vtn distributions and spacing, and Vt shifting and widening calculation and flows based on 7.5% per Yupin WL-WL and BL-BL cell floating-gate coupling effect for both the boundary and non-boundary WLs for this concurrent ABL and AnP 1P, 2P, 3P and FP (Fine) program and program-verify will be disclosed and explained in details throughout the specification and particularly in FIG. 5A through FIG. 6R. More details of preferred 8 $V_{LBL}$ assignments and generations based on 3-Cap or 4-Cap technique in 3 or 4 sequential operation cycles of T0, T1, T2, and T3 are also disclosed from FIG. 8G to FIG. 8H. Lastly, a method of providing individual $V_{SL}$-based Vt-offset to more effectively cope with Yupin-effect is also disclosed.

Throughout the specification, the as-mentioned ABL program stands for All-BL NAND program. Here it specifically stands for All-LBL NAND program in this application. This means all N-bit nLC NAND cells of all LBLs in one physical WL are simultaneously selected for an nLC program operation at a time. Additionally, the as-mentioned AnP program stands for all n-state of nLC program plus one program-inhibit operations are performed concurrently with same starting and ending time. Note, the terminologies of "concurrent" and "simultaneous" are used in the present invention. In other words, this AnP program scheme provides a truly effective method to allow all individual nLC's n varied-level Vtn of memory cell channel threshold states to be programmed simultaneously with self-ΔVtn-controlled scheme with starting and finishing substantially at a same time without earlier program lockout. The ΔVtn means that true n−1 final target Vtn-differences defined by n Vt states of nLC data. For an 8-state TLC cell, there are 8 equally-spaced ΔVtpn=0.5V. But most time only 7 out of 7 of ΔVtn are made equal for higher Vtn between P1 to P7 states. For ΔVtpn between P0 and P1 is usually made larger to take into larger Vt shift that frequently happen between P0 and P1.

In an embodiment, the Yupin BL-BL floating-gate coupling effect can be minimized because no early lockout program scenario will happen to all nLC program states as the result from the present NAND design with all n-state of nLC program plus one program-inhibit operations being performed concurrently with substantially same starting time and same ending time. The reason of this AnP capability to end all TLC states' program almost at same time is due to its nature of highly accurate self-timed TLC program control scheme by using a ΔVtn-based $V_{LBL}$ voltages that are assigned in accordance with the exact Vtn-difference among 8 interim and final targeted TLC Vtn values during all 1P, 2P, 3P and FP TLC programs.

In a specific embodiment, the present invention provides preferred 8 $V_{LBL}$ program voltages and one program-inhibit voltages assigned to 8 corresponding TLC program states such as P0 to P7. For a TLC ABL program, then up to 8 $V_{LBL}$ program voltages and one unified Vinh program-inhibit voltage are preferably used for different TLC program pass. For example, for a SLC-like 2-state 1P program of the TLC program, 2 $V_{LBL}$ voltages and one Vinh assignments are required. For a MLC-like 5-state 2P program of the TLC program, 5 $V_{LBL}$ voltages and one Vinh assignments are required. Additionally, for a TLC 8-state 3P or 3P" program of the TLC program, 8 $V_{LBL}$ voltages and one Vinh assignments are required.

In another specific embodiment, one universal Vinh program-inhibit voltage is assigned for all TLC program states when each individual Vtn value meets its own predetermined value for program-verify after each iterative program pulse being performed. Typically, its value is set to be ~7V for the ideal precharge voltage. But as using 3-Cap or 4-Cap CS technique to generate up to 8 desired $V_{LBL}$ interim or final program voltages and final program-inhibit voltage, then Vinh value varies between 0V and 7V. There is a tradeoff between the final optimal $V_{LBL}$ and Vinh voltages. For more accurately determine the final $V_{LBL}$ voltages, the Vinh value may end up with a voltage much lower than 7V. In some cases, both ideal final Vinh=7V and 8 accurate $V_{LBL}$ program voltages determined for 8 target Vtn can be more easily achieved at the higher Vdd operating voltage.

In yet another specific embodiment, 3-Cap or 4-Cap CS technique is used to generate n desired final $V_{LBL}$ voltages and 1 Vinh program-inhibit voltage per each pass of TLC program. In general, it is preferred to use least number of $C_{LG}$ capacitors for the CS operation as possible to save latency time and power consumption of TLC program operation. In the TLC program, 3 or 4 adjacent $C_{LG}$-based 3-bit or 4-bit PCACHE registers are used per one TLC physical cell under different Vdd. The 3 or 4 adjacent equal $C_{LG}$ capacitors are independently precharged with respective predetermined voltages in accordance with 8 TLC data on one cycle or 3 or 4 different cycles of T0, T1, T2, and T3 can be performed before CS. The precharged voltage values on the 3 or 4 adjacent $C_{LG}$ capacitors preferably vary from 0V to 7V (wherein 7V is about the breakdown voltage of by the string-select transistor).

In an example for MLC program, the 3-Cap CS needs 3 selected LBLps precharge power lines to be coupled with 3 predetermined voltages for charging respectively the 3 adjacent $C_{LG}$s. These 3 precharged $C_{LG}$ voltages are referred as Vinh0 for T0, Vinh1 for T1, and Vinh2 for T2, with 3 equal $C_{LG}$ capacitance. A CS step among the 3 $C_{LG}$ capacitors to generate 4 or 3 final $V_{LBL}$ voltages and a Vinh voltage. Each final $V_{LBL}$ voltage for one program state=(Vinh0+Vinh1+Vinh2)/3. Different MLC program state would have different set of Vinh0+Vinh1+Vinh2 values. Note, less than 3 $C_{LG}$ capacitors can be used for generating the desired 8 $V_{LBL}$ and 1 Vinh voltages but with larger offset from desired values predetermined from target Vtn.

Throughout the specification, Alt-WL program is referred to alternating nLC program, specifically for alternating TLC program, operation among three adjacent WLs. The idea behind the Alt-WL TLC program scheme is that each physical TLC page program is divided into multiple logic pages that have to be programmed in succession according to their physical page order. For a TLC program, it is divided into 3 logic pages such as LSB, CSB, and MSB. This alternating operative way is intended to mitigate the capacitive coupling effect on the preceding pages. In fact, any preceding pages cannot change the threshold voltages of the cells of the current page because they are no long modified after their programming and are referred as lockout states in the lockout page. However, the current page still will be affected by the capacitive coupling effects of the adjacent TLC cells programmed in subsequent order. In the present invention, one or more reliable Alt-WL program TLC program schemes are proposed to improve the mitigation of coupling effect especially from the TLC cell in next adjacent WLs based on its programmed state.

In an embodiment, for properly implementing the Alt-WL TLC program operation, including a SLC-like 1P program followed by a MLC-like 2P program and a final TLC 3P program, Vtpn margin is kept with sufficient margin between each current interim program state and next interim or final program state. For example, a SLC-like 1P program generates 2 interim program states P0 and P4 with optimal Vt margins to prevent early lockout due to BL-BL Yupin coupling effect. The maximum Vt of the interim program state P0 after the 1P program is optimized to be lower than minimum Vt of next interim program state P1 after a 2P program with ~1.3V margin to prevent earlier lockout in the 1P when the 2P program and even a 3P program are performed subsequently. In other words, Vp0max(1P)<Vp1min (2P) and Vp1min (2P)−Vp0max(1P)=1.3V.

In another example, the maximum Vt of an interim program state P4 after the 1P program is optimized to be lower than minimum Vt of the next interim program state P4 after a 2P program with ~1.1V margin to prevent earlier lockout in the 1P when the 2P program and even a 3P program are performed subsequently. In other words, Vtp4max(1P)<Vtp4 min (2P) and Vtp4 min (2P)−Vtp4max (1P)=1.1V.

In yet another example, the interim state P0 is used to generate 3 final lower TLC program states of P0, P1, and P2 while the interim state P4 is used to generate 4 final higher TLC program states of P4, P5, P6, and P7. Thus MSB-bit data of the TLC page data has to be loaded and programmed first. After a successful 1P program, the MSB-bit data can be removed from the $C_{LG}$-based PCACHE register so that next CSB and LSB page data can be sequentially loaded into the same place without taking addition $C_{LG}$s. Note, the removed MSB page data can be retrieved from the cell in current page WLn before the subsequent 2P and 3P programs of the TLC program operation.

In another embodiment, the Alt-WL TLC program operation includes a step for performing 5-state MLC-like 2P' TLC program (replacing a 4-state 2P program) optimized to further reduce the BL-BL coupling effect on current WLn TLC cells by reducing Vt shifting and widening. Table 4 summarizes major difference between an TLC Alt-WL program operation based on an embodiment of the present invention and one used in prior art.

TABLE 4

| TLC Alt-WL program comparison | Present invention | Prior art |
|---|---|---|
| Number of $V_{LBL}$/Vinh for 1P (SLC) | 2/1 | 1/1 |
| Number of $V_{LBL}$/Vinh for 2P' (5-state MLC-like) | 5/1 with zero 1P lockout | 3/1 with some 1P lockout |
| Number of $V_{LBL}$/Vinh for 3P (8-state TLC) | 8/1 with zero 2P lockout | 7/1 with some 2P lockout |
| Values of $V_{LBL}$ | $0 \le V_{LBL} \le$ Vtpnmax. Some $V_{LBL}$ may be greater than Vdd | $0 \le V_{LBL} <$ Vdd-Vt |
| Value of Vinh | Vdd ≤ Vinh ≤ 7 V | Vinh = Vdd |

FIG. 5A shows a preferred ABL, AnP, and Alt-WL program scheme with alternate WL rotations and sequences for performing multi-passes TLC program operations according to an embodiment of the present invention. As shown, a preferred ABL, AnP, and Alt-WL TLC program scheme includes alternate sequences of SLC-like dummy program (DP) and 1P program, 5-state MLC 2P' program and 8-state 2P program, and 8-state TLC 3P and 3P''' programs. In the table, the as-mentioned various program operations respectively induce different Vt shifts referred as DS, 1S and 2S, 2S', 3S, and 3S'' with respect to different time periods starting from t0 to t11. The TLC program operation starts from one top dummy WL, DMYWL, a first boundary WLn−1, non-boundary WLs (e.g., WLn, WLn+1 and WLn+2), and a second boundary WLn+3 and a fine program (FP) of WLn+3 after WLn+4's TLC program.

Within following examples used for illustrating the TLC program operation, the degree of each Yupin floating-gate coupling effect induced by adjacent TLC cells in either the same BL or the same WL is assumed to be one identical factor of 7.5% which is used in the calculation of respective induced Vt-shifting of 1S, 2S, 3S, and DS. The Yupin coupling effect induced by 4 diagonal cells in 2D NAND array is neglected herein for a simpler illustration of the present invention. As a result, total 30% Yupin-effect is considered as worst-case scenario Vt shift and widening to affect all TLC program cells in either boundary or non-boundary WLs. For 3D NAND, BL-BL Yupin-effect is negligible, thus the total Yupin coupling effect is only from two top and bottom adjacent WLs giving a total factor of 15%.

In the example shown in FIG. 5A, the WLn−1 is defined as a first boundary WL of a first group of pages subjecting to the Alt-WL program, which is next to non-boundary WLn with corresponding cells in $E^0$ state and a precedent dummy WLn−2 with corresponding cells in D0 state. The WLn+3 is defined as a second boundary WL with next adjacent WLn+4 with corresponding cells in $E^0$ state even after a 3P program on WLn+3 cells. Any WLs between WLn−1 and WLn+3 such as WLn, WLn+1 and WLn+2, are defined as the non-boundary WLs.

Similar to WLn−1, the WLn+4 is defined as next first boundary WL of a second group of pages subjecting to the Alt-WL TLC program which is continued to be performed in a sequence starting from WLn+4, then WLn+5 and beyond to WLn+7. Note the numbers of non-boundary WLs in the first group and the second group may not be limited to 3 as used here, but can be flexibly increased depending on program needs as long as their cells have been erased before program. All boundary WLs needs to be marked (with a special "Mark" bit) on the spare cells in predetermined locations in each boundary WL to differentiate them from the regular non-boundary WLs for performing TLC read operation with different $V_{SL}$-based individual Vt-compensations.

Referring to FIG. 5A, the TLC program sequences starts from 1P, then 2P or 2P'', then 3P or 3P''', depending the selection of the preferred TLC program scheme. In particular, at t0, dummy cells in DMYWL are programmed first by the DP operation. As a result, DP-induced DS will affect the next adjacent WLn−1 only. But the Yupin coupling affect only happens to N/2-bit LBL cells, e.g., either Odd or Even cells in the WLn−1. At t1, 1P is performed on the WLn−1 in which 1S is induced by the 1P-programmed WLn−1 on adjacent WLn and DMYWL cells. At t2, 1P is performed on the non-boundary WLn in which 1S is induced by 1P-programmed WLn on adjacent WLn−1 cells and WLn+1 cells but the 1P coupling effect of WLn−1 on the WLn cells is reduced. Details on the rest of program sequences can be found in FIG. 5A.

Fig. shows a preferred ABL, AnP, and Alt-WL program scheme with alternate WL rotations and sequences for performing multi-passes TLC program operations according to another embodiment of the present invention. As shown, the Alt-WL TLC program further continues the operation for WLn+4 once WLn+4's TLC page data becomes available. The program sequence is set to be like the regular non-boundary WLs from WLn+5 to WLn+6 and beyond similar to operations on non-boundary WLs from WLn to WLn+2 and down to the second boundary WLn+3.

There are several program options between the second boundary WLn+3 of the first group and the next boundary WLn+4 of the second group. In an embodiment, WLn+3 may be performed 1P operation before 1P program on WLn+4 cells (when MLC data is ready) to reduce the Vt shifting and widening of the WLn+4 cells (for MLC program). In an alternative embodiment, the WLn+3 may be performed a 3P operation to end its whole program passes when the WLn+4 TLC data is not ready yet.

Figure 6A:
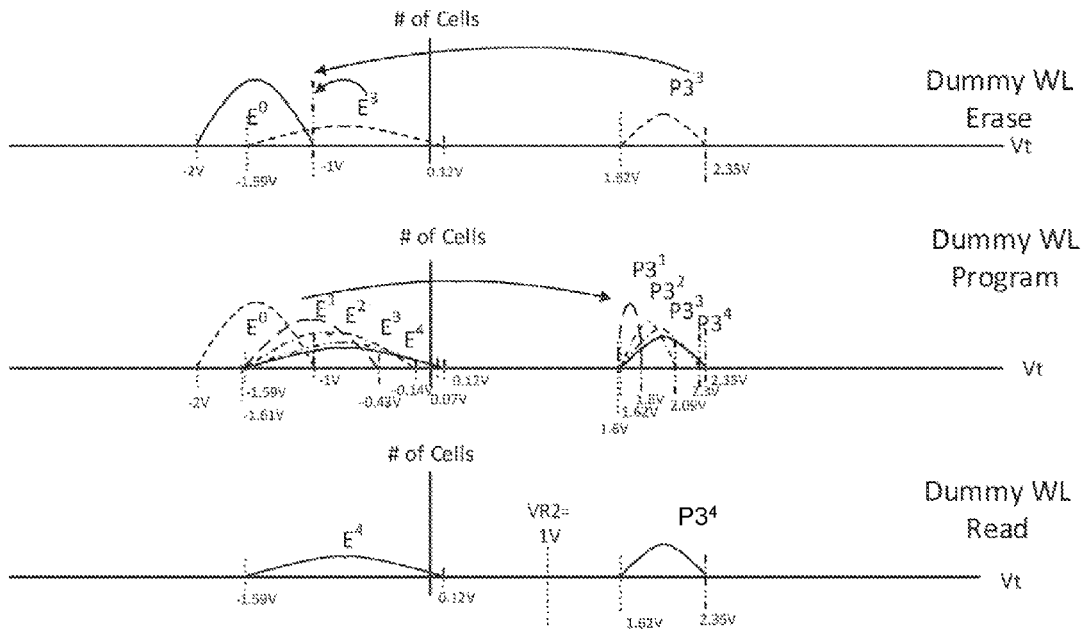
FIG. 6A is a diagram showing preferred Vt distributions of dummy cells in erase, SLC-like program, and read in association with a preferred 1-2-8(coarse)-8(fine) TLC program scheme according to an embodiment of the present invention.

FIG. 6A is a diagram showing preferred Vt distributions of dummy cells in erase, SLC-like program, and read in association with a preferred 1-2-8(coarse)-8(fine) TLC program scheme according to an embodiment of the present invention. As shown, 3 graphs and one table are used to illustrate dummy cell erase, SLC-like program, and read operations when the regular TLC NAND cells are programmed under a 1-2-8(coarse)-8(fine) TLC program scheme. For dummy cell program, only N/2-bit Even/Odd dummy cells per one physical dummy WL are programmed. Thereafter, the second dummy WL N/2 Odd/Even cells will be complementarily programmed to make one paired dummy cells in two dummy WLs (per block) acting as Odd and Even column select transistors without using any extra big select transistors. Although these two dummy WL locations in each block can be flexibly placed in any locations of each NAND string, they are preferably placed together in a middle location to provide two mirrored sub-strings for each string.

Referring to the first graph of FIG. 6A, it shows that an erase operation shifts dummy cell with a program state $P3^3$ with initial positive Vt distribution and an erase-state of $E^3$ with widened Vt distribution ranging from minor positive but major negative values to only one final erase state of $E^0$ state with a desired negative Vte1max≤−1.0V. The Vt-width $E^0$ state is assumed to be 1V, ranging from −1V to −2V. The details of erase-verify and erase operations of dummy cells with bias conditions will be explained with respect to figures from FIG. 9A to FIG. 10F of this specification.

Referring to the second graph of FIG. 6A, it shows that a preferred SLC-like DP step that shifts part of the dummy cell Vt from the initial $E^0$ state to one SLC-like narrow program state $P3^1$ by using one program-verify voltage with a minimum $Vtp3^1$min of 1.6V and a narrow width of 0.2V. Thus the incremental-step-pulse-programming (ISPP) with ΔVpgm>0.2V can be used herein to shorten the dummy cell's program time. In this case, the width of $P3^1$ will be larger than 0.2V.

Note, the maximum DS shift of one Odd/Even $E^0$ cell is induced by 2 Even/Odd dummy's $P3^1$ cells during the DP program. Each voltage shift of DS is optimized by 2V+1.8V=3.8V. Thus DS=(2+1.8)×7.5%×2=0.57V. Each 1S voltage shift in is optimized to be 3V+0.8V=3.8V, regardless of the boundary WLn−1 or non-boundary WLn TLC cell.

Referring to the third graph of FIG. 6A, it shows that a preferred Odd/Even-based dummy cell and DMYWL SLC read operation with one read check voltage VR2 being optimized with 1.0V, for two widened states of $E^4$ and $P3^4$. Note, if the select $V_{DMYWL}1$=1.0 0V but the complimentary $V_{DMYWL}2$=Vread are used, the Odd string is selected for read, vice versa, if the select $V_{DMYWL}1$=Vread but the complimentary $V_{DMYWL}2$=1.00V are used, the Even string is selected for read, where Vread=4-6V.

Figure 6B:
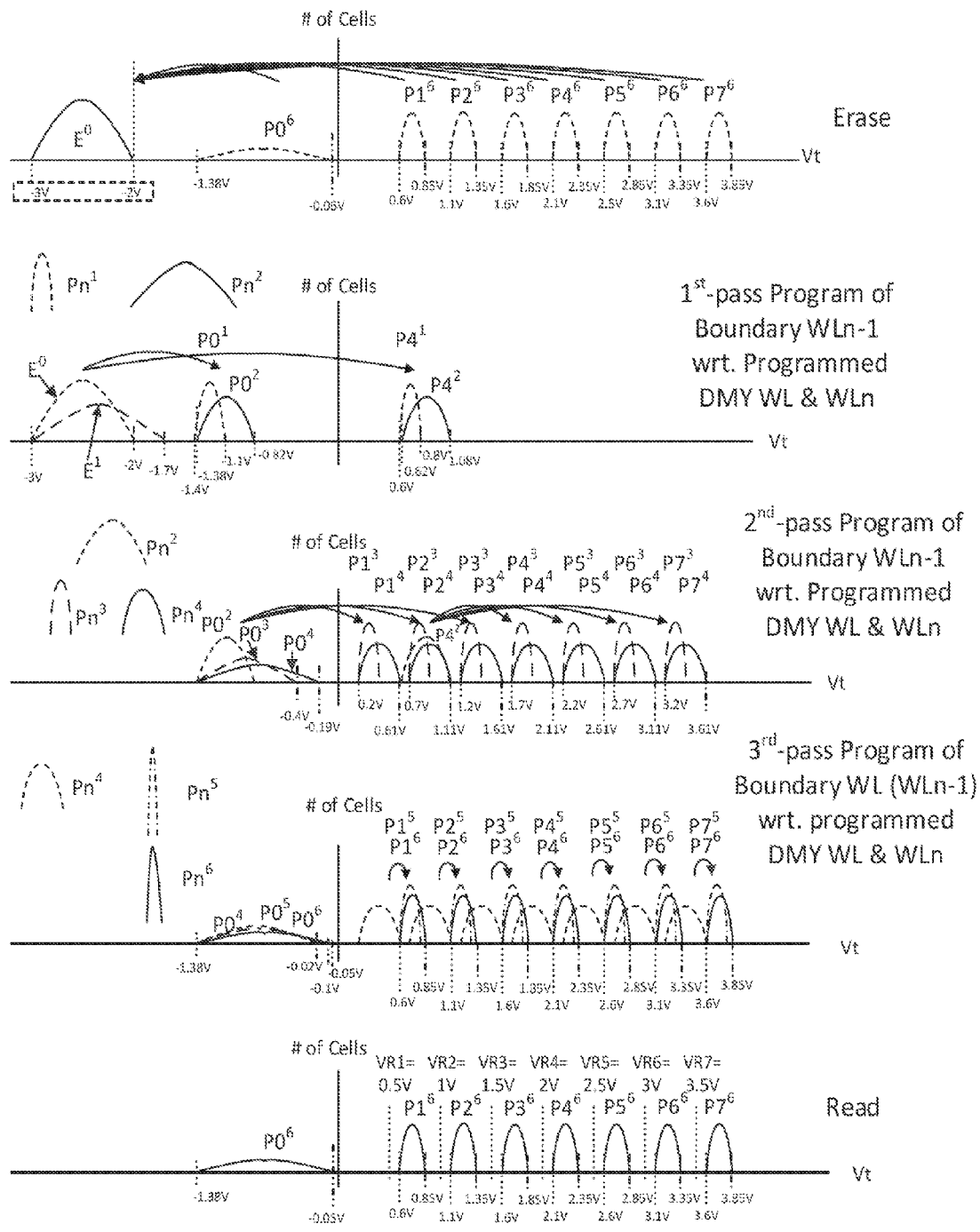
FIG. 6B is a diagram showing Vt distributions, shifting, verify and widened voltages for TLC operations of NAND memory cells with a boundary WLn−1 next to the dummy WL (of FIG. 6A) in association with a preferred 1-2-8 (coarse)-8(fine) TLC program scheme according to an embodiment of the present invention.

FIG. 6B is a diagram showing Vt distributions, shifting, verify and widened voltages for TLC operations of NAND memory cells with a boundary WLn−1 next to the dummy WL (of FIG. 6A) in association with a preferred 1-2-8 (coarse)-8(fine) TLC program scheme according to an embodiment of the present invention. As shown, 5 graphs are used for illustrating that a preferred TLC 1-2-8(coarse)-8(fine) program scheme with 1P, 2P and 3P program operations are performed on one boundary WLn−1 NAND TLC cells which are optimized with respect to dummy WL being programmed with DP and WLn with a regular TLC program. In the first graph, the erase operation shifts the TLC cell Vts from 7 initial program states of $P1^6$, $P2^6$, $P3^6$, $P4^6$, $P5^6$, $P6^6$, and $P7^6$ and one widened $P0^6$ to one $E^0$ state having $Vte^0$max=−2.0V (as an erase-verify voltage). In the second graph, the preferred ABL 1P program shifts cell Vt from an $E^1$ state initially widened due to DS (induced by dummy WL's DP) to 2 narrow SLC-like interim program states $P0^1$ and $P4^1$ by using 2 optimized program-verify voltages $Vtp0^1$min=−1.4V and Vtp4 min=0.6V to prevent earlier lockout during the subsequent 8-state TLC 2P coarse program.

In the third graph, the preferred ABL 2P program shifts the TLC cell Vts from 2 initially widened interim states of $P0^2$ and $P4^2$ to 8 interim near-final narrow TLC states of $P0^3$, $P1^3$, $P2^3$, $P3^3$ in a lower group, and $P4^3$, $P5^3$, $P6^3$, and $P7^3$ in a higher group, respectively, by using 7 new program-verify voltages $Vtp1^3$min=0.2V, $Vtp2^3$min=0.7V, $Vtp3^3$min=1.2V for the lower-group, $Vtp4^3$min=1.7V, $Vtp5^3$min=2.2V, $Vtp6^3$min=2.7V, and $Vtp7^3$min=3.2V for the higher group.

In the fourth graph, the preferred ABL 3P program shifts the TLC cell Vts from 8 initially widened interim TLC coarse states of $P0^4$, $P1^4$, $P2^4$, $P3^4$, $P4^4$, $P5^4$, $P6^4$, $P7^4$ to 8 final narrow fine TLC states of $P0^5$, $P1^5$, $P2^5$, $P3^5$, $P4^5$, $P5^5$, $P6^5$, and $P7^5$ by using 7 new program-verify voltages such as $Vtp1^3$min=0.6V, $Vtp2^3$min=1.1V, $Vtp3^3$min=1.6V, $Vtp4^3$min=2.1V, $Vtp5^3$min=2.6V, $Vtp6^3$min=3.1V, and $Vtp7^3$min=3.6V.

In the fifth graph, the preferred Odd/Even-based TLC read operation with 7 read check voltages such as VR1=0.5V, VR2=1.0V, VR3=1.5V, VR4=2.0V, VR5=2.5V, VR6=3.0V, and VR7=3.5V is performed to distinguish 8 final widened TLC states of $P0^6$, $P1^6$, $P2^6$, $P3^6$, $P4^6$, $P5^5$, $P6^6$, and $P7^6$.

All DP-induced DS, 1P-induced 1S, 2P-induced 2S and 3P-induced 3S Vt-shifts are calculated in terms of Vtmax for E state and P0 state for WLn−1 (one boundary WL) with respect to precedent adjacent dummy WL with Vt=Vte/$V_{DM}$ (and referring to FIG. 5A). Initially at $E^0$ state, $Vte^0$max=−2V and $Vte^0$min=−3V. At t0, DS is induced by DP performed on dummy WL to move from $E^0$ to P6, $Vte^1$max=(−2)+(2+1.8)7.5%=−1.71V. At t1, 1P operation is performed on WLn−1 to move $E^1$ to $P4^1$, $P0^1$ state of WLn−1 is shifted to $Vtp0^1$max=(−1.4)+(0.3)=−1.1V. At t2, 1S is induced on WLn−1 by 1P performed to WLn to $E^1$ to $P4^1$, $Vtp0^2$max=(−1.1)+(2.98+0.8)7.5%=−0.82V. At t3, 2P is performed on WLn−1 to widen $Pn^2$ to $Pn^3$, the $Vtp0^3$max=(−0.82)+(3.4−0.62)7.5%×2=−0.4V. At t5, 2S is induced on WLn−1 by 2P performed on WLn to widen $Pn^3$ to $Pn^4$, the $Vtp0^4$max=(−0.4)+(3.4−0.62)7.5%=−0.19V. At t6, 3P is performed on WLn−1 to widen $Pn^4$ to $Pn^5$, $Vtp0^5$max=(−0.19)+(3.8−3.2)7.5%×2=−0.1V. At t9, 3S is induced on WLn−1 by 3P performed on WLn to widen $Pn^6$ to $Pn^7$, the $Vtp0^6$max=(−0.1)+(3.8−3.2)7.5%=−0.05V. Note, $Vtp0^1$max is set to −1.1V due to WLn−1 ($Vtp4^1$max−$Vte^1$min)7.5%×2=(0.8+0.3)7.5%×2=0.57V, and 0.57V+(−1.71V)=−1.14V<−1.1V. $Vtp0^2$min and $Vtp4^2$min are shifted by 0.02V due to WLn ($Vtp0^1$min−$Vte^1$max)7.5%=(1.72−1.4)7.5%=0.02V. No shift is on $Vtpn^4$min and $Vtpn^6$min because no program is performed on WLn Vtp0.

Figure 6C:
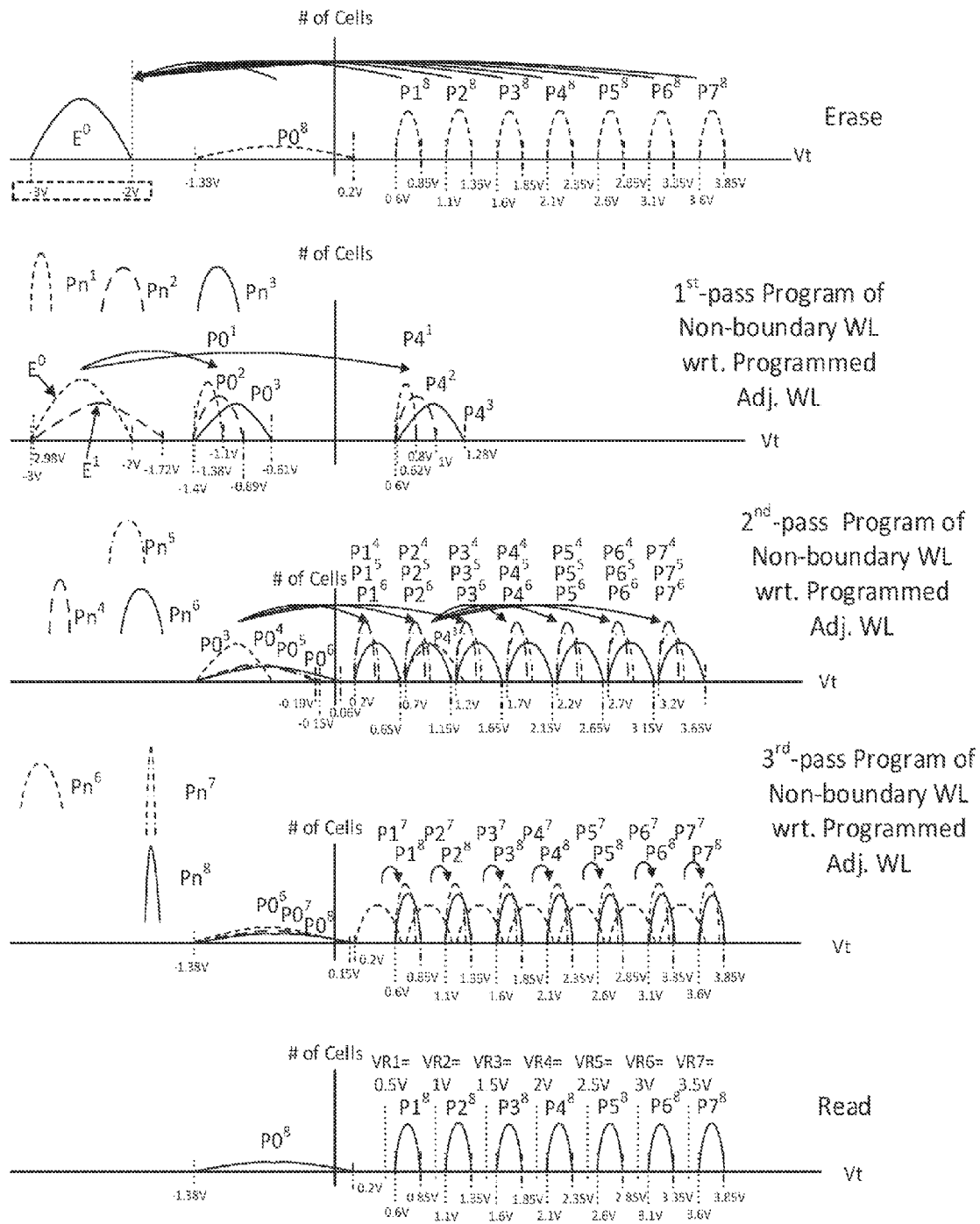
FIG. 6C is a diagram showing Vt distributions, shifting, verify and widened voltages for TLC operations of NAND memory cells with a non-boundary WLn in association with a preferred 1-2-8(coarse)-8(fine) TLC program scheme according to an embodiment of the present invention.

FIG. 6C is a diagram showing Vt distributions, shifting, verify and widened voltages for TLC operations of NAND memory cells with a non-boundary WLn in association with a preferred 1-2-8(coarse)-8(fine) TLC program scheme according to an embodiment of the present invention. As shown, 5 graphs are used to illustrate preferred TLC operations of non-boundary WL's cells under TLC 1-2-8(coarse)-8(fine) program scheme with each interim program 1P, 2P, or 3P in Alt-WL sequences. In the first graph, the erase operation shifts TLC cells Vts from 8 initial widened program states of $P0^8$, $P1^8$, $P2^8$, $P3^8$, $P4^8$, $P5^8$, $P6^8$, $P7^8$ to one $E^0$ state with $Vte^0$max=−2.0V as the erase-verify voltage. In the second graph, the preferred ABL-1P program shifts the cells Vt from one initial widened $E^1$ state with $Vte^1$max=−1.72V induced by DS of dummy WL to 2 narrow SLC-like program states of $P0^1$ and $P4^1$ by using 2 program-verify voltages $Vtp0^1$min=−1.4V and $Vtp4^1$min=0.6V to prevent earlier lockout for subsequent 8-state TLC coarse 2P program. After the 1P program step, no more erase-state cells left. All $E^0$-state cells are programmed into either $P0^1$ or $P4^1$ program-state cells to reduce Yupin BL-BL coupling effect.

Further in the third graph, the preferred ABL 2P program is performed to shift the TLC cells Vts from 2 initially widened interim SLC-like states of $P0^3$ and $P4^3$ respectively to 8 interim near-final narrow TLC states of $P0^4$, $P1^4$, $P2^4$ in a lower group, and $P3^4$, $P4^4$, $P5^4$, $P6^4$, $P7^4$ in a higher group, by using 7 similar new program-verify voltages such as $Vtp1^3min=0.2V$, $Vtp2^3min=0.7V$, $Vtp3^3min=1.2V$ for the lower group, $Vtp4^3min=1.7V$, $Vtp5^3min=2.2V$, $Vtp6^3min=2.7V$, and $Vtp7^3min=3.2V$ for the higher group.

In the fourth graph, the preferred ABL 3P program is performed to shift the TLC cells Vts from 8 initially widened interim TLC coarse states of $P0^7$, $P1^7$, $P2^7$, $P3^7$, $P4^7$, $P5^7$, $P6^7$, $P7^7$ to 8 final narrow TLC states of $P0^8$, $P1^8$, $P2^8$, $P3^8$, $P4^8$, $P5^8$, $P6^8$, and $P7^8$ by using a new set of 7 program-verify voltages $Vtp1^8min=0.6V$, $Vtp2^8min=1.1V$, $Vtp3^8min=1.6V$, $Vtp4^8min=2.1V$, $Vtp5^8min=2.6V$, $Vtp6^8min=3.1V$, and $Vtp7^8min=3.6V$.

Furthermore, in the fifth graph, the preferred Odd/Even-based TLC read operation is performed with 7 read check voltages $VR1=0.5V$, $VR2=1.0V$, $VR3=1.5V$, $VR4=2.0V$, $VR5=2.5V$, $VR6=3.0V$, and $VR7=3.5V$ being used to distinguish 8 final narrow TLC states of P0, $P1^8$, P2, $P3^8$, $P4^8$, $P5^8$, $P6^8$ and $P7^8$.

For each pass of TLC erase and program operations, all 1P-induced 1S, 2P-induced 2S and 3P-induced 3S Vt-shifts are calculated in terms of Vtmax for E state and P0 state for WLn+1 (one example of the non-boundary WLs) with respect to programmed adjacent WLn and WLn+2 (and referring to FIG. 5A). Initially at $E^0$ state, $Vte^0max=-2V$ and $Vte^0min=-3V$. At t2, WLn experienced a 1P operation to move from E to $P4^1$, inducing 1S shift for E state of WLn+1, $Vte^1max=(-2)+(2.98+0.8)7.5\%=-1.72V$. At t4, 1P operation is performed on WLn+1 to move $E^1$ to $P4^1$, the Vt of $P0^1$ state of WLn+1 is shifted to $Vtp0^1max=(-1.4)+(0.3)=-1.1V$, which is due to $(Vtp4^1max-Vte^1min)7.5\%\times2=(0.8+2.98)$ $7.5\%\times2=0.57V$, and $0.57V+(-1.72)=-1.15V<-1.1V$. At t5, 2S is induced on WLn+1 by 2P performed on WLn to widen $Pn^3$ to $Pn^4$ so that $Vtp0^2max=(-1.1)+(3.4-0.62)7.5\%=-0.89V$. At t7, 1S is induced on WLn+1 by 1P on WLn+2 to move $E^2$ to $P4^3$, the $Vtp0^3max=(-0.89)+(2.98+0.8)7.5\%=-0.61V$. At t8, 2P is on WLn+1 to widen $Pn^3$ to $Pn^4$, the $Vtp0^4max=(-0.61)+(3.4-0.62)7.5\%\times2=-0.19V$. At t9, 3S is induced on WLn+1 by 3P performed on WLn to widen $Pn^6$ to $Pn^7$, $Vtp0^5max=(-0.19)+(3.8-3.2)7.5\%=-0.15V$. At t11, 2S is induced on WLn+1 by 2P performed on WLn+2 to widen $Pn^3$ to $Pn^4$, the $Vtp0^6max=(-0.15)+(3.4-0.62)$ $7.5\%=0.06V$. At t12, 3P is performed on WLn+1 to widen $Pn^6$ to $Pn^7$, the $Vtp0^7max=(0.06)+(3.8-3.2)7.5\%\times2=0.15V$. At t14, 3S is induced on WLn+1 by 3P performed on WLn+2 to widen $Pn^6$ to $Pn^7$, the $Vtp0^8max=(0.15)+(3.8-3.2)$ $7.5\%=0.2V$. Note, $Vte^1min$ is shifted by 0.02V due to WLn $(Vtp0^1min-Vte^1max)7.5\%=(1.72-1.4)7.5\%=0.02V$. No shift is on $Vtpn^2min$ due to that no program is on WLn Vtp0. $Vtpn^3min$ is shifted by 0.02V due to WLn+2 $(Vtp0^1min-Vte^1max)7.5\%=(1.72-1.4)7.5\%=0.02V$. No shift is on $Vtpn^5min$ due to that no program is on WLn Vtp0. No shift on $Vtpn^6min$ and $Vtpn^5min$ due to no program on WLn+2 Vtp0.

Figure 6D:
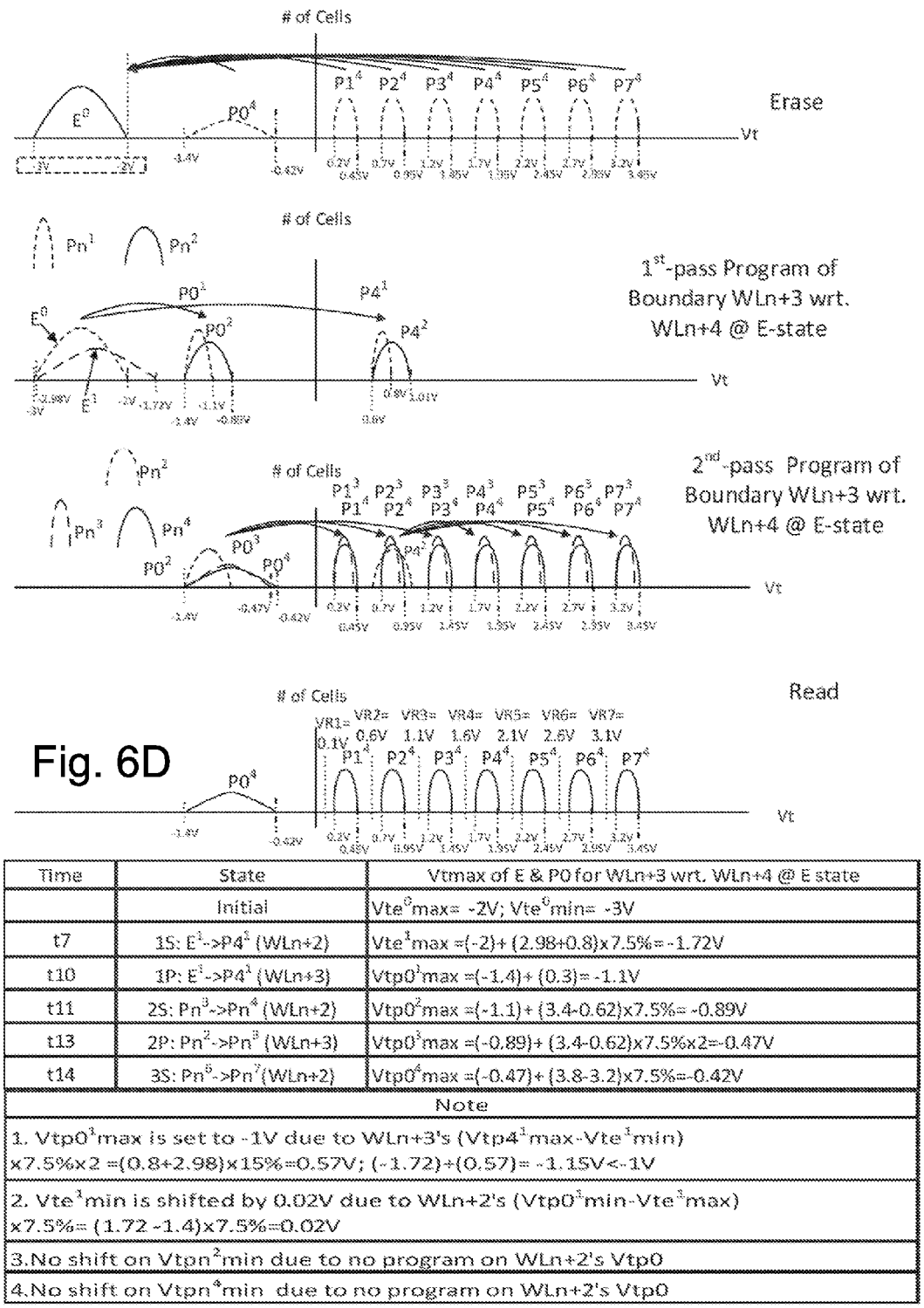
FIG. 6D is a diagram showing Vt distributions, shifting, verify and widened voltages for TLC operations of NAND memory cells with a second non-boundary WLn+3 with next adjacent WLn+4 being at E-state in association with a preferred 1-2-8(coarse)-8(fine) TLC program scheme according to an embodiment of the present invention.

FIG. 6D is a diagram showing Vt distributions, shifting, verify and widened voltages for TLC operations of NAND memory cells with a second non-boundary WLn+3 with next adjacent WLn+4 being at E-state in association with a preferred 1-2-8(coarse)-8(fine) TLC program scheme according to an embodiment of the present invention. As shown, 4 graphs and one table are used to illustrate TLC operations of second boundary WLn+3 NAND cells with adjacent WLn+4 cells being in $E^0$ state under TLC 1-2-8 (coarse)-8(fine) program scheme including each interim program of 1P, 2P and 3P in Alt-WL TLC sequence as defined in FIG. 5A.

In the first graph, the erase operation is performed to shift TLC cells Vts from 7 initial program states of $P1^4$, $P2^4$, $P3^4$, $P4^4$, $P5^4$, $P6^4$, and $P7^4$ and one widened $P0^4$ to one $E^0$ state with $Vte^0max=-2.0V$ as the erase-verify voltage. The 7 initial program states of $P1^4$, $P2^4$, $P3^4$, $P4^4$, $P5^4$, $P6^4$, and $P7^4$ are un-widened because WLn+4 cells are not ready to be programmed when the WLn+3 are finished with 1P, 2P and 3P programs.

In the second graph, the preferred ABL 1P program shifts the cells Vt from one initial widened $E^1$ state to 2 narrow SLC-like program states of $P0^1$ and $P4^1$ by using 2 program-verify voltages $Vtp0^1min=-1.4V$ and $Vtp4^1min=0.6V$ to prevent earlier lockout for the subsequent 2P and 3P TLC programs, similar as the one disclosed in TLC operations for the boundary WLn-1 and non-boundary WLs such as WLn, WLn+1 and WLn+2, etc.

In the third graph, the preferred ABL 2P program is performed to shift the TLC cells Vts from 2 initially widened interim SLC-like states of $P0^2$ and $P4^2$ to 8 interim near-final narrow TLC states of $P0^3$, $P1^3$, $P2^3$, $P3^3$ or a lower group, and $P4^3$, $P5^3$, $P6^3$, $P7^3$ of a higher group, by using one similar new set of 7 program-verify voltages $Vtp1^3min=0.2V$, $Vtp2^3min=0.7V$, $Vtp3^3min=1.2V$ for the lower group, $Vtp4^3min=1.7V$, $Vtp5^3min=2.2V$, $Vtp6^3min=2.7V$, and $Vtp7^3min=3.2V$ for the higher group, In the fourth graph, the preferred Odd/Even-based TLC read operation is performed with 7 read check voltages $VR1=0.1V$, $VR2=0.6V$, $VR3=1.1V$, $VR4=1.6V$, $VR5=2.1V$, $VR6=2.6V$, and $VR7=3.1V$ to distinguish the 7 final narrow TLC programmed states of $P1^4$, $P2^4$, $P3^4$, $P4^4$, $P5^4$, $P6^4$, $P7^4$ with positive Vts and one widened $P0^4$ state with a negative Vt.

The detailed calculations of all Vtpn's width and spacing of each pass of the TLC operation described above on WLn+3's cells during each corresponding time cycle as shown in the table of FIG. 6D in accordance with Alt-WL TLC program sequence as defined in FIG. 5A. In particular, at t7, WLn+3 cells suffer 1S induced by 1P program on WLn+2. At t10, WLn+3 cells perform 1P program. At t11, WLn+3 cells suffer 2S induced by 2P program on WLn+2. At t13, WLn+3 cells perform 2P program. At t14, WLn+3 cells suffer 3S induced by WLn+2's 3P program. Note, WLn+3 cells have the best TLC reliability (without causing coupling effect) when WLn+4's cells are not programmed in $E^0$-state.

Figure 6E:
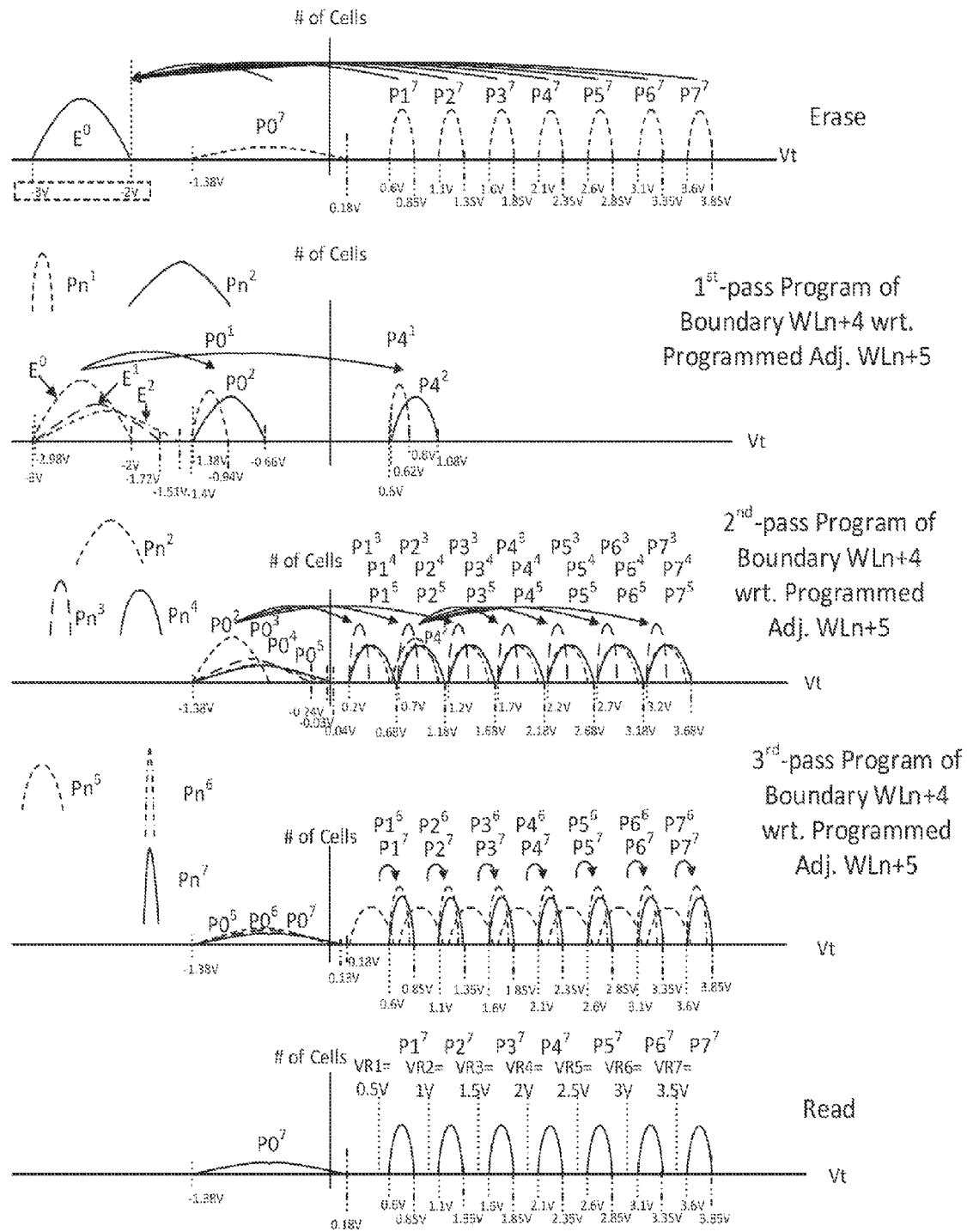
FIG. 6E is a diagram showing Vt distributions, shifting, verify and widened voltages for TLC operations of NAND memory cells with a boundary WLn+4 with next adjacent WLn+5 being fully programmed with TLC data in association with a preferred 1-2-8(coarse)-8(fine) TLC program scheme according to an embodiment of the present invention.

FIG. 6E is a diagram showing Vt distributions, shifting, verify and widened voltages for TLC operations of NAND memory cells with a boundary WLn+4 with next adjacent WLn+5 being fully programmed with TLC data in association with a preferred 1-2-8(coarse)-8(fine) TLC program scheme according to an embodiment of the present invention. As shown, 5 graphs are used to illustrate preferred TLC operations of second boundary WLn+4 NAND cells under a 1-2-8(coarse)-8(fine) program scheme with respect to WLn+5 cells being programmed with TLC data. Again, each interim program of 1P, 2P and 3P follows the preferred ABL, AnP and Alt-WL TLC scheme and sequence proposed in FIG. 5A and FIG. 5B.

In the first graph, the erase operation shifts TLC cells Vts from 7 initial narrow program states of $P1^7$, $P2^7$, $P3^7$, $P4^7$, $P5^7$, $P6^7$, $P7^7$ and one widened $P0^7$ state to one $E^0$ state with $Vte^0max=-2.0V$ as the erase-verify voltage. In the second graph, the preferred ABL 1P program is performed to shift the cells Vt from one $E^1$ state initially widened by WLn+3's 1P-induced 1S at time period of t10 (FIG. 5A), to an $E^2$ state further widened by WLn+3's 2P-induced 2S at time period of t1' (FIG. 5B), and to 2 narrow SLC-like program states of $P0^1$ and $P4^1$ by using 2 program-verify voltages $Vtp0^1min=-1.4V$ and $Vtp4^1min=0.6V$ to prevent earlier lockout for subsequent 8-state TLC 2P coarse program at t3' (FIG. 5B).

Further in the third graph, the preferred ABL 2P program is performed to shift the TLC cells Vts from 2 initially widened interim SLC-like states of $P0^2$ and $P4^2$ to 8 interim near-final narrow TLC states of $P0^3$, $P1^3$, $P2^3$, $P3^3$ in a lower group, and $P4^3$, $P5^3$, $P6^3$, $P7^3$ in a higher group, by using 7 similar new program-verify voltages $Vtp1^3min=0.2V$, $Vtp2^3min=0.7V$, $Vtp3^3min=1.2V$ for the lower group, $Vtp4^3min=1.7V$, $Vtp5^3min=2.2V$, $Vtp6^3min=2.7V$, and $Vtp7^3min=3.2V$ for the higher group.

In the fourth graph, the preferred ABL 3P program is performed to shift the TLC cells Vts from 8 interim TLC coarse states of $P0^6$, $P1^6$, $P2^6$, $P3^6$, $P4^6$, $P5^6$, $P6^6$, and $P7^6$ initially widened due to WLn+5's 1P-induced 1S performed at t2', further widened by WLn+5's 2P-induced 2S performed at t6', to 8 final narrow TLC states of $P0^7$, $P1^7$, $P2^7$, $P3^7$, $P4^7$, $P5^7$, $P6^7$ and $P7^7$ by using new set of 7 program-verify voltages $Vtp1^7min=0.6V$, $Vtp2^7min=1.1V$, $Vtp3^7min=1.6V$, $Vtp4^7min=2.1V$, $Vtp5^7min=2.6V$, $Vtp6^7min=3.1V$, and $Vtp7^7min=3.6V$.

Additionally, in the fifth graph, the preferred Odd/Even-based TLC read operation is performed with 7 read check voltages VR1=0.5V, VR2=1.0V, VR3=1.5V, VR4=2.0V, VR5=2.5V, VR6=3.0V, and VR7=3.5V to distinguish the 8 widened final TLC states of $P0^7$, $P1^7$, $P2^7$, $P3^7$, $P4^7$, $P5^7$, $P6^7$, and $P7^7$.

All TLC's 1P-induced 1S, 2P-induced 2S and 3P-induced 3S are calculated in terms of Vtmax for E state and P0 state for WLn+4 with respect to programmed adjacent WLn+5 (and referring FIG. 5B). Initially at $E^0$ state, $Vte^0max=-2V$ and $Vte^0min=-3V$. At t10, WLn+3 experienced a 1P operation to move from $E^1$ to $P4^1$, inducing 1S shift for E state of WLn+4, $Vte^1max=(-2)+(2.98+0.8)7.5\%=-1.72V$. At t13, 2S is induced by 2P operation performed on WLn+3 to widen $Pn^2$ to $Pn^3$, $Vte^2max=(-1.72)+(3.4-0.62)7.5\%=-1.51V$. At t1', 1P is on WLn+4 to move $E^2$ to $P4^4$, $Vtp0^1max=(-1.51)+(2.98+0.8)7.5\%\times 2=-0.94V$. At t2', 1S is induced on WLn+4 by 1P on WLn+5 to move $E^1$ to $P4^1$, the $Vtp0^2max=(-0.94)+(2.98+0.8)7.5\%=-0.66V$. At t3', 2P is on WLn+4 to widen $Pn^2$ to $Pn^3$, so $Vtp0^3max=(-0.66)+(3.4-0.62)7.5\%\times 2=-0.24V$. At t5', 2S is induced on WLn+4 by 2P performed on WLn+5 to widen $Pn^3$ to $Pn^4$, the $Vtp0^4max=(-0.24)+(3.4-0.62)7.5\%=-0.03V$. At t6', 3S is induced on WLn+4 by 3P performed on WLn+3 to widen $Pn^6$ to $Pn^7$, the $Vtp0^5max=(-0.03)+(4.2-3.21)7.5\%=0.04V$. At t7', 3P is performed on WLn+4 to widen $Pn^5$ to $Pn^6$, the $Vtp0^6max=(0.04)+(3.8-3.2)7.5\%\times 2=0.13V$. At t10', 3S is induced on WLn+4 by 3P performed on WLn+5 to widen $Pn^6$ to $Pn^7$, the $Vtp0^7max=(0.13)+(3.8-3.2)7.5\%=0.18V$. Note, $Vte^1min$ is shifted by 0.02V due to WLn+3 ($Vtp0^1min-Vte^1max$) $7.5\%=(1.72-1.4)7.5\%=0.02V$. No shift on $Vte^2min$ and $Vte^3min$ due to no program on WLn+3 Vtp0. $Vtp0^1max$ is set to -0.94V due to WLn+4 ($Vtp0^1max-Vte^1min$) $7.5\%=(2.98+0.8)7.5\%\times 2=0.57V$, and $0.57V+(-1.51V)=-0.94V>-1V$. $Vtp0^2min$ is shifted by 0.02V due to WLn+5 ($Vtp0^1min-Vte^2max$)$7.5\%=(1.72-1.4)7.5\%=0.02V$. No shift on $Vtpn^4min$ and $Vtpn^6min$ due to no program on WLn+5 Vtp0.

Figure 6F:
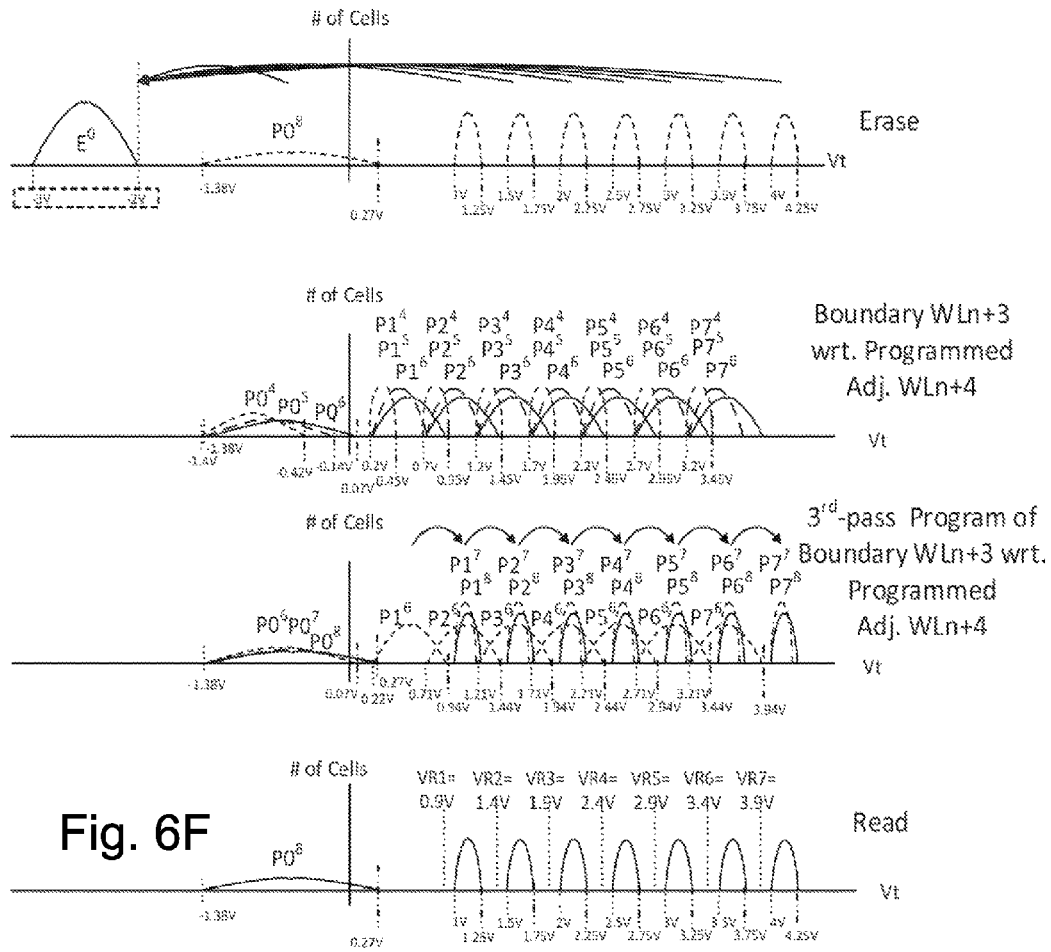
FIG. 6F is a diagram showing Vt distributions, shifting, verify and widened voltages for TLC operations of NAND memory cells with a boundary WLn+3 with next adjacent WLn+4 in a 3P program in association with a preferred 1-2-8(coarse)-8(fine) TLC program scheme according to an embodiment of the present invention.

FIG. 6F is a diagram showing Vt distributions, shifting, verify and widened voltages for TLC operations of NAND memory cells with a boundary WLn+3 with next adjacent WLn+4 in a 3P program in association with a preferred 1-2-8(coarse)-8(fine) TLC program scheme according to an embodiment of the present invention. As shown, 4 graphs and one table are used to illustrate preferred TLC operations on the second boundary WLn+3 NAND cells with the WLn+3 being successfully programmed with 8 coarse TLC data and the next adjacent WLn+4 cells being in $E^0$ state without being programmed with TLC data. Now, TLC data is ready for programming WLn+4 cells, similar to that for the first boundary WLn-1. As a consequence, the WLn+4 TLC program results in Vt-shift and widening to 8 coarse TLC states of WLn+3 cells, thus handling of the WLn+3 cells will be different from other regular WL.

Since the WLn+3 cell has been programmed with a coarse TLC data previously with a narrow Vt-gap of 0.25V without keeping the TLC page data in PCACHE register. Thus, a TLC read of the WLn+3 coarse 8-state data is required before an 1P program on WLn+4 cells to allow an 8-state TLC fine program to perform subsequently.

In the first graph of FIG. 6F, the erase operation forms a shifts TLC cells Vts from 7 initial narrow program states and one widened $P0^8$ state to one $E^0$ state with $Vte^0max=-2.0V$ as the erase-verify voltage. In the second graph, firstly, 8 narrow TLC coarse-programmed Vt states, $P0^4$, $P1^4$, $P2^4$, $P3^4$, $P4^4$, $P5^4$, $P6^4$ and $P7^4$ with Vt-gap of 0.25V is read first and then stored in 3 N-bit PCACHE registers before a 1P program is performed on WLn+4. Secondly, 8 widened TLC states $P0^6$, $P1^6$, $P2^6$, $P3^6$, $P4^6$, $P5^6$, $P6^6$ and $P7^6$ with overlapping Vt are induced by the 1P program on WLn+4.

In the third graph, the preferred ABL 3P program is performed to shift the TLC cells Vts from 8 interim TLC coarse states of $P0^6$, $P1^6$, $P2^6$, $P3^6$, $P4^6$, $P5^6$, $P6^6$, and $P7^6$ initially widened due to WLn+4's 1P program to 8 final narrow fine TLC states of $P0^7$, $P1^7$, $P2^7$, $P3^7$, $P4^7$, $P5^7$, $P6^7$, and $P7^7$ by using 7 new program-verify voltages $Vtp1^7min=1.0V$, $Vtp2^7min=1.5V$, $Vtp3^7min=2.00V$, $Vtp4^7min=2.5V$, $Vtp5^7min=3.00V$, $Vtp6^7min=3.5V$, and $Vtp7^7min=4.0V$.

In the fourth graph, the preferred Odd/Even-based TLC read operation is performed with 7 read check voltages such as VR1=0.9V, VR2=1.4V, VR3=1.9V, VR4=2.4V, VR5=2.9V, VR6=3.4V, and VR7=3.9V to distinguish the 8 final widened TLC states of $P0^8$, $P1^8$, $P2^8$, $P3^8$, $P4^8$, $P5^8$, $P6^8$ and $P7^8$. A table in FIG. 6F includes the detailed calculations of all Vtpn's width and spacing of each pass of the TLC erase and program operations.

Figure 7A:
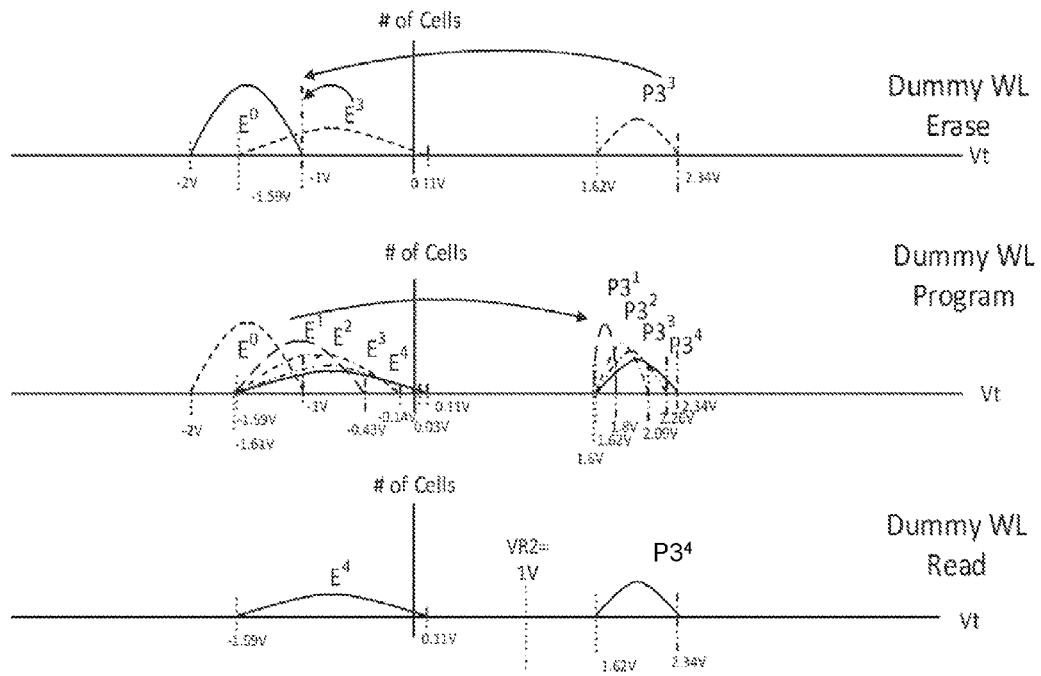
FIG. 7A is a diagram showing Vt distributions, shifting, verify and widened voltages for TLC operations of dummy cells in erase, SLC-like program, and read in association with a preferred 3-pass 1-2-5-8 TLC program scheme according to an embodiment of the present invention.

FIG. 7A is a diagram showing Vt distributions, shifting, verify and widened voltages for TLC operations of dummy cells in erase, SLC-like program, and read in association with a preferred 3-pass 1-2-5-8 TLC program scheme according to an embodiment of the present invention. As shown, 3 graphs and one table are used to demonstrate preferred dummy cell operations of erase, SLC-like program, and read on a DMYWL under a 3-pass 1-2-5-8 TLC program scheme. Since this 1-2-5-8 TLC program scheme is different from previous 1-2-8-8 TLC program scheme, the tuning of dummy WL Vt-width and Vt-widening is different.

In the first graph, the erase operation shifts an initial single program state of $P3^3$ of dummy cells with positive Vt distribution and an erase-state of $E^3$ of the dummy cells with partial positive and partial negative Vt distributions to only one final erase state $E^0$ with negative Vt and a desired $Vte^0max<-1.0V$.

In the second graph, the preferred SLC-like DP program shifts cells Vt from one $E^1$ state initially widened from $E^0$ state to one SLC-like program state of $P3^1$ by using one program-verify voltage of $Vtp3^1min=1.6V$. No narrow-Vt of 0.2V program is needed. Thus the ISPP $\Delta Vpgm>0.2V$ can be used herein to shorten the dummy cell's program time. The widened Vt of $E^4$ state and $P3^4$ state are only slightly different from the corresponding ones shown in FIG. 6A under a 3-pass program scheme of 1-2-8(coarse)-8(fine).

In the third graph, the preferred Odd/Even-based dummy cell and WL read operation is performed with one similar read check voltage, VR2=1.0V, for two widened states of $E^4$ and $P3^4$. In summary, the dummy cell's program is almost identical under either 1-2-8(coarse)-8(fine) or 1-2-5-8 TLC program scheme.

Figure 7B:
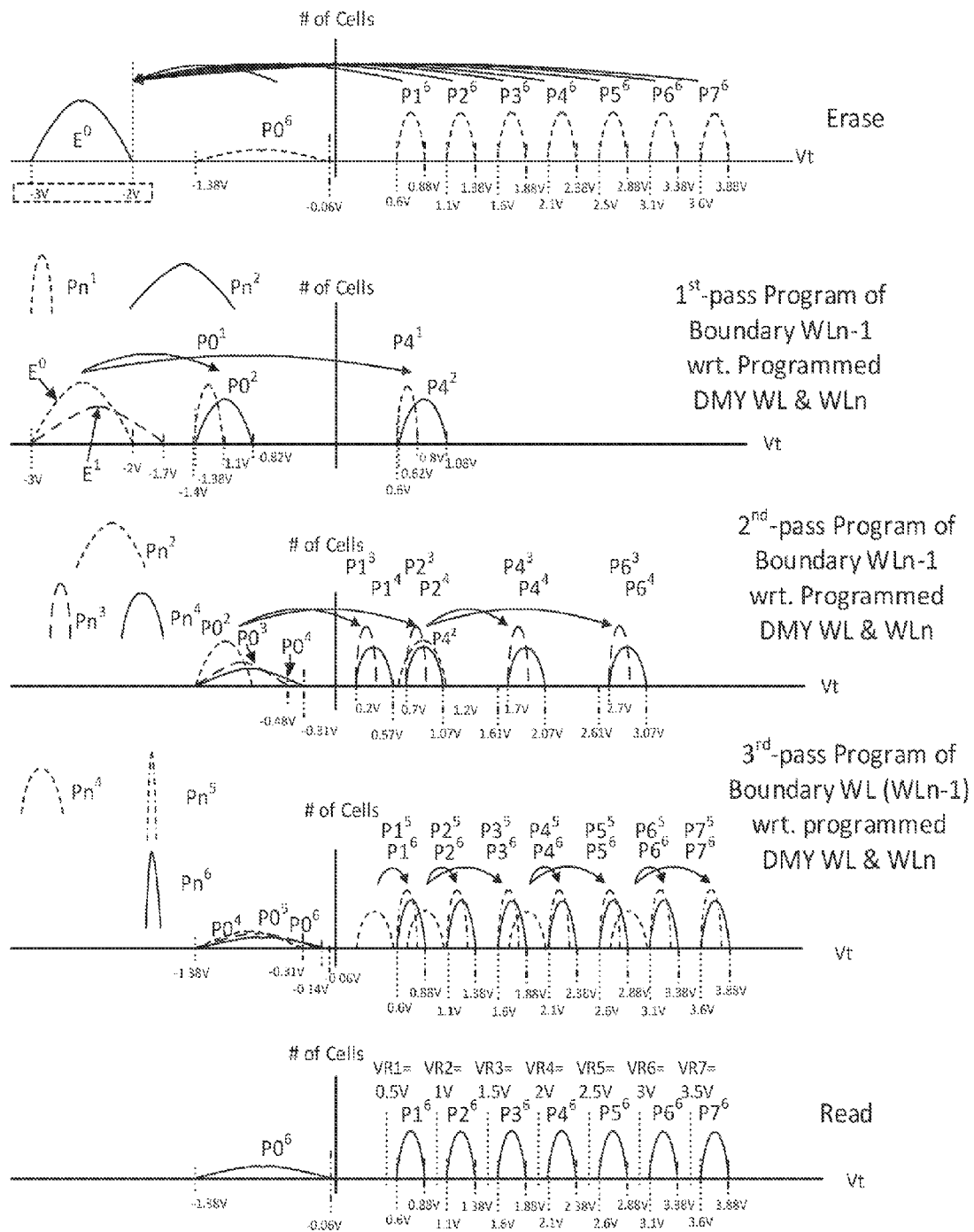
FIG. 7B is a diagram showing Vt distributions, shifting, verify and widened voltages for TLC operations of NAND memory cells with a boundary WLn−1 with programmed dummy WL (of FIG. 7A) in association with a preferred 3-pass 1-2-5-8 TLC program scheme according to an embodiment of the present invention.

FIG. 7B is a diagram showing Vt distributions, shifting, verify and widened voltages for TLC operations of NAND memory cells with a boundary WLn−1 with programmed dummy WL (of FIG. 7A) in association with a preferred 3-pass 1-2-5-8 TLC program scheme according to an embodiment of the present invention. As shown, 5 graphs are used to illustrate preferred TLC operations of one non-boundary WLn NAND cells. Again, each interim program of 1P, 2P' and 3P''' follows the preferred ABL, AnP and Alt-WL 1-2-5-8 TLC scheme and sequences.

In the first graph, the erase operation shifts TLC cells Vts from 8 initial less widened program states of $P1^6$, $P2^6$, $P3^6$, $P4^6$, $P5^6$, $P6^6$, $P7^6$ and one widened $P0^6$ state to one $E^0$ state by using same $Vte^0max=-2.0V$ as a same erase-verify voltage as TLC scheme of 1-2-8(coarse)-8(fine).

In the second graph, the preferred ABL 1P program operation shifts the cells Vt from one $E^1$ state initial widened due to dummy cell DP-induced DS to 2 narrow SLC-like program states of P0 and $P4^1$ by using 2 program-verify voltages Vtp0 min=−1.4V and Vtp4 min=0.6V to prevent earlier lockout for subsequent 5-state TLC 2P' program. The Vtp02max=−0.82V is shifted from −1.1V by a maximum BL-BL coupling effect of 1P-induced 1S from $Vte^0min=-3.0V$ to $Vtp4^1max=0.8V$ at t2.

In the third graph, the preferred ABL 2P' program operation shifts the TLC cells Vts from 2 initially widened interim SLC-like states of $P0^2$ and $P4^2$ to 5 narrow interim MLC-like states of $P0^3$, $P1^3$ and $P2^3$ in a lower group, $P4^3$ and $P6^3$ in a higher group respectively by using 2 new program-verify voltages $Vtp1^3min=0.2V$ and $Vtp2^3min=0.7V$ in the lower-group, two additional program-verify voltages $Vtp4^3min=1.7V$ and $Vtp6^3min=2.7V$ in the higher group without verification for the $P0^3$ state because no program is involved for the P0 state. The 2P'-induced Vt-shift 2S' will shift $Vtp4^3max$ to −0.31V.

In the fourth graph, the preferred ABL 3P''' operation is performed to shift the TLC cells Vts from 5 initially widened interim MLC-like states of $P0^4$, $P1^4$, $P2^4$, $P4^4$, and $P6^4$ to 8 final narrow TLC states of $P0^5$, $P1^5$, $P2^5$, $P3^5$, $P4^5$, $P5^5$, $P6^5$ and $P7^5$ by using new set of 7 program-verify voltages $Vtp1^5min=0.6V$, $Vtp2^5min=1.1V$, $Vtp3^5min=1.6V$, $Vtp4^5min=2.1V$, $Vtp5^5min=2.6V$, $Vtp6^5min=3.1V$, and $Vtp7^5min=3.6V$. This 3P'''-induced Vt-shift 3S''' will further shift $Vtp4^5max$ to −0.14V due to 2 BL-BL Yupin coupling effect. After the 3P''' operation, the ΔVtp=0.22V, which is little less than the targeted spec of 0.25V as set according to an embodiment of the present invention.

In the fifth graph, the preferred Odd/Even-based TLC read operation is performed with 7 read check voltages such as VR1=0.5V, VR2=1.0V, VR3=1.5V, VR4=2.0V, VR5=2.5V, VR6=3.0V, and VR7=3.5V to distinguish the 8 widened final TLC states of $P0^6$, $P1^6$, $P2^6$, $P3^6$, $P4^6$, $P5^5$, $P6^6$, and $P7^6$.

All DP-induced DS, 1P-induced 1S, 2P'-induced 2S' and 3P'''-induced 3S''' Vt-shifts are calculated in terms of Vtmax for E state and P0 state for WLn−1 (one boundary WL) with respect to precedent adjacent dummy WL with $Vt=Vte/V_{DM}$ (and referring to FIG. 5A). Initially at $E^0$ state, $Vte^0max=-2V$ and $Vte^0min=-3V$. At t0, DS is induced by DP performed on dummy WL to move from $E^0$ to $P6^1$, $Vte^1max=(-2)+(2+1.8)7.5\%=-1.71V$. At t1, 1P operation is performed on WLn−1 to move $E^1$ to $P4^1$, $P0^1$ state of WLn−1 is shifted to Vtp0max=(−1.4)+(0.3)=−1.1V. At t2, 1S is induced on WLn−1 by 1P performed to WLn to E to $P4^1$, so that $Vtp0^2max=(-1.1)+(2.98+0.8)7.5\%=-0.82V$. At t3, 2P' is performed on WLn−1 to widen $Pn^2$ to $Pn^3$, the $Vtp0^3max=(-0.82)+(2.9-0.62)7.5\%\times2=-0.48V$. At t5, 2S' is induced on WLn−1 by 2P' performed on WLn to widen $Pn^3$ to $Pn^4$, the $Vtp0^4max=(-0.48)+(2.9-0.62)7.5\%=-0.31V$. At t6, 3P''' is performed on WLn−1 to widen $Pn^4$ to $Pn^5$, $Vtp0^5max=(-0.31)+(3.8-2.7)7.5\%\times2=-0.14V$. At t9, 3S''' is induced on WLn−1 by 3P''' performed on WLn to widen $Pn^6$ to $Pn^7$, the $Vtp0^6max=(-0.14)+(2.9-0.62)7.5\%=-0.06V$. Note, $Vtp0^1max$ is set to −1.1V due to WLn−1 ($Vtp4^1max-Vte^1min$)$7.5\%\times2=(0.8+0.3)7.5\%\times2=0.57V$, and 0.57V+(−1.71V)=−1.14V<−1.1V. $Vtp0^2min$ and $Vtp4^2min$ are shifted by 0.02V due to WLn ($Vtp0^1min-Vte^1max$) $7.5\%=(1.72-1.4)7.5\%=0.02V$. No shift is on $Vtpn^4min$ and $Vtpn^6min$ due to that no program is on WLn Vtp0.

Figure 7C:
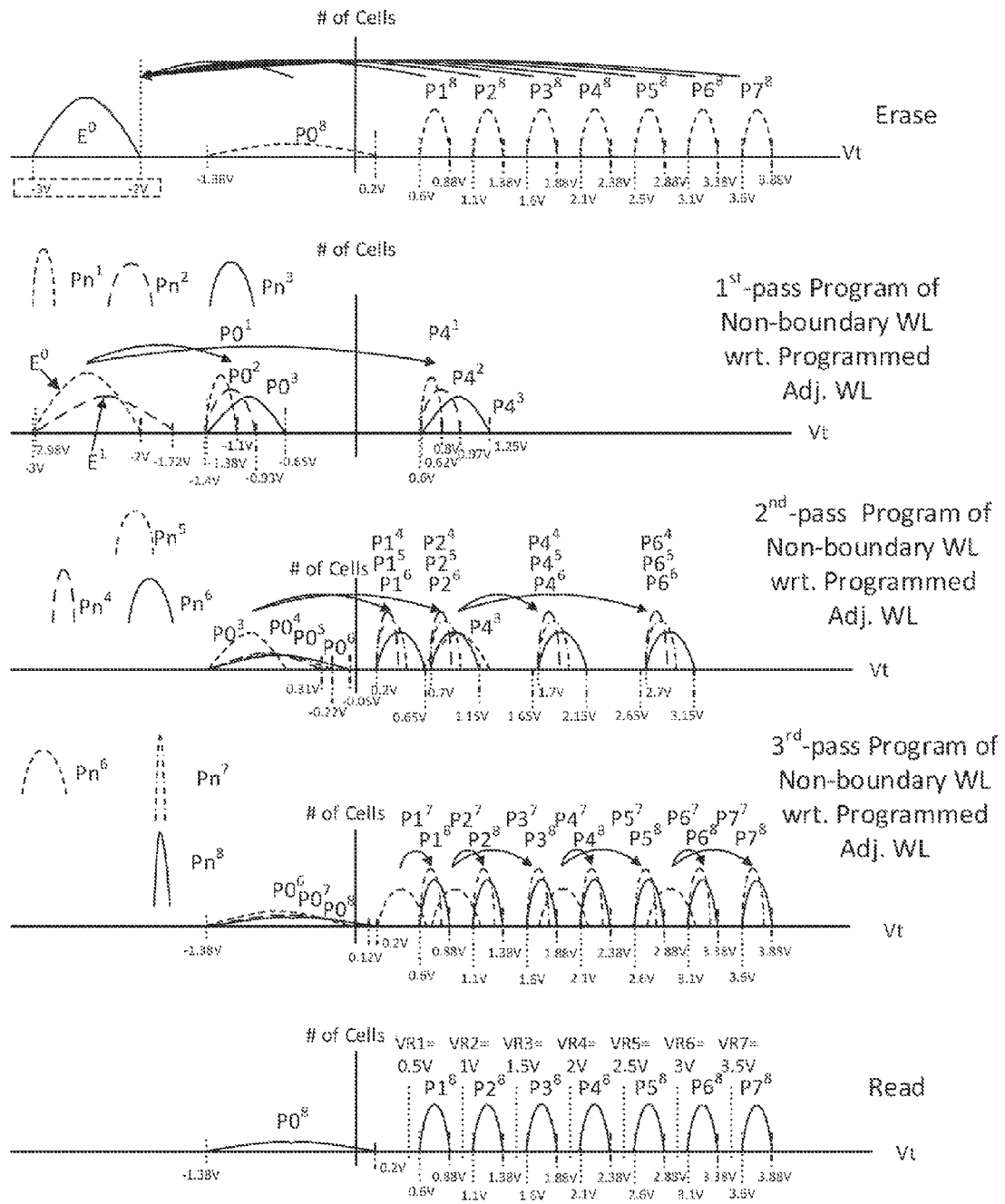
FIG. 7C is a diagram showing Vt distributions, shifting, verify and widened voltages for TLC operations of NAND memory cells with a non-boundary WLn in association with a preferred 3-pass 1-2-5-8 TLC program scheme according to an embodiment of the present invention.

FIG. 7C is a diagram showing Vt distributions, shifting, verify and widened voltages for TLC operations of NAND memory cells with a non-boundary WLn in association with a preferred 3-pass 1-2-5-8 TLC program scheme according to an embodiment of the present invention. As shown, 5 graphs are used to illustrate preferred TLC operations of non-boundary WL cells. Each interim program of 1P, 2P', and 3P''' follows the preferred ABL, AnP and Alt-WL 1-2-5-8 TLC program scheme and sequences.

In the first graph, the erase operation shifts TLC cells Vts from 8 initial widened program states of $P0^8$, $P1^8$, $P2^8$, $P3^8$, $P4^8$, $P5^8$, $P6^8$, and $P7^8$ to one $E^0$ state with $Vte^0max=-2.0V$ as the erase-verify voltage.

In the second graph, the preferred ABL 1P program operation shifts the cells Vt from one initial widened $E^1$ state to 2 narrow SLC-like program states of $P0^1$ and $P4^1$ by respectively using 2 program-verify voltages Vtp0min=−1.4V and $Vtp4^1min=0.6V$ to prevent earlier lockout for subsequent 5-state MLC-like 2P' program, In the third graph, the preferred ABL 2P operation is performed to shift the TLC cells Vts from 2 initially widened interim SLC-like states of $P0^2$ and $P4^2$ to 5 narrow interim MLC-like states of $P0^4$, $P1^4$ and $P2^4$ in a lower group, and $P4^4$ and $P6^4$ in a higher group by respective using new program-verify voltages $Vtp1^4min=0.2V$ and $Vtp2^4min=0.7V$ in the lower-group, and $Vtp4^4min=1.7V$ and $Vtp6^4min=2.7V$ in the higher group without verification for $P0^4$ state.

In the fourth graph, the preferred ABL 3P''' operation is performed to shift the TLC cells Vts from 5 initially widened interim MLC-like states of $P0^6$, $P1^6$, $P2^6$, $P4^6$, and $P6^6$ to 8 narrow final TLC states of $P0^7$, $P1^7$, $P2^7$, $P3^7$, $P4^7$, $P5^7$, $P6^7$, and $P7^7$ by using 7 new program-verify voltages $Vtp1^3min=0.6V$, $Vtp2^3min=1.1V$, $Vtp3^3min=1.6V$, $Vtp4^3min=2.1V$, $Vtp5^3min=2.6V$, $Vtp6^3min=3.1V$, and $Vtp7^3min=3.6V$.

In the fifth graph, the preferred Odd/Even-based TLC read operation is performed with 7 read check voltages such as VR1=0.5V, VR2=1.0V, VR3=1.5V, VR4=2.0V, VR5=2.5V, VR6=3.0V, and VR7=3.5V to distinguish the 8 widened final TLC states of $P0^6$, $P1^6$, $P2^6$, $P3^6$, $P4^6$, $P5^5$, $P6^6$, and $P7^6$.

All 1P-induced 1S, 2P'-induced 2S' and 3P'''-induced 3S''' Vt-shifts are calculated in terms of Vtmax for E state and P0 state for WLn+1 (one example of the non-boundary WLs)

with respect to programmed adjacent WLn and WLn+2 (and referring to FIG. 5A). Initially at $E^0$ state, $Vte^0max=-2V$ and $Vte^0min=-3V$. At t2, WLn experienced a 1P operation to move from $E^1$ to $P4^1$, inducing 1S shift for E state of WLn+1, $Vte^1max=(-2)+(2.98+0.8)7.5\%=-1.72V$. At t4, 1P operation is performed on WLn+1 to move $E^1$ to $P4^1$, the Vt of $P0^1$ state of WLn+1 is shifted to $Vtp0^1max=(-1.4)+(0.3)=-1.1V$, which is due to $(Vtp4^1max-Vte^1min)7.5\%\times2=(0.8+2.98)7.5\%\times2=-1.15V<-1.1V$. At t5, 2P' is on WLn and inducing 2S' to WLn+1 to widen $Pn^3$ to $Pn^4$ so that $Vtp0^2max=(-1.1)+(2.9-0.62)7.5\%=-0.93V$. At t7, 1S is induced on WLn+1 by 1P on WLn+2 to move $E^2$ to $P4^3$, the $Vtp0^3max=(-0.93)+(2.98+0.8)7.5\%=-0.65V$. At t8, 2P' is on WLn+1 to widen $Pn^3$ to $Pn^4$, the $Vtp0^4max=(-0.65)+(2.9-0.62)7.5\%\times2=-0.31V$. At t9, 3S" is induced on WLn+1 by 3P" performed on WLn to widen $Pn^6$ to $Pn^7$, $Vtp0^5max=(-0.31)+(3.8-2.7)7.5\%=-0.22V$. At t11, 2S' is induced on WLn+1 by 2P' performed on WLn+2 to widen $Pn^3$ to $Pn^4$, the $Vtp0^6max=(-0.22)+(2.9-0.62)7.5\%=-0.05V$. At t12, 3P" is performed on WLn+1 to widen $Pn^6$ to $Pn^7$, the $Vtp07max=(-0.05)+(3.8-2.7)7.5\%\times2=0.12V$. At t14, 3S" is induced on WLn+1 by 3P" performed on WLn+2 to widen $Pn^6$ to $Pn^7$, the $Vtp0^8max=(0.12)+(3.8-2.7)7.5\%=0.2V$. Note, $Vte^1min$ is shifted by 0.02V due to WLn $(Vtp0^1min-Vte^1max)7.5\%=(1.72-1.4)7.5\%=0.02V$. No shift is on $Vtpn^2min$ due to that no program is on WLn Vtp0. $Vtpn^3min$ is shifted by 0.02V due to WLn+2 $(Vtp0^1min-Vte^1max)7.5\%=(1.72-1.4)7.5\%=0.02V$. No shift is on $Vtpn^5min$ due to that no program is on WLn Vtp0. No shift on $Vtpn^6min$ and $Vtpn^5min$ due to no program on WLn+2 Vtp0.

Figure 7D:
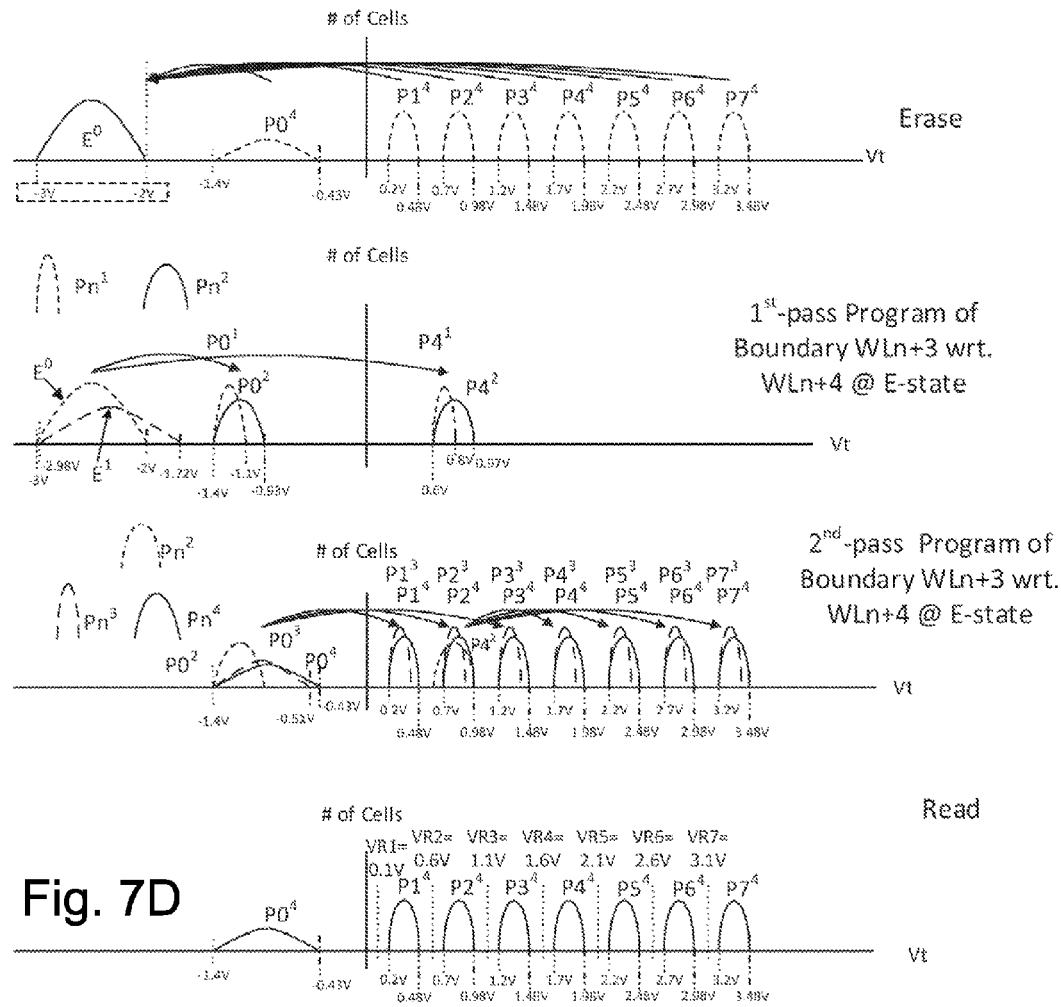
FIG. 7D is a diagram showing Vt distributions, shifting, verify and widened voltages for TLC operations of NAND memory cells with a second non-boundary WLn+3 with next adjacent WLn+4 being at E-state in association with a preferred 1-2-5-8 TLC program scheme according to an embodiment of the present invention.

FIG. 7D is a diagram showing Vt distributions, shifting, verify and widened voltages for TLC operations of NAND memory cells with a second non-boundary WLn+3 with next adjacent WLn+4 being at E-state in association with a preferred 1-2-5-8 TLC program scheme according to an embodiment of the present invention. As shown, 4 graphs and one table are used to illustrate preferred TLC operations of second boundary WLn+3 NAND cells with WLn+4 cells being in $E^0$ state. Again, each interim program of 1P, 2P and 3P follows the preferred ABL, AnP and Alt-WL 1-2-5-8 TLC program scheme.

In the first graph, the erase operation shifts TLC cells Vts from 8 initial widened program states of $P0^4$, $P1^4$, $P2^4$, $P3^4$, $P4^4$, $P5^4$, $P6^4$, and $P7^4$ to one $E^0$ state with $Vte^0max=-2.0V$ as the erase-verify voltage. Then in the second graph, the preferred ABL-1P program operation shifts cells Vt from one initial widened $E^1$ state to 2 narrow SLC-like program states of $P0^1$ and $P4^1$ by using 2 program-verify voltages $Vtp0^1min=-1.4V$ and $Vtp4^1min=0.6V$ to prevent earlier lockout for subsequent 8-state TLC coarse program.

Further in the third graph, the preferred ABL 2P program operation is performed to shift cells' Vts from 2 initially widened interim SLC-like states of $P0^3$ and $P4^3$ to 8 narrow interim near-final TLC states of $P0^3$, $P1^3$, $P2^3$, $P3^3$, $P4^3$, $P5^3$, $P6^3$, and $P7^3$. They are divided into 2 groups of program states by using 7 similar new program-verify voltages such as $Vtp1^3min=0.2V$, $Vtp2^3min=0.7V$, $Vtp3^3min=1.2V$ for $P2^3$, $P3^3$, $P4^3$ in a lower group, $Vtp4^3min=1.7V$, $Vtp5^3min=2.2V$, $Vtp6^3min=2.7V$, and $Vtp7^3min=3.2V$ for $P4^3$, $P5^3$, $P6^3$, and $P7^3$ in a higher group.

In the fourth graph, the preferred Odd/Even-based TLC read operation is performed with 7 read check voltages such as VR1=0.1V, VR2=0.6V, VR3=1.1V, VR4=1.6V, VR5=2.1V, VR6=2.6V, and VR7=3.1V to distinguish the 8 widened final TLC states of $P0^4$, $P1^4$, $P2^4$, $P3^4$, $P4^4$, $P5^4$, $P6^4$, and $P7^4$. Detailed calculations of all Vtpn's width and spacing of each pass of TLC erase and program operations are given in the table of FIG. 7D.

Figure 7E:
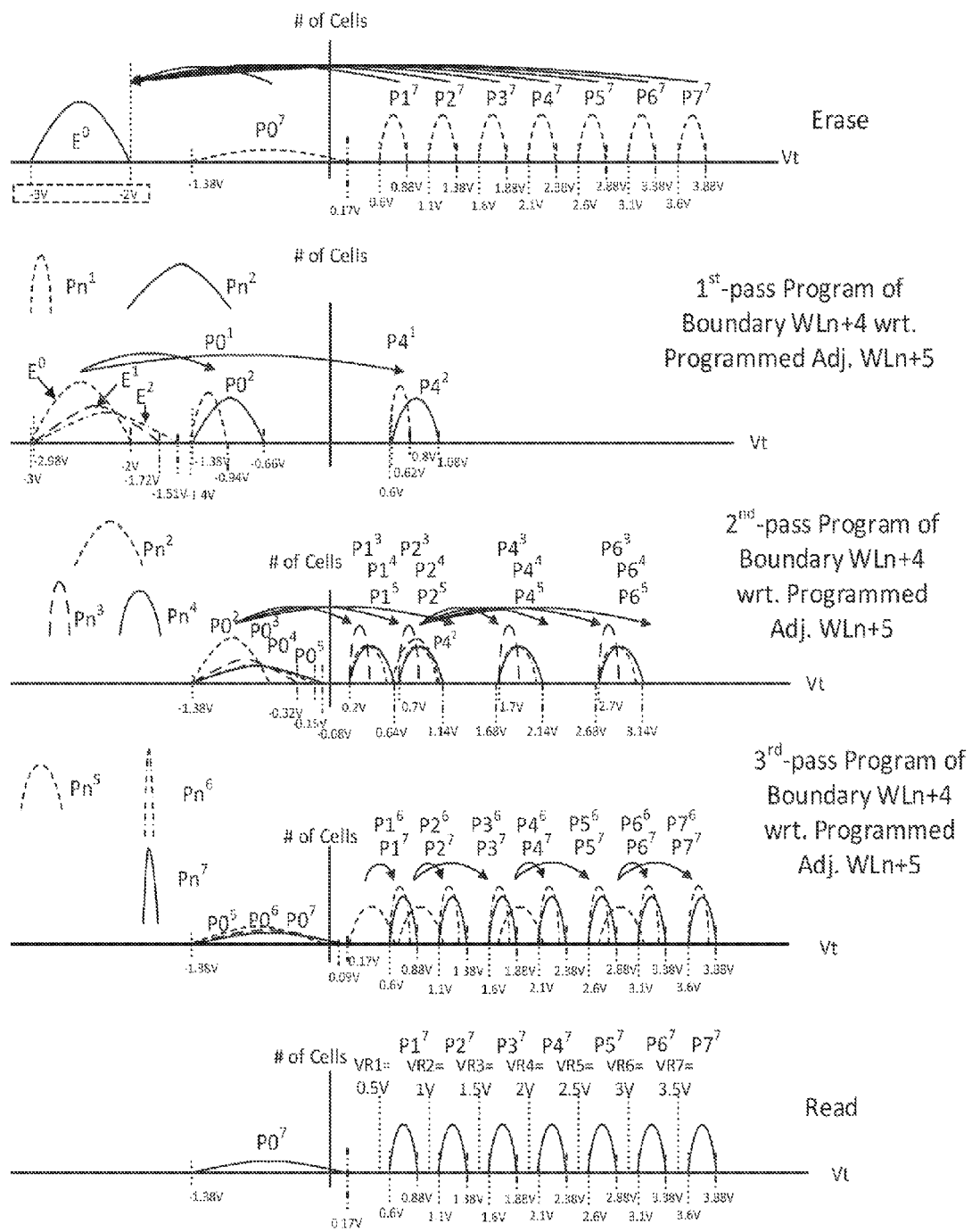
FIG. 7E is a diagram showing Vt distributions, shifting, verify and widened voltages for TLC operations of NAND memory cells with a boundary WLn+4 with next adjacent WLn+5 being fully programmed with TLC data in association with a preferred 1-2-5-8 TLC program scheme according to an embodiment of the present invention.

FIG. 7E is a diagram showing Vt distributions, shifting, verify and widened voltages for TLC operations of NAND memory cells with a boundary WLn+4 with next adjacent WLn+5 being fully programmed with TLC data in association with a preferred 1-2-5-8 TLC program scheme according to an embodiment of the present invention. As shown, 5 graphs are used to demonstrate preferred TLC operations of second boundary WLn+4 NAND cells with respect to adjacent non-boundary WLn+5 cells being programmed with TLC data. Again, each interim program of 1P, 2P', and 3P" follows the preferred ABL, AnP and Alt-WL 1-2-5-8 TLC program scheme and sequences.

The first graph shows an erase operation that shifts TLC cells Vts from 8 initial widened program states of $P0^7$, $P1^7$, $P2^7$, $P3^7$, $P4^7$, $P5^7$, $P6^7$, and $P7^7$ to one $E^0$ state by using $Vte^0max=-2.0V$ as the erase-verify voltage. The second graph shows a preferred ABL 1P operation that shifts the cells Vt from one initial widened $E^1$ state to 2 narrow SLC-like program states of P0 and $P4^1$ by using 2 program-verify voltages such as $Vtp0min=-1.4V$ and $Vtp4^1min=0.6V$ to prevent earlier lockout for subsequent 5-state TLC program.

The third graph shows that a preferred ABL 2P' program operation is performed to shift cells Vts from 2 initially widened interim SLC-like states of $P0^2$ and $P4^2$ to 5 interim narrow MLC states of $P0^3$, $P1^3$, $P2^3$, $P4^3$, and $P6^3$ divided in 2 groups by respectively using new program-verify voltages $Vtp1^3min=0.2V$ and $Vtp2^3min=0.7V$ for $P1^3$ and $P2^3$ in a lower-group, and $Vtp4^3min=1.7V$ and $Vtp6^3min=2.7V$ for $P4^3$ and $P6^3$ in a higher group without verification for $P0^3$ state.

Additionally, the fourth graph shows a preferred ABL 3P" program operation shifts cells Vts from 5 initially widened interim MLC-like states of $P0^6$, $P1^6$, $P2^6$, $P4^6$, and $P6^6$ to 8 final narrow TLC states of $P0^7$, $P1^7$, $P2^7$, $P3^7$, $P4^7$, $P5^7$, $P6^7$, and $P7^7$ by using 7 new program-verify voltages such as $Vtp1^6min=0.6V$, $Vtp2^6min=1.1V$, $Vtp3^6min=1.6V$, $Vtp4^6min=2.1V$, $Vtp5^6min=2.6V$, $Vtp6^6min=3.1V$, and $Vtp7^6min=3.6V$.

Furthermore, the fifth graph shows that a preferred Odd/Even-based TLC read operation is performed with 7 uprising read check voltages such as VR1=0.5V, VR2=1.0V, VR3=1.5V, VR4=2.0V, VR5=2.5V, VR6=3.0V, and VR7=3.5V to distinguish the 8 widened final TLC states of $P0^6$, $P1^6$, $P2^6$, $P3^6$, $P4^6$, $P5^5$, $P6^6$, and $P7^6$.

All TLC's 1P-induced 1S, 2P'-induced 2S' and 3P"-induced 3S" are calculated in terms of Vtmax for E state and P0 state for WLn+4 with respect to programmed adjacent WLn+5 (and referring FIG. 5B). Initially at $E^0$ state, $Vte^0max=-2V$ and $Vte^0min=-3V$. At t10, WLn+3 experienced a 1P operation to move from E' to $P4^1$, inducing 1S shift for E state of WLn+4, $Vte^1max=(-2)+(2.98+0.8)7.5\%=-1.72V$. At t13, 2S is induced by 2P operation performed on WLn+3 to widen $Pn^2$ to $Pn^3$, $Vte^2max=(-1.72)+(3.4-0.62)7.5\%=-1.51V$. At t1', 1P is on WLn+4 to move $E^2$ to $P4^4$, $Vtp0^1max=(-1.51)+(2.98+0.8)7.5\%\times2=-0.94V$. At t2', 1S is induced on WLn+4 by 1P on WLn+5 to move E' to $P4^1$, the $Vtp0^2max=(-0.94)+(2.98+0.8)7.5\%=-0.66V$. At t3', 2P' is on WLn+4 to widen $Pn^2$ to $Pn^3$, so $Vtp0^3max=(-0.66)+(2.9-0.62)7.5\%\times2=-0.32V$. At t5', 2S' is induced on WLn+4 by 2P' performed on WLn+5 to widen $Pn^3$ to $Pn^4$, the $Vtp0^4max=(-0.32)+(2.9-0.62)7.5\%=-0.15V$. At t6', 3S' is induced on WLn+4 by 3P' performed on WLn+3 to widen $Pn^6$ to $Pn^7$, the $Vtp0^5max=(-0.15)+(4.2-3.21)7.5\%=-0.08V$. At t7', 3P" is performed on WLn+4 to widen $Pn^5$ to Pn$^6$, the Vtp0$^6$max=(−0.08)+(3.8−2.7)7.5%×2=0.09V. At t10', 3S" is induced on WLn+4 by 3P" performed on WLn+5 to widen Pn$^6$ to Pn$^7$, the Vtp0$^7$max=(0.09)+(3.8−2.7) 7.5%=0.17V. Note, Vte$^1$min is shifted by 0.02V due to WLn+3 (Vtp0$^1$min−Vte$^1$max)7.5%=(1.72−1.4) 7.5%=0.02V. No shift on Vte$^2$min and Vte$^3$min due to no program on WLn+3 Vtp0. Vtp0$^1$max is set to −0.94V due to WLn+4 (Vtp0$^1$max−Vte$^1$min) 7.5%=(2.98+0.8)7.5%× 2=0.57V, and 0.57V+(−1.51V)=−0.94V>−1V. Vtp02 min is shifted by 0.02V due to WLn+5 (Vtp0$^1$min−Vte$^2$max) 7.5%=(1.72−1.4)7.5%=0.02V. No shift on Vtpn$^4$min and Vtpn$^6$min due to no program on WLn+5 Vtp0.

Figure 7F:
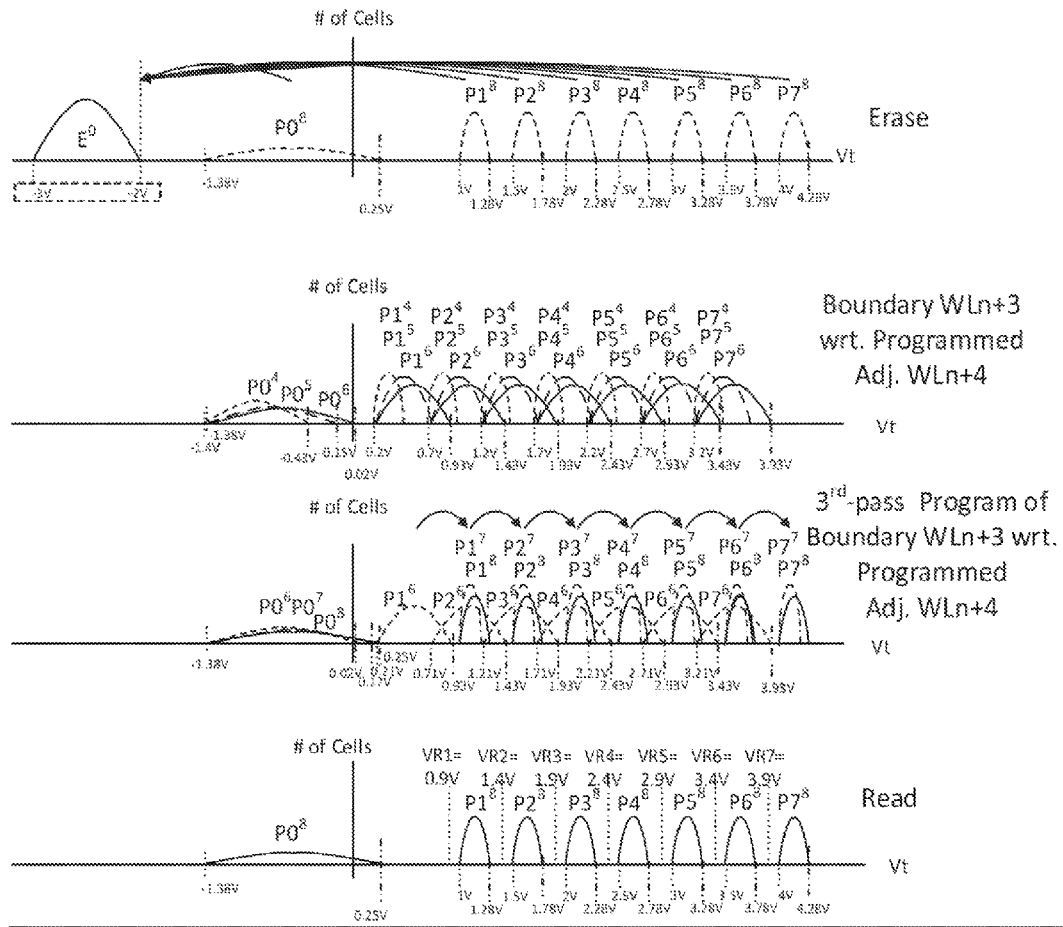
FIG. 7F is a diagram showing Vt distributions, shifting, verify and widened voltages for TLC operations of NAND memory cells with a boundary WLn+3 with next adjacent WLn+4 in a 3P' program in association with a preferred 1-2-5-8 TLC program scheme according to an embodiment of the present invention.

FIG. 7F is a diagram showing Vt distributions, shifting, verify and widened voltages for TLC operations of NAND memory cells with a boundary WLn+3 with next adjacent WLn+4 in a 3P' program in association with a preferred 1-2-5-8 TLC program scheme according to an embodiment of the present invention. As shown, 3 graphs and one table are used to illustrate preferred Vt fine tuning for 8 initial TLC distributions, populations, shifting, verify and widened voltages under 1-2-5-8 TLC program scheme on the second boundary WLn+3 NAND cells under two initial conditions: 1) WLn+3 cells have been successfully programmed with 8 coarse TLC data with WLn+4 cells being in E$^0$ state; 2) WLn+4 cells are to be programmed with a 3P' operation. In the second condition, the WLn+4 TLC data is ready for performing the TLC 3P' program the same way as the first regular boundary WLn−1. As a consequence, the WLn+4 TLC 3P' program will result in Vt shifting and widening to 8 coarse TLC states of the WLn+3 cells, thus the handling of WLn+3 program will be different from the regular WL.

Since the WLn+3 has been programmed with the first coarse TLC data previously with a narrow Vt-gap of 0.25V without keeping the TLC page data in PCACHE register. Thus, a coarse 8-state TLC read operation for the WLn+3 data is required before 1P program for the WLn+4 cells to allow a subsequent accurate 8-state TLC fine program. This TLC read operation on WLn+3 is referred as a prior-read (and save to corresponding PCACHE register temporarily) before a TLC program is performed on next adjacent WLn+4 cells that may not be able keep Vt-gap margin between 8 coarse program states of WLn+3. Again, each interim program of 1P, 2P, and 3P follows the preferred ABL, AnP and Alt-WL TLC scheme and sequence.

In the second graph, a preferred ABL 3P' operation is illustrated to shift cells Vts from 8 initially widened interim TLC states of P0$^6$, P1$^6$, P2$^6$, P3$^6$, P4$^6$, P5$^6$, P6$^6$, and P7$^6$ due to WLn+4's 1P program to 8 final narrow fine TLC states of P0$^7$, P1$^7$, P2$^7$, P3$^7$, P4$^7$, P5$^7$, P6$^7$, and P7$^7$ by using 7 new program-verify voltages such as Vtp1$^7$min=1.0V, Vtp2$^7$min=1.5V, Vtp3$^7$min=2.00V, Vtp4$^7$min=2.5V, Vtp5$^7$min=3.00V, Vtp6$^7$min=3.5V, and Vtp7$^7$min=4.0V.

In the third graph, a preferred Odd/Even-based TLC read operation is performed with 7 read check voltages such as VR1=0.9V, VR2=1.4V, VR3=1.9V, VR4=2.4V, VR5=2.9V, VR6=3.4V, and VR7=3.9V to distinguish the 8 widened final TLC states of P0$^8$, P1$^8$, P2$^8$, P3$^8$, P4$^8$, P5$^8$, P6$^8$, and P7$^8$. All detailed calculations of Vtpn's width and spacing of each pass of TLC erase and program operations are provided in the table of FIG. 7F.

In an embodiment, the present invention provides preferred individual $V_{SL}$-based Vt-compensation for a TLC read on TLC cells programmed under 1-2-5-8 TLC program scheme. The compensation is needed because the Vt-shift and widening of final 3P program performed under 1-2-5-8 TLC program scheme is larger than 3P program performed under 1-2-8(coarse)-8(fine) TLC program scheme.

FIG. 7G is a diagram showing Vt distributions, shifting, verify and widened voltages for TLC operations of NAND memory cells with a boundary WLn+3 with next adjacent WLn+4 in a 3P'' program in association with a preferred 1-2-5-8 TLC program scheme according to another embodiment of the present invention. As shown, the WLn+4's 3P''-induced 3S'' shifting affects the WLn+3 cells that are being programmed with 8 final TLC states under a preferred 3-pass 1-2-5-8 TLC program scheme. In this case, a final largest Vt-shift and widening on the boundary WLn+3 TLC cells can be deduced separately due to program-state shifts of WLn+4 in three scenarios of the 3P''' program: 1) interim state P6$^5$ to final state P7$^6$, 2) interim state P4$^5$ to final state P5$^6$, 3) interim state P2$^5$ to final state P3$^6$. In fact the Vt-widening and shift for each of the above 3 cases is the same 0.03V for Vtpmin and 0.08V for Vtpmax. Then, it is preferred to set $V_{SL}$=0V for the individual $V_{SL}$-based Vt-offset alignment of the TLC read on the boundary WLn+3 cells.

FIG. 7H is a diagram showing Vt distributions, shifting, verify and widened voltages for TLC operations of NAND memory cells with a boundary WLn+3 with next adjacent WLn+4 in an alternative 3P''' program in association with a preferred 1-2-5-8 TLC program scheme according to another embodiment of the present invention. As shown, the WLn+4's 3P'''-induced 3S'' on WLn+3 cells that are programmed with 8 final TLC states under a preferred 3-pass 1-2-5-8 TLC program scheme. In this case, a smaller final Vt shift and widening on the boundary WLn+3 TLC cells can be deduced separately due to program-state shifts of WLn+4 in three scenarios of the 3P''' program: 1) interim state P6$^5$ to final state P6$^6$, 2) interim state P4$^5$ to final state P4$^6$, 3) interim state P1$^5$ to final state P1$^6$. In fact the Vt-widening and shift for each of the above 3 cases is the same 0.03V for Vtpmin and 0.08V for Vtpmax. The above Vt-widening and shifting of 3 cases is unified with a same value of 0.05V. For this preferred Vt-offset alignment of the TLC read on WLn+3 cells, it preferably set $V_{SL}$=0.03V as aligned in the same way for P2$^5$, P4$^5$, and P6$^5$ TLC cells with $V_{SL}$=0V in the case of FIG. 7G.

Figure 7I:
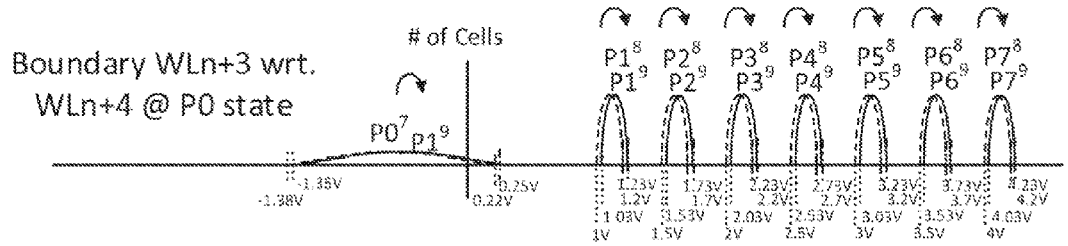
FIG. 7I is a diagram showing Vt distributions, shifting, verify and widened voltages for TLC operations of NAND memory cells with a boundary WLn+3 with next adjacent WLn+4 in another alternative 3P"' program in association with a preferred 1-2-5-8 TLC program scheme according to yet another embodiment of the present invention.

FIG. 7I is a diagram showing Vt distributions, shifting, verify and widened voltages for TLC operations of NAND memory cells with a boundary WLn+3 with next adjacent WLn+4 in another alternative 3P''' program in association with a preferred 1-2-5-8 TLC program scheme according to yet another embodiment of the present invention. As shown, the WLn+4's 3P'''-induced 3S'' on WLn+3 cells that are being programmed with 8 final TLC states under the preferred 3-pass 1-2-5-8 TLC program scheme. In this case, a smaller final Vt shift and widening on the boundary WLn+3's TLC cells can be deduced under a condition of no shifting and widening of the interim P0$^5$ state (stayed at P0$^6$ state) for WLn+4. As the case of FIG. 7H with the smaller Vt shifting and widening are induced, the preferred Vt-offset alignment of the TLC read on WLn+3 cells is obtained by setting $V_{SL}$=0.03V as aligned in same way for P2$^5$, P4$^5$, and P6$^5$ states of TLC cells with $V_{SL}$=0V in the case of FIG. 7G.

Figure 7J:
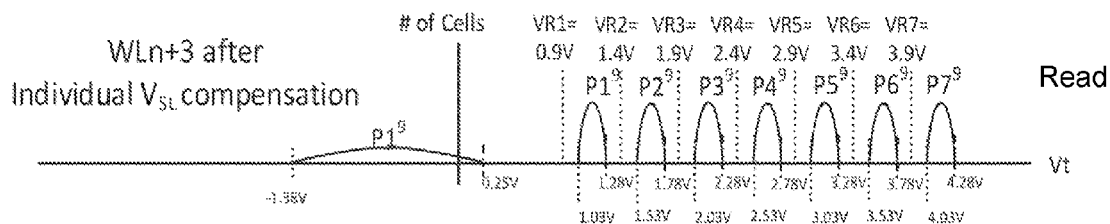
FIG. 7J is a diagram showing respective $V_{SL}$-based Vt-compensation values and 7 preferred read voltage VRn values to tell 8 distinct TLC program states according to an embodiment of the present invention.

FIG. 7J is a diagram showing respective $V_{SL}$-based Vt-compensation values and 7 preferred read voltage VRn values to tell 8 distinct TLC program states according to an embodiment of the present invention. As shown, two respective $V_{SL}$-based Vt-compensations and 7 preferred uprising VRn values are sequentially applied to selected WLs to distinguish 8 distinct TLC program states. In particular, $V_{SL}$=0V for reading TLC cells in WLn+3 when the opposing TLC cells in WLn+4 are at P7, P5, and P3 states; $V_{SL}$=0.03V for reading TLC cells in WLn+3 when the opposing TLC cells in WLn+4 are at P6, P4, P2, P1, and P0 states. 7 VRn values are defined as VR1=0.9V, VR2=1.4V, VR3=1.9V, VR4=2.4V, VR5=2.9V, VR6=3.4V, and VR7=3.9V.

FIG. 8A is a table showing preferred two $V_{LBL}$ program voltages and one program-inhibit voltage of Vinh assigned for a 2-state SLC-like 1P program within TLC program according to an embodiment of the present invention. As shown, a first set of 2 preferred $V_{LBL}$ program voltages and one Vinh program-inhibit voltage is assigned for a first 2-state SLC-like 1P program under 1-2-8(coarse)-8(fine) TLC program scheme. The 2 preferred $V_{LBL}$ program voltages are assigned for performing 1P operation based on Vt difference of 2V as defined by two interim SLC-like program states between P0 and P4. Under such $V_{LBL}$ assignment, P0 and P4 in 1P operation can be started and finished at almost same time without having any earlier lockout state to avoid Yupin-induced BL-BL coupling effect. Once the program Vts of P0 and P4 exceed the pre-determined values, then $V_{LBL}$ is re-assigned with a program-inhibit voltage of Vinh ~7V to avoid over-program. In a specific embodiment, a first $V_{LBL}$ voltage $V_{LBL0}$ is either 2V or Vinh respectively for P0 program or program-inhibit, a second $V_{LBL}$ voltage $V_{LBL1}$ is either 0V or Vinh respectively for P4 program or program-inhibit.

FIG. 8B is a table showing a first set of 7 preferred $V_{LBL}$ program voltages and one Vinh program-inhibit voltage assigned for a 2P program under 1-2-8(coarse)-8(fine) TLC program scheme according to an embodiment of the present invention. As shown, total 8 preferred $V_{LBL}$ coarse voltage assignments for performing the 2P operation are provided based on 7 Vt-differences of final program states of P0, P1, P2, P3, P4, P5, P6, and P7. As such, P0 to P7 in 2P program can be started and finished at almost same time without having any earlier lockout state to reduce Yupin BL-BL coupling effect. Similarly, when 2P programmed Vts of P0-P7 exceed the respectively set values, then $V_{LBL}$ is re-assigned with a program-inhibit voltage of Vinh-7V to prevent over programming. In a specific embodiment, $V_{LBL0}$ is Vinh for P0 program-inhibit voltage without program, $V_{LBL1}$ $V_{LBL7}$ is correspondingly assigned with 3.0V, 2.5V, 2.0V, 1.5V, 1.0V, 0.5V, and 0V for P1, P2, P3, P4, P5, P6, and P7 program accompanying with a unified program-inhibit voltage Vinh-7V.

FIG. 8C is a table showing a second set of 5 preferred $V_{LBL}$ program voltages and one Vinh program-inhibit voltage assigned for a 2P MLC-like program under 1-2-5-8 TLC program scheme according to an embodiment of the present invention. The 5 preferred coarse $V_{LBL}$ voltage assignments for the 2P program are based on 5 Vt-differences defined by 5 interim program states of P0, P1, P2, P4, and P6. As such, all the 5 interim MLC states of P0, P1, P2, P4, and P6 in 2P program can be started and finished at almost same time without having earlier lockout state to reduce Yupin BL-BL coupling effect. Similarly, when 2P programmed Vts of P0, P1, P2, P4, and P6 exceed the respectively set values, then the corresponding $V_{LBL}$ value is re-assigned with a program-inhibit voltage of Vinh≈7V to prevent over programming. In a specific embodiment, these 5 distinct $V_{LBL}$ voltages are given as: $V_{LBL0}$=Vinh for P0 program-inhibit voltage without program; $V_{LBL1}$=2.5V/Vinh for P1 program and program-inhibit voltages; $V_{LBL2}$=2.0V/Vinh for P2 program and program-inhibit voltages; $V_{LBL3}$=1.0V/Vinh for P3 program and program-inhibit voltages; $V_{LBL4}$=1.5V/Vinh for P4 program-inhibit voltage without program to save tie; $V_{LBL6}$=0V/Vinh for P6 program and program-inhibit voltages. Note, all $V_{LBLn}$ values are aligned to $V_{LBL6}$.

FIG. 8D shows 8 sets of 8 preferred $V_{LBL}$ program voltages and one Vinh program-inhibit voltage assigned for a 3P TLC program of Option1 under 1-2-5-8 TLC program scheme with compensation according to an embodiment of the present invention. Each TLC state in WLn 3P program preferably has 8 individual $V_{LBL}$-compensations in accordance with 8 different program states P0 to P7 of the opposing TLC cells located in WLn+1.

These 8 preferred $V_{LBL}$ voltage assignments for 3P TLC program on 8 target TLC cells in WLn are not only based on the 7 major Vt-differences defined by 8 interim program states of P0, P1, P2, P3, P4, P5, P6, and P7 but are also fine tuned by 8 possible programmed states of opposing TLC cells located in adjacent WLn+1. As such, all the 8 interim TLC states of P0, P1, P2, P3, P4, P5, P6, and P7 in the 3P program can be started and finished at almost same time without having earlier lockout state to reduce Yupin BL-BL coupling effect. Similarly, when the 3P programmed Vts of P0, P1, P2, P3, P4, P5, P6, and P7 exceed the respectively set values, then corresponding $V_{LBL}$ value is re-assigned with a program-inhibit voltage of Vinh-7V to prevent over programming.

In a specific embodiment, these 8 major distinct $V_{LBL}$ program or program-inhibit voltages with 8 minor compensations for each TLC cell are set as: For P0 cell in WLn, $V_{LBL0}$=Vinh for opposing cells at any one of P0 to P7 in WLn+1. Alternatively, for P1 cell in WLn, $V_{LBL0}$=3V/Vinh for program and program-inhibit voltages when the opposing cell in WLn+1 is a P0 cell, $V_{LBL1}$=3.1V/Vinh when the opposing cell in WLn+1 is a P1 cell, $V_{LBL2}$=3.2V/Vinh when the opposing cell in WLn+1 is a P2 cell, $V_{LBL3}$=3.3V/Vinh when the opposing cell in WLn+1 is a P3 cell, $V_{LBL4}$=3.0V/Vinh when the opposing cell in WLn+1 is a P4 cell, $V_{LBL5}$=3.1V/Vinh when the opposing cell in WLn+1 is a P5 cell, $V_{LBL6}$=3.2V/Vinh when the opposing cell in WLn+1 is a P6 cell, and $V_{LBL7}$=3.3V/Vinh when the opposing cell in WLn+1 is a P7 cell.

Note, all $V_{LBLn}$ values are aligned to $V_{LBL0}$ or $V_{LBL4}$.

Yet alternatively, for P2 cell in WLn, $V_{LBL0}$ is given as 2.5V/Vinh for program and program-inhibit voltages when the opposing cell in WLn+1 is a P0 cell, $V_{LBL1}$ is given as 2.6V/Vinh when the opposing cell in WLn+1 is a P1 cell, $V_{LBL2}$ is given as 2.7V/Vinh when the opposing cell in WLn+1 is a P2 cell, $V_{LBL3}$ is given as 2.8V/Vinh when the opposing cell in WLn+1 is a P3 cell, $V_{LBL4}$ is given as 2.5V/Vinh when the opposing cell in WLn+1 is a P4 cell, $V_{LBL}$ is given as 2.6V/Vinh when the opposing cell in WLn+1 is a P5 cell, $V_{LBL6}$ is given as 2.7V/Vinh when the opposing cell in WLn+1 is a P6 cell, and $V_{LBL7}$ is given as 2.8V/Vinh when the opposing cell in WLn+1 is a P7 cell. Note, all $V_{LBLn}$ values are aligned to $V_{LBL0}$ or $V_{LBL4}$.

Likewise, the rest of 8 preferred $V_{LBL}$ assignments for P3 to P7 cells in WLn can be referred to the table in FIG. 8D.

FIG. 8E shows 8 sets of 8 preferred $V_{LBL}$ program voltages and one Vinh program-inhibit voltage assigned for a 3P″ TLC program of Option2 under 1-2-8-8 TLC program scheme with similar compensation as FIG. 8D according to another embodiment of the present invention. Each TLC state in WLn 3P program preferably has 8 individual $V_{LBL}$ compensations in accordance with 8 different TLC program states P0 to P7 of opposing cells located in adjacent WLn+1. As shown, these 8 major distinct $V_{LBL}$ program and Inhibit voltages with 8 minor compensations for each TLC cell are provided in eight different sets based on eight different state of the TLC cell in WLn with the corresponding $V_{LBL}$ compensations in accordance with 8 different program states of corresponding opposing TLC cells in the adjacent WLn+1. Referring the FIG. 8E for detail assignments.

FIG. 8F shows 8 sets of 8 preferred novel $V_{LBL}$ program voltages and one program-inhibit voltage of Vinh assigned for a 3P TLC program for both Option1 1-2-8-8 and Option2 1-2-5-8 TLC program schemes with similar compensation of the present invention. Each TLC state in WLn 3P program preferably has 8 individual $V_{LBL}$ compensations in accordance with 8 different TLC opposite cells of P0 to P7 located in WLn+1 of the present invention.

In a specific embodiment, these 8 major distinct $V_{LBL}$ program or program-inhibit voltages with 8 minor compensations for each TLC cell are provided, if the TLC cell is a P0 cell in WLn, as $V_{LBL0}$=Vinh for opposing cells of P0 to P7 in WLn+1, i.e., no program; and if the TLC cell is a P1 cell in WLn, as $V_{LBL0}$=3.0V/Vinh for program and program-inhibit voltages when the opposing cell in WLn+1 is aP0 cell, $V_{LBL1}$=3.0V/Vinh when the opposing cell in WLn+1 is a P1 cell, $V_{LBL2}$=3.1V/Vinh when the opposing cell in WLn+1 is a P2 cell, $V_{LBL3}$=3.1V/Vinh when the opposing cell in WLn+1 is a P3 cell, $V_{LBL4}$=3.2V/Vinh when the opposing cell in WLn+1 is a P4 cell, $V_{LBL5}$=3.2V/Vinh when the opposing cell in WLn+1 is aP5 cell, $V_{LBL6}$=3.3V/Vinh when the opposing cell in WLn+1 is a P6 cell, and $V_{LBL7}$=3.3V/Vinh when the opposing cell in WLn+1 is a P7 cell. Note, all $V_{LBLn}$ values are aligned to $V_{LBL0}$ or $V_{LBL4}$.

Likewise, if the TLC cell is a P2 cell in WLn, another 8 $V_{LBL}$ voltage assignments are given as shown in FIG. 8F and so do the rest of 8 preferred $V_{LBL}$ assignments for P3 to P7 cells in WLn can be referred to corresponding rows in the table of FIG. 8F.

FIG. 8G is a table showing how to calculate and generate several sets of 8 desired $V_{LBL}$ voltages and one program-inhibit voltage per each pass (1P, 2P, 2P', 3P, and 3P''') of ABL, AnP, and Alt-WL TLC program in WLn cells with individual compensations from adjacent WLn+1's TLC Vt coupling effect by using a 3-Cap CS technique performed on 3 vertically adjacent $C_{LG}$ capacitors for each LBL TLC cell under the worst-case Vddmin=2.4V when operating at Vdd=2.7V (this is merely an example, and other Vdd value used in the Flash memory industry is still applicable), regardless of 1-2-8(coarse)-8(fine) or 1-2-5-8 TLC program scheme. As shown, all target ΔVtp-based $V_{LBL}$ and Vinh voltages with compensations for each TLC interim or final program states of P0, P1, P2, P3, P4, P5, P6, and P7 for either 1-2-8(coarse)-8(fine) or 1-2-5-8 TLC program scheme. The target ΔVtp-based $V_{LBL}$ voltages mean that the $V_{LBL}$ voltages are preferably set by Vt-difference between 8 TLC program states.

In an embodiment, 3 equal-size capacitors ($C_{LBL}$) as three 1-bit PCACHE registers are initially precharged with three predetermined values of $V_{LBL}$ that can be same or different under 3 different time periods of T0, T1, and T2. After independent precharge cycle, a CS operation is performed on the 3 capacitors by connecting them to get the desired 8 $V_{LBL}$ voltages for 8 TLC program states of P0, P1, P2, P3, P4, P5, P6, and P7 during each of 1P, 2P, 2P', 3P, and 3P''' TLC programs.

For a SLC-like 1P program, it is preferred to have 2 different $V_{LBL}$ voltages for 2 interim program states of P0 and P4 and one Vinh program-inhibit voltage as defined in FIG. 8A table. For a TLC 2P program, it is preferred to have 8 $V_{LBL}$ voltages for both 8 interim and 8 final program states of P0, P1, P2, P3, P4, P5, P6, and P7 as defined in FIG. 8B table, regardless of 1-2-8-8 or 1-2-5-8 TLC program scheme. For a MLC-like 2P' program under 1-2-5-8 TLC program scheme, it is preferred to have 5 $V_{LBL}$ voltages for 5 interim program states of P0, P1, P2, P4, and P6 as defined in FIG. 8C table. The Vinh voltage is used for precharging and program-inhibiting, which is supplied from each selected local LBLps precharge power line (of each LG) to save power consumption (by not going globally through long column of the array from page buffer). In a specific embodiment, only 2 values of Vinh of 6V and 7V may be used (precharged) to obtain all desired $V_{LBL}$ voltages and one final Vinh voltage under Vddmin=2.4V supplied as a LV operation voltage. This design allows the value of Vinh to be kept less than BVDS of 7V.

FIG. 8H is a table showing how to calculate and generate another sets of 8 desired $V_{LBL}$ voltages and one program-inhibit voltage per each pass (1P, 2P, 2P', 3P, and 3P''') of ABL, AnP, and Alt-WL TLC program in WLn cells with individual compensations from adjacent WLn+1 TLC cell Vt coupling effect by using a similar CS technique but performed among 4 adjacent $C_{LG}$ capacitors for each LBL under a worst-case Vddmin of 1.6V when operating at Vdd=1.8V, regardless of using a 1-2-8(coarse)-8(fine) or a 1-2-5-8 of TLC program scheme.

FIG. 8H also shows all target ΔVtp-based $V_{LBL}$ and Vinh voltages with compensations for each TLC interim or final program states of P0, P1, P2, P3, P4, P5, P6, and P7 for either 1-2-8(coarse)-8(fine) or 1-2-5-8 TLC program scheme. The target ΔVtp-based $V_{LBL}$ voltages are identical, regardless Vdd=1.8V or Vdd=2.7V.

The 4 equal adjacent capacitors ($C_{LBL}$=$C_{LG}$) of 4 1-bit PCACHE registers are initially precharged with three predetermined values of $V_{LBL}$ that can be the same or different under 4 different time periods of T0, T1, T2, and T3. After independent precharge cycle, then a CS operation is performed among the 4 capacitors by connecting them to get the desired 8 $V_{LBL}$ voltages for 8 TLC program states of P0, P1, P2, P3, P4, P5, P6, and P7 during 1P, 2P, 2P', 3P, and 3P''' TLC programs. In a specific embodiment, four values of Vinh of 7V, 6.4V, 5V, and 3.6V are used to obtain all desired interim $V_{LBL}$ voltages and one final Vinh program-inhibit voltage under Vddmin=1.6V when Vdd=1.8V.

FIG. 8I shows various sets of the preferred $V_{FY}$ program-verify voltages on select WLn and associated individual $V_{SL}$-based Vt-offset voltages on each select BLn source nodes in accordance with the each pass of TLC interim and final program states under 1-2-8(coarse)-8(fine) TLC program scheme. In this scheme, for a SLC-like 1P program, only 2 interim program states of P0 and P4 require program-verify with associated $V_{SL}$ voltages to be performed. Here $V_{SL}$=1.4V is applied to verify P0 interim state. For a TLC 2P program, all 8 states of P1 to P7 except P0 require program-verify with associated $V_{SL}$ voltages to be performed. For a TLC 3P program (on non-boundary WL), all 8 states of P1 to P7 except P0 require program-verify with associated $V_{SL}$ voltages to be performed. Further, for a TLC 3P' program (on boundary-WL), all 8 states of P1 to P7 except P0 require program-verify with associated $V_{SL}$ voltages to be performed. The preferred voltages of $V_{FY}$ and $V_{SL}$ (mostly in 0V without extra compensation) are optimized with different values for 1P, 2P, 3P, and 3P' TLC program as shown in FIG. 8I.

FIG. 8J is a table showing various sets of the preferred $V_{FY}$ program-verify voltages on select WLn and associated individual $V_{SL}$ Vt-offset voltages on each select BLn source nodes in accordance with the each pass of TLC interim and final program states under 1-2-5-8 TLC program scheme. In this scheme, for a SLC-like 1P program, only 2 states of P0 and P4 require program-verify and $V_{SL}$ voltages to be performed. Here $V_{SL}$=1.4V is applied to verify P0 interim state. For a MLC-like 5-state 2P program, only 4 states of P1, P2, P4, and P6 except P0, P3, and P5 require program-verify and $V_{SL}$ voltages to be performed. Further for a TLC 3P" program (on non-boundary WL), all 8 states of P1 to P7 except P0 require program-verify and $V_{SL}$ voltages to be performed. Furthermore, for a TLC 3P' program (on boundary-WL), all 8 states of P1 to P7 except P0 require program-verify and $V_{SL}$ voltages to be performed. The preferred $V_{FY}$ and $V_{SL}$ voltages (mostly in 0V without extra compensation) are optimized with different values for 1P, 2P', 2P, 3P", and 3P' TLC program as shown in FIG. 8J.

FIG. 8K is a table showing preferred 7 VRn read voltages and one common $V_{SL}$=0V on those non-boundary WL cells without Vt-offset when next boundary WLn+3 cells are programmed with TLC data according to an embodiment of the present invention. As shown, 7 preferred VRn values and one common $V_{SL}$=0V on those non-boundary WLs such as WLn−1 through WLn+2 without Vt-offset with next boundary WLn+3 cells being programmed with TLC data following the ABL, AnP, Alt-WL sequence as defined in FIG. 5A. In a specific embodiment, the 7 VRn read voltage values are defined and sequentially applied as WL bias voltage $V_{WL}$ to the selected WLn with a common $V_{SL}$=0V: VR1=$V_{WL}$=0.5V is used to distinguish P0 out of remaining 7 TLC states of P1 to P7; VR2=$V_{WL}$=1.0V is used to distinguish P0 and P1 out of remaining 6 TLC states of P2 to P7; VR3=$V_{WL}$=1.5V is used to distinguish P0 to P2 out of remaining 5 TLC states of P3 to P7; VR4=$V_{WL}$=2.0V is used to distinguish P0 to P3 out of remaining 4 TLC states of P4 to P7; VR5=$V_{WL}$=2.5V is used to distinguish P0 to P4 out of remaining 3 TLC states of P5 to P7; VR6=$V_{WL}$=3.0V is used to distinguish P0 to P5 out of remaining 2 TLC states of P6 and P7; and VR7=$V_{WL}$=3.5V is used to distinguish P0 to P6 out of remaining 1 TLC states of P7.

FIG. 8L is a table showing preferred 7 VRn read voltages and one common $V_{SL}$=0V on those boundary WLn+3 cells without Vt-offset when next boundary WLn+4 cells are not programmed with TLC data but in $E^0$-state according to an embodiment of the present invention. As shown, 7 preferred VRn values and one common $V_{SL}$=0V on those boundary WLn+3 without Vt-offset when WLn+4 cells are not programmed with TLC data but in $E^0$ state following the ABL, AnP, Alt-WL sequence as defined in FIG. 5A. In a specific embodiment, the 7 uprising VRn read voltage values are sequentially applied as wordline bias voltage $V_{WL}$ to the selected WLn with a common $V_{SL}$=0V: VR1=$V_{WL}$=0.1V is used to distinguish P0 out of remaining 7 TLC states of P1 to P7; VR2=$V_{WL}$=0.9V is used to distinguish P0 and P1 out of remaining 6 TLC states of P2 to P7; VR3=$V_{WL}$=1.1V is used to distinguish P0 to P2 out of remaining 5 TLC states of P3 to P7; VR4=$V_{WL}$=2.0V is used to distinguish P0 to P3 out of remaining 4 TLC states of P4 to P7; VR5=$V_{WL}$=2.5V is used to distinguish P0 to P4 out of remaining 3 TLC states of P5 to P7; VR6=$V_{WL}$=3.0V is used to distinguish P0 to P5 out of remaining 2 TLC states of P6 and P7; and VR7=$V_{WL}$=3.5V is used to distinguish P0 to P6 out of remaining 1 TLC states of P7.

FIG. 8M is a table showing preferred 7 VRn read voltages and one common $V_{SL}$=0V on those boundary WLn+3 cells without Vt-offset when next boundary WLn+4 cells are programmed with TLC data according to another embodiment of the present invention. As shown, 7 preferred VRn values and one common $V_{SL}$=0V on those boundary WLn+3 without Vt-offset when WLn+4 cells are programmed with TLC data following the ABL, AnP, Alt-WL sequence as defined in FIG. 5A. In a specific embodiment, the 7 uprising VRn read voltage values are sequentially applied as wordline bias voltage $V_{WL}$ to the selected WLn with a common $V_{SL}$=0V: VR1=$V_{WL}$=0.1V is used to distinguish P0 out of remaining 7 TLC states of P1 to P7; VR2=$V_{WL}$=0.9V is used to distinguish P0 and P1 out of remaining 6 TLC states of P2 to P7; VR3=$V_{WL}$=1.1V is used to distinguish P0 to P2 out of remaining 5 TLC states of P3 to P7; VR4=$V_{WL}$=2.0V is used to distinguish P0 to P3 out of remaining 4 TLC states of P4 to P7; VR5=$V_{WL}$=2.5V is used to distinguish P0 to P4 out of remaining 3 TLC states of P5 to P7; VR6=$V_{WL}$=3.0V is used to distinguish P0 to P5 out of remaining 2 TLC states of P6 and P7; and VR7=$V_{WL}$=3.5V is used to distinguish P0 to P6 out of remaining 1 TLC states of P7.

Figure 9A:
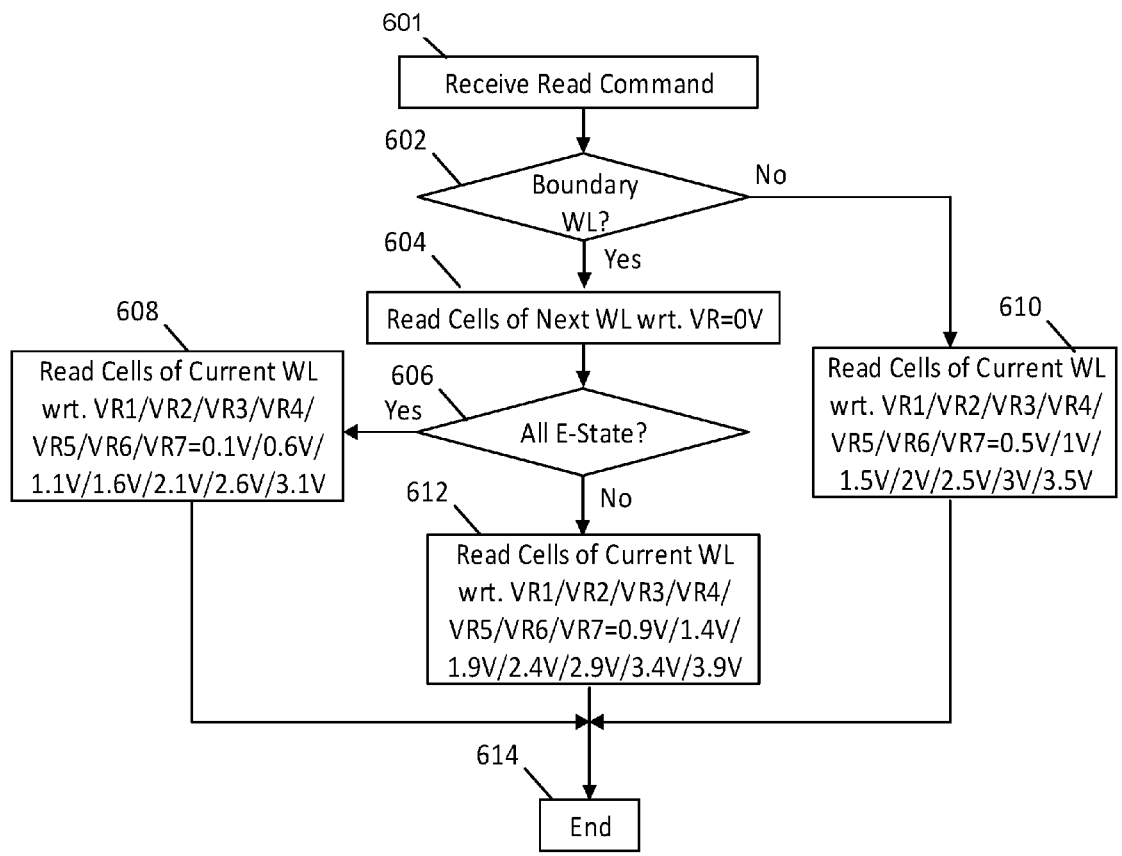
FIG. 9A is a flow chart showing a preferred method for performing TLC read operation on either boundary or non-boundary WL TLC cells programmed under a 1-2-8(coarse)-8(fine) TLC program scheme according to an embodiment of the present invention.

FIG. 9A is a flow chart showing a preferred method for performing TLC read operation on either boundary or non-boundary WL TLC cells programmed under a 1-2-8(coarse)-8(fine) TLC program scheme according to an embodiment of the present invention. As shown, a preferred method 600 is provided for performing TLC read operation under a 1-2-8(coarse)-8(fine) TLC program scheme for both boundary and non-boundary WL TLC cells.

The method 600 starts from step 601 of receiving the TLC read Commend that is added with some new operation designed to have multi-page concurrent TLC operations. Then the next step 602 is divided into two separate paths, depending on determination of WLn on whether it is a boundary or non-boundary WL. The determination can be executed by reading out a Mark cell data pre-stored in bare area of the WLn. The "Mark" cell is preferably being programmed with a SLC 2-state data only. if the Mark cell data is read out "1", it indicates the WLn is a non-boundary wordline, otherwise, if the Mark cell data is read out "0", it indicates the WLn is a boundary wordline.

If the step 602 determines that WLn is not a boundary WL, then the flow moves a step 610 to read TLC cells directly by using 7 uprising VRn of 0.5V, 1V, 1.5V, 2V, 2.5V, 3V, and 3.5V to distinguish corresponding 8 TLC program states.

If the step 602 determines that WLn is a boundary WL, the next step 604 is to perform a special read operation on all cells in next wordline WLn+1 adjacent to WLn. The special read operation only applies a wordline voltage of 0V to check whether all threshold voltage Vt values are smaller than 0V or at least one cell's Vt is greater than 0V. The flow is then in a step 606 being further divided into two paths, depending on determination about the status of the next adjacent WLn+1 based on the read information from step 604.

If the step 606 determines that all the WLn+1 cells are in $E^0$ state only by reading out all threshold voltage Vt values smaller than 0V, indicating that WLn cells would be programmed a coarse-TLC data with a Vt-gap of 0.25V without being widened by WLn+1 (in $E^0$ state), the flow moves to step 608 to read the WLn TLC cells directly by using 7 uprising VRn of 0.1V, 0.6V, 1.1V, 1.6V, 2.1V, 2.6V, and 3.1V to distinguish its 8 TLC program states.

If the step 606 determines that the WLn+1 cells are not all in $E^0$ state by reading out at least one cell's Vt greater than 0V, indicating that WLn+1 at least includes programmed cells and the WLn cells Vts would suffer more shift by corresponding programmed WLn+1 cells. Then the method flow moves to step 612 to alternatively read the WLn TLC cells using a new set of VRn with respectively higher values of 0.9V, 1.4V, 1.9V, 2.4V, 2.9V, 3.4V, and 3.9V to distinguish corresponding 8 TLC program states. The new set of VRn is determined by including additional individual Vt-compensations in accordance with the status of the programmed states of the adjacent cells on WLn+1.

Figure 9B:
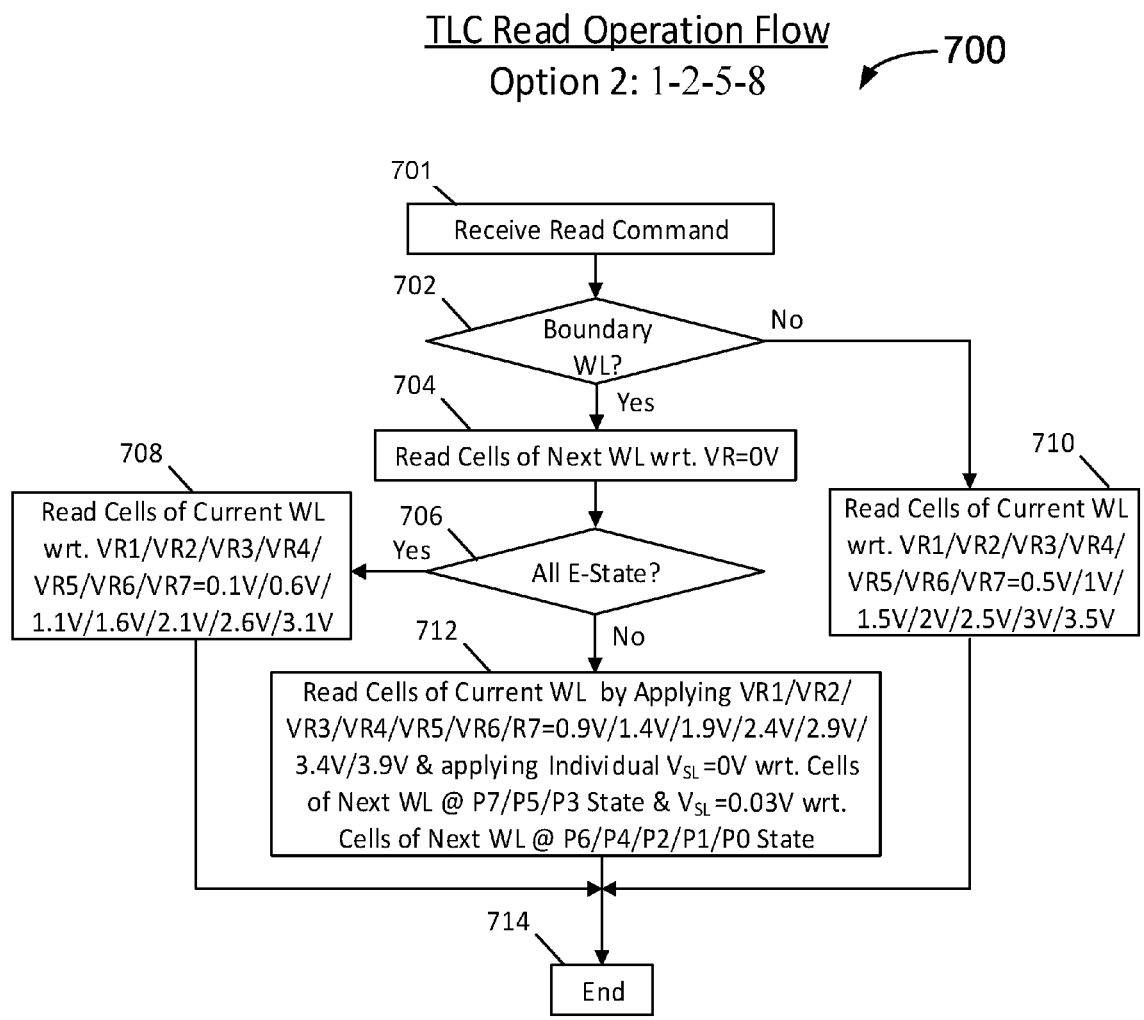
FIG. 9B is a flow chart showing a preferred method for performing TLC read operation on either boundary or non-boundary WL TLC cells programmed under a 1-2-5-8 TLC program scheme according to an embodiment of the present invention.

FIG. 9B is a flow chart showing a preferred method for performing TLC read operation on either boundary or non-boundary WL TLC cells programmed under a 1-2-5-8 TLC program scheme according to an embodiment of the present invention. As shown, another preferred method for both boundary and non-boundary WL TLC cells.

The method 700 starts from step 701 of receiving a TLC read Commend that is added with some new operation designed to have multi-page concurrent TLC operations. Then the next step 702 of the flow is divided into two separate paths, depending on determination of WLn on whether it is a boundary or non-boundary WL, in terms of reading out a Mark cell data of "1" or "0" stored in the WLn.

If the step 702 determines that WLn is not a boundary WL, then the flow moves to step 710 read TLC cells of WLn directly by using 7 uprising VRn of 0.5V, 1V, 1.5V, 2V, 2.5V, 3V, and 3.5V to distinguish corresponding 8 TLC program states.

If the step 702 determines that WLn is a boundary WL, the next step 704 is to perform a special read operation on all cells in next wordline WLn+1 adjacent to WLn. The special read operation only applies a wordline voltage of 0V to check whether all threshold voltage Vt values are smaller than 0V or at least one cell's Vt is greater than 0V. The flow is then in a step 706 being further divided into two paths, depending on determination about the status of the next adjacent WLn+1 based on the read information from step 704.

If the step 706 determines that all the WLn+1 cells are in $E^0$ state only by reading out all threshold voltage Vt values smaller than 0V, indicating that WLn cells would be programmed a coarse-TLC data with a Vt-gap of 0.25V without being widened by WLn+1 (in $E^0$ state), the flow moves to step 708 to read the WLn TLC cells directly by using 7 uprising VRn of 0.1V, 0.6V, 1.1V, 1.6V, 2.1V, 2.6V, and 3.1V to distinguish its 8 TLC program states.

If the step 706 determines that the WLn+1 cells are not all in $E^0$ state by reading out at least one cell's Vt greater than 0V, indicating that WLn+1 at least includes programmed cells and WLn cells Vts would suffer more shift or widening by the corresponding programmed WLn+1 cells, the flow moves to step 712 to alternatively read the WLn TLC cells using a new set of VRn with respectively higher values of 0.9V, 1.4V, 1.9V, 2.4V, 2.9V, 3.4V, and 3.9V including certain Vt-compensations to distinguish corresponding 8 TLC program states. In particular, the Vt-compensations are individually (per cell in each page or per string in each block) implemented by setting $V_{SL}$=0V for the opposing WLn+1 TLC cells at program states P7, P5, and P3 and setting $V_{SL}$=0.03V for the opposing WLn+1 TLC cells at program states P6, P4, P2, P1, and P0.

In one or more embodiments, all the preferred multi-page concurrent NAND TLC operations described above can be implemented in a NAND memory chip 1000 (see FIG. 3) comprised of a YUKAI NAND array and its associated peripheral decoders and SA circuits with preferred bias conditions being set to provide many advantages including flexible control, individual compensation, independent pre-charging/discharging, temporary charge storing, local CACHE charge-sharing, and local/global data conversion, and more. The YUKAI NAND array includes a plurality of preferred paired strings within a plurality of blocks as shown in FIG. 1A or FIG. 1B or FIG. 1C with two-level hierarchical GBLs/LBLs and shared/shielded LBLs/LSLs associated with each string with local precharge power lines but without a CSL and using SLC-programmed dummy cells to perform Odd/Even-BL selection function.

For a purpose of simplifying the illustration of the preferred bias conditions through the peripheral decoders and SA circuits for implementing, e.g., various TLC operations, one LG group within the YUKAI NAND array is assumed to contain only two blocks arranged in mirrored symmetry in LBL-direction (Y-direction). Each block is comprised of N/2 paired 128-cell NAND strings cascaded in WL-direction (X-direction). In this simplified version of NAND array, two identical sets of bias conditions of Even/Odd LBLs ($LBL^{J-1}e$ and $LBL^{J-1}o$), 128 WLs, 2 DWLs, 1 SSL and 1 GSL of each string are shown. For example, the top sub-string contains 64 WLs such as $WL^1 1$ to $WL^1 64$ counted from string middle to string top of top block (e.g., Block1 in FIG. 1A). Conversely, the bottom sub-string contains another 64 WLs such as $WL^2 1$ to $WL^2 64$ counted from string middle to string bottom of top block. Similarly, the same 128 WLs arrangement is shown in the bottom block (e.g., Block2 in FIG. 1A).

In an embodiment, a preferred TLC program operation of the top sub-string is preferably performed sequentially from $WL^1 1$ to $WL^1 64$ of the top block, which is selected to be erased and programmed with a TLC data concurrently. In another embodiment, the TLC program operation of the lower sub-string is preferably performed sequentially from $WL^2 1$ to $WL^2 64$ of this YUKAI NAND string if 64 WLs of bottom block are also selected to be erased and programmed with a TLC data. Note, there is flexibility to independently select the top 64 sub-string first and then the bottom 64-WL string thereafter or vice versa in TLC program. But for easier decoding for preferred M WLn selections (on one WL per one block basis) for this M-page concurrent TLC program operation, same WLn locations of M selected WLn within each selected block is preferred. But when M random WLn are selected for this most flexible concurrent TLC program operation, then each set of voltages of 128 WLs, 1 SSL, and 1 GSL lines have to be latched in the parasitic poly2 capacitances in each select block.

The following examples are using the same WLn locations within the M selected blocks to describe the preferred TLC program operation. Referring back to the YUKAI NAND array in FIG. 1A, a pair of YUKAI NAND blocks, Block1 on top and Block2 on bottom, is configured to be a mirrored symmetry in BL direction (Y-direction) with each individual BL being also a SL of neighboring string and to use small dummy cells programmed with Odd/Even BL selection function without need of an extra big select transistor. Actually, each SL is identical to each BL and can be used interchangeably. Note, each BL is also referred as a local BL or a LBL line laid at m1/m2 level below a top-level global BL.

The fundamental building circuit of the YUKAI NAND Block is one pair of Even and Odd strings with their respective drain and source nodes connecting to two cross-coupled LBLe and LBLo metal lines laid alternately at m1 and m2 levels described in FIG. 2. In other words, using the adjacent string's BL drain node as the individual SL source node so that the individual $V_{SL}$-based Vtn-offset scheme can be flexibly realized in read, program-verify and erase-verify operations.

FIG. 10A shows a preferred set of bias conditions for a multiple-block erase operation according to an embodiment of the present invention. In a specific embodiment, two or more adjacent or non-adjacent YUKAI NAND blocks can be selected for concurrent HV erase operation. In following examples, two adjacent blocks in one LG are selected for erase and program (normally one LG may comprise more than two adjacent blocks). For 2D NAND, the erase HV voltage can be more than 20V by charging $V_{TPW}=V_{DNW}\geq 20V$. Up to M×2 blocks in M LGs are selected for simultaneous multi-block erase operation. The erase bias conditions of each 2-block, all the selected 256 WLs (WL$^1$1–WL$^1$64 to WL$^4$1–WL$^4$64) of the selected regular cells and 4 DWLs (DWL$^1$1, DWL$^1$2, DWL$^2$1 and DWL$^2$2) of dummy cells are coupled to Vss ($V_{WL}=V_{DWL}=0V$) along with $V_{TPW}=V_{DNW}=20V$ and all the selected common poly2-gate lines such as SSL$^1$, GSL$^1$, SSL$^2$, GSL$^2$, BLGJ'-1, PRE$^{J''}$o, PRE$^{J''}$e and LBL$^{J''}$ps are set in floating state (FL) to allow the two blocks be erased and verified against Vte0max. As a result, all N+/TPW diode junctions are precharged to 19.5V on LBL$^{J'-1}$-e and LBL$^{J'-1}$o and LBL$^{J''}$e and LBL$^{J''}$o nodes. Note, the Vte0max is −2.0V. In reality, a LG group may include more than two adjacent blocks that can be connected by one or more LG-divided devices of MLBL.

FIG. 10B shows a preferred set of bias conditions for a first discharge operation after multiple-block erase according to an embodiment of the present invention. Up to M×2 blocks in M LGs are selected for concurrent discharging after 20V concurrent erase operation. During this first discharge operation, all selected TPW and DNW voltages are discharged from 20V to 1V along with the selected WLs, SSL, GSL, PRE$^{J''}$o, PRE$^{J''}$e, LBL$^{J''}$ps, and BLGJ'-1 lines being switched from floating state to Vss=0V so that the subsequent erase discharge can be performed.

By discharging $V_{TPW}$ and $V_{DNW}$ to 1V, one can use Vte0max=−1V for erase-verify for all regular NAND cells and dummy cells at the same time to save power. In summary, the first discharge operation uses corresponding bias conditions to discharge all HV nodes of selected DNW and TPW and all poly2-gate lines of unselected WLs, DWLs, PRE$^{J''}$o, PRE$^{J''}$e, GSL, SSL and BLGJ'-1 for obtaining an erase-verify voltage of −1V for dummy cells after the multiple-block erase operation.

FIG. 10C shows a preferred set of bias conditions for a second discharge operation by setting PRE$^{J''}$o and PRE$^{J''}$e to Vpass, $V_{DNW}=V_{TPW}$ to 1V, LBL$^{J''}$ps line to 1V, and BLGJ'-1 poly2-gate line to 0V. The second discharge operation is to discharge all remaining HV charges on all N+/TPW junction nodes from ~19.5V to 3.5V so that the subsequent erase-verify of ~1V can be performed on regular NAND cells. As a consequence, the HV residue voltage on selected junctions of LBL$^{J''}$e, LBL$^{J''}$o, LBL$^{J'-1}$e, and LBL$^{J'-1}$o and all source/drain nodes of NAND cells in all selected strings of selected blocks are also discharged to 1V by turning on both LG-divided NMOS devices MLBLso and MLBLse so that the subsequent multi-block concurrent erase-verify operation of dummy cells and regular NAND cells can be performed using the same erase-verify voltage of −1V.

In an embodiment, FIG. 10D shows a preferred set of bias conditions for a first step of an erase-verify operation on cells in Even (or Odd) strings to perform concurrent precharge via Even local BL LBL$^{J''}$e or Odd local BL LBL$^{J''}$o with a Vinh voltage. In this example, the LBL$^{J''}$e is selected for precharging Vinh-7V by applying a corresponding precharge power line LBL$^{J''}$ps to Vinh and setting poly2-gate PRE$^{J''}$e to Vpass~10V. At the same time, the LBL$^{J''}$o is disconnected from the precharge power line LBL$^{J''}$ps by setting the poly2-gate PRE$^{J''}$o to 0V. Other bias conditions includes setting BLGJ-1 to Vpass to connect the whole local LBL$^{J''}$e and $V_{TPW}=V_{DNW}=V$ to keep Vs=1.5V of string-select transistor MSe with SSL$^1$ and Vd being set at 1.5V of the MSe with SSL$^2$ being set at 1.5V+Vt. This bias setting maintains the largest Vds≤0.5V across source and drain nodes of all selected cells in the selected strings without causing punch-through and body-effect during erase-verify sensing scheme.

In another embodiment, FIG. 10E shows a preferred set of bias conditions for a second step of the erase-verify operation on cells of Even NAND strings to perform a concurrent discharging or retaining operation to set the LBL$^{J''}$e line voltage in accordance with the erased data. In this example, the precharged LBL$^{J''}$e line is discharged from Vinh to 1V if all 128 cells and 2 dummy cells in each of two adjacent blocks passes an erase-verify voltage of −1V or is allowed to retain a Vinh voltage of ~7V if at least one cell per 128-cell string fails to pass the erase-verify of −1V by setting 0V to all selected WLs and DWLs along with putting LBL$^{J''}$ps precharge power line to 1V and biasing the poly2-gate PRE$^{J''}$o to Vpass 10V.

In yet another embodiment, FIG. 10F shows a preferred set of bias conditions for a third step of the erase-verify operation on cells of Even NAND strings to perform a concurrent chare-sharing (CS) operation between finally developed voltage of each LBL$^{J''}$e in LG$^{J''}$ (120) and each corresponding long GBL line with initial voltage of 0V. Each long GBL m3 metal line is divided to a plurality of broken-GBL m3 lines from GBL$^1$1 in HG1 to GBL$^J$1 in HGj (FIG. 4A). The CS result is sensed and verified by each corresponding sense amplifier (SA) in each page buffer (PB) through each corresponding MI transistor gated by a common gate signal ISO (FIG. 4E). This step of erase-verify operation is done on block-by-block basis.

As shown in FIG. 10F, the selected blocks for CS erase-verify from one MG of HG1 to each corresponding SA in PB. Along the signal path, all broken-GBL divided transistors, MGBL, are being turned on by coupling corresponding poly2-gate signals BHG1, . . . , BHGJ-1 to Vpass and setting the gate signal ISO≥Vdd to connect the SA to the selected block in the selected MG in the selected HG1. When each final CS voltage appearing at each SA is Vinh/J, it means no cell discharge of LBL$^{J''}$e, thus the erase fails. Conversely, when each final CS voltage appearing at each corresponding SA is 1V/J, then it means the cell discharge happens on the selected LBL$^{J''}$e capacitor, thus erase operation of ~1V is passed.

Note, the above verification of a 2-block erase per each MG only guarantees one out of four (2 Even and 2 Odd) NAND strings in 2 adjacent blocks is successful. The rest of 3 strings of two adjacent blocks need to be finally confirmed after one paired dummy cells per string being programmed successfully.

FIG. 11A shows a preferred set of bias conditions for a first step of Even dummy cell program operation to perform a concurrent precharge an Even-LBL LBL$^{J''}$e to Vinh according to an embodiment of the present invention. In this example, LBL$^{J''}$e capacitor is selected for precharging with Vinh-7V from the LBL$^{J''}$ps precharge power line by setting poly2-gate signal PRE$^{J''}$e to Vpass-10V. The voltage of Odd-LBL LBL$^{J''}$o is set to be floating by disconnecting it from the LBL$^{J''}$ps line by setting corresponding poly2-gate signal PRE$^{J''}$o to 0V.

The dummy cells, MLe, in 2 blocks are selected for simultaneous SLC-like program with a target Vt=2V by properly biasing poly2-gate signals: 1) SSL$^1$ and SSL$^2$ to 0V, 2) GSL$^1$ and GSL$^2$ to Vpass, 3) DWL$^1$1 AND DWL$^2$1 to Vpa1 (<Vpass), 4) DWL$^1$2 and DWL$^2$2 at Vpass, 5) WL$^2$1 and WL$^2$64 at Vpass, 6) WL$^4$1 and WL$^4$64 to Vpass, 7) WL$^1$1 through WL$^1$64 being set gradually decreasing values from Vpa2 to Vpa3, 8) WL$^3$1 through WL$^3$64 also being set gradually decreasing values from Vpa2 to Vpa3. By setting gradually decreased gate voltages from Vpass to Vpa1, Vpa2, and Vpa3 is to reduce voltages below Vdd between NAND memory cell MCe associated with $WL^3 64$ and select-transistor MSe associated with $SSL^2$ and the NAND memory cell MCe associated with $WL^1 64$ and select transistor MSe associated with $SSL^1$ so that no GIDL-effect will happens to the cells near the select transistors.

FIG. 11B shows a preferred set of bias conditions for a second step of Even dummy-cell program operation to perform a concurrent discharge of the Odd-LBL $LBL^{J'}o$ to Vss according to an embodiment of the present invention. In this example, $LBL^{J'}o$ is selected for discharge to Vss by turning on transistor MLBLso with its poly2-gate signal $PRE^{J'}o$ being coupled to Vpass and $LBL^{J'}ps$ power line being connected to 0V, but setting PREJ'e to 0V to prevent the leakage of the precharged $LBL^{J'}e$ from Vinh to Vss.

FIG. 11C shows a preferred set of bias conditions for a third step of Even dummy cell program operation with its gate of $DWL^1 2$ being tied to Vpgm and its channel connected to $LBL^{J'}o$ at 0V to perform a concurrent program on the Even dummy cells associated with this $DWL^1 2$ according to an embodiment of the present invention. In this example, $LBL^{J'}e$ is kept at Vinh but $LBL^{J'}o$ is discharged to 0V with $GSL^1$ being biased to Vpass and the channel of the dummy transistor MUo will be biased at Vinh-7V for program-inhibit. The bias voltage of $SSL^1$ is set to 0V to prevent Vinh charged at $LBL^{J'}e$ from leaking to transistors in Even string.

The selected Even dummy cells (MLe) in the top block with its gate connected to $DWL^1 2$ and other Even dummy cells MLe in bottom block with its gate connected to $DWL^2 2$ in two selected adjacent blocks with same BL connection can be programmed simultaneously with same target Vtp-dummy to save time and reduce power consumption. As the results of the above three steps, the Vts of any two adjacent Even-Odd dummy cells in $DWL^1 2$ and $DWL^2 2$ have been programmed to two complementary values: 1) Vtp-dummy≥2.0V for the Even dummy cells MLe by a SLC-like program but with higher Vtp value allowed to keep big Vt spacing from the erase state Vte-dummy; 2) Vte-dummy≤0V as program is performed for Odd dummy cells MLo after erase and a negative Vt is kept.

FIG. 11D, FIG. 11E, and FIG. 11F are used for the present invention to precharge, discharge, and program Odd dummy cells, MUo, in two selected Odd strings in two blocks with the preferred biased conditions that are opposite to above FIG. 11A, FIG. 11B, and FIG. 11C to program Even dummy cells, MLe. Therefore, the details are shown on above tables but the descriptions are skipped for simplicity. As the results, the Vts of any two adjacent Even-Odd dummy cells in $DWL^1 1$ and $DWL^2 1$ have been programmed to two complementary values: 1) Vte-dummy≥2.0V for the Odd dummy cells MLo by a SLC-like program but with higher Vtp value allowed to keep big Vt spacing from the erase state Vte-dummy; 2) Vtp-dummy≤00V as program is not performed for Even dummy cells MLe after erase and a negative Vt is kept.

FIGS. 11G, 11H, and 11I are diagrams showing respective steps to perform concurrent precharge, concurrent discharge and concurrent program-verify for Even dummy cells according to an embodiment of the present invention. As shown, a first step of dummy cell program-verify is to perform a concurrent LBL precharge operation. A second step is to perform a concurrent discharge operation followed by a third step of performing charge-sharing (CS) to complete the final concurrent program-verify operation for the selected Even dummy cells, MLe.

In the precharge step: LBL capacitors at $LBL^{J'}e$ are precharged to Vinh-7V but $LBL^{J'}o$ to 0V. In the discharge step, gate voltage of $SSL^1$ is biased to 0.5V+Vt to set drain node of the Even dummy cell MLe to 0.5V and source node of the MLe to 0V for a proper sensing without cell channel punch-through. The CS step is to distinguish if the selected Even dummy cells are programmed successfully or not by sensing the voltage of $LBL^{J'}e$ to either Vinh/J and smaller or 0V.

FIGS. 11J, 11K, and 11L are diagrams respective steps to perform concurrent precharge, concurrent discharge and concurrent program-verify for Odd dummy cells according to an embodiment of the present invention. As shown, 3 steps are respectively performed for program-verify the selected Odd dummy cells, including a concurrent precharge, a concurrent discharge, and a concurrent program-verify for Odd dummy cells, MUo. The steps and corresponding bias conditions are similar to those applied for Even dummy cell program-verify.

FIGS. 11M, 11N, and 11O are diagrams showing respective steps to further perform concurrent precharge, concurrent discharge and concurrent erase-verify for selected regular cells in Even strings in selected blocks after successful program operation for Odd and Even dummy cells according to an embodiment of the present invention. As shown, 3 steps respectively to perform concurrent precharge, concurrent discharge, and concurrent erase-verify for the selected regular TLC cells in Even strings in the selected blocks after the successful Odd and Even dummy cell program operation. As explained previously, the complete erase-verify of erased Odd and Even regular TLC strings in each selected block can only be performed after the success of program of Odd and Even dummy cells with complementary programmed states to provide Odd/Even string-select function. By using two small Even/Odd dummy cells respectively for corresponding Even/Odd paired YUKAI NAND strings while replacing extra large string-select transistors for Odd/Even string selection, the string size or layout length can be kept small to save area for higher memory cell density. The preferred bias conditions for corresponding three steps of performing erase-verify operation on Even TLC cells can be found in the FIGS. 11M, 11N, and 11O, respectively.

FIGS. 11P, 11Q, and 11R are diagrams showing respective steps to further perform concurrent precharge, concurrent discharge and concurrent erase-verify for selected regular cells in Odd strings in selected blocks after successful program operation for Odd and Even dummy cells according to an embodiment of the present invention. As shown, three steps to further perform concurrent TLC precharge, concurrent discharge, and concurrent erase-verify for selected regular NAND cells in Odd strings. The preferred bias conditions for the corresponding three steps of performing erase-verify operation on Odd TLC cells are similar to those shown in FIGS. 11M, 11N and 11O for operation on Even TLC cells.

In addition, after completion of dummy cells program operations with two complementary Vts, preferred concurrent TLC program, program-verify and read operations can be further performed on all regular TLC cells in selected Even and Odd strings.

FIGS. 12A, 12B, and 12C are diagrams showing respective sets of bias conditions for performing ABL and AnP coarse and fine TLC program operations according to an embodiment of the present invention. As shown, several sets of bias conditions for performing preferred ABL, AnP, and Alt-WL TLC program operations with preferred multiple $V_{LBLs}$ and 1 Vinh and their associated sets of poly2-gate voltages of WLs, SSLs, GSLs, DMYWLs, PRE$^J$e, PRE$^J$o, and BLGJ'-1, LBL$^J$ps precharge power line, as well as TPW and DNW, regardless of 1-2-8-8 or 1-2-5-8 TLC program schemes.

In an embodiment, the desired values of multiple $V_{LBLs}$ and one final Vinh can be optimally generated by using D/A and A/D converters in each SA in each PB and applying a CS technique among 3 or 4 designated $C_{LG}$ capacitors in the YUKAI NAND array. The CS technique details may be varied depending on implementation of LV page buffer using Vdd=1.8V or Vdd=2.4V as operation voltage. The higher Vdd value is, the less number of $C_{LG}$ capacitors and operation cycles are required for the CS technique to generate multiple desired ΔVtp-based $V_{LBL}$ program voltages and one final Vinh in accordance with desired program state Vtpn of the TLC cell.

In a specific embodiment, the ABL and AnP TLC program operation includes at least three steps. In a first step, 3 or 4 adjacent rows of N/2-bit $C_{LBLe}$ LG PCACHE registers and N/2-bit $C_{LBLo}$ LG PCACHE registers (for a NAND array with N-bit page size) are precharged separately with different values predetermined to be in a range between Vdd and Vinh-7V depending on final $V_{LBL}$ set value desired for programming the selected cell (in the page belonging to a particular string) to a specific TLC state or simply inhibiting the programming.

This is done in independently with isolation in individual row of LG PCACHE registers by properly biasing the relevant poly2-gate signals (see FIG. 12A). For example, for programming to final P1 state, a first LG PCACHE register is precharged to 7V in cycle T0, a second LG PCACHE register is precharged to 5.4V in cycle T1, and a third LG PCACHE register is precharged to 5.1V in cycle T2. Alternatively, depending on Vdd operation voltage value, 4 LG PCACHE registers per cell may be chosen for such precharge operation in 4 cycles.

In a second step, a data conversion operation is performed in each isolated LG PCACHE register by selectively discharging the precharged voltage to a desired level designed to obtain the final desired $V_{LBL}$ set value. The discharging is induced by sending a GBL voltage from corresponding top-level metal line from the PB with encoded data of Vdd or a level smaller than Vdd. The discharging is selectively performed, by properly setting bias conditions of relevant poly2-gate signals (see FIG. 12B), in such way that if the GBL voltage is Vdd, no discharge or the LG PCACHE register retains the precharged voltage and if the GBL voltage is smaller than Vdd, then the LG PCACHE register is discharged to just the same level as the encoded GBL voltage level.

For example, the first LG PCACHE register is retained at 7V as a corresponding GBL voltage is Vdd=2.4V at cycle T0, the second LG PCACHE register is discharged from 5.4V to 0.5V as its corresponding GBL voltage is 0.5V at cycle T1, and the third LG PCACHE register is discharged from 5.1V to 0V as its corresponding GBL voltage is 0V at cycle T2. Then, a 3-cap CS operation can be performed among the first, second, and third LG PCACHE registers isolated from all others in the same string, resulting a final $V_{LBL}$ value of 2.5V (i.e., an average value of 7V, 0.5V, and 0V), which is a desired level for ensuring the selected TLC cell to be programmed to a P1 state. Alternatively, if for all three cycles T0, T1, and T2, the corresponding GBL voltage is Vdd, then all LG PCACHE registers retain their precharged voltages. And the subsequent 3-cap CS leads to a $V_{LBL}$ voltage of 5.83V (an averaged value of 7V, 5.4V, and 5.1V), which is used as the final program-inhibit voltage for the selected TLC cell.

Through the second step described above, the obtained $V_{LBL}$ voltage (regardless of a program-inhibit voltage or a desired program voltage) is saved in the LG PCACHE register that contains the selected TLC cell. Depending on the specific programmed state expected for the to-be-programmed cell, this $V_{LBL}$ voltage can be greater than Vdd in certain situation (as in above example, 2.5V>Vdd=2.4V). This $V_{LBL}$ voltage is then passed from the LBL line associated with the LG PCACHE register along the string to drain node of the selected TLC cell, again by properly setting relevant poly2-gate signals (see FIG. 12B). Thus after the second step, a TLC program data from PB is converted per x,y string (x=o for Odd string and y=e for Even string) to the selected cell in the selected page in a pattern defined by a program-inhibit voltage Vinhx,y with a value close to but no greater than 7V and a desired program voltage $V_{LBLx,y}$ for programming the cell to a specific TLC program state. Alternatively, depending on Vdd operation voltage value, for example Vdd=1.6V, 4 LG PCACHE registers per cell may be chosen for performing such data conversion and 4-cap CS operation for enhancing flexibility to obtain the desired program voltage $V_{LBLx,y}$.

In a third step, ABL and AnP TLC program operation is performed by properly biasing the relevant poly2-gate signals and particularly applying uprising ISPP Vpgm programming voltage on the selected WL to program the page. As each cell in the page has pre-stored corresponding Vinhx, y/$V_{LBLx,y}$ voltages in the channel according to expected TLC program-inhibit/program state, the program operation will proceed to change the cell state in terms of its Vt state accordingly.

FIGS. 12D, 12E, and 12F are diagrams showing respective sets of bias conditions for performing Even-BL and AnP TLC concurrent program-verify operations according to an embodiment of the present invention. As shown, bias conditions for performing at least three steps of Even-BL and AnP TLC concurrent program-verify operation are provided regardless of 1-2-8-8 or 1-2-5-8 TLC program schemes.

The three steps for Even-BL and AnP TLC program-verify operation are respectively depicted in FIG. 12D, FIG. 12E, and FIG. 12F. Note, although TLC program is performed in ABL per each selected WLn, the TLC program-verify has to be performed on HBL Odd/Even basis. In other words, only one-half per one physical WLn can be performed program-verify in one cycle. For whole WLn program-verify operation, it needs two cycles to respectively verify whether both Even and Odd TLC strings are being programmed successfully.

In the first step of the HBL TLC program-verify operation shown in FIG. 12D, a 5 precharge operation is performed by setting $C_{LBLe}$=Vinh=7V and $C_{LBLo}$=$V_{SL}$ in each corresponding PCACHE register. In the second step shown in FIG. 12E, a concurrent discharge operation is performed to discharge $C_{LBLe}$ from 7V to 0V when Even TLC cells fail to meet the programmed voltages of $Vtn_{PV}$ (otherwise to retain Vinh voltage at the $C_{LBLe}$ when meeting the programmed voltage). A third step shown in FIG. 12F is performed with a charge-sharing between the LBL capacitor associated with selected cell in either Odd or Even string of the selected page and a corresponding GBL capacitor to send a diluted GBL voltage signal to sense amplifier in the PB. The diluted voltage signal is, in a worst scenario, either a small fraction of Vinh or a value dropping to zero. The sense amplifier includes a Multiplier that is configured to amplify the diluted signal and sense a minimum voltage difference of 50 mV or smaller. If the sense amplifier detects one signal equal to an amplified value of the diluted GBL voltage corresponding to a TLC cell, it indicates that the program of the TLC cell is successful. On the other hand, if the sense amplifier detects at least minimum 50 mV drop from the amplified value of diluted GBL voltage, it indicates that the corresponding TLC cell has not been successfully programmed to a specific TLC state. Then, for whole WLn program-verify operation, it needs a second cycle to repeat the above three steps for verifying whether cells in Odd TLC string are being programmed successfully.

FIGS. 13A, 13B, and 13C are diagrams showing respective sets of bias conditions for performing Even-BL TLC concurrent read operation according to an embodiment of the present invention. As shown, the Even-BL TLC concurrent read operation can be applied for both non-boundary WL and boundary WL regular NAND cells programmed within 1-2-8(coarse)-8(fine) TLC program scheme. Alternatively, the Even-BL TLC concurrent read operation can be applied also for non-boundary WL regular NAND cells programmed within 1-2-5-8 TLC program scheme.

The Even-BL TLC concurrent read operation includes at least three steps respectively depicted in FIG. 13A, FIG. 13B, and FIG. 13C. Note, although TLC program is performed in ABL per each selected WLn, the TLC read, like TLC program-verify, has to be performed on Odd/Even-BL basis. In other words, only one-half numbers of cells, either Odd or Even, per selected WLn can be performed TLC program-verify. For whole WLn read operation, it needs 2 cycles to read all TLC cells associated with Even and Odd strings.

In the first step shown in FIG. 13A, a precharge operation is performed by setting $C_{LBLe}$=Vinh and $C_{LBLo}$ to Floating in each corresponding PCACHE register. In the second step shown in FIG. 13B, a concurrent discharge operation is performed to discharge $C_{LBLe}$ from Vinh to 0V when the selected Even TLC cell Vtpn value (associated with a successful programmed state) is less than the read voltage VRn applied to corresponding WLn (otherwise to retain Vinh voltage at the $C_{LBLe}$). In the third step shown in FIG. 13C, a charge-sharing operation is performed between each Even LBL and its corresponding GBL capacitors so that a sense amplifier in the PB can sense the voltage signal at either Vinh or 0V to determine corresponding TLC data stored in the selected TLC cell in terms of its specific programmed state. Again, for whole WLn read operation, it needs a second cycle to repeat the above three steps for reading TLC cells of Odd string.

FIGS. 13D, 13E, and 13F are diagrams showing respective sets of bias conditions for performing same Even-LBL concurrent read operation on boundary WL cells programmed within 1-2-5-8 TLC program scheme according to an embodiment of the present invention. As shown, bias conditions for performing Even-LBL concurrent read operation on boundary WL cells programmed within 1-2-5-8 TLC program scheme with respect to a programmed adjacent WL are substantially similar to those bias conditions set for the previous TLC cell concurrent read operation shown in FIGS. 13A,13B, and 13C.

In a specific embodiment, other than 1-2-8-8 or 1-2-5-8 TLC program schemes as two typical examples of preferred 3-pass TLC program operation, another preferred TLC program operation includes a 2-pass 1-5-8 TLC program scheme. Naturally, the 2-pass TLC program scheme has much less program and program-verify steps than above two 3-pass TLC program scheme but at the expense of somewhat poorer TLC data reliability due to corresponding ΔVtp=0.2V generated in the 2-pass scheme less than ΔVtp=0.25V generated in two 3-pass schemes. In the embodiment of adopting the 1-5-8 TLC program scheme, an improve TLC read scheme with $V_{SL}$-based Vt-offset is provided to enhance capability to distinguish 8 TLC states, thereby achieving a superior TLC solution with less steps in program without sacrificing data reliability when read. The details of the improved TLC program, verify, read scheme can be found throughout the specification and particularly below.

FIG. 14A shows a preferred ABL, AnP, and Alt-WL TLC program sequence starting from a dummy WL to second boundary WLn+3 with WLn+4 cells stayed in $E^0$ state because its TLC page data is not ready and WLn+3 being programmed with 1P and 2P to full 8 TLC states under 1-5-8 TLC program scheme according to an embodiment of the present invention. As shown, a preferred ABL, AnP and Alt-WL TLC program sequence includes 2 passes alternately performed among the consecutive three adjacent pages. In an embodiment, a first pass (or first step) of the 1-5-8 TLC program scheme is a 1P MLC-like 5-state interim program operation. After the 1P operation, the TLC cell with initial erase state $E^0$ having a deep negative Vt value is programmed into one interim program state of $P0^1$ having less negative Vt value and a narrow Vt-distribution and 4 other interim program states of $P1^1$, $P2^1$, $P4^1$, and P6 having positive Vt values and narrow but unevenly spaced Vt-distributions so that the earlier lockout of the subsequent 8-state TLC program can be avoided to prevent Yupin-induced BL-BL coupling effect.

In the same embodiment, a second pass of the 1-5-8 TLC program scheme is a 2P TLC 8-state interim program operation performed in alternating WL sequence after the 1P operation. This 2P operation is divided into 4 parts. The first part is that one initial interim widened program state of $P1^2$ is programmed into one interim state of $P1^3$ with more positive and narrow Vt-distribution. The second part is that one initial interim widened program state of $P2^2$ is programmed into two interim program states of $P2^3$ and $P3^3$ with more positive and narrow Vt-distributions. The third part is that one initial interim widened program state of $P4^2$ is programmed into two interim program states of $P4^3$ and $P5^3$ with more positive and narrow Vt-distributions. Lastly, the fourth part is that one initial interim widened program state of $P6^2$ is programmed into two interim narrow program states of $P6^3$ and $P7^3$ with more and highest positive Vt and narrow Vt-distributions. The remaining interim state P0 is un-programmed by staying at $P0^3$ without need of program-verify again to save its 2P program time.

Referring to FIG. 14A, besides of the as-mentioned 1P and 2P (plus dummy cell program referred as DP) operations are alternately performed in adjacent WLs, various Vt shifts of DS, 1S, 2S respectively induced by the DP, 1P, and 2P programs are listed in each time period (or step) sequentially from t0 to t10. As shown, the number of steps is less than that for two 3-pass TLC schemes (e.g., comparing to FIG. 5A). The Alt-WL program starts from top dummy WL, DMYWL, then on the first boundary WLn−1, non-boundary WLs including WLn, WLn+1 and WLn+2 in a specific embodiment, and on the second boundary WLn+3. The program of WLn+3 is subject to an impact from WLn+4 TLC cells data as explained earlier in FIG. 5A. In FIG. 14A, WLn+3 is programmed under the assumption that WLn+4 cells stay in $E^0$ state as its TLC page data is not ready and the WLn+3 cell is preferably programmed with 1P and 2P to full 8 TLC states under the 1-5-8 TLC program scheme.

In another embodiment, the numbers of non-boundary WLs in any group can be flexibly increased and not limited to three WLs as indicated in above example, which is depended on the program needs as long as their cells are erased before the program. All boundary WLs need to be marked on spare area in the predetermined locations of each page to differentiate them from the regular non-boundary WLs for facilitating a TLC read with different $V_{SL}$-based individual Vt-compensation.

FIG. 14B shows a preferred ABL, AnP, and Alt-WL TLC program sequence further from WLn+3 to WLn+7 and beyond whenever WLn+4 TLC data is ready to be programmed with 1P and 2P under 1-5-8 TLC scheme according to an embodiment of the present invention. As shown, the ABL, AnP, and Alt-WL TLC program sequence continues in the time periods from t8 to t7' with less number of steps than that using any of the two 3-pass TLC program schemes (see FIG. 5B).

In the example, WLn−1 is defined as the first boundary WL (of a first group) with next WLn (a non-boundary WL) cells in $E^0$ state and precedent WLn−2 (a dummy WL) cells in $D^0$ state. WLn+3 is defined as the second boundary WL with next WLn+4 cells in $E^0$ state even after 2P program on WLn+3 cells. Any WLs between WLn−1 and WLn+3 including WLn, WLn+1 and WLn+2 in a specific embodiment are defined as the non-boundary WLs. Similar to WLn−1, WLn+4 is defined as the next first boundary WL (of a second group) as TLC program is continued to be performed in a sequence starting from WLn+4, then WLn+5 and beyond to WLn+7.

FIG. 14C shows an alternate ABL, AnP, and Alt-WL TLC program sequence from WLn+3 to WLn+7 and beyond with WLn+3 cells being programmed with TLC data and are pre-read to allow FP before WLn+4 cells changing from $E^0$ state to TLC states by 1P and 2P programs under 1-5-8 TLC scheme according to an alternative embodiment of the present invention. As shown, the second boundary WLn+3, after 2P program under 1-5-8 TLC scheme, may be found still not full in desired program states, due to strong WL-WL coupling effect caused by programming on boundary WL of next group, determined by a read operation performed thereon before starting program further on subsequent WLs, WLn+4 and WLn+5. If the read operation leads a decision that a fine program on WLn+3 is necessary, a third pass operation is performed after the 1P operation sequentially on WLn+4 then on WLn+5 and before a 2P operation performed on WLn+4.

FIG. 15A is a diagram showing Vt distributions, shifting, verify and widened voltages for TLC operations of dummy cells in erase, SLC-like program, and read in association with 1-5-8 TLC program scheme according to an embodiment of the present invention. As shown, 3 graphs and one table are used to illustrate preferred SLC-like Vt distributions, populations, Vt verify and widened voltages for performing erase, SLC-like program and read operations on the first DMYWL cells when the regular NAND TLC cells are programmed under the 2-pass 1-5-8 TLC program scheme. Note, only N/2-bit Even/Odd dummy cells per one physical DMYWL are programmed. Thereafter, the N/2-bit Odd/Even dummy cells of the second DMYWL will be complementarily programmed to make one paired dummy cells in one string in 2 dummy WLs acting as one Odd and Even column select transistor without using any extra big select transistors for forming a compact string.

In a specific embodiment, these two dummy WLs can be flexibly placed in any locations of NAND strings in each block. But in a preferred embodiment, two dummy WLs are placed in the middle locations of strings to form two mirrored sub-strings (each with 64-WL).

In the first graph of FIG. 15A, erase operation is performed to shift dummy cell initial single positive programmed state $P4^3$ and one negative erase state of $E^3$ to only one final erase state of $E^0$ with a desired $Vte^1max<-1.0V$ which is less than deep negative erase state Vt of regular NAND TLC cells.

In the second graph of FIG. 15A, a preferred SLC-like DP operation is performed to shift part of dummy cells Vt from one initial $E^0$ state to one narrow program state of $P4^1$ by using one program-verify voltage of $Vtp2^1min=1.6V$ with a narrow width of 0.2V. Larger Vt-width is also possible for the programmed dummy cells.

In the third graph of FIG. 15A, a preferred Odd/Even-based dummy cell SLC read operation with one read check voltage being optimized with VR2=1.3V, for two widened states of $E^4$ and $P4^3$. The table below the graphs shows detailed calculations of several shifting and widening Vte and Vtp4 distributions at 3 cycles of t0, t1, and t3.

FIG. 15B is a diagram showing Vt distributions, shifting, verify and widened voltages for TLC operations of NAND memory cells in first boundary WLn−1 with adjacent dummy WL and non-boundary WLn being under 1-5-8 TLC program scheme according to an embodiment of the present invention. As shown, 4 graphs and one table are used to illustrate a preferred TLC program with the 1-5-8 2-pass program scheme for a first boundary WLn−1 of the first group. Each interim program of 1P and 2P of the 2-pass operation follows the preferred ABL, AnP and Alt-WL TLC program scheme and sequences as defined in FIG. 14A under a condition that dummy WL has been programmed with DP that will induce DS shift on the WLn−1 in the beginning before its 1P program.

In the first graph, an erase operation shifts TLC cells Vts from 7 initial less widened program states of $P1^4$ to $P7^4$ and one widened program state $P0^4$ to one erase $E^0$ state by using $Vte^0max=-2.0V$ as the erase-verify voltage.

In the second graph, a preferred ABL 1P operation shifts cells Vt from one $E^1$ state initially widened due to a DS induced by DP of the dummy WL to 5 narrow MLC-like interim program states of $P0^1$, $P1^1$, $P2^1$, $P4^1$, and $P6^1$ by using 5 optimized but unevenly-spaced program-verify voltages including one negative $Vtp0^1min$ of ~0.9V and four positive $Vtp1^1min=0.2V$, $Vtp2^1min=0.7V$, $Vtp4^1min=1.7V$, and $Vtp6^1min=2.7V$ to prevent earlier lockout for subsequent 2P program.

In the third graph, a preferred ABL 2P operation is performed to shift cells Vts from 5 initially widened and possibly overlapping interim MLC-like states of $P0^2$, $P1^2$, $P2^2$, $P4^2$, and $P6^2$ to 8 final narrow TLC states of $P0^3$, $P1^3$, ... to $P7^3$ by using a set of 6 positive program-verify voltages including $Vtp1^3min=1.0V$, $Vtp2^3min=1.5V$, $Vtp3^3min=2.0V$, $Vtp4^3min=2.5V$, $Vtp5^3min=3.0V$, $Vtp6^3min=3.5V$, $Vtp7^3min=4.0V$. The lowest negative state of $P0^3$ does not need program-verify.

In the fourth graph, a preferred Odd/Even-based TLC read operation is performed with 7 read check voltages of VRn such as VR1=0.9V, VR2=1.4V, VR3=1.9V, VR4=2.4V, VR5=3.4V, VR6=3.9V, and VR7=4.3V to distinguish the 8 widened final TLC states of $P0^4$, $P1^4$, $P2^4$, $P3^4$, $P4^4$, $P5^4$, $P6^4$, and $P7^4$.

FIG. 15C is a diagram showing Vt distributions, shifting, verify and widened voltages for TLC operations of NAND memory cells in non-boundary WLs with adjacent WL programmed under 1-5-8 TLC program scheme for according to an embodiment of the present invention. As shown, 4 graphs and one table are used to illustrate TLC operations of non-boundary WL cells under the 1-5-8 TLC program scheme. All interim 1P and final 2P operations follow the preferred ABL, AnP and Alt-WL TLC scheme and sequence as defined in FIG. 14A.

In the first graph of FIG. 15C, an erase operation shifts TLC cells Vts from 7 initial widened program states of $P1^5$, $P2^5$, $P3^5$, $P4^5$, $P5^5$, $P6^5$ and $P7^5$ and one widened program state $P0^5$ to one $E^0$ state by using $Vte^0max=-2.0V$ as the erase-verify voltage.

In the second graph, a preferred ABL 1P operation that shifts cells Vt from one $E^1$ state with $Vte^1max=-1.56V$ widened by DS induced from a dummy WL to 5 narrow MLC-like program states of $P0^1$, $P1^1$, $P2^1$, $P4^1$, and P6 by using 4 narrow but unevenly-spaced program-verify voltages including $Vtp0^1min=-0.9V$, $Vtp1\ min=0.2V$, $Vtp2^1min=0.7V$, $Vtp4^1min=1.7V$, and $Vtp6^1min=2.7V$ to prevent the earlier lockout for subsequent 8-state final TLC 2P program.

In the third graph, a preferred ABL 2P operation is performed to shift cells Vts from 5 initially widened interim MLC-like states of $P0^3$, $P1^3$, $P2^3$, $P4^3$, and $P6^3$ to 8 final TLC states including one widened negative state $P0^4$ but 7 narrow positive states $P1^4$, $P2^4$, $P3^4$, $P4^4$, $P5^4$, $P6^4$ and $P7^4$ being divided into 4 groups using 7 similar new program-verify voltages. For example, $P0^3$ is preferably shifted and widened to $P0^5$ without being programmed and verified to save verify time. In fact, program state $P0^3$ does not help increasing the $\Delta Vtp$ for better TLC reliability data. $P1^3$ is preferably shifted and widened to $P1^4$ only with $Vtp1^4min=1.0V$. $P2^3$ is preferably shifted and widened to $P2^4$ and $P3^4$ with $Vtp2^4min=1.5V$ and $Vtp3^4min=2.0V$. $P4^3$ is preferably shifted and widened to $P4^4$ and $P5^4$ with $Vtp4^4min=2.5V$ and $Vtp5^4min=3.0V$. $P6^3$ is preferably shifted and widened to $P6^4$ and $P7^4$ with $Vtp6^4min=3.5V$ and $Vtp7^4min=4.0V$. After this TLC's 2P program, the minimum $\Delta Vtp=0.19V$, which is smaller than the target Vt gap of $\Delta Vtp=0.25V$.

In the fourth graph, a preferred Odd/Even-based TLC read operation is performed with 7 similar read check voltages VRn, such as VR1=0.9V, VR2=1.4V, VR3=1.9V, VR4=2.4V, VR5=3.4V, VR6=3.9V, and VR7=4.3V to distinguish the widened 8 final TLC states of $P0^5$, $P1^5$, $P2^5$, $P3^5$, $P4^5$, $P5^5$, $P6^5$, and $P7^5$.

The table below the graphs shows detailed calculations of all Vtpn's width and spacing of each pass of TLC erase and program operations of non-boundary WLs at different cycles. For example, operation cycles of t2, t4, t5, t6, t7 and t9 show the calculation results of $Vte^mmax$ (m=0 and 1) and $Vtp0^mmax$ (m=1 to 5) for 1P and 2P program of non-boundary WLs including WLn, WLn+1 and WLn+2. Additionally, operation cycles of t7, t10, t11, t13 and t14 show the similar calculation results of $Vte^mmax$ (m=0 and 1) and $Vtp0^mmax$ (m=1 to 5) for 1P and 2P program of the second boundary WLn+3 with next adjacent WLn+4 TLC cells in $E^0$-state.

FIG. 15D is a diagram showing Vt distributions, shifting, verify and widened voltages for TLC operations of NAND memory cells in a second boundary WLn+3 with next WLn+4 cells being at E state under 1-5-8 TLC program scheme according to an embodiment of the present invention. As shown, another 4 graphs and one table are used to illustrate preferred TLC operations of the second boundary WLn+3 cells under the 1-5-8 TLC program scheme with next adjacent WLn+4 TLC cells in $E^0$ state. All interim 1P and final 2P programs of the boundary WLn+3 still follow the preferred ABL, AnP and Alt-WL TLC scheme and sequence as defined in FIG. 14A.

In the first graph of FIG. 15D, an erase operation shifts TLC cells Vts from 7 initial widened program states of $P1^3$, $P2^3$, $P3^3$, $P4^3$, $P5^3$, $P6^3$ and $P7^3$ and one widened $P0^3$ to one $E^0$ state by using $Vte^0max=-2.0V$ as the erase-verify voltage.

In the second graph, a preferred ABL TLC's 1P program shifts cells Vt from one initial widened $E^1$ state with $Vte^1max=-1.56V$ induced by 1S of WLn-2's 1P operation to 5 narrow MLC-like program states of $P0^1$, $P1^1$, $P2^1$, $P4^1$, and $P6^1$ by using 4 narrow but unevenly-spaced program-verify voltages including $Vtp0^1min=-0.9V$, $Vtp1\ min=0.2V$, $Vtp2^1min=0.7V$, $Vtp4^1min=1.7V$, and $Vtp6^1min=2.7V$ to prevent earlier lockout for subsequent 8-state final TLC 2P program.

In the third graph, a preferred ABL 2P operation is performed to shift cells Vts from 5 initially non-widened interim MLC-like states of $P0^2$, $P1^2$, $P2^2$, $P4^2$, and $P6^2$ to 8 final narrow TLC states including a widened negative state $P0^3$ but 7 narrow positive states $P1^3$, $P2^3$, $P3^3$, $P4^3$, $P5^3$, $P6^3$, and $P7^3$ divided into 4 similar groups by using 7 similar new program-verify voltages. For example, $P0^2$ is preferably shifted and widened to $P0^3$ without being programmed and verified to save verify time. In fact, programmed state $P0^3$ does not help increasing the $\Delta Vtp$ for better TLC reliability data. Further, $P1^2$ is preferably shifted and widened to $P1^3$ only with $Vtp1^3min=1.0V$. $P2^2$ is preferably shifted and widened to $P2^3$ and $P3^3$ with $Vtp2^3min=1.5V$ and $Vtp3^3min=2.0V$. $P4^2$ is preferably shifted and widened to $P4^3$ and $P5^3$ with $Vtp4^3min=2.5V$ and $Vtp5^3min=3.0V$. $P6^2$ is preferably shifted and widened to $P6^3$ and $P7^3$ with $Vtp6^3min=3.5V$ and $Vtp7^3min=4.0V$. After this TLC's 2P program, the minimum $\Delta Vtp=0.3V$, which is larger than the target Vt gap of $\Delta Vtp=0.25V$.

In the fourth graph, a preferred Odd/Even-based TLC read operation is performed with 7 similar read check voltages VRn, such as VR1=0.9V, VR2=1.4V, VR3=1.9V, VR4=2.4V, VR5=3.4V, VR6=3.9V, and VR7=4.3V to distinguish the widened 8 final TLC states of $P0^5$, $P1^5$, $P2^5$, $P3^5$, $P4^5$, $P5^5$, $P6^5$ and $P7^5$.

The table below the graphs shows detailed calculations of all Vtpn's width and spacing of each pass of the TLC erase and program operations of the second boundary WLn+3 with respect to next adjacent WLn+4 in $E^0$ state at different cycles. For example, operation cycles of t6, t8, t9, and t10 show the calculation results of $Vte^mmax$ (m=0 and 1) and $Vtp0^mmax$ (m=1 to 3) for both 1P and 2P TLC programs of the second boundary WLn+3.

FIG. 15E is a diagram showing Vt distributions, shifting, verify and widened voltages for TLC operations of NAND memory cells in boundary WLn+4 with adjacent WLn+5 cells being programmed TLC data under 1-5-8 TLC program scheme according to an embodiment of the present invention. As shown, another 4 graphs and one are used to demonstrate preferred TLC operations of a new boundary WLn+4 cells under the 1-5-8 TLC program scheme with next non-boundary WLn+5 cells being also programmed with TLC data. All interim 1P and final 2P programs of the boundary WLn+4 and non-boundary WLn+5 and beyond still follow the preferred ABL, AnP and Alt-WL TLC scheme and sequence as defined in FIG. 14B.

In the first graph of FIG. 15E, an erase operation shifts TLC cells Vts from 7 initial widened program states of $P1^4$, $P2^4$, $P3^4$, $P4^4$, $P5^4$, $P6^4$ and $P7^4$ and one widened $P0^4$ to one $E^0$ state by using unified $Vte^0max=-2.0V$ as the erase-verify voltage.

In the second graph, a preferred ABL TLC's 1P operation shifts cells Vt from one initial widened $E^2$ state with $Vte^2max=-1.45V$ induced by 2S of the WLn+3's 2P operation and one $E^1$ state with $Vte^1max=-1.56V$ induced by 1S of the WLn+3's 1P operation to 5 narrow MLC-like program states of $P0^1$, $P1^1$, $P2^1$, $P4^1$, and $P6^1$ by using 4 narrow but unevenly-spaced program-verify voltages of $Vtp0\ min=-0.9V$, $Vtp1^1min=0.2V$, $Vtp2\ min=0.7V$, $Vtp4\ min=1.7V$ and $Vtp6^1min=2.7V$ to prevent earlier lockout for subsequent 8-state final TLC 2P program.

In the third graph, a preferred ABL 2P operation is performed to shift cells Vts from 5 initially widened interim MLC-like states of $P0^2$, $P1^2$, $P2^2$, $P4^2$ and $P6^2$ to 8 final TLC states including one widened negative state $P0^3$ but 7 narrow positive states $P1^3$, $P2^3$, $P3^3$, $P4^3$, $P5^3$, $P6^3$ and $P7^3$ divided into 4 similar groups by using 7 similar new program-verify voltages. For example, $P0^2$ is preferably shifted and widened to $P0^3$ without being programmed and verified to save verify time. In fact, programmed state $P0^3$ does not help increasing the $\Delta Vtp$ for better TLC reliability data. Further, $P1^2$ is preferably shifted and widened to $P1^3$ only with $Vtp1^3min=1.0V$. $P2^2$ is preferably shifted and widened to $P2^3$ and $P3^3$ with $Vtp2^3min=1.5V$ and $Vtp3^3min=2.0V$. $P4^2$ is preferably shifted and widened to $P4^3$ and $P5^3$ with $Vtp4^3min=2.5V$ and $Vtp5^3min=3.0V$. Additionally, $P6^2$ is preferably shifted and widened to $P6^3$ and $P7^3$ with $Vtp6^3min=3.5V$ and $Vtp7^3min=4.0V$. After this TLC's 2P program, the minimum $\Delta Vtp=0.19V$, which is smaller than the target Vt gap of $\Delta Vtp=0.25V$.

In the fourth graph, a preferred Odd/Even-based TLC read operation is performed with 7 similar read check voltages VRn, such as VR1=0.9V, VR2=1.4V, VR3=1.9V, VR4=2.4V, VR5=3.4V, VR6=3.9V, and VR7=4.3V to distinguish the widened 8 final TLC states of $P0^5$, $P1^5$, $P2^5$, $P3^5$, $P4^5$, $P5^5$, $P6^5$ and $P7^5$.

The table below the graphs in FIG. 15E shows detailed calculations of all Vtpn's width and spacing of each pass of TLC erase and program operations of the WLn+4 with respect to WLn+5 cells being programmed with the TLC data at different operation cycles. For example, operation cycles of t10, t1', t2', t3' and t5' show the calculation results of $Vte'''max$ (m=0 to 2) and $Vtp0'''max$ (m=1 to 4) for both 1P and 2P TLC programs of this new boundary WLn+4.

FIG. 15F is a diagram showing preferred 8-state TLC read operation on boundary WLn+3 cells including $V_{SL}=0V$ with respect to WLn+4 cells being program with TLC data under 1-5-8 TLC program scheme according to an embodiment of the present invention. As shown, a preferred 8-state TLC read operation is performed on a boundary WLn+3 without setting individual source node voltage $V_{SL}$ with respect to WLn+4's being program with TLC data under 1-5-8 TLC program scheme. All interim 1P and final 2P programs on WLn+4 and WLn+5 and beyond follow the preferred ABL, AnP and Alt-WL TLC scheme and sequence as defined in FIG. 14B.

A first dotted graph in FIG. 15F shows one widened state $P0^3$ having lowest negative Vt and 7 narrow positive Vt program states of $P1^3$, $P2^3$, $P3^3$, $P4^3$, $P5^3$, $P6^3$ and $P7^3$ initially associated with the WLn+3 TLC cells before 1P and 2P programs of WLn+4.

A second dotted graph shows initial 8 TLC interim states of $P0^3$, $P1^3$, $P2^3$, $P3^3$, $P4^3$, $P5^3$, $P6^3$ and $P7^3$ of WLn+3 have been shifted and widened to 8 near-final TLC states of $P0^4$, $P1^4$, $P2^4$, $P3^4$, $P4^4$, $P5^4$, $P6^4$ and $P7^4$ with less Vtp overlapping due to 1S induced by WLn+4 1P program performed at t1' cycle. Note, the large 1S Vt-shift is induced when WLn+4 TLC cells Vt are shifted from $E^2$ state to $P6^1$ state under 1-5-8 TLC 1P program scheme as shown in FIG. 15E.

A solid graph of FIG. 15F shows initial 8 TLC interim states of $P0^4$, $P1^4$, $P2^4$, $P3^4$, $P4^4$, $P5^4$, $P6^4$ and $P7^4$ of the WLn+3 have been further shifted and widened to 8 final TLC states of $P0^5$, $P1^5$, $P2^5$, $P3^5$, $P4^5$, $P5^5$, $P6^5$ and $P7^5$ with more Vtp overlapping due to 2S induced by WLn+4 2P program performed at t3' cycle. Note, the small 2S Vt-shift is induced when WLn+4 TLC cells Vts are shifted from respective $Pn^2$ to $Pn^3$ under 1-5-8 TLC's 1P program scheme as shown in FIG. 15E.

The detailed calculations of respective $Vtp'''max$ are shown in the table of FIG. 15F. As seen in the table, the large Vt overlapping results in a $\Delta Vtp<0$. Now a preferred $V_{SL}$-based Vt-offset scheme will be adopted to show below to recover the $\Delta Vtp>0$ for reliable TLC read under the 2-pass 1-5-8 TLC program scheme.

FIG. 15G is a diagram showing preferred 8-state TLC read operation on boundary WLn+3 cells with $V_{SL}=0V$ and with respect to WLn+4 TLC cells being in P7 state under 1-5-8 TLC program scheme according to an embodiment of the present invention. As shown, a preferred 8-state TLC read operation on boundary WLn+3 cells with $V_{SL}=0V$ and opposing WLn+4 TLC cells being in P7 state under the 1-5-8 TLC program scheme. Each interim 1P program or final 2P program of WLn+3 or WLn+4 and beyond follows the preferred ABL, AnP and Alt-WL TLC scheme and sequence as defined in FIG. 14B.

A first graph in FIG. 15G shows one initial widened interim $P0^3$ state having lowest negative Vt and 7 narrow positive Vt interim program states of $P1^3$, $P2^3$, $P3^3$, $P4^3$, $P5^3$, $P6^3$, and $P7^3$ of WLn+3 TLC cells before being further widened by WLn+4's 1P and 2P programs. A second graph of FIG. 15G shows initial 8 TLC interim program states of $P0^3$, $P1^3$, $P2^3$, $P3^3$, $P4^3$, $P5^3$, $P6^3$, and $P7^3$ of WLn+3 have been programmed, with shifted and widened Vt, to 8 final TLC states of $P0^5$, $P1^5$, $P2^5$, $P3^5$, $P4^5$, $P5^5$, $P6^5$, and $P7^5$ with $\Delta Vtp=0.16V$, which is smaller than the target Vt gap of $\Delta Vtp=0.25V$. Note, the large 1S is induced when WLn+4 TLC cells Vt is shifted from $E^2$ state to $P6^1$ state under 1P program of the 1-5-8 TLC scheme at t1' cycle and the smaller 2S is induced when WLn+4 TLC cells Vt is shifted from $P6^2$ state to $P7^3$ state under 2P program of the 1-5-8 TLC scheme at t3' cycle as shown in FIG. 15E.

The detailed calculations of respective $Vtp'''max$ are shown in the table of FIG. 15G. Now, a preferred $V_{SL}$-based Vt-offset scheme will be adopted by the WLn+3 in TLC read operation by aligning to P7 state of an opposing TLC cell in WLn+4.

FIG. 15H is a diagram showing preferred 8-state TLC read operation on boundary WLn+3 cells with negligible $V_{SL}=0.05V$ and with WLn+4 TLC cells being in P6 state under 1-5-8 TLC program scheme according to an embodiment of the present invention. As shown, a preferred 8-state TLC read operation on boundary WLn+3 cells with negligible $V_{SL}=0.05V$ and the opposing WLn+4 TLC cells being in P6 state under the 1-5-8 TLC program scheme. The interim 1P program and final 2P program of WLn+3, WLn+4 and beyond follow the preferred ABL, AnP and Alt-WL TLC scheme and sequence as defined in FIG. 14B.

A first graph of FIG. 15H shows one initial widened interim state $P0^3$ having a lowest negative Vt and 7 narrow positive Vt program interim states of $P1^3$, $P2^3$, $P3^3$, $P4^3$, $P5^3$, $P6^3$ and $P7^3$ of WLn+3 TLC cells before being further widened by WLn+4's 1P and 2P programs.

A second graph of FIG. 15H shows initial 8 TLC interim states of $P0^5$, $P1^5$, $P2^5$, $P3^5$, $P4^5$, $P5^5$, $P6^5$ and $P7^5$ of WLn+3 have been programmed, with shifted and widened Vt, to 8 final TLC states of $P0^5$, $P1^5$, $P2^5$, $P3^5$, $P4^5$, $P5^5$, $P6^5$ and $P7^5$ with less ΔVtp=0.2V, which is much smaller than the targeted Vt gap of ΔVtp=0.25V.

A bottom graph in FIG. 15H shows a Vt-shift from 8 initial (dotted) TLC interim states of P0$^5$, P1$^5$, P2$^5$, P3$^5$, P4$^5$, P5$^5$, P6$^5$ and P7$^5$ to 8 (solid) final TLC states of P0$^6$, P1$^6$, P2$^6$, P3$^6$, P4$^6$, P5$^6$, P6$^6$ and P7$^6$ in WLn+3 with the desired Vt-compensation associated with V$_{SL}$=0.05V when the WLn+4 TLC cell is in P6 state. As a result, the Vt-gap is 0.21V between adjacent TLC states.

Note, the large 1S is induced when WLn+4 TLC cells Vt is shifted from E$^2$ state to P6 state under the 1P program of 1-5-8 TLC scheme at t1' cycle and the smaller 2S is induced when WLn+4 TLC cells Vt is shifted from P6$^2$ state to P7$^3$ state under 2P program of the 1-5-8 TLC scheme at t3' cycle as shown in FIG. 15E.

The detailed calculations of respective Vtp$'''$max are shown in the table of FIG. 15H. Now, a preferred V$_{SL}$-based Vt-offset scheme will be adopted by the WLn+3 in TLC read operation by aligning to P7 state of opposing TLC cell in WLn+4.

FIG. 15I is a diagram showing preferred 8-state TLC read operation on boundary WLn+3 cells with V$_{SL}$=0.1V and with WLn+4 TLC cells being in P5 state under 1-5-8 TLC program scheme according to an embodiment of the present invention. As shown, two graphs and one table are used to illustrate a preferred boundary WLn+3's 8-state TLC read operation with negligible V$_{SL}$=0.1V and the opposing WLn+4 TLC cells being in P5 state under the 1-5-8 TLC program scheme. Each interim 1P program or final 2P program of WLn+3, WLn+4 and beyond follows the preferred ABL, AnP and Alt-WL TLC scheme and sequence as defined in FIG. 14B.

A first graph of FIG. 15I shows one initial widened interim P0$^3$ state having a lowest negative Vt and 7 narrow positive Vt interim program states of P1$^3$, P2$^3$, P3$^3$, P4$^3$, P5$^3$, P6$^3$, and P7$^3$ of WLn+3 TLC cells before being further widened by WLn+4's 1P and 2P programs.

A second graph of FIG. 15I shows initial 8 TLC interim states of P0$^5$, P1$^5$, P2$^5$, P3$^5$, P4$^5$, P5$^5$, P6$^5$, and P7$^5$ of WLn+3 have been programmed, with shifted and widened Vt, to 8 final TLC states of P0$^5$, P1$^5$, P2$^5$, P3$^5$, P4$^5$, P5$^5$, P6$^5$, and P7$^5$ with less ΔVtp=0.22V, which is close to the targeted Vt gap of ΔVtp=0.25V.

Another graph on bottom of FIG. 15I shows the Vt-shift from 8 dotted graphs of the initial 8 TLC interim states of P0$^5$, P1$^5$, P2$^5$, P3$^5$, P4$^5$, P5$^5$, P6$^5$, and P7$^5$ to 8 final TLC states of P0$^6$, P1$^6$, P2$^6$, P3$^6$, P4$^6$, P5$^6$, P6$^6$, and P7$^6$ in WLn+3 with the desired V$_{SL}$-based Vt-compensation of V$_{SL}$=0.1V when the next adjacent WLn+4 TLC cell is in P5 state. As a result, the Vt-gap=0.22V between adjacent TLC states. Note, the large 1S is induced when WLn+4 TLC cells Vt is shifted from E$^2$ state to P6 state under 1P program of 1-5-8 TLC scheme at t1' cycle and the smaller 2S is induced when WLn+4 TLC cells Vt is shifted from P6$^2$ state to P7$^3$ state at t3' cycle as shown in FIG. 15E.

The detailed calculations of respective Vtp$'''$max are shown in the table of FIG. 15I. Now, a preferred V$_{SL}$-based Vt-offset scheme will be adopted by WLn+3 in the TLC read operation by aligning to P7 state of opposing TLC cell in WLn+4.

FIG. 15J is a diagram showing preferred 8-state TLC read operation on boundary WLn+3 cells with V$_{SL}$=0.14V and with WLn+4 TLC cells being in P4 state under 1-5-8 TLC program scheme according to an embodiment of the present invention. As shown, two graphs and one table are used to illustrate a preferred boundary WLn+3's 8-state TLC read operation with V$_{SL}$=0.14V and the opposing TLC cells being in P4 state in WLn+4 under the 1-5-8 TLC program scheme. Again, each interim 1P or final 2P program of WLn+3, WLn+4 and beyond follows the preferred ABL, AnP and Alt-WL TLC scheme and sequence as defined in FIG. 14B.

The first graph on top shows one initial widened interim P0$^3$ state at a lowest negative Vt and 7 narrow positive Vt interim program states of P1$^3$, P2$^3$, P3$^3$, P4$^3$, P5$^3$, P6$^3$, and P7$^3$ of WLn+3 TLC cells before being further widened by WLn+4's 1P and 2P programs.

The second graph shows initial 8 TLC interim states of P0$^5$, P1$^5$, P2$^5$, P3$^5$, P4$^5$, P5$^5$, P6$^5$, and P7$^5$ of WLn+3 have been programmed, with shifted and widened Vt, to 8 final TLC states of P0$^5$, P1$^5$, P2$^5$, P3$^5$, P4$^5$, P5$^5$, P6$^5$, and P7$^5$ with less ΔVtp=0.21V, which is close to the targeted Vt gap of ΔVtp=0.25V.

Another graph at bottom of FIG. 15J shows the Vt-shift from initial 8 TLC interim states of P0$^5$, P1$^5$, P2$^5$, P3$^5$, P4$^5$, P5$^5$, P6$^5$, and P7$^5$ to 8 final TLC states of P0$^6$, P1$^6$, P2$^6$, P3$^6$, P4$^6$ P5$^6$, P6$^6$, and P7$^6$ in WLn+3 with the desired V$_{SL}$-based Vt-compensation of V$_{SL}$=0.14V when WLn+4 TLC cell is in P4 state. As a result, the Vt-gap=0.21V between adjacent TLC states. The detail Vt-shift calculations are same as above.

FIG. 15K is a diagram showing preferred 8-state TLC read operation on boundary WLn+3 cells with V$_{SL}$=0.18V and with WLn+4 TLC cells being in P3 state under 1-5-8 TLC program scheme according to an embodiment of the present invention. As shown, two graphs and one table are used to illustrate a preferred boundary WLn+3's 8-state TLC read operation with negligible V$_{SL}$=0.18V and the opposing WLn+4 TLC cells being in P3 state under the 1-5-8 TLC program scheme. Again, each interim 1P program or final 2P program of WLn+3, WLn+4 and beyond follows the preferred ABL, AnP and Alt-WL TLC scheme and sequence as defined in FIG. 14B. As a result, the Vt-gap=0.21V between adjacent TLC states.

FIG. 15L shows two graphs and one table of a preferred boundary WLn+3's 8-state TLC read operation with negligible V$_{SL}$=0.23V and the opposing WLn+4 TLC cells being in P2 state under the 1-5-8 TLC program scheme. Each of interim 1P program and final 2P program of WLn+3, WLn+4 and beyond follows the preferred ABL, AnP and Alt-WL TLC scheme and sequence as defined in FIG. 14B. As a result, the same Vt-gap=0.21V between adjacent TLC states.

FIG. 15M shows two graphs and one table of a preferred boundary WLn+3's 8-state TLC read operation with negligible V$_{SL}$=0.27V and the opposing WLn+4 TLC cells being in P1 state under the 1-5-8 TLC program scheme. Each of interim 1P and final 2P programs of WLn+3, WLn+4 and beyond follows the preferred ABL, AnP and Alt-WL TLC scheme and sequence as defined in FIG. 14B table. As a result, the same Vt-gap=0.21V between adjacent TLC states.

FIG. 15N shows two graphs and one table of a preferred boundary WLn+3's 8-state TLC read operation with negligible V$_{SL}$=0.35V and the opposing WLn+4 TLC cells are in P0 state under the 1-5-8 TLC program scheme. Each of interim 1P and final 2P programs of WLn+3, WLn+4 and beyond follows the preferred ABL, AnP and Alt-WL TLC scheme and sequence as defined in FIG. 14B. As a result, the Vt-gap=0.21V between adjacent TLC states.

FIG. 15O summarizes preferred 8 final TLC states with Vt width=0.39V and Vt-gap=0.21V after applying 8 individual V$_{SL}$ compensations of 0V, 0.05V, 0.1V, 0.14V, 0.18V, 0.23V, 0.27V and 0.35V for 8-state TLC read operation on the boundary WLn+3 in accordance with WLn+4's 8 TLC cells of P7, P6, P5, P4, P4$^3$, P2, P1 and P0 under the 1-5-8 TLC program scheme. Each interim 1P program, final 2P program of WLn+3, WLn+4 and beyond follows the preferred ABL, AnP and Alt-WL TLC scheme and sequence as defined in FIG. 14B. As a result, it demonstrates that the Vt-gap=0.21V between 8 adjacent TLC states in the boundary WLn+3 cells can be maintained when individual $V_{SL}$-based Vt-compensation is adopted.

FIG. 16A is a diagram showing Vt distributions, shifting, verify and widened voltages for TLC operations of new boundary WLn+4 cells under 1-5-8 TLC program scheme with next WLn+5 cells being also programmed with TLC data according to an embodiment of the present invention. As shown, 4 graphs and one table are used to demonstrate preferred TLC operations on a new boundary WLn+4 cells under the 1-5-8 TLC program scheme with WLn+5 cells being also programmed with TLC data. Each of interim 1P and final 2P programs of WLn+4 and WLn+5 and beyond follows the preferred ABL, AnP and Alt-WL TLC scheme and sequence as defined in FIG. 14B but with some simplified timing operations. The difference between the operation in FIG. 16A and that in FIG. 15E is that on WLn+3 cells a 3P fine tune program is performed before 1P program on WLn+4 cells when the WLn+4 TLC page data is ready.

In the first graph, an erase operation shifts TLC cells Vts from 7 initial widened program states of $P1^5$, $P2^5$, $P3^5$, $P4^5$, $P5^5$, $P6^5$, and $P7^5$ and one widened state $P0^4$ to one $E^0$ state by using a unified $Vte^0max=-2.0V$ as the erase-verify voltage.

In the second graph, a preferred ABL TLC 1P operation is performed at t1' cycle to shift cells Vt from one initial widened $E^2$ state with $Vte^2max=-1.42V$ to 5 narrow MLC-like interim program states of $P0^1$, $P1^1$, $P2^1$, $P4^1$, and P6 with 4 unevenly-spaced program-verify voltages of $Vtp0^1min=-0.9V$, $Vtp1^1min=0V$, $Vtp2\ min=0.6V$, $Vtp4\ min=1.8V$ and $Vtp6^1min=3V$ to prevent earlier lockout for subsequent 8-state final TLC 2P program. Note, $Vte^2max=-1.42V$ is shifted from $Vte^1max=-1.54V$ by both 1S-shift (at t8) 2S-shift (at t10) on WLn+3 induced by previous 1P+2P programs when WLn+4's TLC page data is not ready.

In the third graph, a preferred ABL 2P program is performed to shift cells Vts from 5 initially widened interim MLC-like states of $P0^3$, $P1^3$, $P2^3$, $P4^3$ and $P6^3$ to 8 final TLC states including 1 widened state $P0^4$ having a negative Vt but 7 narrow $P1^4$, $P2^4$, $P3^5$, $P4^4$, $P5^4$, $P6^4$ and $P7^4$ states with positive Vts being divided into 4 similar groups by using 7 similar new program-verify voltages. For example, $P0^3$ is preferably shifted and widened to $P0^5$ without being programmed and verified to save verify time. In fact, $P0^3$ program does not help increasing the ΔVtp for better TLC reliability data. Further, $P1^3$ is preferably shifted and widened to one final $P1^4$ only with $Vtp1^4min=0.8V$. Additionally, $P2^3$ is preferably shifted and widened to 2 final $P2^4$ and $P3^4$ with $Vtp2^4min=1.4V$ and $Vtp3^4min=2.0V$. $P4^3$ is preferably shifted and widened to 2 final $P4^4$ and $P5^4$ with $Vtp4^4min=2.6V$ and $Vtp5^4min=3.2V$. Furthermore, $P6^3$ is preferably shifted and widened to 2 final $P6^4$ and $P7^4$ with $Vtp6^3min=3.8V$ and $Vtp7^3min=4.4V$. After the TLC 2P program, the minimum ΔVtp of 0.28V is obtained, which larger than the target Vt gap of ΔVtp=0.25V. Thus the $V_{SL}$-based Vt compensation is not required in this example.

In the fourth graph, a preferred Odd/Even-based TLC read operation is performed with 7 similar read check voltages VRn, such as VR1=0.7V, VR2=1.3V, VR3=1.9V, VR4=2.5V, VR5=3.1V, VR6=3.7V, and VR7=4.3V to distinguish the 8 final narrow TLC states of $P0^5$, $P1^5$, $P2^5$, $P3^5$, $P4^5$, $P5^5$, $P6^5$, and $P7^5$ of WLn+4.

The table below the 4 graphs in FIG. 16A shows the detailed calculations of all Vtpn's width and spacing of each pass of TLC erase and program operations of WLn+4 with respect to WLn+5 cells being programmed with TLC data at different cycles. For example, the cycles of t8, t10, t1', t2', t3', t4' and t6' show the calculation results of $Vte^mmax$ (m=0 to 2) and $Vtp0^mmax$ (m=1 to 5) for both TLC 1P and 2P programs of this new boundary WLn+4.

FIG. 16B is a diagram showing Vt distributions, shifting, verify and widened voltages for TLC operations of boundary WLn+3 cells being programmed with TLC data and pre-read to allow a fine program (FP) before 1P and 2P programs on WLn+4 cells by under 1-5-8 TLC program scheme according to an embodiment of the present invention. As shown, 3 graphs and one table are depicted for illustrating preferred TLC Vt distributions, populations, shifting, verify and widened voltages when WLn+3 cells are programmed with TLC data and are pre-read to allow a fine program (FP) before WLn+4 cells are changed from $E^0$-state to TLC states by 1P and 2P programs under 1-5-8 TLC program scheme. Each of interim 1P program and final 2P program of WLn+4 and WLn+5 and beyond follows the preferred ABL, AnP and Alt-WL TLC scheme and sequence as defined in FIG. 14B but with some simplified timing operations. Note, the FP is also defined as 3P operation for the WLn+3.

In the first graph, a big Vt-gap=0.4V is found among one widened state $P0^3$ and 7 narrow program states of $P1^3$, $P2^3$, $P3^3$, $P4^3$, $P5^3$, $P6^3$, and $P7^3$ of WLn+3 TLC cells before 1P operation onWLn+4 is performed.

In the second graph, a zero Vt-gap=0V is found among 8 widened states $P0^4$, $P1^4$, $P2^4$, $P3^4$, $P4^4$, $P5^4$, $P6^4$, and $P7^4$ of WLn+3 TLC cells after 1P operation of WLn+4 is performed, leading to undistinguishable states. Therefore, WLn+3 TLC cells have to be pre-read before 1P operation on WLn+4 to allow distinction between 8 TLC states and to allow an accurate FP operation.

In the second graph again, it shows that a preferred ABL TLC 3P (or FP) operation is performed at t3' cycle to shift and narrow down 8 overlapping interim program states of $P0^4$, $P1^4$, $P2^4$, $P3^4$, $P4^4$, $P5^4$, $P6^4$ and $P7^4$ of WLn+3 TLC cells to 7 final TLC states of $P1^5$, $P2^5$, $P3^5$, $P4^5$, $P5^5$, $P6^5$ and $P7^5$ and one widened $P0^6$ (which needs no program and verify to save 3P time of WLn+3).

In the third graph, it shows that a preferred Odd/Even-based TLC read operation is performed with 7 similar read check voltages VRn, such as VR1=1.3V, VR2=1.9V, VR3=2.5V, VR4=3.1V, VR5=3.7V, VR6=4.3V, and VR7=4.9V to distinguish the 7 narrow final TLC states of $P1^6$, $P2^6$, $P3^6$, $P4^6$, $P5^6$, $P6^6$, and $P7^6$ and one widened $P0^6$ of WLn+3. As a result, the Vt-gap=0.28V is maintained for this boundary WLn+3 TLC cells. This suggests that no individual $V_{SL}$-based Vt-compensation is needed for WLn+3 when an accurate 3P is performed under a pre-read condition before 1P program on WLn+4.

FIG. 16C is a diagram showing Vt distributions, shifting, verify and widened voltages for TLC operations of non-boundary WLn+2 cells before and after WLn+3 cells 3P program under 1-5-8 TLC program scheme according to an embodiment of the present invention. As shown, 2 graphs and one table are depicted for demonstrating 8 preferred TLC Vt distributions, populations, shifting, verify and widened voltages of a non-boundary WLn+2 before and after 3P program on next boundary WLn+3 in accordance with ABL, AnP and Alt-WL 1-5-8 TLC program scheme and sequence as defined in FIG. 14B table.

In the first graph, it shows at least Vt-gap=0.27V among 8 narrow program states of $P1^5$, $P2^5$, $P3^5$, $P4^5$, $P5^5$, $P6^5$, and $P7^5$ of the WLn+2 TLC cells before a 3P program on WLn+3 cells is performed.

In the first graph again, it shows a minor reduced Vt-gap=0.21V among 8 program states $P0^6$, $P1^6$, $P2^6$, $P3^6$, $P4^6$, $P5^6$, $P6^6$, and $P7^6$ of WLn+2 cells widened by 3S induced by 3P operation on WLn+3. Similarly, no need of $V_{SL}$-based Vt-offset is required.

In the second graph, it shows that a preferred Odd/Even-based TLC read operation is performed with 7 similar read check voltages VRn, such as VR1=0.7V, VR2=1.3V, VR3=1.9V, VR4=2.5V, VR5=3.1V, VR6=3.7V, and VR7=4.3V to distinguish the 7 final narrow TLC states of $P1^6$, $P2^6$, $P3^6$, $P4^6$, $P5^6$, $P6^6$, and $P7^6$ and one widened $P0^6$ of WLn+2. As a result, the Vt-gap=0.21V can be maintained for this non-boundary WLn+2 TLC cells. Thereby, no individual $V_{SL}$-based Vt compensation is required when an accurate 3P operation is performed on WLn+3.

FIG. 17A is a table showing a set of preferred 5 $V_{LBL}$ program voltages and one Vinh program-inhibit voltage assigned for a 1P MLC-like program to generate 5 interim states under 1-5-8 TLC program scheme according to an embodiment of the present invention. In an embodiment, 5 preferred $V_{LBL}$ voltage assignments are provided for the 1P program operation based on Vt-differences of 5 interim program states of P0, P1, P2, P4, and P6. As such, the 1P program can start from E state to finish with all the 5 MLC-like interim states of P0, P1, P2, P4, and P6 at substantially a same time without having earlier lockout state to reduce Yupin BL-BL coupling effect. Similarly, when Vts of P0, P1, P2, P4, and P6 exceed the respectively set values with the 1P program, corresponding $V_{LBL}$ voltage is re-assigned with an inhibit-voltage of Vinh≈7V. In an example, the 5 distinct $V_{LBL}$ voltages are set as: $V_{LBL0}$=3.9V/Vinh for P0 program/program-inhibit voltages, $V_{LBL1}$=3.0V/Vinh for P1 program/program-inhibit voltages, $V_{LBL2}$=2.4V/Vinh for P2 program/program-inhibit voltages, $V_{LBL4}$=1.2V/Vinh for P4 program/program-inhibit voltages, $V_{LBL6}$=0V/Vinh for P6 program/program-inhibit voltages. Note, all $V_{LBL}$ values are aligned to $V_{LBL6}$. Since 5-state MLC-like 1P program is an interim program, rather than a final program, additional $V_{LBL}$ compensation in accordance with TLC opposite cells in the adjacent WLn+3 is not considered in this stage.

FIG. 17B shows 8 sets of preferred 8 $V_{LBL}$ program voltages and one Vinh program-inhibit voltage assigned for performing an 8-state TLC 2P program with $V_{LBL}$ compensations under 1-5-8 TLC program scheme according to an embodiment of the present invention. The 2P program for each TLC state in WLn preferably has 8 individual $V_{LBL}$ compensations in accordance with 8 different states of P0 to P7 of opposing TLC cells located in WLn+1.

Unlike prior art, the preferred 8 $V_{LBL}$ voltage assignments for performing a 3P operation to 8 target TLC cells in WLn are not only based on the major 7 Vt-differences defined by the 8 interim program states of P0, P1, P2, P3, P4, P5, P6, and P7 but are also fine tuned by 8 possible opposing TLC cells located in adjacent WLn+1. As such, all 8 interim TLC states of P0, P1, P2, P3, P4, P5, P6, and P7 in a 2P final program can be started and finished at almost same time without having earlier lockout state to reduce Yupin BL-BL coupling effect. Similarly, when the Vts of the 2P programmed states P0, P1, P2, P3, P4, P5, P6, and P7 exceed the respectively set values, then $V_{LBL}$ is re-assigned with an inhibit-voltage of Vinh=7V.

In a specific embodiment, these 8 major distinct $V_{LBL}$ program and inhibit voltages with 8 minor compensations for each TLC cell are set as: 1) for P0 cell in WLn, $V_{LBL0}$=Vinh for opposing WLn+1 cells in any state of P0 to P7; 2) for P1 cell in WLn, $V_{LBL0}$=3.6V/Vinh for program and program-inhibit voltages when the opposing WLn+1 cell is in P0 state, $V_{LBL1}$=3.6V/Vinh when the opposing WLn+1 cell is in P1 state, $V_{LBL2}$=3.6V/Vinh when the opposing WLn+1 cell is in P2 state, $V_{LBL3}$=3.9V/Vinh when the opposing WLn+1 cell is in P3 state, $V_{LBL4}$=3.6V/Vinh when the opposing WLn+1 cell is in P4 state, $V_{LBL5}$=3.9V/Vinh when the opposing WLn+1 cell is in P5 state, $V_{LBL6}$=3.6V/Vinh when the opposing WLn+1 cell is in P6 state, and $V_{LBL7}$=3.9V/Vinh when the opposing WLn+1 cell is in P7 state. Note, all $V_{LBL}$ values are aligned to $V_{LBL0}$ or $V_{LBL4}$.

Alternatively, 3) for P2 cell in WLn, $V_{LBL0}$=3V/Vinh for program and program-inhibit voltages when the opposing WLn+1 cell is in P0 state, $V_{LBL1}$=3V/Vinh when the opposing WLn+1 cell is in P1 state cell, $V_{LBL2}$=3V/Vinh when the opposing WLn+1 cell is in P2 state, $V_{LBL3}$=3.3V/Vinh when the opposing WLn+1 cell is in P3 state, $V_{LBL4}$=3V/Vinh when the opposing WLn+1 cell is in P4 state, $V_{LBL5}$=3.3V/Vinh when the opposing WLn+1 cell is in P5 state, $V_{LBL6}$=3V/Vinh when the opposing WLn+1 cell is in P6 state, and $V_{LBL7}$=3.3V/Vinh when the opposing WLn+1 cell is in P7 state. Note, all $V_{LBL}$ values are aligned to $V_{LBL0}$ or $V_{LBL4}$. Likewise, the rest of 8 preferred $V_{LBL}$ assignments for P3 to P7 cells in WLn can be referred to FIG. 17B.

FIG. 17C is a table showing a set of preferred 8 $V_{LBL}$ program voltages and one Vinh program-inhibit voltage assigned for a 3P program under 1-5-8 TLC program scheme with $V_{LBL}$ compensation according to an embodiment of the present invention. As shown, 8 preferred $V_{LBL}$ program voltages and one program-inhibit voltage of Vinh are assigned for performing a 3P TLC program under 1-5-8 TLC program scheme.

Like 1P program, 8 preferred $V_{LBL}$ voltage assignments for a 3P program are based on Vt-differences defined by 8 program states of P0, P1, P2, P3, P4, P5, P6, and P7 so that the 3P program can be started and finished at almost same time without having earlier lockout state to reduce Yupin BL-BL coupling effect. Similarly, when Vts of P0, P1, P2, P3, P4, P5, P6, and P7 after the 3P program exceed the respectively set values, then $V_{LBL}$ is re-assigned with an inhibit-voltage of Vinh≈7V to prevent over-programming.

In a specific embodiment, these 8 distinct $V_{LBL}$ voltages are set as: $V_{LBL0}$=Vinh for P0 without program and program-inhibit voltages, $V_{LBL1}$=3.6V/Vinh for P1 program/program-inhibit voltages, $V_{LBL2}$=3V/Vinh for P2 program/program-inhibit voltages, $V_{LBL3}$=2.4V/Vinh for P3 program/program-inhibit voltages, $V_{LBL4}$=1.8V/Vinh for P4 program/program-inhibit voltages, $V_{LBL5}$=1.2V/Vinh for P5 program/program-inhibit voltages, $V_{LBL6}$=0.6V/Vinh for P6 program/program-inhibit voltages, $V_{LBL7}$=0V/Vinh for P7 program/program-inhibit voltages. Note, all $V_{LBL}$ values are aligned to $V_{LBL7}$. In summary, since 8-state TLC 3P program is a final program, a $V_{LBL}$ compensation in accordance with opposing TLC cells in the adjacent WLn+3 is preferably performed.

FIG. 17D shows an example of generating several sets of $V_{LBL}$ voltages and one program-inhibit voltage for both 1P and 2P of 1-5-8 TLC program for either boundary and non-boundary WLn cells with or without individual $V_{LBL}$ compensations from adjacent WLn+1 programmed cells subjecting to 3-cap CS operations according to an embodiment of the present invention. As shown, several sets of $V_{LBL}$ voltages and one program-inhibit voltage of both 1P and 2P operations of ABL, AnP and Alt-WL 1-5-8 TLC program scheme for either boundary and non-boundary WLn' cells are generated with or without the individual $V_{LBL}$ compensations from adjacent WLn+1's TLC cells. In the embodiment, a 3-cap CS technique is performed on three adjacent $C_{LG}$ capacitors for each LBL TLC cell in a selected page under the worst-case Vddmin=2.4V when operating at Vdd=2.7V.

Referring to FIG. 17D, all target ΔVtp-based $V_{LBL}$ and Vinh voltages are provided with compensations for each TLC interim or final program states of P0, P1, P2, P3, P4, P5, P6 and P7 under 1-5-8 TLC 2-pass program scheme. The target ΔVtp-based $V_{LBL}$ voltages are preferably set by the Vt-difference between 5 program states obtained by 1P operation and 8 program states generated by 2P operation.

The three equal-sized capacitors $C_{LG}$ form 3 bits PCACHE registers which are initially precharged with three predetermined $V_{LBL}$ values under three different time periods of T0, T1, and T2. After the precharge cycle, then a CS is performed on these three $C_{LG}$ capacitors by connecting them to get the 8 desired $V_{LBL}$ voltages for generating 8 TLC program states of P0, P1, P2, P3, P4, P5, P6, and P7 through both 1P and 2P programs.

Note, for a MLC-like 5-state 1P program, it is preferred to have 5 different $V_{LBL}$ voltages for 5 interim program states of P0, P1, P2, P4, and P6 and one Vinh as defined in FIG. 17A table. For a TLC 8-state 2P program, it is preferred to have 8 $V_{LBL}$ voltages for both 8 interim and final program states of P0, P1, P2, P3, P4, P5, P6, and P7 as defined in FIG. 17B table under 1-5-8 TLC scheme.

The one Vinh voltage is used for precharge each $C_{LG}$ from each selected local LBLps lines to save power consumption. Only values between 5V and 7V are used in precharge to obtain all desired $V_{LBL}$ voltages and one final Vinh through CS operation under Vddmin=2.4V. The precharged value of Vinh is kept less than BVDS of 7V in the present description.

In another specific embodiment, a method of generating multiple TLC $V_{LBL}$ program voltages and one Vinh voltage includes at least three steps with one restriction as summarized below. This scheme is based on a low-power CS operation performed on three small and identical local $C_{LG}$ capacitors. Before CS, each $C_{LG}$ is precharged with a varied and predetermined voltage that can be larger than Vdd but less than Vinh to avoid junction breakdown. But this high precharged voltage is not supplied by PB through a long GBL (or connected multiple broken-GBLs) to reach the selected local LBL. Instead, this precharged voltage is supplied through corresponding LBLps precharge power line directly to the $C_{LG}$ capacitor to save power consumption.

In a first step of the method, three separate $C_{LBL}$ ($C_{LG}$) capacitors are independently precharged to three initial predetermined $V_{LBL}$ voltages in accordance with each corresponding TLC bit data in 3 different cycles of T0, T1 and T2 before CS is performed. These 3 separate $C_{LG}$ capacitors are configured to store 3 bits in 3 separate PCAHCE registers associated with three adjacent LGs by connecting 2 LG-divided NMOS devices of MLBL controlled by 2 BLG poly2-gate signals as seen in FIG. 4A and are preferably physically located within one MG and HG groups. During this precharge step, 3 $C_{LG}$ capacitors are not connected together. Each $C_{LG}$ capacitor is independently charged in one of three timelines T0, T1, and T2 to a predetermined voltage by grounding the gate of MLBL with reference to FIG. 4A. For example, in FIG. 17D, it shows $V_{LBL0}$=Vinh0=7V in T0, $V_{LBL1}$=Vinh1=5.4V in T1 and $V_{LBL2}$=Vinh2=5.1V in T2 are respectively precharged to three adjacent $C_{LG}$ capacitors.

In a second step of the method, a $V_{LBL}$/$V_{GBL}$ sequential conversion operation for either 1P or 2P operation is performed in accordance with three timelines of T0, T1, and T2. Conventionally, there are only 2 digital $V_{GBL}$ voltages such as Vdd or Vss stored in each 3-bit TLC PB for each TLC data. But in the present invention, the one digital Vss program voltage is converted into 5 analog $V_{LBL}$ program voltages for performing 1P operation and 8 analog $V_{LBL}$ voltages for performing 2P operation. All 5 or 8 $V_{LBL}$ program voltages are set below Vdd-Vt in $C_{GBL}$ from PB but then converted to $V_{LBL}$ voltages defined by the differences of ΔVtpn as shown in FIG. 17A for 1P operation, in FIG. 17B 2P operation, and in FIG. 17C for 3P (fine program) operation, where the converted $V_{LBL}$ can be greater than Vdd but no greater than Vinh. All these $V_{LBL}$ voltages have to be generated via a 3-cap CS technique.

For the program-inhibit voltage of Vdd in $V_{GBL}$, it is directly converted to a higher value of Vinh (~7V or less) precharged and stored in $C_{LG}$ by the voltage conversion operation. For other varied $V_{LBL}$ (<Vdd-Vt) program voltages set in $C_{GBL}$ from PB, the voltage conversion operation allows corresponding $C_{LBL}$ to discharge from the Vinh voltage precharged to one of three $C_{LG}$s to the same corresponding $V_{LBL}$ (<Vdd-Vt) program voltages set in $C_{GBL}$ in accordance with each corresponding program state in 1P and 2P under Vddmin=2.4V when Vdd=2.7V. The Vss set in each GBL from each PB in conventional digital program voltage is only to provide one value $V_{LBL}$=0V, which is just one of 5 final $V_{LBL}$ program voltages for performing 1P operation and one of 8 final $V_{LBL}$ program voltages for performing 2P operation under the 1-5-8 TLC program scheme.

Note, the conversion is done by setting the selected gate signal MG 1 to Vdd to turn on the selected MMG device to connect the GBL to the selected LBL and by setting non-selected gate signals MG$^1$1 to 0V to disconnect the unselected N-bit LBL lines from the common N-bit GBL lines as shown in FIG. 4B. If $V_{GBL}$<Vdd-Vt, then $V_{LBL}$=$V_{GBL}$ because the corresponding MMG device are being fully turned on by setting VMG$^1$1=Vdd to equalize the voltages present at both drain and source nodes of each MMG device. As a result, any Vinh precharged voltage in local $C_{LBL}$ would be discharged to the same voltage at GBL. In other words, $V_{LBL}$=$V_{GBL}$ when $V_{GBL}$<Vdd-Vt. If $V_{GBL}$=Vdd, then $V_{LBL}$=Vinh because MG$^1$ is biased with Vdd on both MMG device gate and drain nodes with Vinh on source node. As a result, the MMG device is biased in off-state, thus Vinh at the source node of LBL can be retained without leaking to the drain node of GBL at Vdd.

In a third step of the method, final $V_{LBL}$ voltages are generated by a 3-cap charge-sharing operation. This is done by turning on 2 adjacent corresponding LG-divided devices, MLBL, to connect the three adjacent $C_{LG}$ capacitors shown in FIG. 4A per 1-cycle. The 3-cap stands for 3 adjacent $C_{LG}$ capacitors used for generating one $V_{LBL}$ of 5 program voltages assigned for performing TLC 1P operation. The calculation below is based on assumption of three equal-sized $C_{LG}$s: $C_{LBL0}$=$C_{LBL1}$=$C_{LBL2}$. Then the final $V_{LBL}$=(⅓)[($V_{LBL0}$ in $C_{LBL0}$ done in T0)+($V_{LBL1}$ in $C_{LBL1}$ done in T1)+($V_{LBL2}$ in $C_{LBL2}$ done in T2)].

In order to generate total 5 desired $V_{LBL}$ voltages as defined in FIG. 17A and one final Vinh for TLC cell for performing 1P and 2P programs under Vdd=2.4V, 3 different precharge voltages of 7V, 5.4V and 5.1V are required respectively for the three adjacent $C_{LG}$s and are supplied from the corresponding local LBLps precharge power lines in 3 time periods of T0, T1, and T2 as seen in FIG. 7C. At each timeline only two $V_{GBL}$ voltages, either $V_{GBL}$=Vdd or $V_{GBL}$<Vdd, are supplied from each bit of PB for each corresponding TLC data.

The 3-cap calculation of a first desired $V_{LBL}$=3.9V for programming P0 state in 1P operation is shown in FIG. 17D. As shown, at T0 cycle, each PB generates one $V_{GBL}$=1.2V for P0 MLC data but the corresponding $V_{LBL0}$=Vinh0=7V in $C_{LBL0}$ precharged from a LBLps=7V. As $V_{GBL}$=1.2V<Vdd–Vt, then the $C_{LBL0}$ will be discharged from 7V to 1.2V. Thus, $V_{LBL0}$=1.2V at T0. At T1, $V_{GBL}$=Vdd and $V_{LBL}$=Vinh1=5.4V precharged in $C_{LBL1}$. Because $V_{GBL}$=Vdd>Vdd–Vt, thus Vinh1 can be retained in the $C_{LBL1}$, thus, $V_{LBL1}$=5.4V at T1. At T2, $VG_{BL}$=Vdd>Vdd–Vt and $V_{LBL2}$=Vinh2=5.1V precharged in $C_{LBL2}$ by setting LBLps=5.1V. Thus $V_{LBL}$=5.1V can be retained in $C_{LBL2}$ at T2. Then in the CS step, the final value of $V_{LBL}$ under 3-cap CS is calculated: $V_{LBL}$=(⅓)[$V_{LBL0}$+$V_{LBL1}$+$V_{LBL2}$]=(⅓)[1.2V+5.4V+5.1V]=3.9V.

Similarly, the 3-cap calculation of a first desired $V_{LBL}$=3V for programming P1 state in 1P operation can also be done and shown in FIG. 17D. Other desired $V_{LBL}$ values for programming P2, P4, P6 states in 1P operation and P1 through P7 states in 2P or 3P operations under 1-5-8 TLC program scheme are also shown in table here. Thus, the description is skipped herein for brevity. The method can be executed with lower precharge current via local precharge power line and faster speed to perform program-verify due to a smaller value of $C_{LBL}$×$V_{LBL}$ in the present invention than $C_{GBL}$×Vdd in prior art.

FIG. 17E shows another method of using 4-cap charge-sharing for calculating all desired $V_{LBL}$ voltages in accordance with the ΔVtpn differences of 1P, 2P, and 3P operations under 1-5-8 TLC program scheme and a condition of Vddmin=1.6V when operating at Vdd=1.8V.

In a specific embodiment, 4 equal-sized adjacent LBL capacitors $C_{LG}$ associated with 4 bits PCACHE registers are initially precharged with 4 predetermined values under 4 different time periods of T0, T1, T2, and T3. After the precharge cycle, then a data-conversion and a similar CS are performed under the condition of Vddmin=1.6V. Note, due to different Vdd values, precharged $V_{LBL}$ voltages and Vinh in $C_{LG}$ capacitors are optimized with different values comparing to examples in FIG. 17D. In the embodiment with Vddmin=1.6V, 4 $C_{LG}$ precharged voltages of 7V, 6.4V, 5V, and 3.6V and several varied $V_{GBL}$ voltages of 0.8V, 0.6V, 0.4V, 0.3V, 0.2V, 0V and Vdd set in GBL from PB are used and able to generate all desired $V_{LBL}$ voltages accurately.

FIG. 17F shows 3 preferred sets of $V_{FY}$ program-verify voltages on selected WL with or without the individual $V_{SL}$-based Vt-offset for respective 1P, 2P, and 3P programs under 1-5-8 TLC program scheme according to an embodiment of the present invention. For an 1P MLC-like 5-state program on TLC cells, there are only 5 sets of $V_{FY}$ voltages: $V_{WL}$=0V and correspondingly $V_{SL}$=0.9V compensation are applied for verifying P0 interim state, $V_{WL}$=0V and $V_{SL}$=0V for verifying interim P1 state, $V_{WL}$=0.6V and $V_{SL}$=0V for verifying interim P2 state, $V_{WL}$=1.8V and $V_{SL}$=0V for verifying interim P4 state, and $V_{WL}$=3.3V and $V_{SL}$=0V for verifying interim P6 state. The program-verify for 2 interim P3 and P5 states are neglected because there are no program operations for P3 and P5 during 1P program.

For a 2P 8-state TLC program, there are only 7 sets of $V_{FY}$ voltages are required for verifying final P1, P2, P3, P4, P5, P6, and P7 program states. The program-verification of the final P0 program state is neglected without affecting the TLC read accuracy to save the verification time because P0 state needs a large negative voltage for verification that would consume too much power to precharge $V_{TPW}$ and $V_{DNW}$ for a proper negative verification. Therefore, no verification for final P0 state. Other program-verify voltages include: $V_{WL}$=0.8V and $V_{SL}$=0V for final P1 verification, $V_{WL}$=1.4V and $V_{SL}$=0V for final P2 verification, $V_{WL}$=2V and $V_{SL}$=0V for final P3 verification, $V_{WL}$=2.6V and $V_{SL}$=0V for final P4 verification, $V_{WL}$=3.2V and $V_{SL}$=0V for final P5 verification, $V_{WL}$=3.8V and $V_{SL}$=0V for final P6 verification, and $V_{WL}$=4.4V and $V_{SL}$=0V for final P7 verification. Program-verify for interim P0 state is neglected because there is no program on P0 during 2P program.

For a 3P 8-state TLC fine program, there are only 7 sets of $V_{FY}$ voltages are required for final P1, P2, P3, P4, P5, P6, and P7 program states. The program-verification of the final P0 program state is neglected without affecting the TLC read accuracy to save the verification time because P0 state needs a large negative voltage for verification that would consume too much power to precharge $V_{TPW}$ and $V_{DNW}$ for a proper negative verification. Therefore, no verification for final P0 state. Other program-verify voltages include: $V_{WL}$=1.4V and $V_{SL}$=0V for final P1 verification, $V_{WL}$=2V and $V_{SL}$=0V for final P2 verification, $V_{WL}$=2.6V and $V_{SL}$=0V for final P3 verification, $V_{WL}$=3.2V and $V_{SL}$=0V for final P4 verification, $V_{WL}$=3.8V and $V_{SL}$=0V for final P5 verification, $V_{WL}$=4.4V and $V_{SL}$=0V for final P6 verification, and $V_{WL}$=5V and $V_{SL}$=0V for final P7 verification. Program-verify for interim P0 state is neglected because there is no program on P0 during 3P program.

FIG. 17G shows preferred 7 VRn read voltages and $V_{SL}$ voltages for TLC read of non-boundary WLs (WLn–1~WLn+2) with respect to the programmed adjacent WLn under 1-5-8 TLC program scheme according to an embodiment of the present invention. As shown, a preferred TLC read operation is performed in the non-boundary WLs with respect to the programmed adjacent WLn without using $V_{SL}$-based Vt-offset (by setting $V_{SL}$ to 0V). For example, a first read condition is setting $V_{WL}$=VR1=0.7V and $V_{SL}$=0V to distinguish P0 out from P1 to P7; a second read condition is setting $V_{WL}$=VR2=1.3V and $V_{SL}$=0V to further distinguish P0 and P1 out from P2 to P7; a third read condition is setting $V_{WL}$=VR3=1.9V and $V_{SL}$=0V to further distinguish P0 to P2 out from P3 to P7; a fourth read condition is setting $V_{WL}$=VR4=2.5V and $V_{SL}$=0V to distinguish P0 to P3 out from P4 to P7; a fifth read condition is setting $V_{WL}$=VR5=3.1V and $V_{SL}$=0V to further distinguish P0 to P4 out from P5 to P7; a sixth read condition is setting $V_{WL}$=VR6=3.7V and $V_{SL}$=0V to distinguish P0 to P5 out from P6 and P7; and a seventh read condition is setting $V_{WL}$=VR7=4.3V and $V_{SL}$=0V to distinguish P0 to P6 out from P7.

FIG. 17H shows preferred 7 VRn read voltages and $V_{SL}$ voltages for TLC read of boundary WLn+3 cells programmed under 1-5-8 TLC program scheme with respect to adjacent WLn+4 cells being in E state without using $V_{SL}$-based Vt-offset according to an embodiment of the present invention. As shown, a preferred TLC read operation is performed in the boundary WLn+3 with the adjacent WLn+4 TLC cells in $E^0$ state without using $V_{SL}$-based Vt-offset (or by setting $V_{SL}$ to 0V). For example, a first read condition is setting $V_{WL}$=VR1=0.7V and $V_{SL}$=0V to distinguish P0 out from P1 to P7; a second read condition is setting $V_{WL}$=VR2=1.3V and $V_{SL}$=0V to further distinguish P0 and P1 out from P2 to P7; a third read condition is setting $V_{WL}$=VR3=1.9V and $V_{SL}$=0V to further distinguish P0 to P2 out from P3 to P7; a fourth read condition is setting $V_{WL}$=VR4=2.5V and $V_{SL}$=0V to distinguish P0 to P3 out from P4 to P7; a fifth read condition is setting $V_{WL}$=VR5=3.1V and $V_{SL}$=0V to further distinguish P0 to P4 out from P5 to P7; a sixth read condition is setting $V_{WL}$=VR6=3.7V and $V_{SL}$=0V to distinguish P0 to P5 out from P6 and P7; and a seventh read condition is setting $V_{WL}$=VR7=4.3V and $V_{SL}$=0V to distinguish P0 to P6 out from P7.

FIG. 17I shows preferred 7 VRn read voltages for TLC read of boundary WLn+3 cells with 8 sets of 7 individual $V_{SL}$ compensations in accordance with 8 different TLC program states stored in the adjacent WLn+4 cells according to an embodiment of the present invention. As shown, for the boundary WLn+3 TLC read operation, individual $V_{SL}$-based Vt-compensations are provided in accordance with 8 different TLC program states stored in the adjacent WLn+4 cells. For example, a first read condition is setting $V_{WLn+3}$=VR1=1.1V along with 8 individual $V_{SL}$ compensation voltages to differentiate P0 out of P1 to P7 of the WLn+3 cell in accordance with corresponding 8 TLC program states stored in the adjacent WLn+4 cell 1) at P0 state, $V_{WL}$=1.1V, $V_{SL}$=0.35V; 2) at P1 state, $V_{WL}$=1.1V, $V_{SL}$=0.27V; at P2 state, $V_{WL}$=1.1V, $V_{SL}$=0.23V; at P3, $V_{WL}$=1.1V, $V_{SL}$=0.18V; at P4, $V_{WL}$=1.1V, $V_{SL}$=0.14V; at P5, $V_{WL}$=1.1V, $V_{SL}$=0.1V; at P6, $V_{WL}$=1.1V, $V_{SL}$=0.05V; at P7, $V_{WL}$=1.1V, $V_{SL}$=0V. The rest 6 sets of read conditions of $V_{WL}$ and corresponding $V_{SL}$-compensation for reading the remaining 6 program states of WLn+3 cell can be found in FIG. 17I. Note, all $V_{SL}$ voltages for P0 to P6 are aligned to P7 in WLn+4.

FIG. 17J shows preferred 7 VRn read voltages and $V_{SL}$ voltages for TLC read of boundary WLn+3 cells programmed under 1-5-8 TLC program scheme with respect to adjacent WLn+4 cells being in TLC programmed states without including $V_{SL}$-based Vt-offset according to an embodiment of the present invention. As shown, a preferred TLC read is performed in the boundary WLn+3 cells with the adjacent WLn+4 TLC cells being programmed to a TLC state without including $V_{SL}$-based Vt-offset (or by setting each $V_{SL}$ to 0V). In this embodiment, a first read condition is setting $V_{WL}$=VR1=1.3V and $V_{SL}$=0V to distinguish P0 out from P1 to P7; a a second read condition is setting $V_{WL}$=VR2=1.9V and $V_{SL}$=0V to further distinguish P0 and P1 out from P2 to P7; a third read condition is setting $V_{WL}$=VR3=2.5V and $V_{SL}$=0V to further distinguish P0 to P2 out from P3 to P7; a fourth read condition is setting $V_{WL}$=VR4=3.1V and $V_{SL}$=0V to distinguish P0 to P3 out from P4 to P7; a fifth read condition is setting $V_{WL}$=VR5=3.7V and $V_{SL}$=0V to further distinguish P0 to P4 out from P5 to P7; a sixth read condition is setting $V_{WL}$=VR6=4.3V and $V_{SL}$=0V to distinguish P0 to P5 out from P6 and P7; and a seventh read condition is setting $V_{WL}$=VR7=4.9V and $V_{SL}$=0V to distinguish P0 to P6 out from P7.

FIG. 18A is a flow chart of a preferred method for performing a TLC read operation for both boundary and non-boundary WL cells under 1-5-8 TLC program scheme according to an embodiment of the present invention. As shown, a preferred method 800 is provided for performing a TLC read operation under 1-5-8 TLC program scheme for both boundary and non-boundary WL cells. The flow starts from step 801 of receiving the TLC read Commend that is added with some new operations designed to have multi-page concurrent TLC operations. The multi-page concurrent TLC read operation comprises a method in which multiple WLs are concurrently selected for TLC read on a basis of one-WL per block per MG in one or more HGs of the YUKAI NAND array. The WL selection is subjected to such restriction because for each WL read each TLC bit is sensed after the CS between one selected $C_{MG}$ and $J \times C_{HG}$ in the worst-case scenario. Thus the capacitance value of $C_{MG}$ cannot be too small as compared to $J \times C_{HG}$ by each SA of the PB during CS operation. When M WLs are selected for the M-page concurrent TLC read, the M WLs are specifically selected from M blocks in M different MG groups (M×$C_{MG}$) in either a same or different HGs in one NAND plane for concurrent read. Concurrent read is performed such that M pages of $C_{MG}$ PCACHE registers are selected for concurrent local precharge, concurrent local TLC data evaluation (discharging or retaining in accordance with TLC data), concurrent local $V_{SL}$-based Vt-compensation, and concurrent voltages setup on M sets of 127 unselected WLs, one selected WL, SSL, and GSL lines (see FIGS. 3 and 4A).

Unlike prior art only one WL in one block in one NAND plane is selected for read, embodiments of the present invention can have M WLs selected to be read simultaneously with only one selection restriction. One WL per block in one MG group is sensed by each corresponding SA in PB at a time for CS to avoid data contention among M selected pages of TLC cells. But because CS time is relatively smaller than $C_{MG}$ precharge time and TLC data evaluation time locally, therefore, it can be treated as M WLs being read concurrently, giving proximately M-fold reduction in read latency. The operation flow shown in method 800 is based on read of one selected WL only for description simplicity.

Referring to FIG. 18A, the next step 802 of the method 800 is a determination step that leads to two split paths, step 804 and step 810, and is performed to determine whether the selected WLn is a boundary WL or not. In a specific embodiment, the determination of the WLn status is based on a "Mark" bit stored in each WLn. For concurrent M WLs selection, then M "Mark" bits have to be read out respectively from M WLn. By definition, the Mark bit is "1" for a non-boundary WLn and "0" for a boundary WLn. "1" means that a cell is in an erase-state, while "0" is in a program state, being handled like a SLC storage for reliable Mark bit. The Mark bit can be formed at the spare area of each WLn.

When Mark bit is read "1" in step 802, then it indicates WLn is not a boundary WL, thus the flow moves to step 810 for performing a TLC read operation in which $V_{SL}$-based Vt-compensation is not needed. Thus, 7 preferred uprising VRn of 0.7V, 1.3V, 1.9V, 2.5V, 3.1V, 3.7V, and 4.3V are sequentially applied to each selected WLn to distinguish 8 distinct TLC states.

When Mark bit is read "0" in step 802, then it indicates WLn is indeed a boundary WL, thus the flow moves to step 804 for performing a special read on adjacent next WLn+1 with respect wordline voltage of 0V. Since the WLn is boundary WL, a $V_{SL}$-based Vt compensation in accordance with the opposing cells TLC data stored in the next adjacent WLn+1 is needed before the WLn cell can be accurately read.

Thus the flow moves to another determination step 806 that leads to two other paths corresponding to two status in the WLn+1 TLC data. In another specific embodiment, based on results from step 804, if threshold Vt of at least one cell in WLn+1 is greater than the special read wordline voltage of 0V, step 806 determines that cells of WLn+1 are not all in $E^0$ state. In other words, at least one of WLn+1 cells stores a 8-state TLC data. Then flow moves to step 812, in which WLn TLC read employs 7 $V_{SL}$ compensations voltages of, respectively, 0V for P7 cell, 0.05V for P6 cell, 0.1V for P5 cell, 0.14V for P4 cell, 0.18V for P3 cell, 0.23V for P2 cell, 0.27V for P1 cell and 0.35V for P0 cell in accordance with WLn+1 stored TLC cell data along with 7 uprising VRn of VR1=1.1V, VR2=1.7V, VR3=2.3.V, VR4=2.9V, VR5=3.5V, VR6=4.1V and VR7=4.7V are sequentially applied on WLn for performing an accurate 3-bit TLC read.

Conversely, if threshold Vts of all cells in WLn+1 page are smaller than the special read wordline voltage of 0V, step 806 determines that all cells in WLn+1 are erase $E^0$ state. Then the flow moves to step 808, in which 8-state TLC read is performed without the need of $V_{SL}$-based Vt-compensation. Thus, 7 uprising VRn of VR1=0.7V, VR2=1.3V, VR3=1.9V, VR4=2.5V, VR5=3.1V, VR6=3.7V and VR7=4.3V are sequentially applied to the WLn with a common $V_{SL}$=0V to distinguish 8 TLC states for performing an accurate 3-bit TLC read. At Step 414, the method 800 of the TLC read is ended.

FIG. 18B shows a preferred method 900 for performing a TLC read operation for both boundary and non-boundary WLn cells under 1-5-8 TLC program scheme plus a 3P operation according to an embodiment of the present invention. The method 900 starts from step 901 for receiving TLC read Command for reading cells in selected WLn the same as the method 800 while making a difference next from the method 800 shown in FIG. 18A by moving to step 902 first to read Mark bits out from the next adjacent WLn+1 to determine whether each selected WLn is a boundary WL or not.

In an embodiment, the WLn status, at least in terms of a first Mark bit, is stored in an adjacent WLn+1, rather than in WLn. There is advantage doing in this manner because whether WLn+1 is in $E^0$ state or not is subject to the availability of WLn+1 TLC page data before performing 1P operation on WLn. The first Mark bit for WLn can be done simultaneously with the WLn+1 cell being subjected to TLC 1P program without performing extra program operation to reduce the unnecessary WL, Vpgm, program disturb. For concurrent M WLn selection, then M Mark bits have to be read out from M corresponding adjacent WLn+1 cells. Again, the definition of the Mark bit is "1" for a non-boundary WLn and "0" for a boundary WLn. The Mark bit is formed at the spare area of each WLn+1.

The step 902 of the method 900 is a determination step that leads to two split paths, step 904 and step 910, based on the determination on whether the selected WLn is a boundary WL or not.

When the Mark bit is read "1" from the WLn+1, then it indicates that the selected WLn is not a boundary WL, thus the flow moves to step 910, where a $V_{SL}$-based Vt-compensation is not needed. Thus, an accurate 3-bits TLC read can be performed by applying 7 uprising VRn of VR1=0.7V, VR2=1.3V, VR3=1.9V, VR4=2.5V, VR5=3.1V, VR6=3.7V, and VR7=4.3V sequentially to each selected WLn along with a $V_{SL}$=0V to distinguish 8 distinct TLC states of the WLn cells.

When the Mark bit is read "0" from the WLn+1, then it indicates that the selected WLn is indeed a boundary WL, thus the flow moves to step 904 for performing a special read on adjacent next WLn+1 with respect wordline voltage of 0V. Following that, the method 900 flow enters another determination step 906 that leads the flow to two additional split paths, depending on an identification of a second Mark bit to indicate whether the WLn+1 stores all $E^0$ state data.

Based on results from step 904, if threshold Vt of at least one cell in WLn+1 is greater than the special read wordline voltage of 0V, step 906 determines that cells of WLn+1 are not all in $E^0$ state. Then WLn+1 cells are not all in erase $E^0$ states and at least one cell stores 8-state TLC page data. Then method 900 moves to step 908 for performing TLC read operation on WLn cells.

At Step 908, an accurate 3-bit TLC read on WLn will not employ any $V_{SL}$ compensation voltages but sequentially apply 7 uprising VRn read voltages on WLn, respectively, VR1=0.7V for differentiating P0 state out of P1 to P7 cells, VR2=1.3V for differentiating P1 state, VR3=1.9V for differentiating P2 state, VR4=2.5V for differentiating P3 state, VR5=3.1V for differentiating P4 state, VR6=3.7V for differentiating P5 state, and VR7=0.38V for differentiating P6 state.

Conversely, if threshold Vts of all cells in WLn+1 page are smaller than the special read wordline voltage of 0V, step 906 determines that all cells in WLn+1 are erase $E^0$ state. Then the flow moves to Step 912, which does not need $V_{SL}$-based Vt-compensation. 7 VRn are provided including VR1=1.3V for differentiating P0 cell out of P1 to P7 cells, VR2=1.9V for P1 cell, VR3=2.5V for P2 cell, VR4=3.1V for P3 cell, VR5=3.7V for P4 cell, VR6=4.3V for P5 cell and VR7=4.9V for P6 and sequentially applied on the selected WLn for an accurate 3-bit TLC read. At Step 914, the method 900 for performing a TLC read is ended.

In an alternative embodiment, a preferred mixed TLC+SLC block in YUKAI NAND array is provided, where the TLC cell in each mixed TLC+SLC block is subjected to a 2-pass 1-5-8 ABL and AnP program scheme in an Alt-WL program sequence as defined in FIG. 20A. The mixed TLC+SLC block provides flexibility that the SLC WL in the block can be programmed either before or after the TLC WLs in the same block. In most cases, the SLC WL is programmed with a SLC page data after adjacent TLC WL being programmed with a TLC page data. In this case, the TLC WLs cells are programmed in a lockout state before the adjacent SLC WL cells are programmed thereafter. The TLC WLs adjacent to any SLC WLs are referred as the boundary TLC WLs. As a result, the lockout TLC cells in these boundary TLC WLs would suffer additional Vt-widening and Vt-shifting. Thereby, the boundary TLC data reliability is jeopardized. Note, dummy WL cells program is also a SLC-like program but it is always programmed before its adjacent TLC WLs. Thus the lockout states of the adjacent TLC WLs' cells would not happen. Therefore the TLC WLs next to dummy SLC cells are not the worst-cast TLC WLs in terms of TLC reliability as compared to TLC WLs next to the regular SLC WLs of this mixed SLC+TLC block. In a specific embodiment, TLC program schemes can also be used to for 3 adjacent WLs mixed one SLC WL. In the following example, the 1-5-8 TLC program scheme is used.

FIG. 19A is diagram showing an alternative YUKAI NAND array 400 made by mixed TLC+SLC blocks including a plurality of 4-WL units at least within each half-block with 3 continuous WLs of TLC cells and one WL of SLC cells and two dummy WLs inserted together in the middle of each string according to an embodiment of the present invention. As shown, a preferred mixed TCL+SLC block is provided such that every four WLs include three continuous TLC WLs followed by one SLC WL. Here, two dummy WLs are placed adjacent to each other and are treated same as the regular SLC WLs of this mixed TLC+SLC block because the dummy WLs cells are also programmed with 2-state SLC data with one negative Vte and one positive Vtp.

In this example, two dummy WLs of $DWL^1 1$ and $DWL^1 2$ are physically placed next to each other and inserted as two middle WLs for a first sub-string with 64 WLs such as $WL^1 64$ to $WL^1 1$ in reverse order on one side of the $DWL^1 1$ and a second sub-string with another 64 WLs such as $WL^2 1$ to $WL^2 64$ on another side of $DWL^1 2$. Each sub-string is further divided into a plurality of units. Each unit includes 4 mixed WLs with one SLC WL in series with 3 TLC WLs. Each dummy WL is treated as one SLC WL so that, in the current example, two SLC WLs can be removed and the percentage of TLC array occupancy in whole NAND array can be increased in each block for a higher density and lower cost. The last WL (WL$^1$64) in the first sub-string and the last WL (WL$^2$64) in the second sub-string are respectively placed next to SSL' and GSL$^1$ lines without an adjacent SLC WL.

For example, for a NAND block with such 4-WL units made by 3 adjacent TLC WLs and one SLC WL, the TLC occupancy percentage=3/[1+3]=75%. Although the NAND array 400 with mixed TLC+SLC blocks has only a 75% TLC occupancy percentage, the data reliability of the 75% TLC cells is much superior than that of TLC cells in the NAND array comprising of 100% TLC WLs. In the NAND array with 100% TLC cells, boundary TLC WLs must exist such as WLn+3, which has the worst TLC data reliability as demonstrated in one or more embodiments provided in the specification. On the contrary in the preferred NAND array 400 with mixed TLC+SLC blocks, there is no more boundary WLn+3 in this 4-WL mixed TLC+SLC blocks. Therefore, the 3 adjacent TLC WLs are all treated as non-boundary TLC WLs in which only a final step of TLC program of a next adjacent WL will widen Vt-shift of the current TLC WL. As a result, this final-step Vt widening and shifting is much smaller and is relatively comparable to that for the SLC-induced Yupin coupling effect. This 1S Vt-shift induced by SLC-like program operation is about 0.15V to 0.2V, which is still not negligible for the preferred TLC states with only 0.25V targeted Vt-gap between two adjacent TLC states.

FIG. 19B is diagram showing another alternative YUKAI NAND array 500 made by mixed TLC+SLC blocks including a plurality of 4-WL units at least within each half-block with 3 continuous WLs of TLC cells and one WL of SLC cells and one dummy WL inserted ahead of a first sub-string and another dummy WL in the middle of each string ahead of a second sub-string according to another embodiment of the present invention. As shown, another preferred mixed TCL+SLC block is such that every four WLs include three continuous TLC WLs followed by one SLC WL. Here, two dummy WLs are not physically placed next to each other. Instead, dummy WL DWL$^1$1 is placed between SSL1 and WL$^1$1 line and DWL$^1$2 is placed between WL$^2$1 and WL$^1$64. As the result, the TLC occupancy percentage will be further increased as configured in FIG. 19B.

FIG. 20A shows a preferred ABL, AnP, and Alt-WL program sequence for mixed TLC (3-WL)+SLC (1-WL) in each 4-WL unit of a whole block according to an embodiment of the present invention. As shown in an example, an ABL, AnP, and Alt-WL program sequence is provided for several adjacent WLs in each 4-WL unit with mixed TLC (3-WL)+SLC (1-WL) in a block of whole 128 WLs as seen in FIG. 19A under 1-5-8 scheme for TLC. A first unit includes a dummy WL (as the SLC WL) plus WLn−1, WLn, and WLn+1 three TLC WLs. A second unit follows with a SLC WLn+2 then three TLC WLn+3, WLn+4, and WLn+5.

The preferred ABL, AnP, and Alt-WL program sequence starts from a DP operation for a first SLC-like dummy WL (DWL1) and then a second dummy WL (DWL2) followed by a 1P operation for a first TLC WL, WLn−1, a second TLC WL, WLn, then a third TLC WL, WLn+1, in accordance with the timing clocks from t_, t0, t1, t2, t3, t4, t5, t6, and t7. In the example, DWL2 is treated as a SLC WL to increase the percentage of the desired TLC array occupancy more than 75%.

The SLC-like DP program for the DWL1 is performed at t_, while the next SLC-like DP program for DWL2 is performed at t0. The DP on the DWL1 will result in a DS Vt-shift on DWL2 cells. Likewise, the DP on the DWL2 will result in another DS Vt-shift on WLn−1 TLC erase-cells before 1P program is performed on WLn−1. Therefore, when the TLC cell in WLn−1 is performed under a 2-pass 1-5-8 TLC program scheme, the DS induced by DP on the DWL2 has been taken by the WLn−1 and can be manipulated to a negligible value. Thereby, for WLn−1 only the Yupin coupling effect caused by performing TLC program on its adjacent WLn needs to be considered. Thus it is relatively small compared to WLn+3 TLC cells because additional Yupin coupling effect is caused by a SLC program on precedent WLn+2 which is performed after TLC program lockout of the WLn+3.

Note, within the WL framework defined by such 4-WL units in a mixed SLC+TLC unit, WLn+1 belongs to a first unit. WLn+3 and WLn+5 belong to a second unit. WLn+1 is defined as a true boundary TLC WL with an adjacent SLC WL, WLn+2. Similarly, WLn+5 is defined as a true boundary TLC WL with an adjacent SLC WL, WLn+6. While, WLn−1 is adjacent to DWL2, it is not a true boundary TLC WL because DWL2 cells are programmed with SLC data before the WLn−1.

1P' and 2P' operations are two subsequent programs for SLC-WL programs on WLn+2. The 1P' operation is defined to program the selected WL from initial widened E$^0$ state to a narrow P0$^1$ state with a Vtp0 min=−0.9V optimally defined by taking two BL-BL Yupin coupling effects. The detailed program sequences and Vt-shifts of the mixed TLC and SLC can be found in FIG. 20A.

FIG. 20B shows another preferred ABL, AnP, and Alt-WL program sequence for mixed TLC (3-WL)+SLC (1-WL) in each 4-WL unit of a whole block according to another embodiment of the present invention. As shown, the preferred ABL, AnP, and Alt-WL program sequence is continued performing on next 4-WL unit with mixed TLC (3-WL)+SLC (1-WL) and beyond through a whole 128-WL block. Starting from a 1P operation on TLC WLn+3 at t0'cycle, followed by a 1P operation on TLC WLn+4 at t1' cycle, then a 2P' operation on SLC WLn+2 at t2' cycle, further a 2P operation on TLC WLn+3 at t3' cycle, then 1P operation on TLC WLn+5 at t4' cycle, furthermore a 2P operation on TLC WLn+4 at t5' cycle, followed by a 1P' operation on SLC WLn+6 at t6' cycle, further a 2P operation on TLC WLn+5 at t7' cycle. Note, SLC 1P' program on WLn+6 is performed after TLC program on WLn+3, WLn+4, and WLn+5. The SLC 1P' program on WLn+6 only affects TLC WLn+5 cells.

FIG. 20C shows an alternative ABL, AnP, and Alt-WL program sequence for mixed TLC (3-WL)+SLC (1-WL) in each 4-WL unit of a whole block according to yet another embodiment of the present invention. As shown, the preferred ABL, AnP, and Alt-WL program sequence is alternatively performed further on next 4-WL unit with mixed TLC (3-WL)+SLC (1-WL) and beyond through a whole 128-WL block. This alternative program sequence starts from a 1P operation on TLC WLn+3 at t0' cycle, followed by a 1P operation on TLC WLn+4 at t1' cycle, further a 2P' operation by SLC WLn+2's 2P' at t2' cycle, then a 2P operation on TLC WLn+3 at t3' cycle, furthermore a 1P operation on TLC WLn+5's at t4' cycle, furthermore a 2P operation on TLC WLn+4 at t5' cycle, followed by a SP operation with real data on SLC WLn+2 at t0". Note, SLC SP (SLC-program) on WLn+2 is performed after TLC program of WLn+1, WLn+3 and WLn+4. The SLC SP program on WLn+2 affects both WLn+1 TLC cells and WLn+3 TLC cells.

FIG. 21A is a diagram showing Vt distributions, populations, shifting, verify and widened voltages for TLC operations of new boundary WLn+1 TLC cells in mixed SLC+

TLC units under 1-5-8 TLC program scheme with WLn+2 cells being programmed with 1P and 2P of SLC data according to an embodiment of the present invention. As shown, four graphs and one table are used to demonstrate preferred TLC Vt distributions, populations, shifting, verify and widened voltages for respective key TLC operations of a new boundary TLC WLn+1 cells in a mixed SLC+TLC units under 1-5-8 TLC program scheme and a condition of WLn+2 cells being programmed with SLC data via 1P and 2P operations. Each of the interim 1P operation and final 2P operation on WLn+2 cell is performed only to program erase state to a P0 state.

In the first graph, an erase operation shifts TLC cells Vts from 7 initial widened program states of $P1^5, P2^5, P3^5, P4^5, P5^5, P6^5$, and $P7^5$ and one widened $P0^5$ state to one $E^0$ state by using a unified $Vte^0max=-2.0V$ as the erase-verify voltage.

In the second graph, a 1P operation under 1-5-8 TLC program scheme is performed on WLn+1 at t4 that shifts cells Vt from one initial widened $E^1$ state with $Vte^1max=-1.54V$ to 5 interim MLC-like narrow program states of $P0^1, P1^1, P2^1, P4^1$, and $P6^1$ with 4 unevenly-spaced program-verify voltages including $Vtp0^1min=-0.9V$, $Vtp1\ min=0V$, $Vtp2^1min=0.6V$, $Vtp4^1min=1.8V$, and $Vtp6^1min=3V$ to prevent earlier lockout for subsequent 8-state final TLC 2P program. Note, $Vte^1max=-1.54V$ is shifted from $Vte^0max=-2.0V$ by 1P-induced 1S at t2 on WLn cells programmed to $P6^1$ state.

In the third graph, a 2P operation is performed on WLn+1 to shift cells Vts from 5 initially widened interim MLC-like states of $P0^2, P1^3, P2^3, P4^3$, and $P6^3$ to 8 final TLC states including a widened $P0^3$ state with negative Vt but 7 narrow positive Vt program states of $P1^4, P2^4, P3^5, P4^4, P5^4, P6^4$, and $P7^4$, which are divided into 4 similar groups by using 7 similar new program-verify voltages. For example, $P0^3$ state is preferably shifted and widened to $P0^5$ state without being programmed and verified, so as to be neglected for saving verify time. In fact, $P0^3$ program does not help increasing the $\Delta Vtp$ for better TLC reliability data. Additionally, $P1^3$ state is preferably shifted and widened to one final $P1^4$ state only with $Vtp1^4min=0.8V$. $P2^3$ state is preferably shifted and widened to 2 final states $P2^4$ and $P3^4$ respectively with $Vtp2^4min=1.4V$ and $Vtp3^4min=2.0V$. $P4^3$ state is preferably shifted and widened to 2 final states $P4^4$ and $P5^4$ respectively with $Vtp4^4min=2.6V$ and $Vtp5^4min=3.2V$. Furthermore, $P6^3$ state is preferably shifted and widened to 2 final states $P6^4$ and $P7^4$ respectively with $Vtp6^3min=3.8V$ and $Vtp7^3min=4.4V$. After this 2P program on the TLC cells, the minimum $\Delta Vtp=0.32V$, which is larger than the target $\Delta Vtp=0.25V$. Thus the $V_{SL}$-based Vt-compensation is not required.

In the fourth graph, a preferred Odd/Even-based TLC read operation is performed with 7 similar read check voltages VRn, including VR1=0.7V, VR2=1.3V, VR3=1.9V, VR4=2.5V, VR5=3.1V, VR6=3.7V, and VR7=4.3V being sequentially applied to the selected WLn+1 to distinguish 8 final narrow TLC states of $P0^5, P1^5, P2^5, P3^5, P4^5, P5^5, P6^5$, and $P7^5$ of WLn+1 cells. The table in FIG. 21A shows the detailed calculations of all Vtpn's width and spacing of each pass of TLC erase and program operations of the selected WLn+1 with respect to adjacent WLn+2 cells being programmed with the SLC data at different cycles.

FIG. 21B is a diagram showing Vt distributions, populations, shifting, verify and widened voltages for SLC 1P' and 2P' program of WLn+2 SLC cells in mixed SLC+TLC units under 1-5-8 TLC program scheme according to an embodiment of the present invention. As shown, two graphs and one table are listed for demonstrating preferred Vt distributions, populations, shifting, verify and widened voltages for a selected WLn+2 mixed TLC+SLC unit subjected to 1P' and 2P' SLC program.

In the 1P' interim SLC-like program, all widened $E^1$ state cells in WLn+2 are programmed to an interim narrow P0 state with $Vtp0min=-0.9V$ at t6. Before the 1P program, an initial $E^0$ state is shifted and widened to the $E^1$ state by precedent adjacent WLn+1 1P program performed at t4 due to Yupin WL-WL coupling effect. Next, Vt of the WLn+2 cell in $P0^1$ state is shifted and widened to a $P0^2$ state by a 2P program on the WLn+1 performed at t7. Furthermore, Vt of the WLn+2 cell in $P0^2$ state is further shifted and widened to a $P0^3$ state by next adjacent WLn+3 1P program performed at t0' without verification to save SLC program time on the WLn+2.

Alternatively, in the 2P SLC program, the WLn+2 cell in $P0^3$ state is further programmed to a final $P0^4$ state with a $Vtp0^4min=0V$ at t2' and this $P0^4$ state is ready for subsequent SLC program to a higher Vt value with narrow distribution in P1 state having a Vt-gap of about 0.41V between P0 and P1 states of WLn+2 SLC cells.

FIG. 21C is a diagram showing Vt distributions, populations, shifting, verify and widened voltages for TLC operations of new boundary WLn+3 TLC cells in the mixed SLC+TLC units under 1P and 2P operations of 1-5-8 TLC program scheme with respect to WLn+4 being programmed with TLC data and WLn+2 cells being programmed with SLC data according to an embodiment of the present invention. Each of the interim 1P and final 2P programs on the WLn+3 is performed only to program erase-state cells to P0 state.

In the first graph, an erase operation is performed to shift the TLC cell Vts from 7 initial widened program states of $P1^5, P2^5, P3^5, P4^5, P5^5, P6^5$, and $P7^5$ and one widened $P0^5$ state to one $E^0$ state by using a unified $Vte^0max=-2.0V$ as the erase-verify voltage.

In the second graph, a preferred 1P operation is performed under 1-5-8 TLC program scheme at t0' that shifts cell Vt from one initial widened $E^1$ state with $Vte^1max=-1.54V$ to 5 interim MLC-like narrow-distributed program states of $P0^1, P1^1, P2^1, P4^1$, and P6 with 4 unevenly-spaced program-verify voltages including $Vtp0^1min=-0.9V$, $Vtp1\ min=0V$, $Vtp2^1min=0.6V$, $Vtp4^1min=1.8V$, $Vtp6^1min=3V$ to prevent earlier lockout for subsequent 8-state final TLC 2P program. Note, $Vte^1max=-1.82V$ for the WLn+3 cell is shifted from initial $E^0$ with a 1S induced by 1P operation at t6 on precedent adjacent WLn+2 SLC cells to program to P6 state.

In the third graph, a 2P operation is performed to shift cells Vts from 5 initially widened interim MLC-like states of $P0^2, P1^3, P2^3, P4^3$, and $P6^3$ to 8 final TLC states including a widened $P0^3$ state with negative Vt and 7 narrow positive Vt program states $P1^4, P2^4, P3^5, P4^4, P5^4, P6^4$, and $P7^4$, which are divided into 4 similar groups by using 7 similar new program-verify voltages. For example, $P0^3$ state is preferably shifted and widened to a $P0^5$ state without being programmed and verified to save verify time. In fact, $P0^3$ program does not help increasing the $\Delta Vtp$ for better TLC reliability data. $P1^3$ state is preferably shifted and widened to one final $P1^4$ state only with $Vtp1^4min=0.8V$. $P2^3$ state is preferably shifted and widened to 2 final states $P2^4$ and $P3^4$ respectively with $Vtp2^4min=1.4V$ and $Vtp3^4min=2.0V$. $P4^3$ state is preferably shifted and widened to 2 final states $P4^4$ and $P5^4$ respectively with $Vtp4^4min=2.6V$ and $Vtp5^4min=3.2V$. Additionally, $P6^3$ state is preferably shifted and widened to 2 final states $P6^4$ and $P7^4$ respectively with Vtp6³min=3.8V and Vtp7³min=4.4V. After this 2P TLC program, the minimum ΔVtp=0.28V, which is larger than the target ΔVtp=0.25V. Thus the $V_{SL}$-based Vt compensation is not required.

In the fourth graph, a preferred Odd/Even-based TLC read operation is performed with 7 similar read check voltages VRn, including VR1=0.7V, VR2=1.3V, VR3=1.9V, VR4=2.5V, VR5=3.1V, VR6=3.7V, and VR7=4.3V being sequentially applied to the selected WLn+3 to distinguish 8 final narrow TLC states of P0⁵, P1⁵, P2⁵, P3⁵, P4⁵, P5⁵, P6⁵, and P7⁵.

FIG. 21D is a diagram showing Vt distributions, populations, shifting, verify and widened voltages for TLC operations of WLn+1 cells in mixed SLC+TLC units before and after WLn+2's SLC program according to an embodiment of the present invention. As shown, 3 graphs and one table are provided to illustrate preferred TLC operations of WLn+1 before and after WLn+2's SLC program in accordance with ABL, AnP 1-5-8 TLC program scheme and Alt-WL sequence as defined in FIG. 14B.

As shown in the first graph, at least a Vt-gap=0.27V is provided among 8 narrow program states of P1⁵, P2⁵, P3⁵, P4⁵, P5⁵, P6⁵, and P7⁵ of WLn+1 TLC cells before SP operation is performed on SLC WLn+2.

As shown in the second graph, a SP operation is performed at t0'' on WLn+2 such that its interim state P0⁶ is shifted to a SLC program state P1⁶. This operation causes a minor reduced Vt-gap of 0.24V by changing program states of P0⁶, P1⁵, P2⁵, P3⁵, P4⁵, P5⁵, P6⁵, and P7⁵ of WLn+1 TLC cells to slightly widened program states of P0⁶, P1⁶, P2⁶, P3⁶, P4⁶, P5⁶, P6⁶, and P7⁶. In this case, no $V_{SL}$-based Vt-offset is required for WLn+1 cells.

In a specific embodiment, during SP operation, part of the widened interim state P0⁶ of WLn+2 cell is selectively programmed to a final narrow SLC program state P1⁶ with a verification voltage of Vtp1⁶min=0.9V. The Vt-gap between the P0⁶ state and the P1⁶ state is 0.41V. This Vt-gap is large enough for SLC read on the WLn+2 cell, thus no $V_{SL}$-based Vt-compensation is needed.

As shown in the third graph, 8 TLC program states of WLn+3 cell are widened by a SS Vt-shift induced by the SP operation performed on WLn+2 at t0'' due to Yupin WL-WL coupling effect, but only resulting in a negligible 0.09V Vt-widening. As a result, final Vt-gap of at least 0.2V is kept among the 8 TLC program states of P0⁶, P1⁶, P2⁶, P3⁶, P4⁶, P5⁶, P6⁶, and P7⁶ of WLn+3 cell. In this case, no $V_{SL}$-based Vt-offset is required for WLn+3 cells.

FIG. 21E is a diagram showing Vt distributions, populations, shifting, verify and widened voltages for TLC operations of WLn+1's 8-state TLC cells, SLC operation of WLn+2 SLC cells, and TLC operation of WLn+3's another 8-state TLC cells in the mixed TLC+SLC unit according to an embodiment of the present invention. As shown, 3 graphs are respectively used to demonstrate corresponding Vt distributions and gaps between 8-state TLC cells in WLn+1, SLC cells in WLn+2, and 8-state TLC cells in WLn+3 in a mixed TLC+SLC unit.

For example, Vt-gap is maintained at least 0.28V among top the 8 TLC program states of P0⁶ to P7⁶ of WLn+1. A SP operation is performed on WLn+2 so that an interim P0⁵ state is shifted to the final narrow P1⁶ state with a Vt-gap=0.41V. Additionally, Vt-gap of 0.2V is maintained among top 7 program states of P1⁶ to P7⁶ of WLn+3.

FIG. 22A shows preferred 5 $V_{LBL}$ program voltages and one Vinh program-inhibit voltage assigned for 1P and 1P' MLC-like programs to generate 5 interim states under 1-5-8 TLC program scheme in a mixed TLC+SLC unit according to an embodiment of the present invention. As shown, 5 $V_{LBL}$ voltage assignments are provided for performing interim 1P operation on TLC WLs in each mixed TLC+SLC unit are based on Vt-differences defined by 5 interim program states of P0, P1, P2, P4, and P6. As such, all 5 interim MLC states can be programmed in the 1P operation with a substantial same start and finish time without having earlier lockout state. This can reduce Yupin BL-BL coupling effect during programming as any earlier lockout program state may be affected by neighboring cell's unfinished program. When the Vts of P0, P1, P2, P4, and P6 exceed the respectively set values, indicating that corresponding program is done, then $V_{LBL}$ is re-assigned with an inhibit-voltage of Vinh≈7V to prevent over-programming.

For example, these 5 distinct $V_{LBL}$ voltages are set as: $V_{LBL0}$=3.9V/Vinh as P0 state program/program-inhibit voltages, $V_{LBL1}$=3.0V/Vinh as P1 state program/program-inhibit voltages, $V_{LBL2}$=2.4V/Vinh as P2 state program/program-inhibit voltages, $V_{LBL4}$=1.2 V/Vinh as P4 program/program-inhibit voltages, and $V_{LBL6}$=0V/Vinh as P6 program/program-inhibit voltages. Note, all $V_{LBLn}$ values are aligned to $V_{LBL6}$.

Since 5-state MLC-like 1P program is an interim program, rather than a final program, a $V_{LBL}$ compensation in accordance with Vt states of opposing TLC cells in the adjacent WL is not included. For 1P' program on a SLC WL in the mixed TLC+SLC unit, only one interim P0 state is programmed from erase state E⁰ with $V_{LBL}$ being set to 0V (aligned to $V_{LBL0}$). Once the Vtp0 min value is reached, then 1P' program is stopped.

FIG. 22B shows 8 sets of preferred 8 $V_{LBL}$ program voltages and one Vinh program-inhibit voltage assigned for a 2P program to generate 8 states under 1-5-8 TLC program scheme with $V_{LBL}$ compensation according to an embodiment of the present invention. As shown, 8 sets of preferred 8 $V_{LBL}$ program voltages and one Vinh program-inhibit voltage are assigned for a 2P 8-state TLC program on selected TLC WLn. In addition, Each TLC state at WLn is preferably associated with 8 individual $V_{LBL}$ compensations in accordance with 8 different program states of P0 to P7 of opposing TLC cells located in the adjacent WLn+1.

Further, 8 preferred $V_{LBL}$ voltage assignments are provided for performing a 2P operation to generate 8 target TLC states in the WLn. Those $V_{LBL}$ voltages firstly are determined based on the major Vt-differences defined by 8 interim TLC states of P0, P1, P2, P3, P4, P5, P6, and P7 of the WLn, and secondly are fine tuned to 8 final program states affected by 8 possible program states of opposing TLC cells located in the adjacent WLn+1 due to Yupin WL-WL and BL-BL coupling effect. This Yupin coupling effect can be mitigated by introducing 8 individual $V_{LBL}$ compensations in accordance with 8 different program states of P0 to P7 of opposing TLC cells located in the adjacent WLn+1. With such fine tuned $V_{LBL}$ voltages, all 8 interim TLC states of P0, P1, P2, P3, P4, P5, P6, and P7 in 2P program can be started and finished at almost same time without having earlier lockout state to reduce Yupin BL-BL coupling effect. Similarly, when the Vts of 8 program states P0, P1, P2, P3, P4, P5, P6, and P7 exceed the respectively set values, then corresponding $V_{LBL}$ is re-assigned with a program-inhibit voltage of Vinh≈7V to inhibit program so that no over-programming occurs.

In an example, for programming P0 state cell in WLn, $V_{LBL0}$ is assigned to Vinh in accordance with opposing cells in any TLC states of P0 to P7 in WLn+1. In another example, for programming P1 state cell in WLn, $V_{LBL0}$ is set to 3.6V/Vinh as program/program-inhibit voltages when the opposing TLC cell in WLn+1 is a P0 state cell, $V_{LBL1}$ is set to 3.6V/Vinh when the opposing TLC cell in WLn+1 is a P1 state cell, $V_{LBL2}$ is set to 3.6V/Vinh when the opposing TLC cell in WLn+1 is a P2 state cell, $V_{LBL3}$ is set to 3.9V/Vinh when the opposing TLC cell in WLn+1 is a P3 state cell, $V_{LBL4}$ is set to 3.6V/Vinh when the opposing cell in WLn+1 is a P4 state cell, $V_{LBL5}$ is set to 3.9V/Vinh when the opposing TLC cell in WLn+1 is a P5 state cell, $V_{LBL6}$ is set to 3.6V/Vinh when the opposing TLC cell in WLn+1 is a P6 state cell, and $V_{LBL7}$ is set to 3.9V/Vinh when the opposing TLC cell in WLn+1 is a P7 state cell, Note, all $V_{LBL}$ values are aligned to $V_{LBL0}$ or $V_{LBL4}$.

Likewise, the rest preferred $V_{LBL}$ assignments for P2 through P7 cells in WLn can be referred to FIG. 22B. For 2P' program on a SLC WL in the mixed TLC+SLC unit, the interim P0³ state with negative Vt is further programmed to another interim P0⁴ state with positive Vt with $V_{LBL}$ being set to 0V. Once the Vtp0 min value (0V) is reached, then 2P' program is stopped.

FIG. 22C shows preferred 2 $V_{LBL}$ program voltages for SLC program according to an embodiment of the present invention. As shown, for P0 state cell, no program is needed, thus $V_{LBL}$=Vinh is applied; for P1 state cell, SLC program is needed, thus $V_{LBL}$=0V is applied. Once the P1 state Vt is reached, then Vinh is re-applied to stop the further SLC program.

FIG. 22D shows two sets of preferred $V_{FY}$ program-verify voltages on selected WLn with individual $V_{SL}$ Vt-offset voltages respectively in accordance with MLC-like 1P programmed 5 states of P0, P1, P2, P4, and P6 and TLC 2P programmed 7 states of P1 to P7 for a mixed TLC+SLC unit according to an embodiment of the present invention. As shown, for a MLC-like 1P program, 5 states of P0, P1, P2, P4, and P6 require program-verify with certain $V_{SL}$ voltages being applied accordingly. For example, for P0-state verification, a set of $V_{WL}$=0V and $V_{SL}$=0.9V are used. For P1-state, a set of $V_{WL}$=0V and $V_{SL}$=0V are used for verification. For P2-state, a set of $V_{WL}$=0.6V and $V_{SL}$=0V are used for verification. In another example, for P3-state, it can be neglected because no P3-state program in 1P operation. For P4-state, a set of $V_{WL}$=1.8V and $V_{SL}$=0V are used for verification. Also for P5-state, it is neglected because no P5-state program in 1P operation. Additionally, for P6-state a set of $V_{WL}$=3.0V and $V_{SL}$=0V are used for verification. Furthermore, for P7-state, again it is neglected because no P7-state program in 1P operation.

In an alternative embodiment, for a TLC 8-state 2P program, 7 states of P1 through P7 require program-verify with $V_{SL}$ voltage being set to 0V. For P0-state: it is neglected because no P0-state program in 2P operation. Additional for P1-state, a set of $V_{WL}$=0.8V and $V_{SL}$=0V are used for verification. For P2-state, a set of $V_{WL}$=1.4V and $V_{SL}$=0V are used for verification. For P3-state, a set of $V_{WL}$=2.0V and $V_{SL}$=0V are used for verification. For P4-state, a set of $V_{WL}$=2.6V and $V_{SL}$=0V are used for verification. For P5-state, a set of $V_{WL}$=3.2V and $V_{SL}$=0V are used for verification. For P6-state, a set of $V_{WL}$=3.8V and $V_{SL}$=0V are used for verification. For P7-state, a set of $V_{WL}$=4.4V and $V_{SL}$=0V are used for verification.

FIG. 22E shows various sets of preferred $V_{FY}$ program-verify voltages on select WLn with individual $V_{SL}$-based Vt-offset voltages of 1P', 2P', and SP in accordance with the each interim and final SLC programs for mixed TLC+SLC units according to an embodiment of the present invention. As shown, for a 1P' program, the P0 state program-verify is performed by setting $V_{WL}$=0V and $V_{SL}$=0.9V. But no P1 state needs to be program-verified.

In a 2P' program operation, again no P1 state needs to be program-verified. But the P0 state needs to be verified by setting $V_{WL}$=0V and $V_{SL}$=0V.

In a SP program operation, again no P0 state needs to be program-verifies because program is not done yet under SP for P0 state. But the P1 program state needs to be verified by setting $V_{WL}$=0.9V and $V_{SL}$=0V.

FIG. 22F shows 7 preferred VRn values and one common $V_{SL}$=0V on those TLC WLs of the mixed TLC+SLC units according to an embodiment of the present invention. In this example, the 7 uprising VRn values are respective wordline voltages $V_{WL}$ applied to the selected WLn with a common $V_{SL}$=0V. $V_{WL}$=0.7V is used to distinguish P0 out of remaining 7 TLC states of P1 to P7. $V_{WL}$=1.3V is used to distinguish P0 and P1 out of remaining 6 TLC states of P2 to P7. $V_{WL}$=1.9V is used to distinguish P0 to P2 out of remaining 5 TLC states of P3 to P7. $V_{WL}$=2.5V is used to distinguish P0 to P3 out of remaining 4 TLC states of P4 to P7. $V_{WL}$=3.1V is used to distinguish P0 to P4 out of remaining 3 TLC states of P5 to P7. $V_{WL}$=3.7V is used to distinguish P0 to P5 out of remaining 2 TLC states of P6 and P7. $V_{WL}$=4.3V is used to distinguish P0 to P6 out of remaining 1 TLC states of P7.

FIG. 22G shows one preferred VR value and one common $V_{SL}$=0V on those SLC WLs of the mixed TLC+SLC units according to another embodiment of the present invention. The one VR value is defined and applied to the selected WLn with a common $V_{SL}$=0V.

In another embodiment, the two dummy WLs placed at both ends of each NAND string in each block can be electrically treated as two extra but free SLC WLs in the preferred TLC+SLC mixed 2D hierarchical NAND array. As such these two dummy WLs should be physically placed at top 4-WL unit below SSL1 line with an order of 1 dummy WL and 3 TLC-WLs and bottom 4-WL unit with a reverse order of 3 TLC-WLs and 1 dummy WL. Thus, the program and program-verify operation of these two dummy WLs cells should be same as the regular SLC cells in this mixed SLC+TLC array.

In yet another embodiment, the present invention further discloses that the SLC-WL cells are configured to quickly store PB data from external off-chip DRAM CACHE registers when power supply of Vdd is suddenly removed. During normal TLC operations, all 3 pages of TLC logic data are stored in SLC form as Vinh/Vss HV digital data in the 3 pages of $C_{MG}$ PCACHE registers in any step during program, o program-verify or read, even in precharge step. For this mixed TLC+SLC NAND array, a multi-page concurrent SLC program and program-verify on multiple selected SLC WLs can be performed to reduce the latency. Specifically, the operation includes concurrently selecting one $C_{MG}$'S TLC MSB page, or one $C_{MG}$'S TLC CSB page, or one $C_{MG}$'S TLC LSB page for performing ABL N-bit concurrent SLC program on one separate physical page in one or more blocks in one or more LGs within the $C_{MG}$ in accordance with N-bit MSB/CSB/LSB page data by the on-chip state-machine. The M pages off-chip DRAM N-bit digital data (each may be a MSB, or CSB, or LSB data of a TLC data) can be performed an ABL multi-page concurrent N-bit SLC program on M selected SLC WLs in M 4-WL units without increasing the PB sizes in peripheral area.

In a specific embodiment, in the mixed TLC+SLC NAND array, the operation above connects three separate N-bit TLC page data to three separate N-bit $C_{LG}$s on the same time by setting 3 SSL gate control signals to Vdd and 3 GSL gate control signals to 0V for the 3 selected blocks within 3 separate LGs and MGs that contain MSB, CSB and LSB page data, setting 3 wordline gate voltage to a SLC program voltage Vpgm about 18-20V, with each SLC program time ≥10s in one-pulse, and setting all unselected wordlines to Vpass ~10V.

This unique feature of the mixed TLC+SLC NAND array reduces the die sizes and program speed and need of costly super-large Vdd capacitors to store the Vdd voltage for preparing a sudden power down. After Vdd being powered up again, the M pages of stored SLC data in M SLC-WLs in M 4-WL units can be concurrently programmed into the desired TLC in background program. In one or more embodiments, multiple SLC WL cells can be performed multiple TLC WLs on the same time to reduce the latency and power consumption.

Although the above has been illustrated according to specific embodiments, there can be other modifications, alternatives, and variations. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A NAND memory array with BL-hierarchical structure for concurrent All-BL (ABL), All-Vtn-Program (AnP) and Alternate-WL (Alt-WL) program, Half-BL (HBL) Odd/Even program-verify and read operations, the NAND memory array comprising:

a NAND plane comprising N number of columns of NAND memory cells connected in series along a bitline (BL) direction, the N number of columns being cascaded one another along a wordline (WL) direction perpendicular to the BL-direction, the NAND plane being divided to J number of HG groups arranged in the BL-direction, each HG group including L number of MG groups, each MG group including J' number of LG groups, each LG group including H number of blocks, each block including N number of strings, each string including K number of NAND memory cells and a pair of string-select transistors respectively located in two ends of the string and a pair of dummy memory cells, wherein N, J, L, J', H, and K are respectively selected from integers of 2 and greater based on memory chip design;

a two-level bit line hierarchical structure comprising J rows of N number of first broken metal lines laid at a first level along the BL-direction connected by J−1 rows of N number of GBL-divide transistors as N global bit lines (GBLs) through the J HG groups for connecting N corresponding columns to a page buffer, and N number of second broken metal lines per each MG group laid at a second level below the first level along the BL-direction with all Even-numbered N/2 second broken metal lines being independently grounded and N number of third broken metal lines per each same MG group laid at a third level below the second level along the BL-direction with all Odd-numbered N/2 third broken metal lines being independently grounded and all N/2 Odd-numbered second broken metal lines and all N/2 Even-numbered third broken metal lines together forming N local bit lines (LBLs) respectively connected to N GBLs via N Y-pass devices, each of the N LBLs being divided to J' broken-LBLs by J'−1 rows of N number of LBL-divide transistors, each broken-LBL being associated with a LG group and configured to connect either a drain node of an Odd-numbered string as a local bit line or a source node of a neighboring Even-numbered string as a local source line in alternative manner through the H number of strings along the BL-direction in the LG group without a common source line laid in the WL-direction in each block for all N number of strings, each LBL forming an on-chip capacitor $C_{MG}$ with full electrical shielding at each of the second and third level;

a row of N/2 number of Odd precharge transistors per each LG group having corresponding drain nodes coupled to respective N/2 Odd-numbered broken-LBLs and corresponding source nodes coupled to a common precharge power line laid at a fourth level below the third level along the WL-direction, and a row of N/2 number of Even precharge transistors per same LG group having corresponding drain nodes coupled to respective Even-numbered broken-LBLs and corresponding source nodes coupled to the common precharge power line, the common precharge power line being optionally connected to a medium-high voltage up to 7V or connected to ground or other voltages for discharging;

wherein each row of N memory cells in any block forms a page and multiple pages in one or more selected LG groups are configured to perform multi-page concurrent All-BL (ABL), All-threshold-states-program (AnP), and Alternate-WL (Alt-WL) program operation with individual LBL program-voltage compensations in several program passes and to perform multi-page concurrent HBL Odd/Even program-verify and read operations in two cycles with option of applying individual source-line-voltage-based transistor threshold-level compensations for substantially reducing WL-WL and BL-BL coupling effects.

2. The NAND memory array of claim 1 wherein the N is number of bits per physical page selected from 4 KB, 8 KB, 16 KB or other suitable integers; J is selected from 8, 16, or other suitable integer smaller than 16; L is an integer greater than 7; J' is selected from 4, 8, or other suitable integer smaller than 8; H is selected from 4, 8; and K is selected from 8, 16, 32, 64, 128, 256 or other suitable integer smaller than 256.

3. The NAND memory array of claim 1 wherein each of the plurality of NAND memory transistors is either a transistor selected from 1-poly charge-trapping SONOS type and 2-poly floating gate type, with non-volatile design selected from either PMOS or NMOS NAND, 2T Flotox-based EEPROM, NAND-based NOR, and NAND-based Flash, based on a manufacturing technology selected from 2D type and 3D type, PMOS or NMOS NAND cell and flash technology types.

4. The NAND memory array of claim 1 further comprising a M/1 column decoder configured to consolidate N GBLs associated with the N number of columns to N/M GBLs directly connecting to a page buffer with a size reduced by M-fold, wherein M is an integer equal to $2^m$ with m=1, 2, 3.

5. The NAND memory array of claim 1 wherein each broken-GBL is associated with a HG group and configured to form a $C_{HG}$ capacitor isolated by the GBL-divide transistors controlled by a BHG common gate signal, each broken-LBL is associated with a LG group and configured to form a $C_{LG}$ capacitor isolated by the LBL-divide transistors controlled by a BLG common gate signal.

6. The NAND memory array of claim 1 wherein the two dummy memory cells in a same (Odd/Even-numbered) string are programmed with two SLC complementary Vts and any Odd-numbered dummy memory cell is programmed a SLC Vt complementary to any Even-numbered dummy memory cell in a same row so that an Odd/Even BL-select function in each block can be implemented for the HBL Odd/Even program-verify and read operations.

7. The NAND memory array of claim 1 wherein each Y-pass device comprises a 2-to-1 multiplexer so that total number of GBLs is reduced to N/2 in each HG group respectively coupling to N number of LBLs in each MG group and a reduced N/2-bit page buffer, making the GBLs with 4λ pitch size versus LBLs with 2λ pitch size.

8. The NAND memory array of claim 1 wherein the N/2 Odd/Even-numbered LBL at the second/third level optionally being concurrently charged to a LBL voltage up to 7V are interleaved with the N/2 Even/Odd second/third level broken metal lines being electrically grounded to substantially eliminate BL-BL coupling effect on TLC memory cell program.

9. The NAND memory array of claim 1 wherein each NAND memory cell in a string is configured to be a 3-bit TLC cell capable of storing eight threshold Vt levels of charges representing eight program states above the initial erase state in a negative Vt level.

10. The NAND memory array of claim 9 wherein the N broken-LBLs associated with a LG group are configured to be a N-bit LG PCACHE register capable of storing one of different analog voltages for providing individual bit line voltages to perform one of multi-page concurrent TLC ABL, AnP, and Alt-WL program operation with multiple program passes on one selected page of TLC memory cells in the LG group to convert an initial erase state of each TLC memory cell to a proper one state of two or more interim program states and further to a desired one state of 8 final TLC program states so that all N TLC memory cells in the selected page can be programmed in each program pass with a substantially same starting time and a substantially same finishing time without earlier lockout and with BL-BL coupling effect being substantially eliminated, each program pass being followed by one of multi-page two cycles of HBL program-verify operation, each of the N-bit LG PCACHE register being reassigning the medium-high voltage up to 7V as a program-inhibit voltage to stop programming on the corresponding TLC memory cell once an interim program state or one of 8 final TLC program states is verified.

11. The NAND memory array of claim 10 wherein the different analog voltages for providing individual bit line voltage are determined in accordance with threshold-voltage (Vt) differences among corresponding two or more interim program states or up to 8 final TLC program states of the N TLC memory cells in the selected page during each of the multiple program passes, wherein at least some values of the different analog voltages are greater than Vdd provided that the Vdd is an operation voltage of a low-voltage page buffer.

12. The NAND memory array of claim 11 wherein each of the different analog voltages for providing individual bit line voltage is further adjusted by considering a factor representing a WL-WL coupling effect from a TLC memory cell in an adjacent page varied in accordance with its status of being programmed specifically to one of 8 TLC program states in at least a last pass of the multiple program passes during the TLC program on the adjacent page.

13. The NAND memory array of claim 12 wherein each of the different analog voltages for providing individual bit line voltage is generated, per each of the multiple program passes, by first selecting three or four adjacent broken-LBLs along one corresponding column including one broken-LBL associated with the selected LG group that contains the N TLC memory cells in the selected page to be performed with iterative program and program-verify operation; independently and sequentially precharging each broken-LBL from respective common precharge power lines with a predetermined voltage up to 7V; resetting the precharged voltage in each broken-LBL by doing charge-sharing among the three or four broken-LBLs to generate a LBL voltage defined under each of the multiple program passes in accordance with varied states of corresponding one of the N TLC memory cells in the selected page, and passing the LBL voltage as one of the 8 different analog voltages to a floating-gate channel of the corresponding one TLC memory cell.

14. The NAND memory array of claim 13 wherein the one medium-high voltage for program-inhibiting is a value greater than the Vdd and close to but no greater than drain-source breakdown voltage of ~7V and is generated substantially in a same way as each of the different analog voltages, and at least one of the different analog voltages has a value higher than the Vdd.

15. The NAND memory array of claim 10 wherein the multi-page concurrent TLC program operation includes a 3-pass 1-2-8(coarse)-8(fine) TLC program scheme per page by performing an ABL first pass (1P) operation to program one initial erase state with a negative Vt value in a single wide distribution to two SLC-like interim states followed by a HBL program-verify operation, performing an ABL second pass (2P) operation to turn the two interim states to 8 coarse TLC-like program states followed by a HBL program-verify operation, and performing an ABL third pass (3P) operation to obtain 8 fine TLC program states from the previous 8 coarse TLC-like program states followed by a HBL program-verify operation.

16. The NAND memory array of claim 15 wherein the different analog voltages comprise two bit line program voltages of 2V (or Vdd whichever is lower) and 0V and one program-inhibit voltage of ~7V passed respectively to floating gate channels of TLC memory cells in the selected page in the selected LG group for performing the 1P operation on the selected page of TLC memory cells, or a first set of seven bit line program voltages of 0V, 0.5V, 1V, 1.5V, 2V, 2.5V, 3V and one program-inhibit voltage of ~7V passed respectively to floating gate channels of TLC memory cells in the selected page in the selected LG group for performing the 2P operation on the selected page of TLC memory cells, or eight second sets of seven bit line program voltages and one program-inhibit voltage of ~7V passed respectively to floating gate channels of TLC memory cells in the selected page in the selected LG group for performing the 3P operation on the selected page of TLC memory cells, the eight second sets of seven bit line program voltages being adjusted from the first set of seven voltages for 2P operation based on respective to-be-programmed states of the selected page of TLC memory cells and incorporation of WL-WL coupling effect from the adjacent page of TLC memory cells varied in accordance with its status been programmed specifically to one of 8 program states by its own TLC program.

17. The NAND memory array of claim 10 wherein the multi-page concurrent TLC program operation includes a 3-pass 1-2-5-8 TLC program scheme per page by performing an ABL first pass (1P) operation to program one initial erase state with a negative Vt value in a single wide distribution to two SLC-like interim states followed by a HBL program-verify operation, performing an ABL second pass (2P') operation to turn the two interim states to 5 MLC-like interim states followed by a HBL program-verify operation, and performing an ABL third pass (3P'') operation to obtain 8 final TLC program states from the previous 5 MLC-like interim states followed by a HBL program-verify operation.

18. The NAND memory array of claim 17 wherein the different analog voltages respectively comprise two bit line program voltages of 2V (or Vdd whichever is lower) and 0V and one program-inhibit voltage of ~7V passed respectively to floating gate channels of TLC memory cells in the selected page in the selected LG group for performing the 1P operation on the selected page of TLC memory cells, or four bit line program voltages of 0V, 1V, 2V, 2.5V and one program-inhibit voltage of ~7V passed respectively to floating gate channels of TLC memory cells in the selected page in the selected LG group for performing the 2P' operation, or eight sets of seven bit line program voltages and one program-inhibit voltage of ~7V passed respectively to floating gate channels of TLC memory cells in the selected page in the selected LG group for performing the 3P''' operation on the selected page of TLC memory cells, the eight sets of seven bit line program voltages being determined by incorporation of respective Vt-distribution differences of 8 programmed states of the selected page of TLC memory cells and WL-WL coupling effect from the adjacent page of TLC memory cells varied in accordance with its status been programmed specifically to one of 8 program states by its own TLC program.

19. The NAND memory array of claim 10 wherein the multi-page concurrent TLC program operation includes a 2-pass 1-5-8 TLC program scheme per page by performing an ABL first pass (1P) operation to program one initial erase state with a negative Vt value in a single wide distribution to 5 MLC-like interim states followed by a HBL program-verify operation, then performing an ABL second pass (2P) operation to obtain 8 TLC program states from the previous 5 MLC-like interim states followed by a HBL program-verify operation, and optionally performing an ABL third pass (3P) operation on a selected page of TLC memory cells with a boundary wordline to fine tune corresponding Vt distributions to obtain 8 final TLC program states from the previous 8 TLC program states followed by a HBL program-verify operation.

20. The NAND memory array of claim 19 wherein the different analog voltages respectively comprise five bit line program voltages of 0V, 1.2V, 2.4V, 3.3V, 3.9V and one program-inhibit voltage of ~7V passed respectively to floating gate channels of TLC memory cells in the selected page in the selected LG group for performing the 1P operation on the selected page of TLC memory cells, or eight first sets of seven bit line program voltages and one program-inhibit voltage of ~7V passed respectively to floating gate channels of TLC memory cells in the selected page in the selected LG group for performing the 2P operation on the selected page of TLC memory cells, the eight first sets of seven bit line program voltages being determined by incorporation of respective Vt-distribution differences of 8 programmed states of the selected page of TLC memory cells and WL-WL coupling effect from the adjacent page of TLC memory cells varied in accordance with its status been programmed specifically to one of 8 program states by its own TLC program, or optionally a second set of seven bit line program voltages and one program-inhibit voltage of ~7V passed respectively to floating gate channels of the TLC memory cells in the selected page in the selected LG group for performing the 3P operation on the selected page of TLC memory cells.

21. The NAND memory array of claim 10 wherein the multi-page concurrent TLC ABL, AnP, and Alt-WL program operation with multiple program passes is performed in an alternate-WL scheme with rotations of performing each of the multiple program passes among three adjacent WLs, each program pass performed on each TLC NAND memory cell at one of the three WLs inducing shifts and widening of threshold voltage distributions of two or more interim or final program states of neighboring TLC memory cell in a same string at adjacent WLs due to a WL-WL coupling effect.

22. The NAND memory array of claim 21 wherein the multi-page concurrent TLC ABL, AnP, and Alt-WL program operation under a 1-2-8(coarse)-8(fine) scheme or a 1-2-5-8 scheme comprises a series of operations on a first selected packet of pages respectively with a dummy wordline, a first boundary wordline, three non-boundary wordlines, and a second boundary wordline:

starting with a dummy cell program on one page of dummy memory cells with the dummy wordline;
   performing a first pass program on a first page of TLC memory cells with the first boundary wordline;
   performing a first pass program on a second page of TLC memory cells with a non-boundary wordline next to the first page;
   performing a second pass program again on the first page of TLC memory cells with the first boundary wordline;
   performing a first pass program alternately on a third page of TLC memory cells with a non-boundary wordline next to the second page;
   performing a second pass program on the second page of TLC memory cells with the non-boundary wordline;
   performing a third pass program again on the first page of TLC memory cells with the first boundary wordline;
   performing a first pass program alternately on a fourth page of TLC memory cells with a non-boundary wordline next to the third page;
   performing a second pass program again on the third page of TLC memory cells with the non-boundary wordline;
   performing a third pass program again on the second page of TLC memory cells with the non-boundary wordline;
   performing a first pass program on a fifth page of TLC memory cells with the second boundary wordline next to the fourth page;
   performing a second pass program again on the fourth page of TLC memory cells with the non-boundary wordline;
   performing a third pass program again on the third page of TLC memory cells with the non-boundary wordline;
   performing a second pass program on the fifth page of TLC memory cells with the second boundary wordline;
   performing a third pass program on the fourth page of TLC memory cells with the non-boundary wordline; and
   performing a third pass program on the fifth page of TLC memory cells with the second boundary wordline if no program data is ready for any pages beyond the fifth page.

23. The NAND memory array of claim 22 wherein the multi-page concurrent TLC ABL, AnP, and Alt-WL program operation under a 1-2-8(coarse)-8(fine) scheme or a 1-2-5-8 scheme comprises a series of operations continued beyond the second boundary wordline on a second selected packet of pages respectively with a third boundary wordline next to the second boundary wordline, and three more non-boundary wordlines:

reading the data of the fifth page of TLC memory cells with the second boundary wordline subjected to a second pass program before performing a third pass program thereon;

performing a first pass program on a sixth page of TLC memory cells with the third boundary wordline next to the fifth page;

performing a first pass program on a seventh page of TLC memory cells with a non-boundary wordline next to the sixth page;

performing a second pass program again on the sixth page of TLC memory cells with the third boundary wordline;

performing a first pass program alternately on an eighth page of TLC memory cells with a non-boundary wordline next to the seventh page;

performing a second pass program again on the seventh page of TLC memory cells with the non-boundary wordline;

performing a third pass program alternately on the fifth page of TLC memory cells with the second boundary wordline based on the read data;

performing a third pass program again on the sixth page of TLC memory cells with the third boundary wordline;

performing a first pass program alternately on a ninth page of TLC memory cells with a non-boundary wordline next to the eighth page;

performing a second pass program on the seventh page of TLC memory cells with the second boundary wordline;

performing a third pass program again on the sixth page of TLC memory cells with the third boundary wordline.

24. The NAND memory array of claim 21 wherein the multi-page concurrent TLC ABL, AnP, and Alt-WL program operation under a 1-5-8 scheme comprises a series of operations on a first selected packet of pages respectively with two dummy wordlines, a first boundary wordline, three non-boundary wordlines, and a second boundary wordline:

performing dummy cell program sequentially on the two pages of dummy memory cells with the two dummy wordlines;

performing a first pass program on a first page of TLC memory cells with the first boundary wordline;

performing a first pass program on a second page of TLC memory cells with a non-boundary wordline next to the first page;

performing a second pass program again on the first page of TLC memory cells with the first boundary wordline;

performing a first pass program alternately on a third page of TLC memory cells with a non-boundary wordline next to the second page;

performing a second pass program on the second page of TLC memory cells with the non-boundary wordline;

performing a first pass program alternately on a fourth page of TLC memory cells with a non-boundary wordline next to the third page;

performing a second pass program again on the third page of TLC memory cells with the non-boundary wordline;

performing a first pass program on a fifth page of TLC memory cells with the second boundary wordline next to the fourth page;

performing a second pass program again on the fourth page of TLC memory cells with the non-boundary wordline; and performing a second pass program on the fifth page of TLC memory cells with the second boundary wordline.

25. The NAND memory array of claim 24 wherein the multi-page concurrent TLC ABL, AnP, and Alt-WL program operation under a 1-5-8 scheme comprises a series of operations continued beyond the second boundary wordline on a second selected packet of pages respectively with a third boundary wordline next to the second boundary wordline followed by three more non-boundary wordlines:

performing a first pass program on a sixth page of TLC memory cells with the third boundary wordline next to the fifth page with the second boundary wordline;

performing a first pass program on a seventh page of TLC memory cells with a non-boundary wordline next to the sixth page;

performing a second pass program again on the sixth page of TLC memory cells with the third boundary wordline;

performing a first pass program alternately on an eighth page of TLC memory cells with a non-boundary wordline next to the seventh page;

performing a second pass program again on the seventh page of TLC memory cells with the non-boundary wordline;

performing a first pass program alternately on a ninth page of TLC memory cells with a non-boundary wordline next to the eighth page;

performing a second pass program again on the eighth page of TLC memory cells with the non-boundary wordline.

26. The NAND memory array of claim 24 wherein the multi-page concurrent TLC ABL, AnP, and Alt-WL program operation under a 1-5-8 scheme comprises a series of operations continued beyond the second boundary wordline on a second selected packet of pages respectively with a third boundary wordline next to the second boundary wordline followed by three more non-boundary wordlines:

reading data in the fifth page of TLC memory cells with the second boundary wordline after the second pass program thereon;

performing a first pass program on a sixth page of TLC memory cells with the third boundary wordline next to the fifth page;

performing a first pass program on a seventh page of TLC memory cells with a non-boundary wordline next to the sixth page;

performing a third pass program on the fifth page of TLC memory cells with the second boundary wordline;

performing a second pass program again on the sixth page of TLC memory cells with the third boundary wordline;

performing a first pass program alternately on an eighth page of TLC memory cells with a non-boundary wordline next to the seventh page;

performing a second pass program again on the seventh page of TLC memory cells with the non-boundary wordline;

performing a first pass program alternately on a ninth page of TLC memory cells with a non-boundary wordline next to the eighth page;

performing a second pass program again on the eighth page of TLC memory cells with the non-boundary wordline.

27. The NAND memory array of claim 10 wherein the multi-page TLC ABL, AnP, and Alt-WL program operation is performed concurrently on M pages of TLC memory cells selected on a basis of one-page-per-LG-group from one or more MG groups of one or more HG groups, wherein for programming each of the M pages of TLC memory cells, seven N-bit MG PCACHE registers formed by seven rows of N LBLs associated with seven MG groups are selected from total L MG groups of one HG group wherein at least one of the seven MG groups contains said one page of TLC memory cells, the first six N-bit MG PCACHE registers being used for respectively storing two copies of three TLC logic-page data (MSB, CSB, and LSB) in a digital pattern of 7V/Vss converted from Vdd/Vss sequentially loaded from I/Os and one additional N-bit LG PCACHE register formed by a row of N broken-LBLs is selected from the at least one MG group that contains said one page of TLC memory cells for temporarily storing an interim TLC program data loaded from the page buffer during iterative recall and write-back operations for TLC program and program-verify.

28. The NAND memory array of claim 27 wherein each recall operation per page is performed in HBL manner on Odd/Even-BL basis in two cycles, each cycle being configured to read half-page N/2-bit of one of the three TLC logic-page data stored in corresponding one of six N/2-bit MG PCACHE registers to N/2-bit page buffer by performing Odd/Even-BL charge-sharing operation between the associated LBL and corresponding GBL with N/2-bit data pattern voltages in Vinh-7V/Vss being diluted down to (1/J×L)Vinh/Vss.

29. The NAND memory array of claim 27 wherein each write-back operation per page is performed in ABL manner in one cycle after each two-cycle recall operation to reload N-bit of one of the three TLC logic-page data back from the page buffer to corresponding two N-bit MG PCACHE registers associated with two MG groups in two cycles by performing, per each cycle, a concurrent precharging operation on one N-bit MG PCACHE registers with Vinh-7V from the common precharge power line and a voltage-conversion operation to change digital data pattern from Vdd/Vss to Vinh/Vss via the N-bit page buffer and up to J HG PACHE registers depending on locations of the one of two MG groups in the HG group selected out of the J HG groups relative to the page buffer.

30. The NAND memory array of claim 10 wherein the multi-page program-verify operation is performed concurrently on M pages of TLC memory cells selected on a basis of one-page-per-MG-group from one or more MG groups of one or more HG groups, M being an integer up to J×L, wherein for program-verifying each selected page of the M pages of TLC memory cells, 6 MG PCACHE registers formed by six rows of N LBLs are kept storing two copies of three pages of TLC page digital data of MSB, CSB, and LSB in a digital pattern of Vinh/Vss and one additional N-bit MG PCACHE register associated with another MG group that contains said page is used to iteratively store N-bit interim program-verify data and precharged voltage by performing a two-cycle operation on Odd/Even-BL basis, a first cycle operation for Odd-BL including precharging all Odd N/2-bit MG PCACHE register with a Vinh-7V from the common precharge power line, applying a pre-determined program-verify voltage to a common wordline of the selected page, selectively discharging individual Odd LBLs toward 0V preset at neighboring Even LBLs from the page buffer if corresponding threshold voltages of the TLC memory cells in some Odd LBLs are smaller than the pre-determined program-verify voltage or otherwise retaining Vinh in corresponding Odd LBLs, performing charge-sharing of the Odd N/2-bit MG PCACHE register with Odd N/2-bit GBL to send a diluted GBL voltage to a sense amplifier in the page buffer, the sense amplifier including an Multiplier capable of detecting a maximum diluted GBL voltage corresponding to the retained Vinh to determine that one corresponding TLC memory cell has been successfully programmed and detecting a minimum mV drop from the maximum diluted GBL voltage to determine that another corresponding TLC memory cell has not been successfully programmed; repeating above operations in the second cycle for Even-BL.

31. The NAND memory array of claim 10 wherein each selected page of the M pages of TLC memory cells selected on a basis on one-page-per-MG-group from one or more MG groups of one or more HG groups is subjected to a concurrent HBL Odd/Even-BL TLC read operation in two cycles, a first cycle operation for Odd-BL including precharging all Odd N/2-bit MG PCACHE register associated with the MG group that contains the selected page with a Vinh-7V from the common precharge power line, sequentially applying a set of 7 uprising read voltages to a common wordline of said page, selectively discharging individual Odd LBLs toward 0V preset at neighboring Even LBLs from the page buffer if corresponding threshold voltages of the TLC memory cells in corresponding Odd LBLs are smaller than particular one of the 7 uprising read voltages or otherwise retaining Vinh-7V at the corresponding Odd LBLs, performing charge-sharing of the Odd N/2-bit MG PCACHE register with Odd N/2-bit GBL to send a GBL signal corresponding to each TLC memory cell in the selected page to a sense amplifier in the page buffer to determine a state of the TLC memory cell by detecting and decoding the GBL signal; repeating above operations in the second cycle for Even-BL.

32. The NAND memory array of claim 31 wherein the selectively discharging individual Odd/Even LBLs comprises individually applying predetermined voltages from the page buffer via the corresponding GBLs to respective neighboring Even/Odd LBLs as local source lines of the Odd/Even-numbered strings so that either one source line compensation voltage is commonly coupled to source nodes of all TLC memory cells of the selected page in Odd/Even-numbered strings or one or more up to 7 individual source line compensation voltages are coupled to respective source nodes of N TLC memory cells of the selected page in Odd/Even-numbered strings one-to-one corresponding to the 7 uprising read voltages and varying in accordance with different TLC program states of respective N TLC memory cells in corresponding Odd/Even-numbered strings in an adjacent page.

33. The NAND memory array of claim 32 wherein the individual source line compensation voltages are all set to 0V for reading the selected page with a non-boundary wordline of a packet of multiple pages selected for performing TLC ABL, AnP, Alt-WL program operation, and are given to 8 set of 7 Vt-compensation values for reading the selected page with a boundary wordline of a packet of multiple pages selected for performing TLC ABL, AnP, Alt-WL program operation wherein each of the 8 sets of 7 Vt-compensation values is determined based on each of 8 possible programmed states of respective N opposing TLC memory cells in next page adjacent to the selected page with the boundary wordline.

34. The NAND memory array of claim 33 wherein the selectively discharging individual Odd/Even LBLs comprises adjusting respective values of the 7 uprising read voltages based on whether the selected page is with a non-boundary wordline of a packet of multiple pages selected for performing TLC program affected by N opposing TLC memory cells of respective N strings in adjacent page being programmed in certain TLC program states or with a boundary wordline of the packet affected by N opposing TLC memory cells of respective N strings in adjacent page being at an erase state or at a programmed state, and further based on whether the individual source line compensation voltages are applied when the selected page is with a boundary wordline.

35. The NAND memory array of claim 31 wherein the multi-page HBL Odd/Even TLC read operation for reading one or more pages of TLC memory cells programmed under a three-pass 1-2-8(coarse)-8(fine) TLC program scheme comprises:
receiving a command for reading a selected page of TLC memory cells with a first wordline;
determining that the first wordline is not a boundary wordline by reading out a mark bit "1" stored in bare area of the selected page;
performing the HBL Odd/Even TLC read operation in two cycles on the selected page of TLC memory cells by at least sequentially applying a first set of 7 uprising read voltages of 0.5V, 1V, 1.5V, 2V, 2.5V, 3V, and 3.5V to the first wordline of the selected page;
determining that the first wordline is a boundary wordline by reading out a mark bit "0" stored in bare area of the selected page;
performing special read on TLC memory cells in next adjacent page using a wordline voltage of 0V;
determining that the TLC memory cells with the second wordline are all in erase states by reading out all negative threshold Vt values smaller than 0V;
performing the HBL Odd/Even TLC read operation in two cycles on the selected page of TLC memory cells by at least sequentially applying a second set of 7 uprising read voltages of 0.1V, 0.6V, 1.1V, 1.6V, 2.1V, 2.6V, and 3.1V to the first wordline of the selected page;
determining that the TLC memory cells with the second wordline are not all in erase states by reading out at least one threshold Vt value greater than 0V;
performing the HBL Odd/Even TLC read operation in two cycles on the selected page of TLC memory cells by at least sequentially applying a third set of 7 uprising read voltages of 0.9V, 1.4V, 1.9V, 2.4V, 2.9V, 3.4V, and 3.9V to the first wordline of the selected page.

36. The NAND memory array of claim 31 wherein the multi-page HBL Odd/Even TLC read operation for reading one or more pages of TLC memory cells programmed under a three-pass 1-2-5-8 TLC program scheme comprises:
receiving a command for reading a selected page of TLC memory cells with a first wordline;
determining that the selected page is not with a boundary wordline by reading out a mark bit "1" stored in bare area of the selected page;
performing the HBL Odd/Even TLC read operation in two cycles on the selected page of TLC memory cells by at least sequentially applying a first set of 7 uprising read voltages of 0.5V, 1V, 1.5V, 2V, 2.5V, 3V, and 3.5V to the first wordline of the selected page;
determining that the first wordline is a boundary wordline by reading out a mark bit "0" stored in bare area of the selected page;
performing special read on TLC memory cells in next adjacent page using a wordline voltage of 0V;
determining that the TLC memory cells with the second wordline are all in erase states by reading out all negative threshold Vt values smaller than 0V;
performing the HBL Odd/Even TLC read operation in two cycles on the selected page of TLC memory cells by at least sequentially applying a second set of 7 uprising read voltages of 0.1V, 0.6V, 1.1V, 1.6V, 2.1V, 2.6V, and 3.1V to the first wordline of the selected page;
determining that the TLC memory cells with the second wordline are not all in erase states by reading out at least one threshold Vt value greater than 0V;
performing the HBL Odd/Even TLC read operation in two cycles on the selected page of TLC memory cells by at least sequentially applying a third set of 7 uprising read voltages of 0.9V, 1.4V, 1.9V, 2.4V, 2.9V, 3.4V, and 3.9V to the first wordline of the selected page and applying certain source line voltages for providing threshold state Vt-compensations to distinguish corresponding 8 TLC program states of the TLC memory cells in the selected page, wherein the Vt-compensations are individually implemented per cell by setting source lines of corresponding TLC memory cells with the first wordline to 0V in accordance with opposing TLC cells with the second wordline being at three following TLC program states P7, P5, and P3 and setting source lines of corresponding TLC memory cells with the first wordline to 0.03V in accordance with opposing TLC cells with the second wordline being at other TLC program states P6, P4, P2, P1, and P0.

37. The NAND memory array of claim 31 wherein the multi-page HBL Odd/Even TLC read operation for reading one or more pages of TLC memory cells programmed under a two-pass 1-5-8 TLC program scheme comprises:
receiving a command for reading a selected page of TLC memory cells with a first wordline;
determining that the first wordline is not a boundary wordline by reading out a mark bit "1" stored in bare area of the selected page;
performing the HBL Odd/Even TLC read operation in two cycles on the selected page of TLC memory cells by at least sequentially applying a first set of 7 uprising read voltages of 0.7V, 1.3V, 1.9V, 2.5V, 3.1V, 3.7V, and 4.3V to the first wordline of the selected page;
determining that the first wordline is a boundary wordline by reading out the mark bit "0" stored in bare area of the selected page;
performing special read on TLC memory cells in next adjacent page using a wordline voltage of 0V;
determining that the TLC memory cells with the second wordline are all in erase states by reading out all negative threshold Vt values smaller than 0V;
performing the HBL Odd/Even TLC read operation in two cycles on the selected page of TLC memory cells by at least sequentially applying a second set of 7 uprising read voltages of 0.7V, 1.3V, 1.9V, 2.5V, 3.1V, 3.7V, and 4.3V to the first wordline of the selected page;
determining that the TLC memory cells with the second wordline are not all in erase states by reading out at least one threshold Vt value greater than 0V;
performing the HBL Odd/Even TLC read operation in two cycles on the selected page of TLC memory cells by at least sequentially applying a third set of 7 uprising read voltages of 1.1V, 1.7V, 2.3V, 2.9V, 3.5V, 4.1V, and 4.7V to the first wordline of the selected page and applying certain source line voltages of 0V, 0.05V, 0.1V, 0.14V, 0.18V, 0.23V, 0.27V, and 0.35V respectively for providing threshold state Vt-compensations to distinguish corresponding 8 TLC program states of the TLC memory cells in the selected page in accordance with the stored TLC data in the TLC memory cells with the second wordline.

38. The NAND memory array of claim 31 wherein the multi-page HBL Odd/Even TLC read operation for reading one or more pages of TLC memory cells programmed under a two-pass 1-5-8 TLC program scheme with an additional third-pass operation comprises:

receiving a command for reading a selected page of TLC memory cells with a first wordline;
determining that the first wordline is not a boundary wordline by reading out a first mark bit "1" stored in bare area of the selected page;
performing the HBL Odd/Even TLC read operation in two cycles on the selected page of TLC memory cells by at least sequentially applying a first set of 7 uprising read voltages of 0.7V, 1.3V, 1.9V, 2.5V, 3.1V, 3.7V, and 4.3V to the first wordline of the selected page;
determining that the first wordline is a boundary wordline by reading out the first mark bit "0" stored in bare area of the selected page;
performing special read on TLC memory cells in next adjacent page using a wordline voltage of 0V;
determining that the TLC memory cells with the second wordline are all in erase states by reading out all negative threshold Vt values smaller than 0V;
performing the HBL Odd/Even TLC read operation in two cycles on the selected page of TLC memory cells by at least sequentially applying a second set of 7 uprising read voltages of 0.7V, 1.3V, 1.9V, 2.5V, 3.1V, 3.7V, and 4.3V to the first wordline of the selected page;
determining that the TLC memory cells with the second wordline are not all in erase states by reading out at least one threshold Vt value greater than 0V;
performing the HBL Odd/Even TLC read operation in two cycles on the selected page of TLC memory cells by at least sequentially applying a third set of 7 uprising read voltages of 1.3V, 1.9V, 2.5V, 3.1V, 3.7V, 4.3V, and 4.9V to the first wordline of the selected page.

39. The NAND memory array of claim 1 wherein all NAND memory cells and two dummy memory cells in a string are configured with a plurality of mixed SLC+3TLC cell units, each unit comprising one SLC memory cell connecting three consecutive TLC memory cells, the two dummy memory cells being placed in the middle of the string to divide the string to a first sub-string and a second sub-string or being placed with one dummy memory cell next to the first string-select transistor at an end of the first sub-string and another dummy memory cell next to the second string-select transistor at another end of the second sub-string.

40. The NAND memory array of claim 39 wherein the N broken-LBLs associated with a LG group are configured to be a N-bit LG PCACHE register capable of storing one of different analog voltages for providing individual bit line voltages to perform one of multi-page concurrent mixed TLC+SLC ABL, AnP, and Alt-WL program operation with multiple program passes on one selected page of TLC memory cells from one of multiple units of mixed SLC page and three consecutive TLC pages in the LG group to convert an initial erase state of each TLC memory cell to a proper one state of two or more interim program states and further to a desired one state of 8 final TLC program states so that all N TLC memory cells in the selected page can be programmed in each program pass with a substantially same starting time and a substantially same finishing time without earlier lockout and with BL-BL coupling effect being substantially eliminated, each program pass being followed by one of multi-page two cycles of HBL program-verify operation, each of the N-bit LG PCACHE register being reassigning the medium-high voltage up to 7V as a program-inhibit voltage to stop programming on the corresponding TLC memory cell once an interim program state or one of 8 final TLC program states is verified.

41. The NAND memory array of claim 40 wherein the different analog voltages for providing individual bit line voltage are determined in accordance with threshold-voltage (Vt) differences among corresponding two or more interim program states or up to 8 final TLC program states of the N TLC memory cells in the selected page during each of the multiple program passes, wherein at least some values of the different analog voltages are greater than Vdd provided that the Vdd is an operation voltage of a low-voltage page buffer.

42. The NAND memory array of claim 41 wherein each of the different analog voltages for providing individual bit line voltage is further adjusted by considering a factor representing a WL-WL coupling effect from a TLC memory cell in an adjacent page varied in accordance with its status of being programmed specifically to one of 8 TLC program states in at least a last pass of the multiple program passes during the TLC program on the adjacent page, wherein the factor representing a WL-WL coupling effect is substantially reduced except that the selected page is a middle TLC page of the three consecutive TLC pages.

43. The NAND memory array of claim 42 wherein each of the different analog voltages for providing individual bit line voltage is generated, per each of the multiple program passes, by first selecting three or four adjacent broken-LBLs along one corresponding column including one broken-LBL associated with the selected LG group that contains the N TLC memory cells in the selected page to be performed with iterative program and program-verify operation; independently and sequentially precharging each broken-LBL from respective common precharge power lines with a predetermined voltage up to 7V; resetting the precharged voltage in each broken-LBL by doing charge-sharing among the three or four broken-LBLs to generate a LBL voltage defined under each of the multiple program passes in accordance with varied states of corresponding one of the N TLC memory cells in the selected page, and passing the LBL voltage as one of the 8 different analog voltages to a floating-gate channel of the corresponding one TLC memory cell.

44. The NAND memory array of claim 43 wherein the one medium-high voltage for program-inhibiting is a value greater than the Vdd and close to but no greater than drain-source breakdown voltage of ~7V and is generated substantially in a same way as each of the different analog voltages, and at least one of the different analog voltages has a value higher than Vdd.

45. The NAND memory array of claim 40 wherein the multi-page concurrent mixed TLC+SLC program operation includes a 2-pass 1-5-8 TLC program scheme per TLC page by performing an ABL first pass (1P) operation to program one initial erase state with a negative Vt value in a single wide distribution to 5 MLC-like interim states followed by a HBL program-verify operation, performing an ABL second pass (2P) operation to turn the 5 interim states to 8 TLC program states followed by a HBL program-verify operation, and a 2-pass 1-1 SLC program scheme plus an optional 1-pass 1-2 SLC program scheme per SLC page by performing an ABL first pass (1P') operation to shift one initial erase to a first interim state with a smaller negative Vt in a narrower distribution followed by a HBL verify operation, performing an ABL second pass (2P'') operation to further shift the first interim state to a second interim state with minimum positive Vt value without program followed by a HBL verify operation, and performing an ABL SLC program (SP) operation to form a SLC program state with higher positive Vt value from the previous second interim state with a reduced Vt shift followed by a HBL program-verify operation.

46. The NAND memory array of claim 45 wherein the different analog voltages comprise five bit line program voltages of 0V, 1.2V, 2.4V, 3.3V, 3.9V and one program-inhibit voltage of ~7V passed respectively to floating gate channels of TLC memory cells in the selected TLC page from one of multiple units of mixed SLC page and three consecutive TLC pages in the selected LG group for performing the 1P operation on the selected page of TLC memory cells, or comprise eight sets of seven bit line program voltages and one program-inhibit voltage of ~7V passed respectively to floating gate channels of TLC memory cells in the selected page in the selected LG group for performing the 2P operation on the selected page of TLC memory cells, the eight sets of seven bit line program voltages being determined by incorporation of respective Vt-distribution differences of 8 programmed states of the selected page of TLC memory cells and WL-WL coupling effect from the adjacent page of TLC memory cells varied in accordance with its status been programmed specifically to one of 8 program states by its own TLC program, wherein the selected page is a TLC page with a non-boundary wordline and the next adjacent page is a TLC page with a boundary wordline.

47. The NAND memory array of claim 45 wherein the different analog voltages comprise a single bit line program voltage of 0V passed to floating gate channels of a selected page of SLC memory cells from one of the multiple units of mixed SLC page and three consecutive TLC pages in the selected LG group and a program-inhibit voltage for performing both 1P'' and 2P'' operations, or comprise a single bit line program voltage of 0V and one program-inhibit voltage of ~7V passed to floating gate channels of a selected page of SLC memory cells from one of the multiple units of mixed SLC page and three consecutive TLC pages in the selected LG group and a program-inhibit voltage for performing the SP operation.

48. The NAND memory array of claim 45 wherein the multi-page concurrent mixed TLC+SLC ABL, AnP, and Alt-WL program operation with multiple program passes is performed in an alternate-WL scheme with rotations of performing each of the multiple program passes among three adjacent mixed SLC and TLC pages, each program pass performed on each TLC NAND memory cell at one of TLC pages inducing shifts and widening of threshold voltage distributions of two or more interim or final program states of neighboring TLC or SLC memory cell in a same string at adjacent TLC or SLC pages due to a WL-WL coupling effect, each of 1P'' and 2P'' operation performed on each SLC NAND memory cell at one SLC page inducing shifts and widening of threshold voltage distributions of two or more interim or final program states of neighboring TLC memory cell in a same string at precedent adjacent TLC page due to a WL-WL coupling effect, each SP operation on each SLC NAND memory cell at one SLC page inducing slight widening of threshold voltage distributions of two or more interim or final program states of neighboring TLC memory cell in a same string at adjacent TLC pages due to a WL-WL coupling effect.

49. The NAND memory array of claim 48 wherein the multi-page concurrent mixed TLC+SLC ABL, AnP, and Alt-WL program operation under the 1-5-8 TLC scheme and the 2-pass 1-1 SLC program scheme comprises a series of operations on a first selected packet of mixed SLC+3TLC pages respectively with two dummy wordlines, a first boundary TLC wordline, a non-boundary TLC wordline, a second boundary TLC wordline, and a second SLC wordline:

starting with a dummy cell program on one page of dummy memory cells with a first one of two dummy wordlines;

performing a dummy cell program on a first page of dummy memory cells with a second one of the two dummy wordlines as a first SLC wordline;

performing a 1P program on a second page of TLC memory cells with the first boundary TLC wordline next to the first page;

performing a 1P program on a third page of TLC memory cells with the non-boundary TLC wordline next to the second page;

performing a 2P program again on the second page of TLC memory cells with the first boundary TLC wordline;

performing a 1P program alternately on a fourth page of TLC memory cells with the second boundary TLC wordline next to the third page;

performing a 2P program again on the third page of TLC memory cells with the non-boundary TLC wordline;

performing a 1P'' program alternately on a fifth page of SLC memory cells with a second SLC wordline next to the fourth page;

performing a 2P program again on the fourth page of TLC memory cells with the second boundary TLC wordline.

50. The NAND memory array of claim 49 wherein the multi-page concurrent mixed TLC+SLC ABL, AnP, and Alt-WL program operation under the 1-5-8 TLC scheme and the 2-pass 1-1 SLC program scheme comprises a series of operations beyond the second SLC wordline on a second selected packet of mixed SLC+3TLC pages respectively with a third boundary TLC wordline next to the second SLC wordline, a non-boundary TLC wordline, a fourth boundary TLC wordline, and a third SLC wordline:

performing a 1P program on a sixth page of TLC memory cells with the third boundary TLC wordline next to the fifth page;

performing a 1P program on a seventh page of TLC memory cells with the non-boundary TLC wordline next to the sixth page;

performing a 2P'' program on the fifth page of SLC memory cells with the second SLC wordline to cause threshold voltage Vt shift on corresponding TLC memory cells at precedent fourth page;

performing a 2P program again on the sixth page of TLC memory cells with the third boundary TLC wordline;

performing a 1P program alternately on an eighth page of TLC memory cells with the fourth boundary TLC wordline next to the seventh page;

performing a 2P program again on the seventh page of TLC memory cells with the non-boundary TLC wordline;

performing a 1P'' shift operation alternately on a ninth page of SLC memory cells with a third SLC wordline next to the eighth page;

performing a 2P program again on the eighth page of TLC memory cells with the fourth boundary TLC wordline.

51. The NAND memory array of claim 48 wherein the multi-page concurrent mixed TLC+SLC ABL, AnP, and Alt-WL program operation under the 1-5-8 TLC scheme and the 2-pass 1-1 plus a 1-2 SP program scheme comprises a series of operations on a selected packet of mixed SLC+ 3TLC pages respectively with a first boundary TLC wordline, a first non-boundary TLC wordline, a second boundary TLC wordline, a second SLC wordline, a third boundary TLC wordline, and a second non-boundary TLC wordline:
performing a 1P program on a first page of TLC memory cells with the first boundary TLC wordline;
performing a 1P program on a second page of TLC memory cells with the non-boundary TLC wordline next to the first page;
performing a 2P program again on the first page of TLC memory cells with the first boundary TLC wordline;
performing a 1P program alternately on a third page of TLC memory cells with the second boundary TLC wordline next to the second page;
performing a 2P program again on the second page of TLC memory cells with the first non-boundary TLC wordline;
performing a 1P' program alternately on a fourth page of SLC memory cells with the second SLC wordline next to the third page;
performing a 2P program again on the third page of TLC memory cells with the second boundary TLC wordline;
performing a 1P program on a fifth page of TLC memory cells with the third boundary TLC wordline next to the fourth page;
performing a 1P program on a sixth page of TLC memory cells with the second non-boundary TLC wordline next to the fifth page;
performing a 2P' program on the fourth page of SLC memory cells with the second SLC wordline;
performing a 2P program on the fifth page of TLC memory cells with the third boundary TLC wordline;
performing a 2P program on the sixth page of TLC memory cells with the second non-boundary wordline; and
performing a SP program on the fourth page of the SLC memory cells with the second SLC wordline to store a SLC data therein.

52. The NAND memory array of claim 40 wherein the multi-page program-verify operation is performed concurrently on M pages of TLC memory cells selected on a basis of one-page-per-MG-group from one of multiple units of mixed SLC page and consecutive TLC pages in one or more MG groups from of one or more HG groups, M being an integer up to J×L, wherein for program-verifying each selected page of the M pages of TLC memory cells, 3 pairs of MG PCACHE registers formed by six rows of N LBLs are kept storing two copies of three pages of TLC page digital data of MSB, CSB, and LSB in a digital pattern of Vinh/Vss and one additional N-bit MG PCACHE register associated with another MG group that contains said page is used to iteratively store N-bit interim program-verify data and precharged voltage by performing a two-cycle operation on Odd/Even-BL basis, a first cycle operation for Odd-BL including precharging all Odd N/2-bit MG PCACHE register with a Vinh-7V from the common precharge power line, applying a pre-determined program-verify voltage to a common wordline of the selected page, selectively discharging individual Odd LBLs toward 0V preset at neighboring Even LBLs from the page buffer if corresponding threshold voltages of the TLC memory cells in some Odd LBLs are smaller than the pre-determined program-verify voltage or otherwise retaining Vinh in corresponding Odd LBLs, performing charge-sharing of the Odd N/2-bit MG PCACHE register with Odd N/2-bit GBL to send a diluted GBL voltage to a sense amplifier in the page buffer, the sense amplifier including an Multiplier capable of detecting a maximum diluted GBL voltage corresponding to the retained Vinh to determine that one corresponding TLC memory cell has been successfully programmed and detecting a minimum mV drop from the maximum diluted GBL voltage to determine that another corresponding TLC memory cell has not been successfully programmed; repeating above operations in the second cycle for Even-BL.

53. The NAND memory array of claim 40 wherein each selected page of the M pages of TLC memory cells selected on a basis on one-page-per-MG-group from one of multiple units of mixed SLC page and consecutive TLC pages in one or more MG groups of one or more HG groups is subjected to a concurrent HBL Odd/Even-BL TLC read operation in two cycles, a first cycle operation for Odd-BL including precharging all Odd N/2-bit MG PCACHE register associated with the MG group that contains the selected page with a Vinh-7V from the common precharge power line, sequentially applying a set of 7 uprising read voltages to a common wordline of said page, selectively discharging individual Odd LBLs toward 0V preset at neighboring Even LBLs from the page buffer if corresponding threshold voltages of the TLC memory cells in corresponding Odd LBLs are smaller than particular one of the 7 uprising read voltages or otherwise retaining Vinh-7V at the corresponding Odd LBLs, performing charge-sharing of the Odd N/2-bit MG PCACHE register with Odd N/2-bit GBL to send a GBL signal corresponding to each TLC memory cell in the selected page to a sense amplifier in the page buffer to determine a state of the TLC memory cell by detecting and decoding the GBL signal; repeating above operations in the second cycle for Even-BL.

54. The NAND memory array of claim 53 wherein the set of 7 uprising read voltages comprises 0.7V, 1.3 V, 1.9V, 2.5V, 3.1V, 3.7V, and 4.3V applied to the wordline of the selected page without source line voltage compensation for performing the HBL Odd/Even TLC read operation to distinguish 8 TLC program states of each TLC memory cell in the selected page.

55. The NAND memory array of claim 39 wherein each of the two dummy memory cells is configured to replace one regular SLC NAND memory cell in forming one of mixed SLC+3TLC cell units.

56. The NAND memory array of claim 40 wherein M×3 SLC pages selected from M×3 dispersed LG groups in one or more HG groups are configured to be programmed under a ABL N-bit concurrent SLC program to store 3 pages TLC N-bit digital data previously stored respectively in a first pair of N-bit MG PCAHCE registers for MSB page, a second pair of N-bit MG PCAHCE registers for CSB page, and a third pair of N-bit MG PCAHCE registers for LSB page, by setting corresponding control gate signals for M×3 rows of first/second string-select transistors to Vdd/0V, setting gate voltages for unselected wordlines to Vpass ~10V, and setting gate voltages for corresponding M×3 selected pages to one value greater than 18V for at least 10 s when system power supply is removed unintentionally.

57. The NAND memory array of claim 56 wherein the M pages of stored N-bit digital data in M SLC pages from M mixed SLC+3TLC units can be concurrently programmed back into a desired TLC page in a background program after system power supply is restored.

\* \* \* \* \*